United States Patent
Murakami et al.

(10) Patent No.: US 8,522,109 B2
(45) Date of Patent: Aug. 27, 2013

(54) LOSS CORRECTION ENCODING DEVICE AND LOSS CORRECTION ENCODING METHOD

(75) Inventors: Yutaka Murakami, Osaka (JP); Shutai Okamura, Osaka (JP)

(73) Assignee: Panasonic Corporation, Osaka (JP)

(\*) Notice: Subject to any disclaimer, the term of this patent is extended or adjusted under 35 U.S.C. 154(b) by 299 days.

(21) Appl. No.: 12/994,367

(22) PCT Filed: Jul. 2, 2009

(86) PCT No.: PCT/JP2009/003080
§ 371 (c)(1), (2), (4) Date: Nov. 23, 2010

(87) PCT Pub. No.: WO2010/001610
PCT Pub. Date: Jan. 7, 2010

(65) Prior Publication Data
US 2011/0087948 A1      Apr. 14, 2011

(30) Foreign Application Priority Data
Jul. 2, 2008   (JP) ................................. 2008-173735

(51) Int. Cl.
*H03M 13/00*   (2006.01)

(52) U.S. Cl.
USPC ........... 714/755; 714/776; 714/762; 714/788; 714/786

(58) Field of Classification Search
USPC .................. 714/758, 755, 786, 762, 788, 776
See application file for complete search history.

(56) References Cited

U.S. PATENT DOCUMENTS

| | | | | |
|---|---|---|---|---|
| 5,392,299 A * | 2/1995 | Rhines et al. | | 714/756 |
| 6,055,277 A * | 4/2000 | Stephens et al. | | 375/285 |
| 6,061,820 A | 5/2000 | Nakakita | | |
| 7,003,712 B2 * | 2/2006 | Martinian et al. | | 714/761 |
| 7,756,044 B2 * | 7/2010 | Padhye et al. | | 370/238 |
| 7,818,445 B2 * | 10/2010 | Zuckerman et al. | | 709/231 |
| 2009/0262757 A1 * | 10/2009 | Rainish | | 370/476 |
| 2010/0325521 A1 * | 12/2010 | Khisti et al. | | 714/762 |

FOREIGN PATENT DOCUMENTS

| | | |
|---|---|---|
| EP | 1 965 498 | 9/2008 |
| JP | 8-186570 | 7/1996 |
| WO | 2006/038054 | 4/2006 |
| WO | 2007/072721 | 6/2007 |

OTHER PUBLICATIONS

International Search Report dated Aug. 4, 2009.

(Continued)

*Primary Examiner* — Guy Lamarre
(74) *Attorney, Agent, or Firm* — Dickinson Wright PLLC

(57) ABSTRACT

A loss correction encoding device having an improved capability of loss correction using LDPC-CC is disclosed. In the loss correction encoding device (120), a rearranging unit (122) rearranges information data contained in n information packets according to the constraint length Kmax and the encoding rate (q−1)/q of a cheek polynomial of the loss correction code used in a loss correction encoding unit (123). Specifically, the rearranging unit (122) rearranges the information data in such a way that continuous Kmax×(q−1) pieces of information data after rearrangement are contained in different information packets. The rearranging unit (122) distributes the information data to information blocks from n information packets (n satisfies formula (1)).

$$K\max \times (q-1) \leq n \qquad (1).$$

5 Claims, 67 Drawing Sheets

(56) References Cited

OTHER PUBLICATIONS

Ying Yu Tal, et al., "Alegebraic Construction of Quasi-Cyclic LDPC Codes for the AWGN and Erasure Channels," IEEE Transactions on Communications, vol. 54, No. 10, Oct. 2006, pp. 1765-1774.

Ali Emre Pusane, et al., "On Deriving Good LDPC Convolutional Codes from QC LDPC Block Codes," ISIT 2007, Jun. 2007, pp. 1221-1225.

Zhengang Chen, et al., "Efficient Encoding and Termination of Low-Density Parity-Check Convoluntional Codes," Proceedings of the IEEE Global Telecommunications Conference, Nov. 27-Dec. 1, 2006, pp. 1-5.

Takaaki Kishigama, et al., "LDPC-Convolutional Codes for IEEE 802.16m FEC Scheme," IEEE 802.16 Broadband Wireless Access Working Group, Jan. 2008, pp. 1-6.

D. J. C. MacKay, "Good Error-Correcting Codes Based on Very Sparse Matrices," IEEE Transactions on Information Theory, vol. 45, No. 2, Mar. 1999, pp. 399-431.

R. G. Gallager, "Low-Density Parity-Check Codes," IRE Transactions on Information Theory, Jan. 1962, pp. 21-28.

A. J. Felstrom, et al., "Time-Varying Periodic Convolutional Codes With Low-Density Parity-Check Matrix," IEEE Transactions on Information Theory, vol. 45, No. 6, Sep. 1999, pp. 2181-2191.

R. G. Gallager, "Low-Density Parity-Check Codes," Cambridge, MA, MIT Press, Jul. 1963, pp. 1-90.

M. P. C. Fossorier, et al., "Reduced Complexity Iterative Decoding of Low-Density Parity Check Codes Based on Belief Propagation," IEEE Transactions on Communications, vol. 47, No. 5, May 1999, pp. 673-680.

Jinghu Chen, et al., "Reduced-Complexity Decoding of LDPC Codes," IEEE Transactions on Communications, vol. 53, No. 8, Aug. 2005, pp. 1288-1299.

Extended European Search Report dated Dec. 10, 2012.

Y. Murakami, et al., "LDPC Convolutional Codes Based on Parity Check Polynomial," IEICE Technical Report, RCS2008-13, ISSN 0913-5685, XP008147297, May 29-30, 2008, pp. 75-79.

Y. Murakami, et al., "G.hn: Two-mode support by using low density parity check-convolutional codes (LDPC-CCs)," ITU-Telecommunication Standardization Sector, Study Group 15, XP017534304, Jun. 16-20, 2008, pp. 1-8.

\* cited by examiner $$\mathbf{H}^T_{[0,n]} = \begin{pmatrix} h_1^{(0)}(0) & h_1^{(0)}(1) & \cdots & h_1^{(M)}(M) & & 0 & \cdots & 0 \\ h_2^{(0)}(0) & h_2^{(0)}(1) & \cdots & h_2^{(0)}(M) & & 0 & & \\ 0 & h_1^{(0)}(1) & \cdots & \vdots & h_1^{(M)}(M+1) & & & \vdots \\ 0 & h_2^{(0)}(1) & \cdots & \vdots & h_2^{(M)}(M+1) & & & \\ & 0 & \cdots & \vdots & \cdots & & & h_1^{(M)}(n) \\ & & \ddots & & & & & h_2^{(M)}(n) \\ & & & \ddots & & & & \vdots \\ & & & & & & 0 & h_2^{(0)}(n) \end{pmatrix}$$

FIG. 2

| INFORMATION PACKET 1 | INFORMATION PACKET 2 | INFORMATION PACKET 3 |
|---|---|---|

FIG.7A

| INFORMATION PACKET 1 | INFORMATION PACKET 2 | INFORMATION PACKET 3 | DUMMY PACKET 1 | DUMMY PACKET 2 |
|---|---|---|---|---|

FIG.7B

CHECK POLYNOMIAL #1

$$(D^2+D^1+1)X(D)+(D^2+D^1+1)P(D)=0$$

H1 = 11 11 11

CHECK POLYNOMIAL #2

$$(D^5-D^1+1)X(D)+(D^5+D^1-1)P(D)=0$$

H2 = [1]1 [0]0 [0]0 [0]0 [1]1 [1]1

CHECK POLYNOMIAL #3

$$(D^4+D^2+1)X(D)+(D^4+D^2+1)P(D)=0$$

H3 = 11 00 11 00 11

H =
```
11 11 11
11 00 00 00 11 11
11 00 11 00 11
        11 11 11
        11 00 00 00 11 11
        11 00 11 00 11
              11 11 11
              11 00 00 00 11 11
              11 00 11 00 11
```
CHECK POLYNOMIAL #1
CHECK POLYNOMIAL #2
CHECK POLYNOMIAL #3
CHECK POLYNOMIAL #1
CHECK POLYNOMIAL #2
CHECK POLYNOMIAL #3
CHECK POLYNOMIAL #1
CHECK POLYNOMIAL #2
CHECK POLYNOMIAL #3

FIG.11

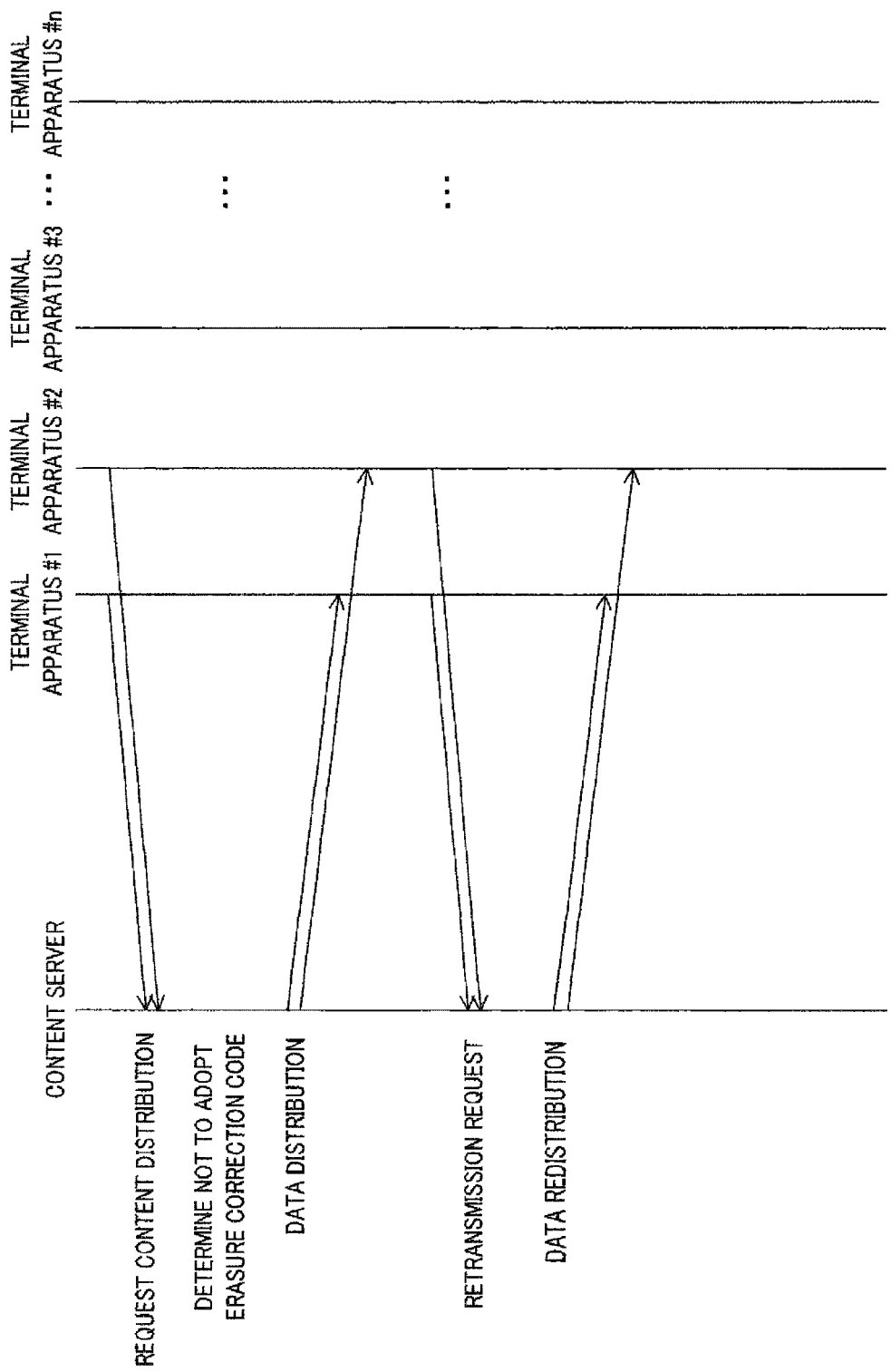

$$H = \begin{matrix} 00000000 & H1 & 11000000000000000000000000000000\\ 00000000000 & H2 & 11000000000000000000000000000000\\ 0000000000000 & H3 & 11000000000000000000000000000000\\ 0000000000000000 & H4 & 11000000000000000000000000000000\\ 000000000000000000 & \cdot & 11000000000000000000000000000000\\ 00000000000000000000 & \cdot & 11000000000000000000000000000000\\ 0000000000000000000000 & Hm & 11000000000000000000000000000000\\ 00000000000000000000000000 & H1 & 11000000000000000000000000000000\\ 0000000000000000000000000000 & H2 & 11000000000000000000000000000000\\ 000000000000000000000000000000 & H3 & 11000000000000000000000000000000\\ 0000000000000000000000000000000000 & H4 & 11000000000000000000000000000000\\ 000000000000000000000000000000000000 & \cdot & 11000000000000000000000000000000\\ 00000000000000000000000000000000000000 & \cdot & 11000000000000000000000000000000\\ 0000000000000000000000000000000000000000 & Hm & 11000000000000000000000000000000\\ 000000000000000000000000000000000000000000 & H1 & 11000000000000000000000000000000\\ 00000000000000000000000000000000000000000000 & H2 & 11000000000000000000000000000000\\ 0000000000000000000000000000000000000000000000 & H3 & 11000000000000000000000000000000\\ 000000000000000000000000000000000000000000000000 & H4 & 11000000000000000000000000000000\\ 00000000000000000000000000000000000000000000000000 & \cdot & 11000000000000000000000000000000\\ 0000000000000000000000000000000000000000000000000000 & \cdot & 11000000000000000000000000000000\\ 000000000000000000000000000000000000000000000000000000 & Hm & 11000000000000000000000000000000 \end{matrix}$$

FIG. 25

GENERATOR POLYNOMIAL $\quad G = \begin{bmatrix} 1 & (D^2+1)/(D^2+D+1) \end{bmatrix}$ PARITY CHECK POLYNOMIAL $\quad (D^2+1)X(D) + (D^2+D+1)P(D) = 0$

PARITY CHECK MATRIX $H =$

```
110000000000000000000000000000...
011000000000000000000000000000...
110110000000000000000000000000...
001101100000000000000000000000...
000011011000000000000000000000...
000000110110000000000000000000...
000000001101100000000000000000...
000000000011011000000000000000...
000000000000110110000000000000...
................................
```

TRANSMISSION SEQUENCE $wi = (xi, pi)$

TRANSMISSION VECTOR $w = (x_1, p_1, x_2, p_2, x_3, p_3, x_4, p_4, x_5, p_5, \cdots, x_i, p_i, \cdots)$ $Hw = 0$

WHEN INFORMATION SIZE OF ERASURE CORRECTION CODE IS 16384 BITS

| | EXAMPLE 1 USABLE CODING RATE | EXAMPLE 2 USABLE CODING RATE | EXAMPLE 3 USABLE CODING RATE |
|---|---|---|---|
| WHEN PACKET SIZE IS 64 BYTES | R=5/6 | R=1/2, 2/3, 3/4, 4/5, 5/6 | R=3/4, 4/5, 5/6 |
| WHEN PACKET SIZE IS 256 BYTES | R=2/3, 3/4, 4/5 | R=1/2, 2/3, 3/4, 4/5 | R=1/2, 2/3, 3/4, 4/5 |
| WHEN PACKET SIZE IS 1024 BYTES | R=1/2 | R=1/2 | R=1/2 |

FIG.41

WHEN CODING RATE OF ERASURE CORRECTION CODE R=2/3

| | EXAMPLE 1 USABLE BLOCK SIZE | EXAMPLE 2 USABLE BLOCK SIZE | EXAMPLE 3 USABLE BLOCK SIZE |
|---|---|---|---|
| WHEN PACKET SIZE IS 64 BYTES | 6144 BITS | 6144 BITS, 24576 BITS, 49152 BITS | 6144 BITS, 24576 BITS |
| WHEN PACKET SIZE IS 256 BYTES | 24576 BITS | 24576 BITS, 49152 BITS | 24576 BITS, 49152 BITS |
| WHEN PACKET SIZE IS 1024 BYTES | 49152 BITS | 49152 BITS | 49152 BITS |

FIG.45

FIG.49

LOSS CORRECTION ENCODING DEVICE AND LOSS CORRECTION ENCODING METHOD

TECHNICAL FIELD

The present invention relates to an erasure correction coding apparatus and erasure correction coding method that perform erasure correction using, for example, a low-density parity-check convolutional code (LDPC-CC).

BACKGROUND ART

In applications such as moving image streaming, in a case where an intolerably large number of packets are erased in an application level, an error correction code is used to secure quality. For example, Patent Literature 1 discloses creating redundant packets using a Reed-Solomon code for a plurality of information packets, adding these redundant packets to the information packets and transmitting these packets. By this means, even in a case where packets are erased, it is possible to decode erased packets if these packets are within a range of error correction capability of a Reed-Solomon code.

However, in a case where the number of packets erased exceeds the correction performance of a Reed-Solomon code or where packets are sequentially erased over a relatively long period due to fading in a radio communication path and burst erasure is caused, a case is possible where erasure correction is not performed effectively. In a case of using a Reed-Solomon code, although it is possible to improve correction performance by increasing the block length of a Reed-Solomon code, there is a problem that the amount of calculations in encoding and decoding processing and the circuit scale increase.

Regarding such a problem, attention has been attracted to a low-density parity-check (LDPC) code as an error correction code for packet erasure. An LDPC code refers to a code defined by a very sparse parity check matrix, and enables encoding and decoding processing with feasible time and calculation cost even in a case where a codebook length is the order of several to tens of thousands.

FIG. 1 is a conceptual diagram showing a communication system utilizing LDPC code erasure correction coding. In FIG. 1, the communication apparatus on the encoding side performs LDPC coding on information packets 1 to 4 to transmit, and generates parity packets a and b. A higher layer processing section outputs coding packets found by adding parity packets to information packets, to a lower layer (physical layer in the example of FIG. 1), and a physical layer processing section in the lower layer converts the coding packets in a form that can be transmitted in the communication channel, and outputs the result to the communication channel. FIG. 1 shows an example case where the communication channel is a radio communication channel.

The communication apparatus on the decoding side performs reception processing in a physical layer processing section in the lower layer. At this time, presume that bit error occurs in the lower layer. Due to this bit error, a case is possible where packets including corresponding bits are not decoded correctly in the higher layer and where a packet is erased. In the example of FIG. 1, a case is shown where information packet 3 is erased. A higher layer processing section decodes erased information packet 3 by applying LDPC decoding processing to a received packet sequence. As LDPC decoding, for example, a sum-product algorithm utilizing belief propagation (BP) (see Non-Patent Literature 1) is used.

A low-density parity-check block (hereinafter "LDPC-BC") code is a block code (e.g. see Non-Patent Literature 1 and Non-Patent Literature 2) and has a very higher flexibility in a code configuration than a Reed-Solomon code, and can support various code lengths and coding rates by using different parity check matrixes. However, a system supporting a plurality of coding lengths and coding rates needs to hold a plurality of parity check matrixes.

In contrast to this kind of LDPC code of block code, LDPC-CC (Low-Density Parity-Check Convolutional Code) allowing encoding and decoding of information sequences of arbitrary length have been investigated (e.g. see Non-Patent Literature 3).

An LDPC-CC is a convolutional code defined by a low-density parity-check matrix. As an example, parity check matrix $H^T[0,n]$ of an LDPC-CC in a coding rate of $R=½$ is shown in FIG. 2. Here, element $h_1^{(m)}(t)$ of $H^T[0,n]$ has a value of 0 or 1. All elements other than $h_1^{(m)}(t)$ are 0. M represents the LDPC-CC memory length, and n represents the length of an LDPC-CC codeword. As shown in FIG. 2, a characteristic of an LDPC-CC parity check matrix is that it is a parallelogram-shaped matrix in which 1 is placed only in diagonal terms of the matrix and neighboring elements, and in which the bottom-left and top-right elements of the matrix are zero.

FIG. 3 shows a configuration example of an encoder of an LDPC-CC defined by parity check matrix $H^T[0,n]$ when $h_1^{(0)}(t)=1$ and $h_2^{(0)}(t)=1$. As shown in FIG. 3, an LDPC-CC encoder is provided with M+1 shift registers and a modulo-2 (exclusive OR) adder. Consequently, a characteristic of an LDPC-CC encoder is that it can be implemented with extremely simple circuitry in comparison with a circuit that performs generator matrix multiplication or an LDPC-BC encoder that performs computation based on backward (forward) substitution. Also, since the encoder shown in FIG. 3 is a convolutional code encoder, it is not necessary to divide an information sequence into fixed-length blocks when encoding, and an information sequence of any length can be encoded.

Citation List

Patent Literature

[PTL 1]
Japanese Patent Application Laid-Open No. HEI8-186570

Non-Patent Literature

[NPL 1]
D. J. C. Mackay, "Good error-correcting codes based on very sparse matrices," IEEE Trans. Inform. Theory, vol. 45, no. 2, pp 399-431, March 1999.
[NPL 2]
R. G. Gallager, "Low-density parity check codes," IRE Trans. Inform. Theory, IT-8, pp-21-28, 1962.
[NPL 3]
A. J. Felstorom, and K. Sh. Zigangirov, "Time-Varying Periodic Convolutional Codes With Low-Density Parity-Check Matrix," IEEE Transactions on Information Theory, Vol. 45, No. 6, pp 2181-2191, September 1999.
[NPL 4]
R. D. Gallager, "Low-Density Parity-Check Codes," Cambridge, Mass.: MIT Press, 1963.
[NPL 5]
M. P. C. Fossorier, M. Mihaljevic, and H. Imai, "Reduced complexity iterative decoding of low density parity check codes based on belief propagation," IEEE Trans. Commun., vol. 47., no. 5, pp. 673-680, May 1999.

[NPL 6]

J. Chen, A. Dholakia, E. Eleftheriou, M. P. C. Fossorier, and X.-Yu Hu, "Reduced-complexity decoding of LDPC codes," IEEE Trans. Commun., vol. 53, no. 8, pp. 1288-1299, August 2005.

SUMMARY OF INVENTION

Technical Problem

However, an encoding apparatus and erasure correction coding method using an LDPC-CC for erasure correction, have not been sufficiently investigated.

It is therefore an object of the present invention to provide an erasure correction coding apparatus and erasure correction coding method for improving the erasure correction capability in erasure correction using an LDPC-CC.

Solution to Problem

The erasure correction coding apparatus of the present invention that is applied to a communication apparatus that performs packet communication, employs a configuration having: an arranging section that arranges information data included in a plurality of information packets according to constraint length Kmax and coding rate (q−1)/q of a parity check polynomial of a low-density parity-check convolutional code; and an encoding section that applies erasure correction coding to arranged information data using the parity check polynomial and generates parity packets.

The erasure correction coding method of the present invention that is applied to packet communication, includes the steps of: arranging information data included in a plurality of information packets according to constraint length Kmax and coding rate (q−1)/q of a parity check polynomial of a low-density parity-check convolutional code; and applying erasure correction coding to arranged information data using the parity check polynomial and generating parity packets includes:

Advantageous Effect of Invention

According to the present invention, it is possible to improve the erasure correction capability in erasure correction using an LDPC-CC.

BRIEF DESCRIPTION OF DRAWINGS

FIG. 2 shows an LDPC-CC parity check matrix;

FIG. 7 shows input or output packets of a dummy data inserting section according to Embodiment 1;

FIG. 11 shows parity check polynomials of an LDPC-CC of a time varying period of 3 and the configuration of parity check matrix H of this LDPC-CC;

FIG. 23 is a diagram showing sequences between a content server and terminal apparatuses #1 to #n;

FIG. 25 shows an example of the configuration of an LDPC-CC parity check matrix of a time varying period of 4;

FIG. 27 shows a parity check matrix of a (7, 5) convolutional code;

FIG. 28 shows an example of the configuration of parity check matrix H about an LDPC-CC of a coding rate of ⅔ and a time varying period of 2;

FIG. 29 shows an example of the configuration of an LDPC-CC parity check matrix of a coding rate of ⅔ and a time varying period of m;

FIG. 41 shows an example of relationships between packet sizes and usable coding rates for an erasure correction code;

FIG. 45 shows an example of relationships between packet sizes and usable block sizes;

FIG. 49 is a drawing for explaining a packet generating method (for a packet size of 64 bits), according to Embodiment 5 of the present invention;

DESCRIPTION OF EMBODIMENTS

Now, embodiments of the present invention will be described in detail with reference to the accompanying drawings.

Embodiment 1

Figure 1:
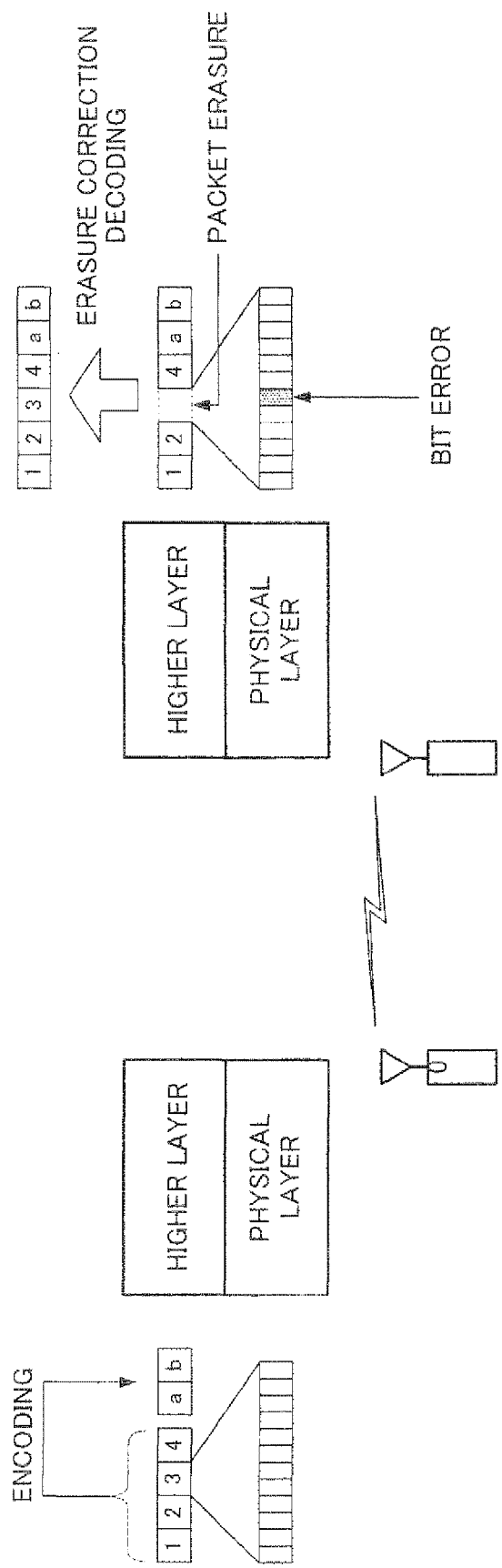
FIG. 1 is a conceptual diagram showing a communication system utilizing LDPC-CC code erasure correction coding.
Figure 3:
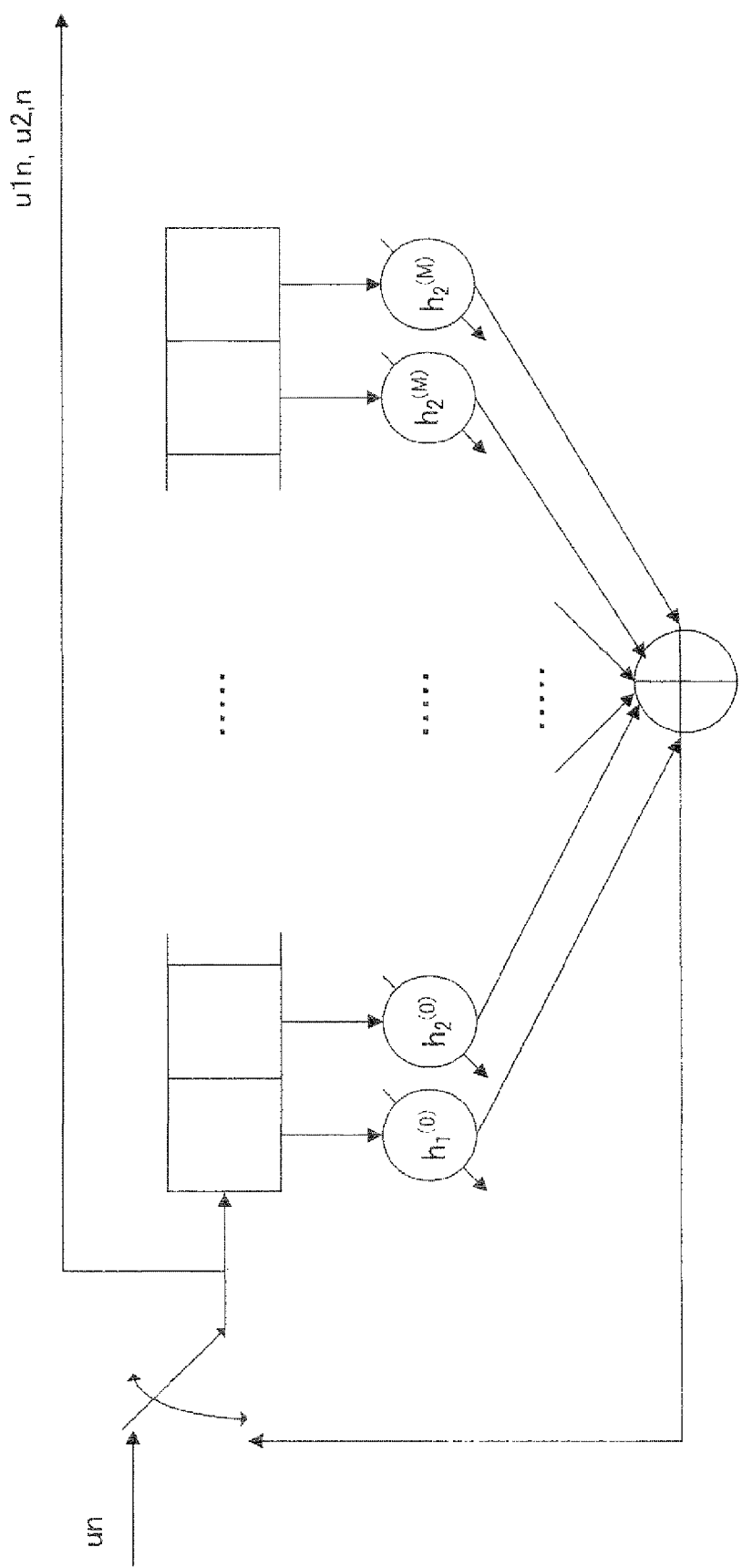
FIG. 3 shows a configuration of an LDPC-CC encoder.
Figure 4:
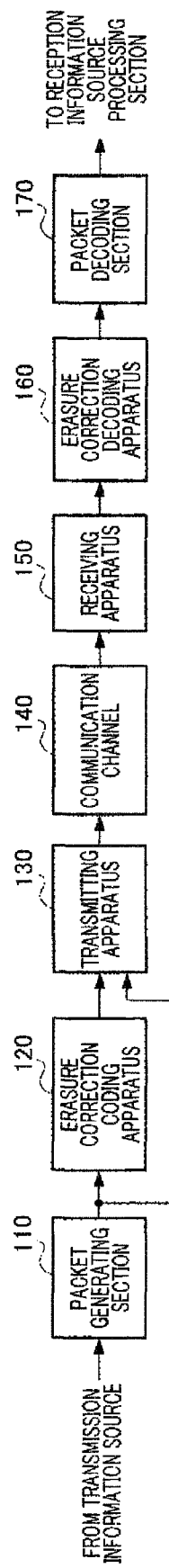
FIG. 4 shows the overall configuration of an encoder according to Embodiment 1 of the present invention.

FIG. 4 shows the overall configuration of a communication system according to Embodiment 1 of the present invention. In FIG. 4, the communication system is provided with packet generating section 110, erasure correction coding apparatus 120, transmitting apparatus 130, communication channel 140, receiving apparatus 150, erasure correction decoding apparatus 160 and packet decoding section 170. In the figure, packet generating section 110, erasure correction coding apparatus 120 and transmitting apparatus 130 correspond to the encoding side, and receiving apparatus 150, erasure correction decoding apparatus 160 and packet decoding section 170 correspond to the decoding side.

Figure 5:
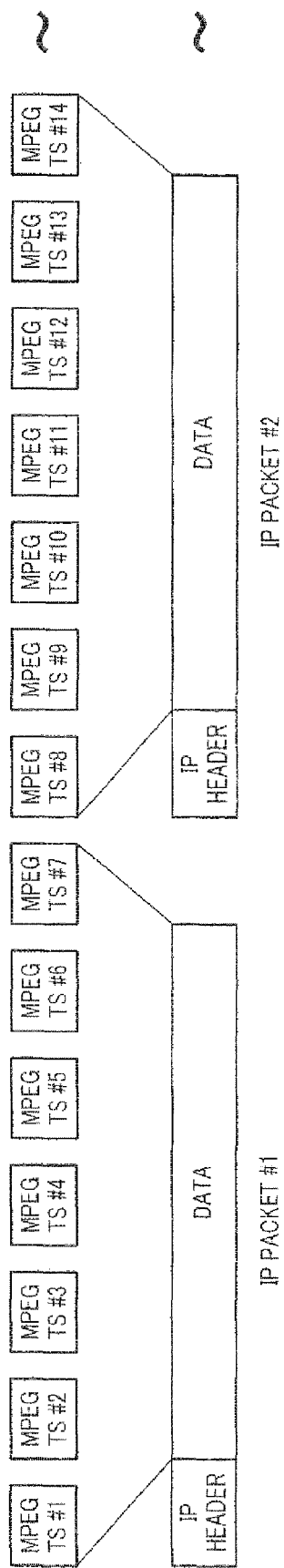
FIG. 5 shows a packet sequence generated from a packet generating section according to Embodiment 1.

Packet generating section 110 converts information data outputted from a transmission information source into information packets by adding a header to the information data. For example, as shown in FIG. 5, in a case where TS's (Transport Streams) of an MPEG (Moving Picture Expert Group) given as information data are converted into IP packets, packet generating section 110 generates an IP packet by grouping seven MPEG-TS's and adding an IP header to the head. Packet generating section 110 outputs the generated information packet to erasure correction coding apparatus 120 and transmitting apparatus 130.

Erasure correction coding apparatus 120 performs erasure correction coding processing on the information packet outputted from packet generating section 110, and generates a parity packet. Erasure correction coding apparatus 120 outputs the generated parity packet to transmitting apparatus 130. Also, the configuration and operations of erasure correction coding apparatus 120 will be described later.

Transmitting apparatus 130 converts the information packet and parity packet outputted from erasure correction coding apparatus 120 into a form that can be transmitted, according to the medium to use as the communication channel, and transmits the result to communication channel 140.

Communication channel 140 represents the route through which a signal transmitted from transmitting apparatus 130 passes before receiving apparatus 150 receives the signal. As a communication channel, it is possible to use an Ethernet (registered trademark), power line, metal cable, optical fiber, radio, light (such as visible light and infrared) or combinations of these.

Receiving apparatus 150 receives a signal reached from transmitting apparatus 130 via communication channel 140, and converts the signal into a form of packets. Receiving apparatus 150 outputs the converted received packets to erasure correction decoding apparatus 160.

If there is a packet (erased packet) erased in the received packets, erasure correction decoding apparatus 160 performs erasure correction using a parity packet added by erasure correction coding apparatus 120 on the encoding side. Erasure correction decoding apparatus 160 extracts only information packets from the received packets subjected to erasure correction, and outputs the extracted information packets to packet decoding section 170. In contrast, if there is no erased packet in the received packets, erasure correction is not performed, and only information packets of the received packets are outputted to packet decoding section 170. The configuration and operations of erasure correction decoding apparatus 160 will be described later.

Packet decoding section 170 converts packetized information data into a form that can be decoded by a received information source processing section (not shown), and outputs the result to received information source processing section. In the example of FIG. 5, seven MPEG-TS's are extracted from IP packet data and outputted to the received information source processing section.

Figure 6:
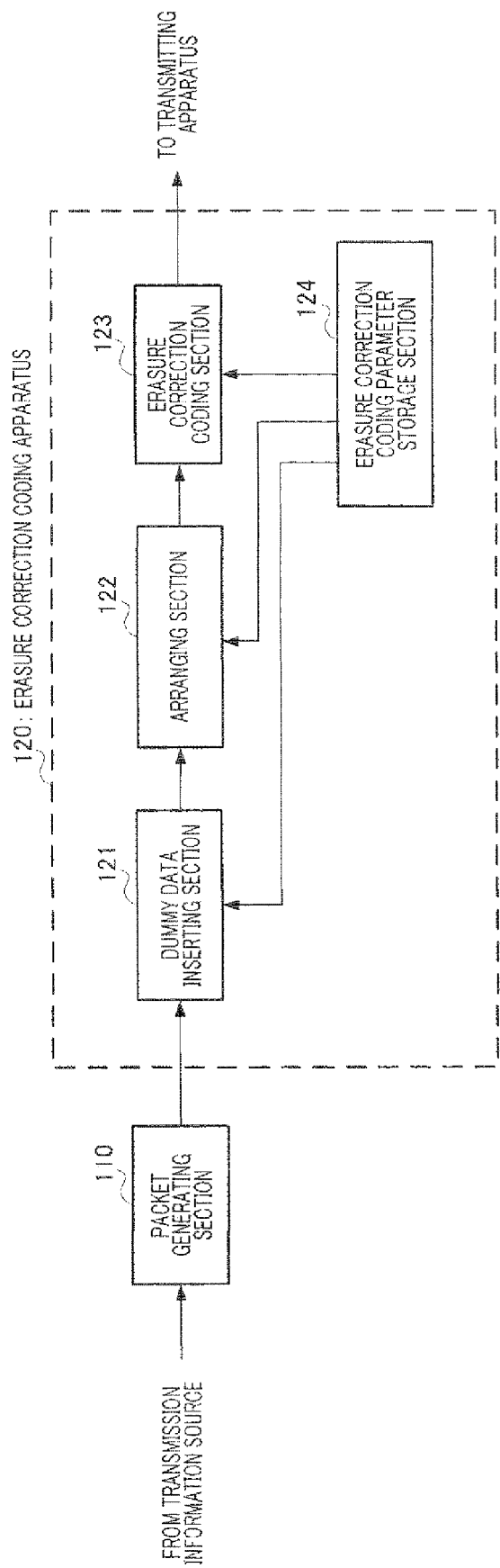
FIG. 6 is a block diagram showing the main configuration of an erasure correction coding apparatus according to Embodiment 1.

FIG. 6 is a block diagram showing the main configuration of an erasure correction coding apparatus 120 according to Embodiment 1 of the present invention. In the present embodiment, erasure correction coding apparatus 120 uses an LDPC-CC (Low-Density Parity-Check Convolutional Code) as an erasure correction code. Also, an LDPC-CC having good erasure correction capability will be described later.

Erasure correction coding apparatus 120 is provided with dummy data inserting section 121, arranging section 122, erasure correction coding section 123 and erasure correction coding parameter storage section 124.

Erasure correction coding parameter storage section 124 stores LDPC-CC parameters to use in erasure correction coding. To be more specific, as LDPC-CC parameters, erasure correction coding parameter storage section 124 stores, for example, an LDPC-CC parity check polynomial, number of LDPC-CC coding processing unit packets n and information about constraint length Kmax and coding rate $(q-1)/q$ of an LDPC-CC parity check polynomial. Erasure correction coding parameter storage section 124 outputs number of coding processing unit packets n to dummy data inserting section 121, outputs information about constraint length Kmax and coding rate $(q-1)/q$ of an LDPC-CC to arranging section 122, and outputs an LDPC-CC parity check polynomial to erasure correction coding section 123. Here, the definition of Kmax will be described later in detail.

Dummy data inserting section 121 compares the number of information packets outputted from packet generating section 110 and number of coding processing unit packets n in erasure correction coding section 123, and, if the number of information packets equals number of coding processing unit packets n, outputs the information packets as is to arranging section 122. In contrast, if the number of packets is less than n, dummy data inserting section 121 generates n packets by adding dummy packets known between the encoding side and the decoding side, to the information packets, and outputs n packets to which the dummy packets have been added, to arranging section 122 as information packets.

FIG. 7 shows an input or output packet sequence in dummy data inserting section 121. In a case where number of coding processing unit packets n is 5 in erasure correction coding section 123, if three information packets are received as input from packet generating section 110 to dummy data inserting section 121 (see FIG. 7A), dummy data inserting section 121 adds two dummy packets to the end part of the three information packets outputted from packet generating section 110 (see FIG. 7B).

Arranging section 122 arranges information data included in n information packets, according to constraint length Kmax and coding rate $(q-1)/q$ of a parity check polynomial of the erasure correction code used in erasure correction coding section 123. To be more specific, arranging section 122 performs arrangement such that $Kmax \times (q-1)$ consecutive items of information data arranged are formed with information data included in different information packets.

Figure 8:
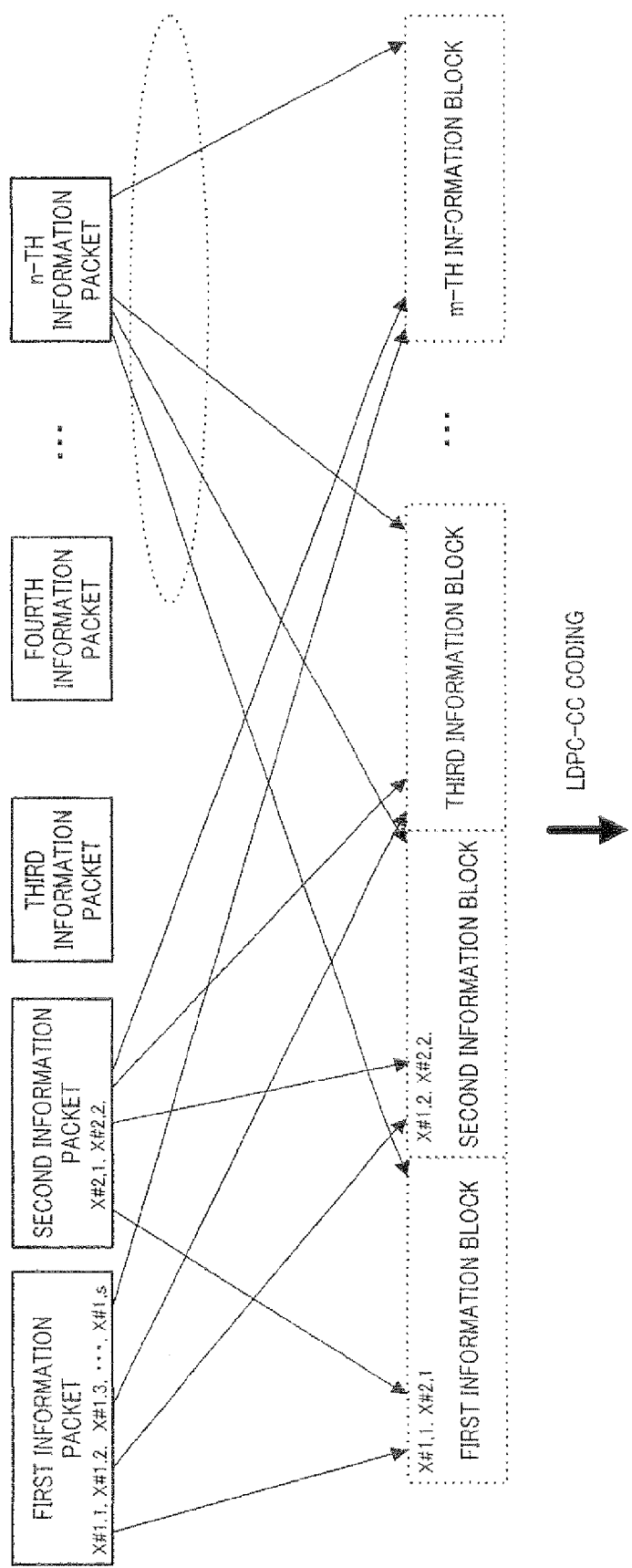
FIG. 8 is a drawing for explaining an arranging section and arrangement processing according to Embodiment 1.

Arrangement processing in arranging section 122 will be explained below using FIG. 8. In FIG. 8, first to n-th information packets refer to information packets outputted from dummy data inserting section 121. The k-th information packet (k=1, n) includes s items of information data of x#k,1, x#k,2, x#k,3, x#k,s−1 and x#k,s. Also, an example case will be explained with the present embodiment where the relationship of m=s holds true.

First, arranging section 122 sorts information data included in each information packet into a plurality of information blocks. For example, as shown in FIG. 8, among data x#1,1, x#1,2, x#1,3, . . . , x#1,s−1 and s#1,s included in the first information packet, arranging section 122 sorts data x#1,1 into the first information block, data x#1,2 into a second information block, data x#1,3 into a third information block, . . . , and data x#1,s into an m-th information block.

Thus, arranging section 122 sorts each information data included in each information packet into a plurality of information blocks. As a result, the first information block is designed to include information data of a plurality of information packets, x#1,1, x#2,1, x#3,1, . . . , x#n−1,1 and x#n,1.

At this time, from n information packets satisfying equation 1, arranging section 122 sorts each information data into a plurality of information blocks. By doing so, in each information block, $Kmax \times (q-1)$ consecutive items of information data are formed with information data included in different information packets. Arranging section 122 arranges sorted information data in each information block.

[1]

$$Kmax \times (q-1) \leq n \quad \text{(Equation 1)}$$

Thus, arranging section 122 sorts each information data included in n information packets satisfying equation 1, into m information blocks, and outputs first to m-th information blocks to erasure correction coding section 123.

Erasure correction coding section 123 applies erasure correction coding to the first to m-th information blocks, based on LDPC-CC parameters held in erasure correction coding parameter storage section 124.

Figure 9:
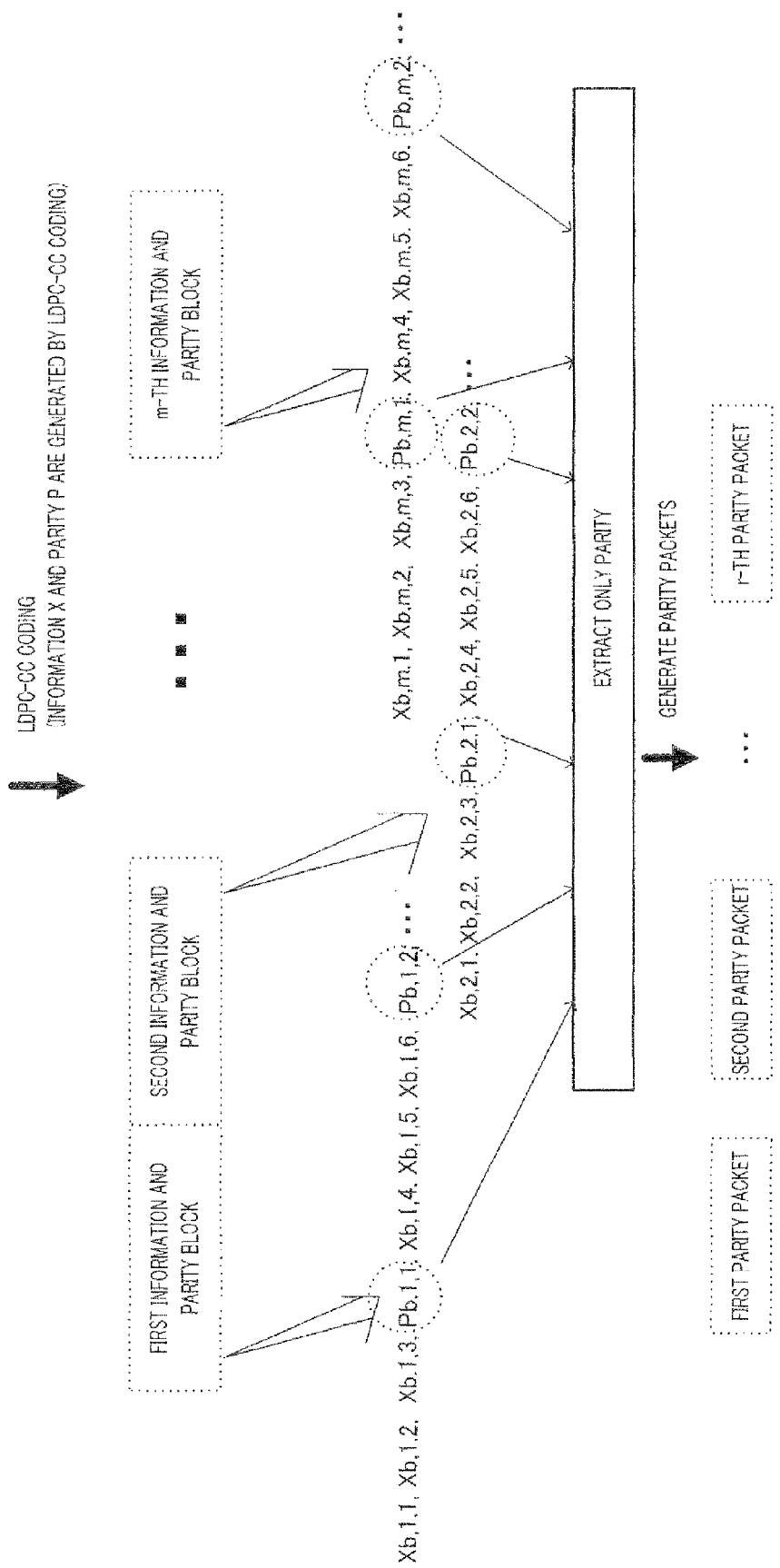
FIG. 9 is a drawing for explaining erasure correction coding processing in an erasure correction coding section according to Embodiment 1.

Erasure correction coding processing in erasure correction coding section 123 will be explained below using FIG. 9. FIG. 9 shows a state where parity data is generated by applying erasure correction coding to arranged information data outputted from arranging section 122 (i.e. first to m-th information blocks in FIG. 8).

In FIG. 9, an i-th information and parity block (i=1, . . . , m) represents a block including information data and parity data generated by applying erasure correction coding to an i-th information block of FIG. 8 in erasure correction coding section 123. Here, FIG. 9 shows an example case where erasure correction coding section 123 applies erasure correction coding of a coding rate of ¾.

As shown in FIG. 9, in an i-th information and parity block (i=1, . . . , m), if the information is represented by "Xb" and the parity is represented by "Pb," the data of the i-th information and parity block includes Xb,i,1, Xb,i,2, Xb,i,3, Xb,i,4, Xb,i,5, Xb,i,6, . . . , and parity data Pb,i,1, Pb,i,2, and so on. In a case where the coding rate is ¾, at point in time k, parity for Xb,i,3(k−1)+1, Xb,i,3(k−1)+2 and Xb,i,3(k−1)+3 is Pi,k. Here, in Xb,i,t and Pb,i,t, "i" represents the information and parity block number, and "t" represents the order of each data X and parity data P in the i-th information and parity block.

Erasure correction coding section 123 extracts only parity data from generated information data and parity data, paketizes extracted parity data and generates parity packets.

Also, in the example of FIG. 9, erasure correction coding section 123 generates m information and parity blocks from n information packets, and generates r parity packets from the m information and parity blocks. Erasure correction coding section 123 outputs the r generated parity packets (first to r-th parity packets) to transmitting apparatus 130.

Transmitting apparatus 130 transmits first to n-th information packets and first to r-th parity packets to receiving apparatus 150 via communication channel 140. Receiving apparatus 150 outputs received packets to erasure correction decoding apparatus 160.

Figure 10:
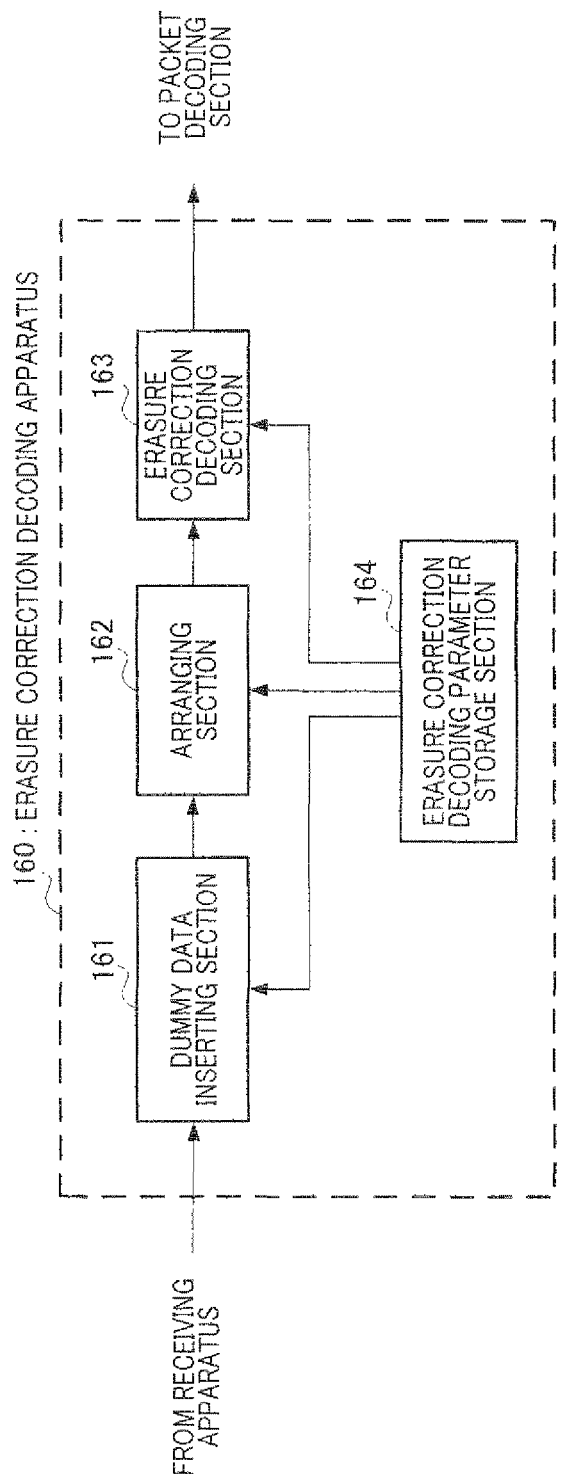
FIG. 10 is a block diagram showing the main configuration of an erasure correction decoding apparatus according to Embodiment 1.

FIG. 10 is a block diagram showing the main configuration of erasure correction decoding apparatus 160 according to Embodiment 1 of the present invention. Erasure correction decoding apparatus 160 is mainly provided with dummy data inserting section 161, arranging section 162, erasure correction decoding section 163 and erasure correction decoding parameter storage section 164.

Erasure correction decoding parameter storage section 164 stores LDPC-CC parameters to use in erasure correction decoding. As LDPC-CC parameters, erasure correction decoding parameter storage section 164 stores, for example, an LDPC-CC parity check polynomial, number of LDPC-CC coding processing unit packets n, and information about constraint length Kmax and coding rate (q−1)/q of an LDPC-CC parity check polynomial. Erasure correction decoding parameter storage section 164 outputs number of coding processing unit packets n to dummy data inserting section 161, outputs information about constraint length Kmax and coding rate (q−1)/q of an LDPC-CC to arranging section 162, and outputs an LDPC-CC parity check polynomial to erasure correction decoding section 163.

If there is an erased packet in a received packet sequence and the erased packet is a dummy packet, dummy data inserting section 161 inserts a dummy packet in the position of the erased packet and outputs a packet sequence in which the dummy packet has been inserted, to arranging section 162. Also, if the erased packet is not a dummy packet, dummy data inserting section 161 outputs information about the received packet sequence and the position of the erased packet, to arranging section 162.

Arranging section 162 arranges the information data and parity data included in n+r received packets, according to constraint length Kmax and coding rate (q−1)/q of a parity check polynomial of the erasure correction code. To be more specific, in opposite process to erasure correction coding section 123, similar to FIG. 9, arranging section 162 generates m information and parity blocks from n+r received packets. Arranging section 162 outputs the m information and parity blocks (first to m-th information and parity blocks) to erasure correction decoding section 163.

Erasure correction decoding section 163 applies erasure correction to the first to m-th information and parity blocks by a BP (Belief Propagation) algorithm, based on parity check matrix H held in erasure correction decoding parameter storage section 164, and acquires information data and parity data. Further, erasure correction decoding section 163 extracts only information data from the decoding result, acquires information packets by paketizing the extracted information data, and outputs the acquired information packets to packet decoding section 170.

As described above, with the present embodiment, arranging section 122 arranges information data included in n information packets satisfying equation 1, according to constraint length Kmax and coding rate (q−1)/q of a parity check polynomial of the erasure correction code. Here, if constraint length Kmax and coding rate (q−1)/q of a parity check polynomial of the erasure correction code and the number of information packets, n, satisfy equation 1, it is possible to provide good decoding characteristics.

The reason will be explained below. Here, an example case will be explained where erasure correction coding section 123 performs erasure correction using an LDPC-CC of a time varying period of g and a coding rate of (q−1)/q. In an LDPC-CC of a time varying period of g and a coding rate of (q−1)/q, a case will be considered in which parity check polynomials are represented as shown in equation 2.

[2]

$$(D^{a^{\#k,1,1}}+D^{a^{\#k,1,2}}+\ldots+D^{a^{\#k,1,L1k}}+1)X_1(D)+(D^{a^{\#k,2,1}}+D^{a^{\#k,2,2}}+\ldots+D^{a^{\#k,2,L2k}}+1)X_2(D)+\ldots$$
$$+(D^{a^{\#k,q-1,1}}D^{a^{\#k,q-1,2}}+\ldots+D^{a^{\#k,q-1,Lq-1k}}+1)X_{q-1}(D)+(D^{b^{\#k,1}}+D^{b^{\#k,2}}+\ldots D^{b^{\#k,Lk}}+1)P(D)=0 \quad \text{(Equation 2)}$$

In equation 2, D is a delay operator. Also, $a_{x,y,z}$ and $b_{x,z}$ each represent an order in the parity check polynomials of equation 2. Also, the time varying period is g, and therefore k=1, 2, . . . , g.

(Definition of Kmax)

Here, in g parity check polynomials expressed in the check polynomial of equation 2, the maximum value (the maximum order) is $a_{max}$ in all $a_{\#x,y,z}$. The relationship of Kmax=$a_{max}$+1 holds true between maximum order $a_{max}$ and constraint length Kmax in the check polynomials of equation 2.

For example, for an LDPC-CC of a time varying period of 3 defined by equations 3-1 to 3-3, maximum order $a_{max}$ is 5 from equation 3-2, and therefore constraint length Kmax is 6.

[3]

$$(D^2+D^1+1)X(D)+(D^2+D^1+1)P(D)=0 \quad \text{(Equation 3-1)}$$

$$(D^5+D^1+1)X(D)+(D^5+D^1+1)P(D)=0 \quad \text{(Equation 3-2)}$$

$$(D^4+D^2+1)X(D)+(D^4+D^2+1)P(D)=0 \quad \text{(Equation 3-3)}$$

FIG. 11 shows LDPC-CC parity check matrix H of a time varying period of 3 and a coding rate of ½, defined by equations 3-1 to 3-3. As shown in FIG. 11, LDPC-CC parity check matrix H of a time varying period of 3 is defined by first sub-matrix H1 of parity check polynomial #1 represented by equation 3-1, second sub-matrix H2 of parity check polynomial #2 represented by equation 3-2 and third sub-matrix H3 of parity check polynomial #3 represented by equation 3-3. To be more specific, in parity check matrix H, first sub-matrix H1, second sub-matrix H2 and third sub-matrix H3 are arranged in the row direction in order. When the coding rate is ½, a configuration is employed in which a sub-matrix is shifted two columns to the right between an i-th row and an (i+1)-th row, as shown in FIG. 11.

Here, see parity check polynomial #2 represented by equation 3-2 including maximum order $a_{max}$. In second sub-matrix H2="110000001111" of parity check polynomial #2, parity check matrix elements related to information data are "100011." In FIG. 11, elements inside squares refer to parity check matrix elements related to information data. Here, the number of parity check matrix elements related to information data is Kmax×(q−1) (=6×(2−1)).

With the present embodiment, Kmax×(q−1) items of information data corresponding to parity check matrix elements related to information data are designed to be information data included in different information packets. Therefore, arranging section 122 selects information data on a bit-by-bit basis, from Kmax×(q−1) information packets among n information packets satisfying equation 1, and arranges the results in order.

For example, in a case of using parity check matrix H defined by the parity check polynomials of equations 3-1 to 3-3, Kmax=6 and q=2. Consequently, if these values are substituted into equation 1, Kmax×(q−1)=6×(2−1)=6≦n. Therefore, in this case, arranging section 122 selects information data on a bit-by-bit basis from six or more information packets and arranges the results in order such that six consecutive items of information data are formed with information data included in different information packets.

By this means, arranging section 122 arranges each information data such that Kmax×(q−1) consecutive items of information data are formed with information data included in different information packets, so that erasure correction coding section 123 in a subsequent stage generates parity data from information data of different information packets.

Now, assume that one of received packets is erased in communication channel 140. For example, consider a case where a second information packet is erased.

Figure 12:
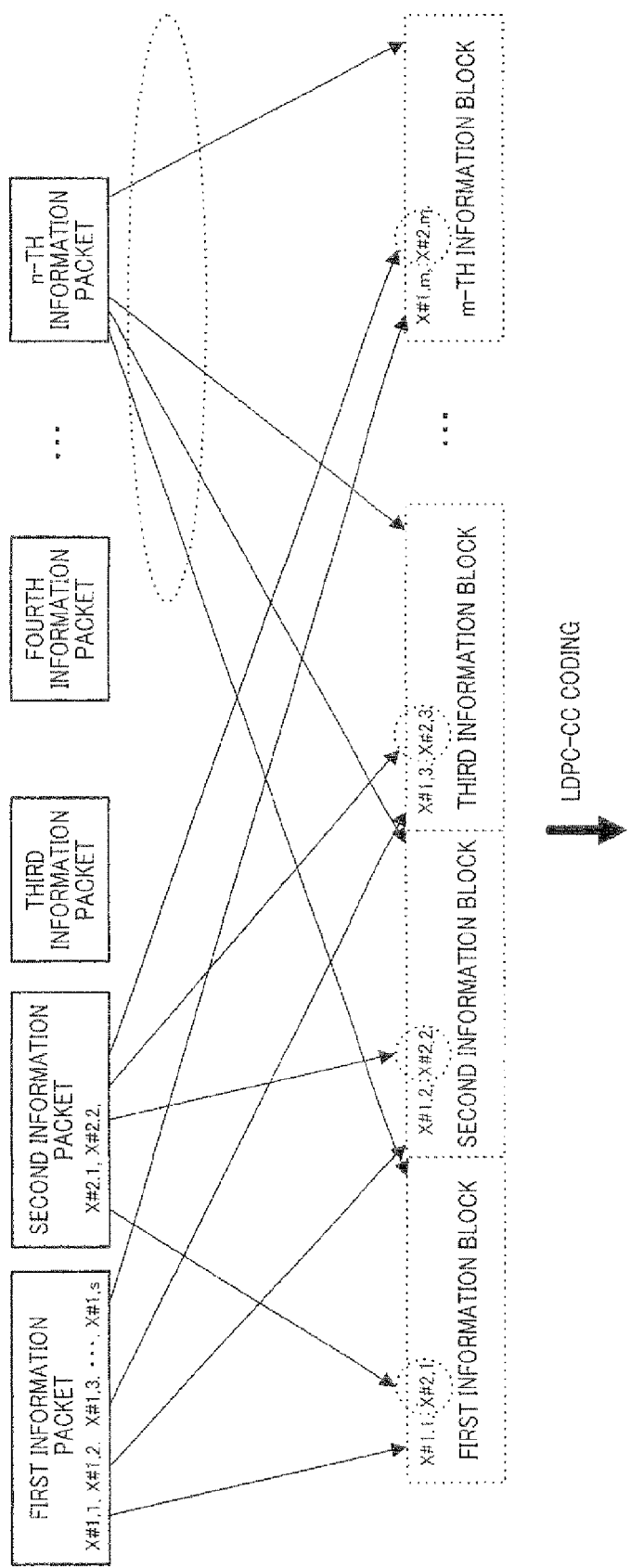
FIG. 12 is a drawing for explaining an arranging section and arrangement processing according to Embodiment 1.

FIG. 12 shows a state where a second information packet is erased in communication channel 140 among first to n-th information packets and first to r-th parity packets. If the second information packet is erased, s items of information data x#2,1, x#2,2, x#2,3, . . . , x#2,s−1 and x#2,s included in the second information packet are erased. In FIG. 12, data in the dotted circle represents the erased information data.

As described above, arranging section 162 of erasure correction decoding apparatus 160 arranges information data and parity data included in n received packets, according to constraint length Kmax and coding rate (q−1)/q of a parity check polynomial of the erasure correction code, and generates m items of information and parity blocks.

Figure 13:
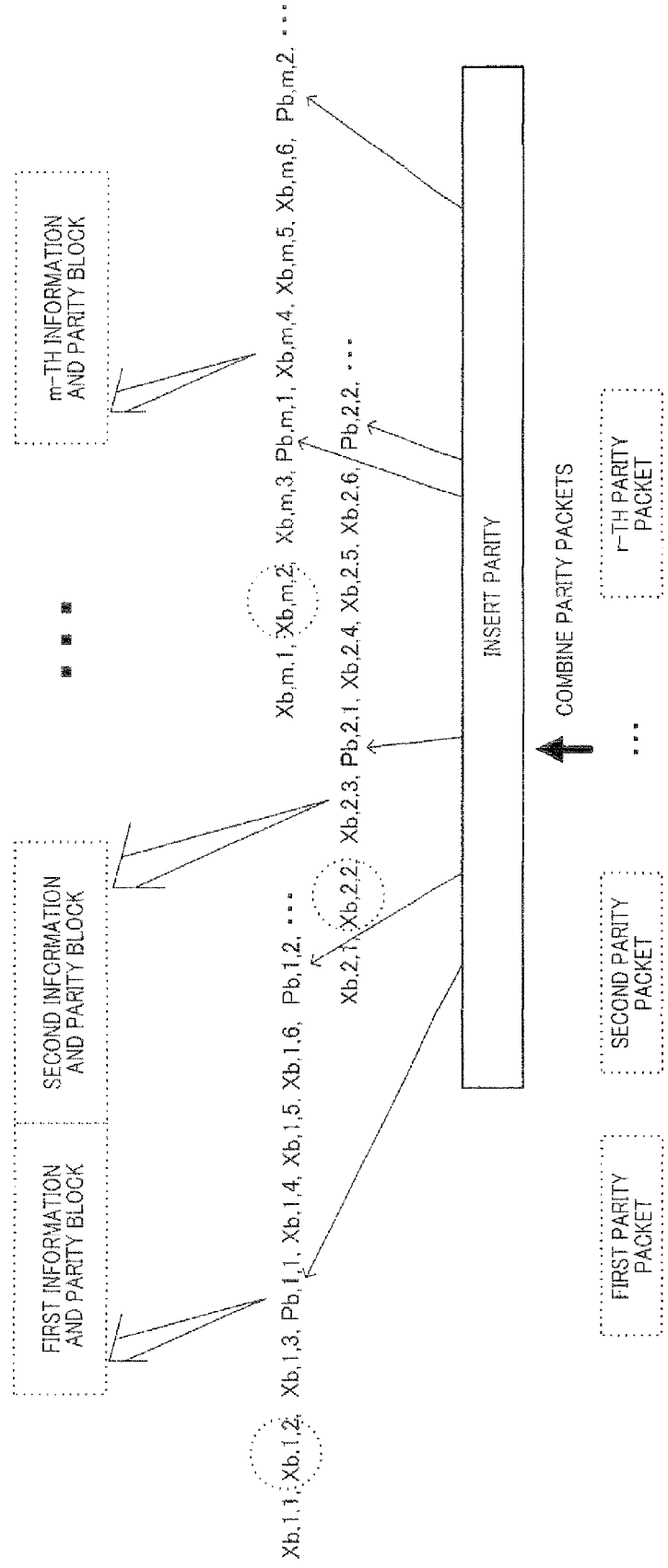
FIG. 13 is a drawing for explaining erasure correction coding processing in an erasure correction decoding section according to Embodiment 1.

FIG. 13 shows m information and parity blocks generated in arranging section 162. As is known from FIG. 13, if a second information packet is erased, each information data included in the erased packet is sorted in information and parity blocks in a distributed manner. To be more specific, referring to information X without parity, the width in which "1" is present in each row of a parity check matrix, is maximum Kmax×(q−1). Therefore, even if the erasure shown in FIG. 12 occurs, it is possible to reliably perform decoding as long as information of all different packets is provided in this maximum Kmax×(q−1). This is because, although there are a plurality of positions in which "1" is present in each row, there is only one position for an erased bit in each row, so that it is possible to reliably perform decoding with the BP decoding algorithm.

As described above, according to the present embodiment, parity packets are generated by arranging information data included in n information packets satisfying equation 1, according to constraint length Kmax and coding rate (q−1)/q of a parity check polynomial of the erasure correction code, and by applying erasure correction coding to the arranged information data. By this means, even in a case where a packet is erased in a communication channel, each information data included in the erased packet is distributed into Kmax×(q−1) consecutive data sequences for which belief propagation is reliably performed, so that it is possible to reliably propagate belief by erasure correction decoding using the BP decoding algorithm and improve erasure correction capability.

Also, although a case has been described with the above explanation where the number of information packets outputted from packet generating section 110 equals number of coding processing unit packets n in erasure correction coding section 123, the present invention is equally applicable to a case where the number of information packets is less than number of coding processing unit packets n. A case will be explained below with FIG. 4, where the number of packets outputted from packet generating section 110 is less than number of coding processing unit packets n in erasure correction coding section 123.

Figure 14:
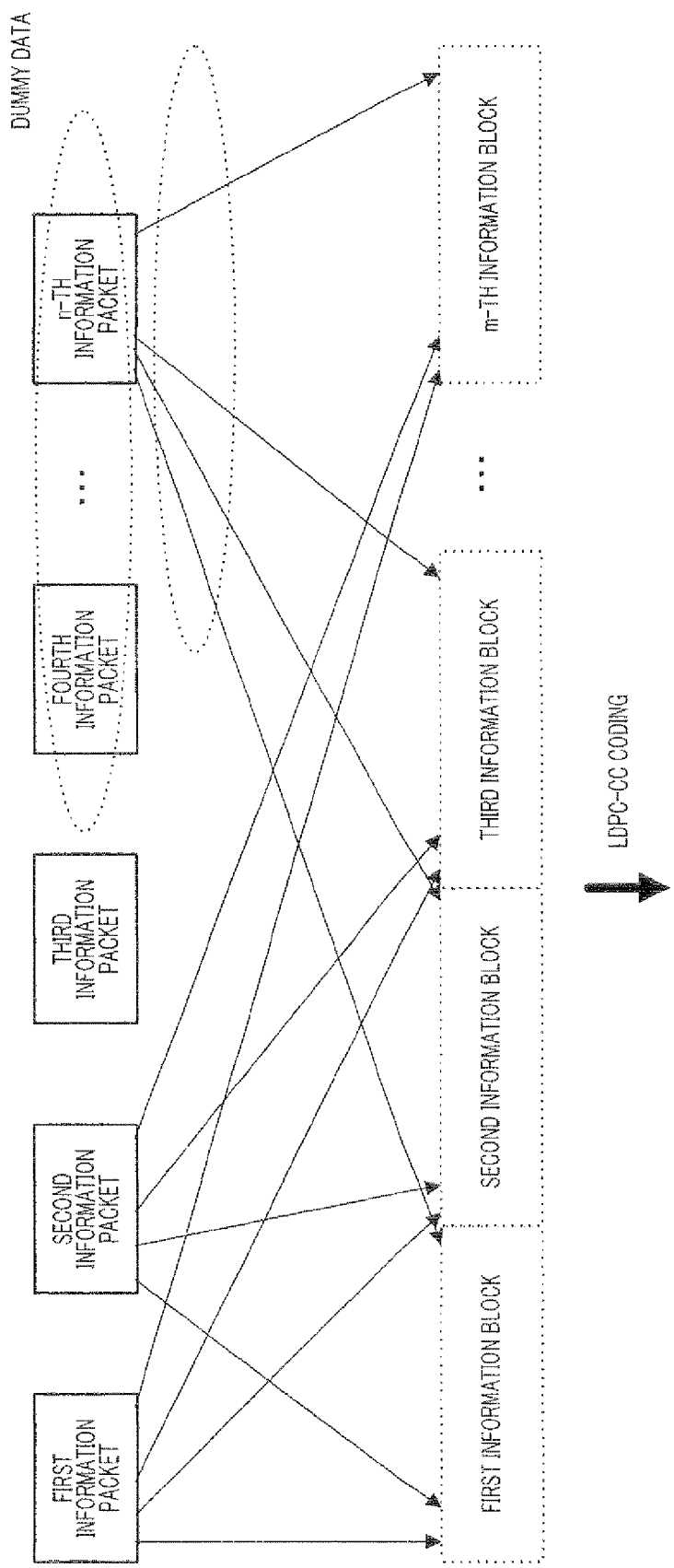
FIG. 14 is a drawing for explaining arrangement processing in a case where the number of information packets is less than number of coding processing unit packets n in an erasure correction coding section.

As shown in FIG. 14, in a case where information data is comprised of only three information packets (first to third information packets), dummy data inserting section 121 inserts dummy data (of, all 0's, for example) as fourth to n-th information packets and outputs n packets in which dummy data has been inserted, to arranging section 122.

In the same way as in a case where the number of information packets outputted from packet generating section 110 equals number of coding processing unit packets n in erasure correction coding section 123, arranging section 122 arranges information data included in n information packets according to constraint length Kmax and coding rate (q−1)/q of a parity check polynomial of the erasure correction code used in erasure correction coding section 123.

In the same way as in a case where the number of information packets outputted from packet generating section 110 equals number of coding processing unit packets n in erasure correction coding section 123, erasure correction coding section 123 applies erasure correction coding to m information blocks, extracts found parity and generates r parity packets from the extracted parity. Erasure correction coding section 123 outputs r parity packets to transmitting apparatus 130.

Transmitting apparatus 130 transmits only three information packets and r parity packets to communication channel 140 and does not transmit the dummy packets inserted by dummy data inserting section 121 to communication channel 140.

Thus, in a case where the number of information packets outputted from packet generating section 110 equals number of coding processing unit packets n in erasure correction coding section 123, erasure correction coding apparatus 120 generates parity packets by applying erasure correction coding to n packets in which dummy packets have been inserted. However, transmitting apparatus 130 transmits only three information packets and r parity packets to communication channel 140 and does not transmit the dummy packets inserted by dummy data inserting section 121 to communication channel 140, so that it is possible to prevent degradation in throughput.

Embodiment 2

In Embodiment 1, information data included in a plurality of information packets is arranged according to constraint length Kmax and coding rate $(q-1)/q$ of a parity check polynomial of an erasure correction code, and $Kmax \times (q-1)$ consecutive items of information data arranged are formed with information data included in different packets. With the present embodiment, in addition, the arrangement pattern of $Kmax \times (q-1)$ consecutive items of information data arranged is made different between information blocks. An arrangement pattern refers to the order of the numbers of information packets having included information data.

Figure 15:
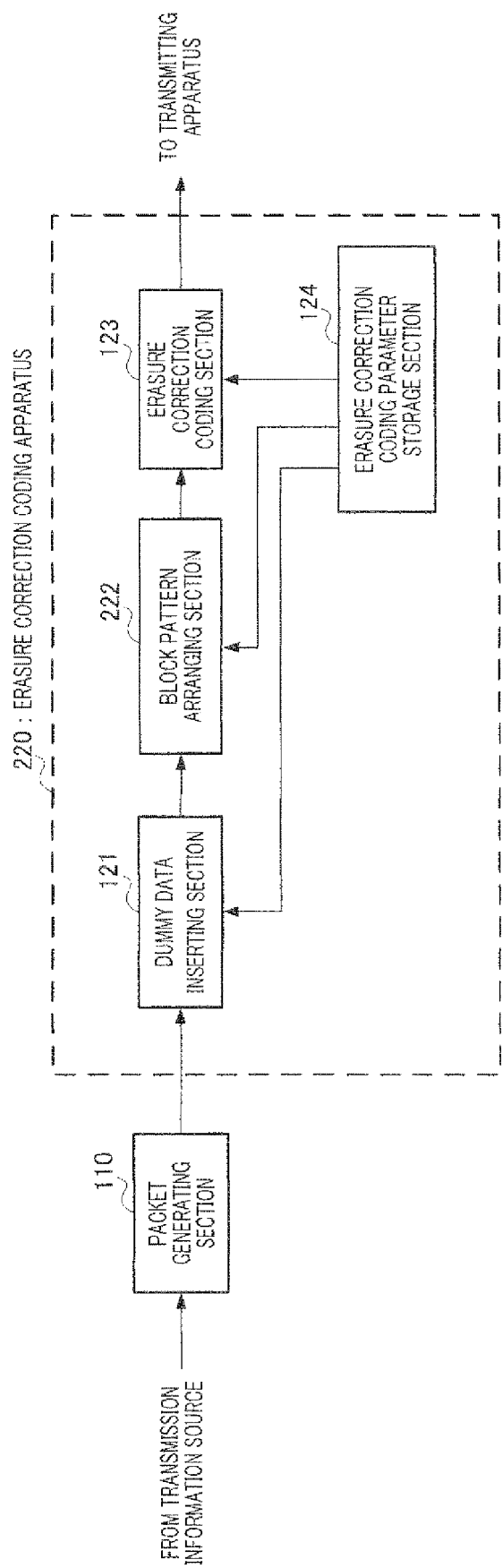
FIG. 15 is a block diagram showing the main configuration of an erasure correction coding apparatus according to Embodiment 2 of the present invention.

FIG. 15 is a block diagram showing the main configuration of an erasure correction coding apparatus according to Embodiment 2 of the present invention. Also, in the erasure correction coding apparatus of FIG. 15 according to the present embodiment, the same components as in FIG. 6 will be assigned the same reference numerals as in FIG. 6 and their explanation will be omitted. Erasure correction coding apparatus 220 of FIG. 15 includes block pattern arranging section 222 instead of arranging section 122 in FIG. 6.

Similar to arranging section 122, block pattern arranging section 222 arranges information data included in n information packets such that $Kmax \times (q-1)$ consecutive items of information data arranged are formed with information data included in different information packets. Further, in block pattern arranging section 222, the arrangement pattern of $Kmax \times (q-1)$ consecutive items of information data arranged is made different between information blocks. Also, arrangement processing in block pattern arranging section 222 will be described later.

Figure 16:
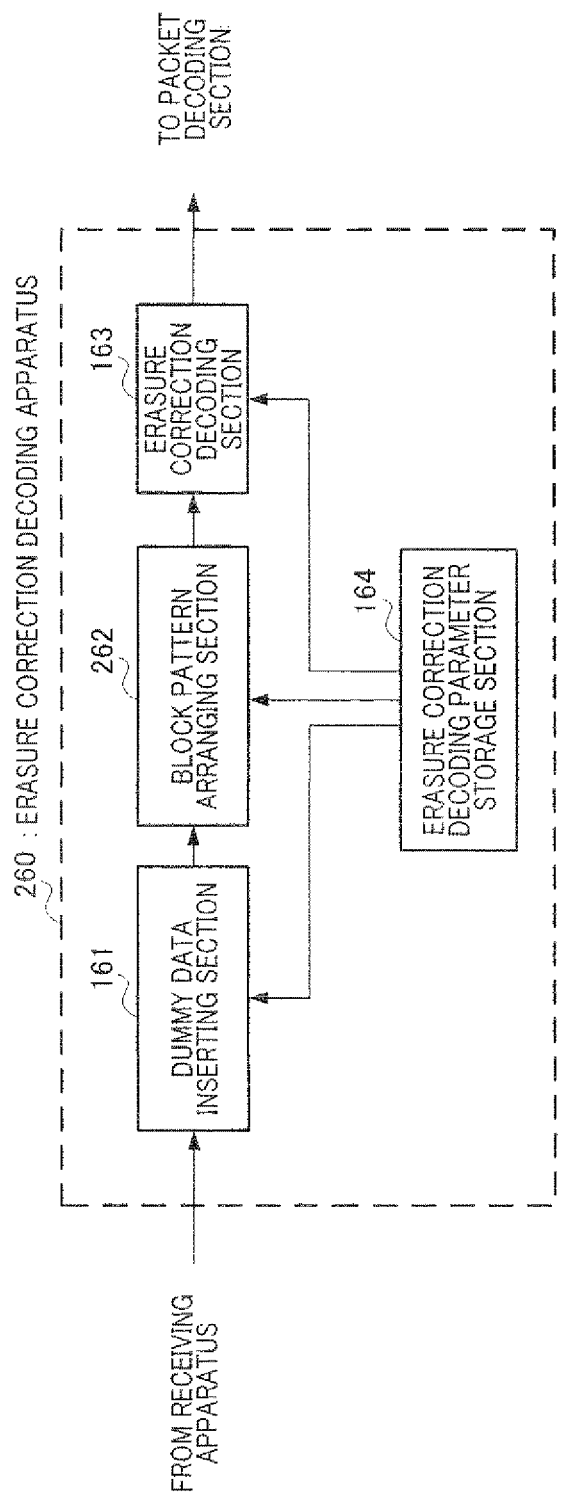
FIG. 16 is a block diagram showing the main configuration of an erasure correction decoding apparatus according to Embodiment 2.

FIG. 16 is a block diagram showing the main configuration of an erasure correction decoding apparatus according to Embodiment 2 of the present invention. Also, in the erasure correction decoding apparatus of FIG. 16 according to the present embodiment, the same components as in FIG. 10 will be assigned the same reference numerals as in FIG. 10 and their explanation will be omitted. Erasure correction decoding apparatus 260 of FIG. 16 includes block pattern arranging section 262 instead of arranging section 162 in FIG. 10.

Similar to block pattern arranging section 222, block pattern arranging section 262 generates m information blocks (first to m-th information blocks) such that $Kmax \times (q-1)$ consecutive items of information data arranged are formed with information data included in different information packets, and the arrangement pattern of information packets having included information data varies between information blocks.

Further, in opposite process to erasure correction coding section 123, block pattern arranging section 262 selects parity data from r parity packets (first to r-th parity packets), inserts parity data into the positions of corresponding information blocks, and generates m information and parity blocks. Block pattern arranging section 262 outputs the first to m-th information and parity blocks to erasure correction decoding section 163. Also, arrangement processing in block pattern arranging section 262 will be described later.

Next, arrangement processing in block pattern arranging section 222 and block pattern arranging section 262 will be explained. Block pattern arranging section 262 is based on arrangement processing in block pattern arranging section 222, and therefore only arrangement processing in block pattern arranging section 222 will be explained.

Figure 17:
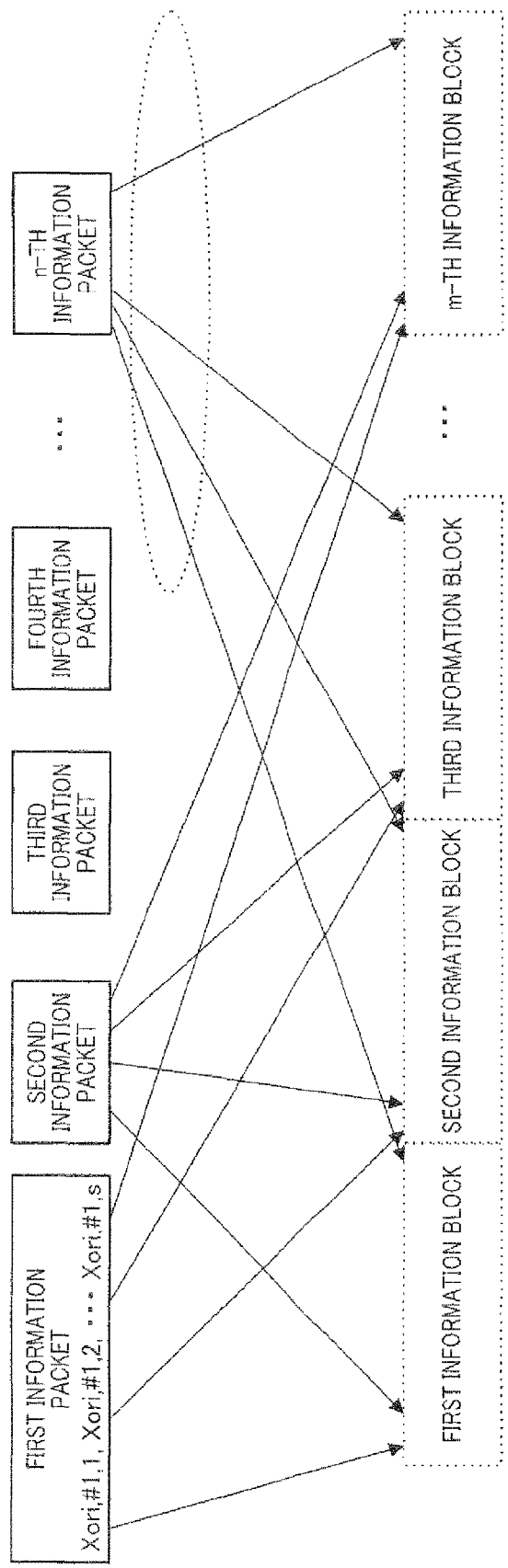
FIG. 17 is a drawing for explaining an arranging section and arrangement processing according to Embodiment 2.

Similar to arranging section 122, first, block pattern arranging section 222 sorts information data included in each information packet, into a plurality of information blocks. For example, as shown in FIG. 17, among data Xori,#1,1, Xori,#1,2, Xori,#1,3, ..., Xori,#1,s−1 and Xori,#1,s included in the first information packet, block pattern arranging section 222 sorts data Xori,#1,1 into the first information block, sorts data Xori,#1,2 into a second information block, sorts data Xori,#1,3 into a third information block, ..., and sorts data Xori,#1,s into an m-th information block. That is, the information blocks in FIG. 17 correspond to the information blocks in FIG. 8. However, as for the information blocks in FIG. 17, the same information packet data may be present in an information block. For example, the first information block of FIG. 17 may include data of two or more first information packets. Also, m and s are arbitrary natural numbers.

Further, in block pattern arranging section 222, the order of the numbers of information packets having included information data sorted into each information block, is made different between information blocks. This will be explained below using FIG. 18.

Figure 18:
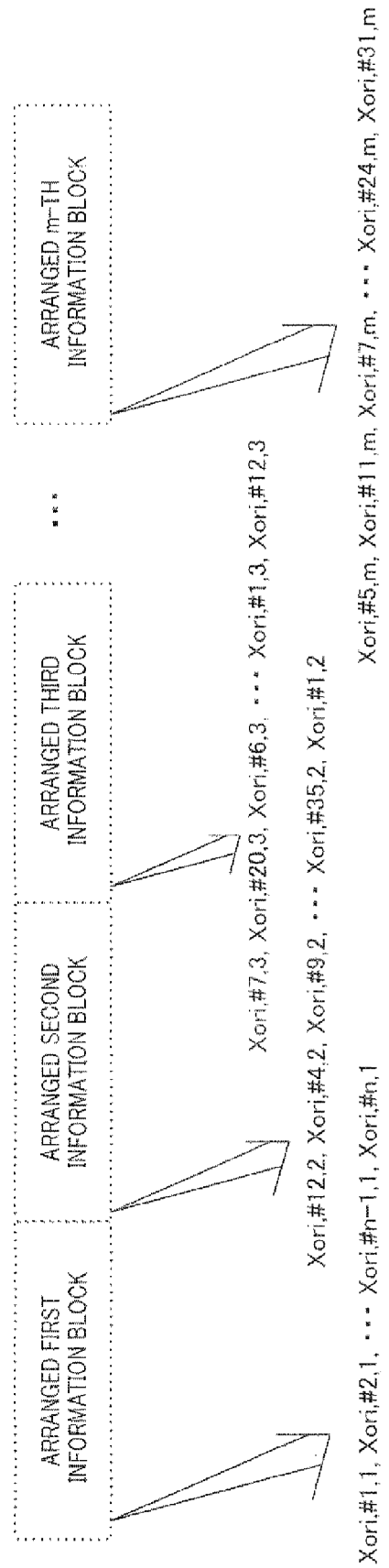
FIG. 18 is a diagram showing an arranging section and arrangement processing according to Embodiment 2.

FIG. 18 shows an example where block pattern arranging section 222 arranges information data of m information packets into m information blocks. FIG. 18 shows an example where block pattern arranging section 222 arranges data such that: in the arranged first information block, Xori,#1,1, Xori,#2,1, ..., Xori,#n−1,1 and Xori#n,1 are provided in order; in an arranged second information block, Xori,#12,1, Xori,#4,1, Xori,#9,1, ..., Xori,#35,1 and Xxori,#1,1 are provided in order; in an arranged third information block, Xori,#7,1, Xori,#20,1, Xori,#6,1, ..., Xori,#1,1 and Xxori,#12,1 are provided in order; ...; and in an arranged m-th information block, Xori,#5,1, Xori,#11,1, Xori,#17,1, ..., Xori,#24,1 and Xxori,#31,1 are provided in order.

At this time, the arrangement pattern of information packets having included information data is "1, 2, n−1, n" in the first information block, "12, 4, 9, ..., 35, 1" in the second information block, "7, 20, 6, ..., 1, 12" in the third information block, and "5, 11, 7, ..., 24, 31" in the m-th information block. That is, the arrangement pattern varies between information blocks. Here, the best example is provided when all arrangement patterns are different. Taking into account the effect of the present embodiment, if there are different patterns, it is possible to provide the effect of the present embodiment.

Also, similar to Embodiment 1, the arranged first information block, the arranged second information block, ..., and the arranged m-th information block in FIG. 18 are received as input and subjected to LDPC-CC coding to generate parity and then generate parity packets (which is equivalent to FIG. 9). At this time, similar to Embodiment 1, packets to transmit are information packets and parity packets.

Thus, in block pattern arranging section 222, the arrangement pattern of information packets having included information data is made different between information blocks. By this means, in communication channel 140, in a case where a plurality of packets are erased, it is possible to improve erasure correction capability.

For example, assume that, in a case of an LDPC-CC using the parity check polynomial represented by equation 4 in erasure correction coding section 123, the first and third information packets are erased in communication channel 140. Also, the relationship between an LDPC-CC parity check polynomial and an LDPC-CC parity check matrix will be explained in detail in "LDPC-CC code" later.

[4]

$$(D^4+D^2+1)X(D)+(D^3+1)P(D)=0 \quad \text{(Equation 4)}$$

Figure 19:
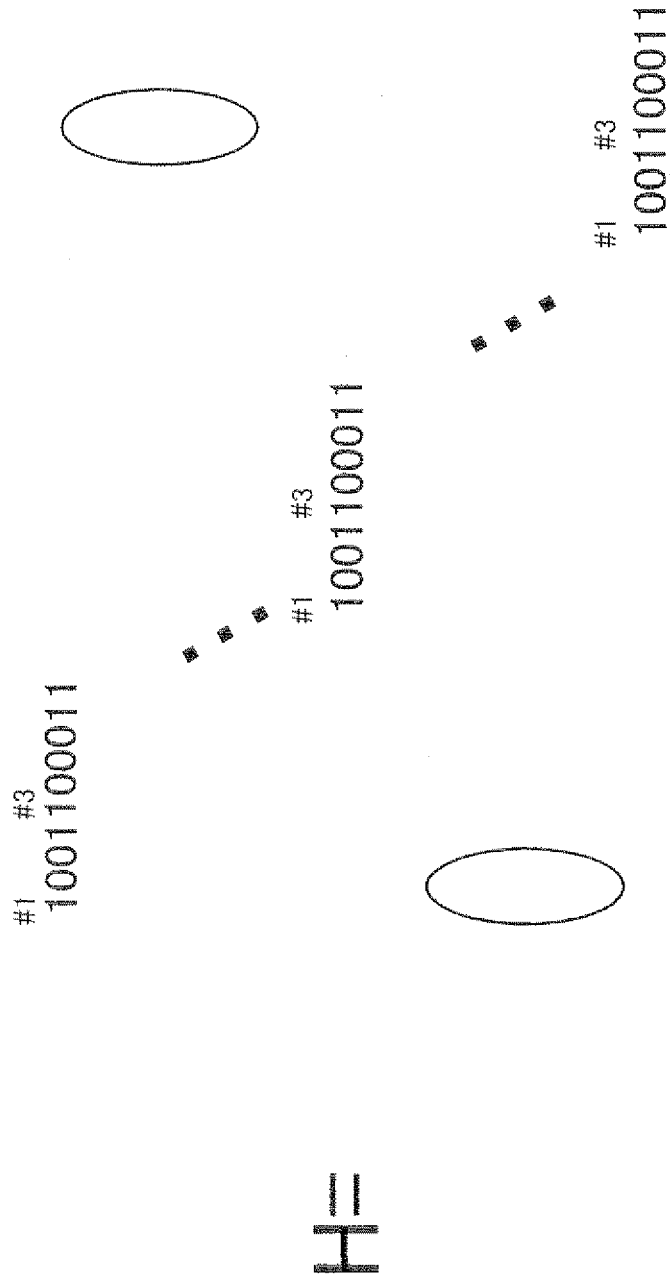
FIG. 19 is a diagram showing parity check matrix H defined using a parity check polynomial represented by equation 4.

Also, FIG. 19 shows parity check matrix H defined using the parity check polynomial represented by equation 4.

Here, in a case where the arrangement pattern of information packets is the same between information blocks, if the decoding side has difficulty decoding information data of first and third erased information packets in the first information and parity block using the parity check polynomial of equation 4, there is necessarily a high possibility that the information data of first and third erased information packets is difficult to decode using the parity check polynomial of equation 4, even in second to m-th information and parity blocks. In a parity check matrix, "1" is always present in the first information packet data and third information packet data, and, consequently, there is a low possibility of enabling decoding.

Especially, in parity check matrix H, in a case of a time-invariant LDPC-CC (which refers to an LDPC-CC of a time varying period of 1) or a time-variant LDPC-CC in which time varying period g is short, if information data of first and third erased information packets is difficult to decode in the first information and parity block, there is a high possibility that information data of first and third information packets is also difficult to decode even in subsequent information and parity blocks. This is because, in the parity check matrix, first information packet data and third information packet data can prevent a phenomenon that "1" is always present.

In contrast, when the arrangement pattern of information packets having included information data is made different between information blocks like the present embodiment, even in a case of a time-invariant LDPC-CC or a time-variant LDPC-CC in which time varying period g is short, it is possible to prevent the situation where decoding of erased data becomes difficult, so that it is possible to prevent degradation in erasure correction capability.

As described above, the present embodiment selects information on a bit-by-bit basis from $K_{max} \times (q-1)$ or more information packets, sorts the information data into a plurality of blocks and arranges the information data such that the order of information packets having included information data varies between information blocks. By changing the arrangement pattern of information packets having included information data between information blocks, even in a case of a time-invariant LDPC-CC or a time-variant LDPC-CC in which time varying period g is short, it is possible to prevent a situation where decoding of erased data is sequentially difficult, and prevent degradation in erased correction capability.

Embodiment 3

A case will be explained with Embodiment 3 of the present invention where a server such as a content server of a communication system mounting an erasure correction coding apparatus, determines whether or not to adopt an erasure correction code, according to the number of terminal apparatuses to access.

Figure 20:
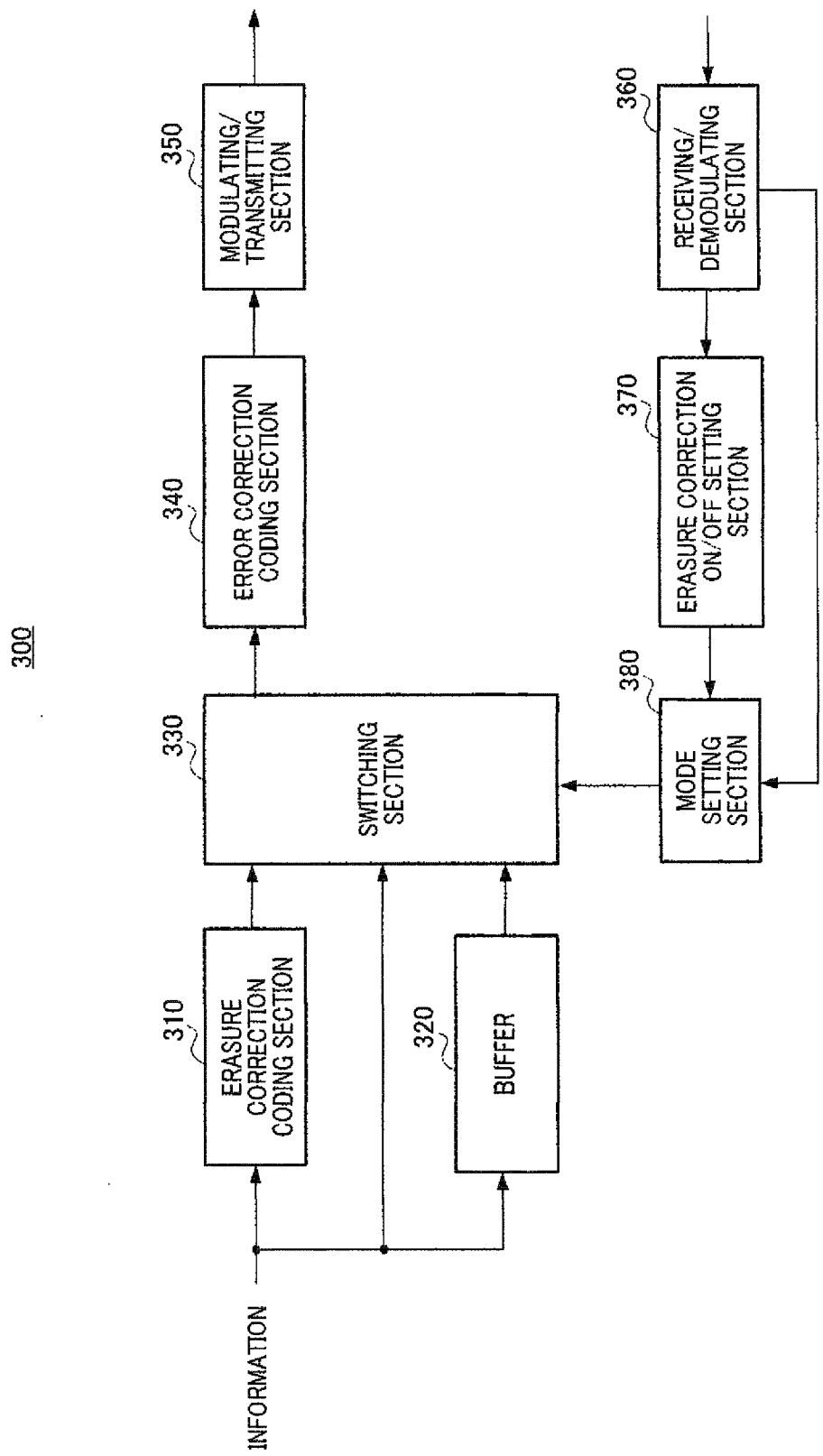
FIG. 20 is a block diagram showing the main configuration of a server according to Embodiment 3 of the present invention.

FIG. 20 is a block diagram showing the main configuration of a server according to Embodiment 3. Server 300 of FIG. 20 is mainly provided with erasure correction coding section 310, buffer 320, switching section 330, error correction coding section 340, modulating/transmitting section 350, receiving/demodulating section 360, erasure correction on/off setting section 370 and mode setting section 380.

Receiving/demodulating section 360 decides the number of terminal apparatuses based on, for example, a content distribution request message reported from a terminal apparatus in a communication system during a training period. Receiving/demodulating section 360 outputs the number of terminal apparatuses to erasure correction on/off setting section 370.

Also, signals transmitted from a terminal apparatus include both information and control information, and the control information includes information such as a retransmission request and a data distribution request. Receiving/demodulating section 360 demodulates, for example, a retransmission request or data distribution request included in the control information transmitted from the terminal apparatus, and outputs the retransmission request or the data distribution request to mode setting section 380 as a control signal.

Erasure correction on/off setting section 370 determines whether or not to perform erasure correction, based on the number of terminal apparatuses, and outputs the determination result to mode setting section 380. Whether or not to perform erasure correction is determined by a threshold decision between the number of terminal apparatuses and a predetermined number. To be more specific, erasure correction is determined to be adopted when the number of terminal apparatuses is equal to or greater than a predetermined number, or erasure correction is determined not to be adopted when the number of terminal apparatuses is less than a predetermined number.

Mode setting section 380 sets one of an erasure correction mode, retransmission mode and normal mode, according to the determination result of erasure correction on/off setting section 370 and the control signal outputted from receiving/demodulating section 360, and outputs the mode setting result to switching section 330. Here, the erasure correction mode refers to a mode adopting erasure correction, the retransmission mode refers to a mode for performing retransmission according to a retransmission request, and the normal mode refers to a mode for performing neither erasure nor retransmission.

If the mode setting result indicates the erasure correction mode, switching section 330 outputs encoded data subjected to erasure correction coding outputted from erasure correction coding section 310, to erasure correction coding section 340. Also, if the mode setting result indicates a retransmission mode (i.e. there is a retransmission request from a terminal, and data for this request is transmitted), information data temporally stored in buffer 320 is outputted to error correction coding section 340 as data for retransmission. Here, as a retransmission method, any method is possible. Also, if the mode setting result indicates the normal mode for performing neither erasure nor retransmission, information data is outputted as is to error correction coding section 340.

Thus, when packets are erased, server 300 switches between compensating for the erased packets by retransmission and compensating for the erased packets by erasure correction, based on the number of terminal apparatuses that request content distribution in a communication system.

Figure 21:
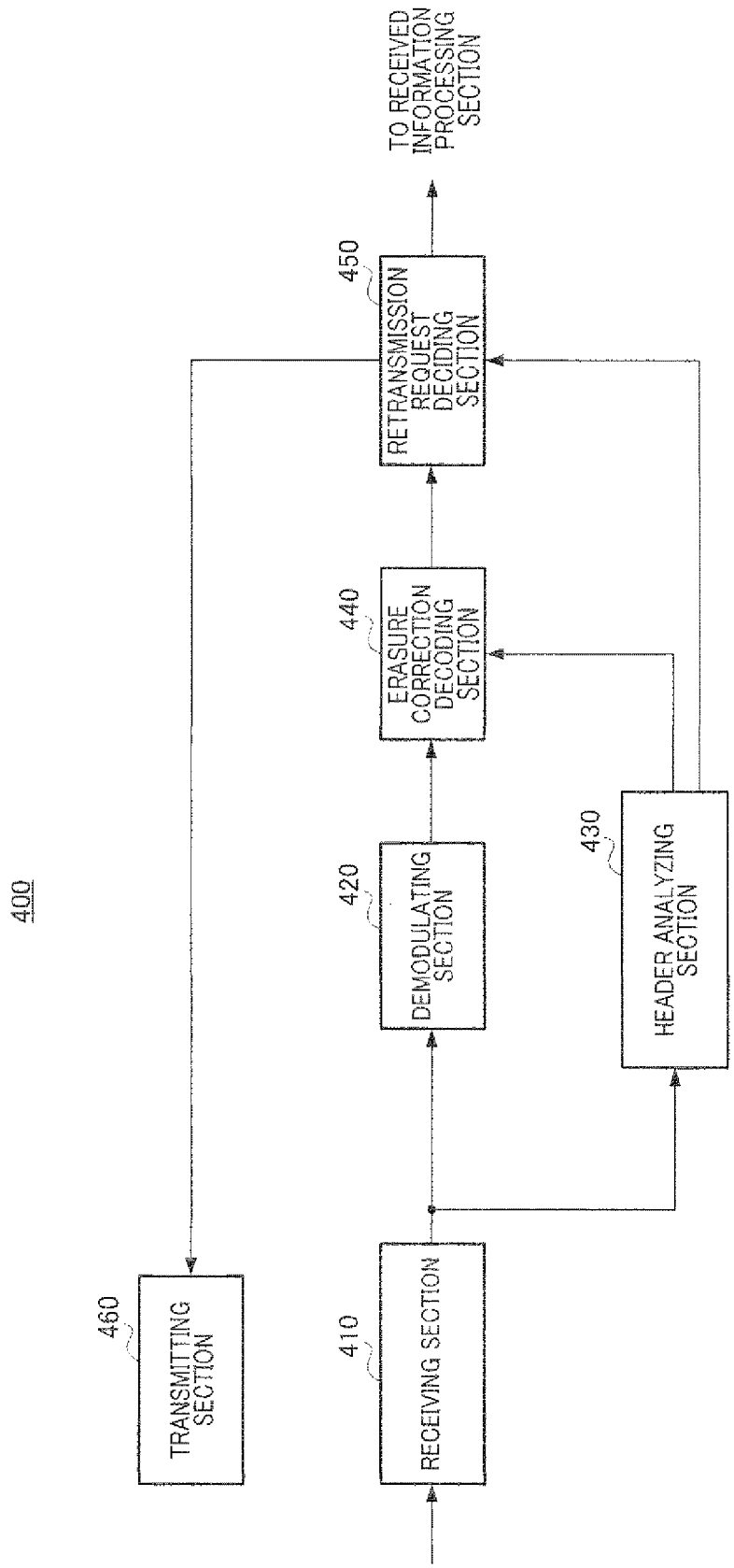
FIG. 21 is a block diagram showing the main configuration of a terminal apparatus according to Embodiment 3.

FIG. 21 is a block diagram showing the main configuration of a terminal apparatus according to Embodiment 3. Terminal apparatus 400 of FIG. 21 is mainly provided with receiving section 410, demodulating section 420, header analyzing section 430, erasure correction decoding section 440, retransmission request deciding section 450 and transmitting section 460.

Receiving section 410 receives a signal transmitted from server 300, separates the signal into the data and the header, and outputs the data to demodulating section 420 and the header to header analyzing section 430. Demodulating section 420 performs demodulation processing on the data and outputs data subjected to demodulation processing to erasure correction decoding section 440. Header analyzing section 430 analyzes the header and decides whether or not an erasure correction is provided, and outputs the decision result to erasure correction decoding section 440 and retransmission request deciding section 450. If the decision result shows that an erasure correction is provided, erasure correction decoding section 440 applies erasure correction decoding processing to the data subjected to demodulation processing, and outputs decoded data to retransmission request deciding section 450.

In contrast, if the decision result shows that an erasure correction is not provided, erasure correction decoding section 440 does not perform erasure correction decoding processing, and outputs the data subjected to demodulation processing as is to retransmission request deciding section 450. Retransmission request deciding section 450 decides whether or not to send a retransmission request to server 300, based on whether or not an erasure correction is performed in data subjected to demodulation processing, and, if a retransmission is requested, outputs a retransmission request message to transmitting section 460. Here, depending on the system configuration, even if data subjected to demodulation processing is erased in a case where an erasure correction is provided, retransmission request deciding section 450 may employ a configuration not supporting retransmission. Transmitting section 460 transmits, for example, a retransmission request message to server 300.

Figure 22A:
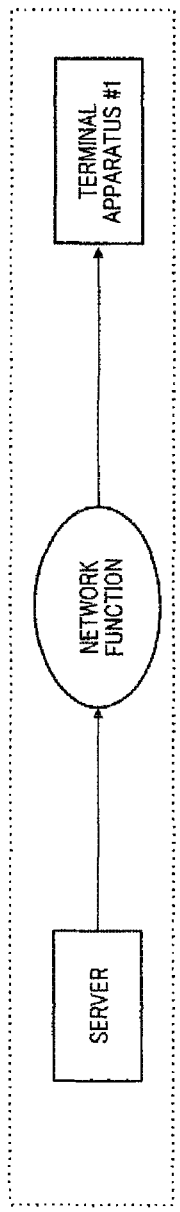
FIG. 22 shows an example of a communication system according to Embodiment 3.
Figure 22B:
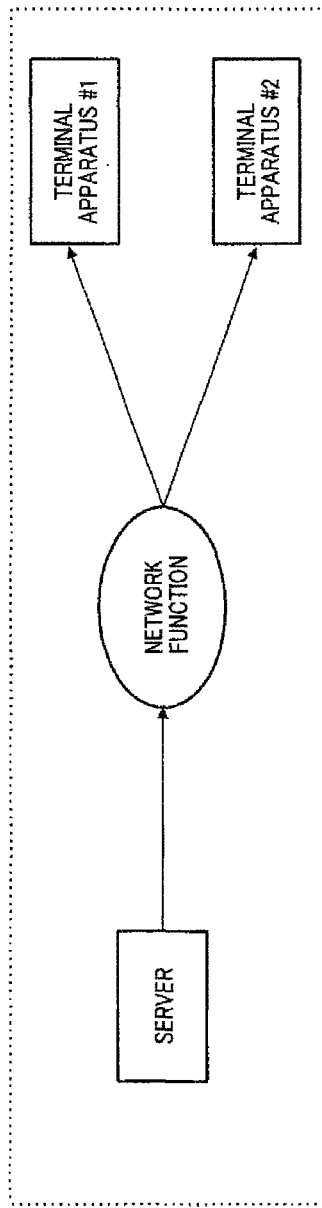

FIG. 22 shows an example of a communication system according to the present embodiment. In FIG. 22A, the number of terminal apparatuses is one, and a server and the terminal apparatus are connected on a one-to-one basis via the network function. In this environment, a communication channel is occupied by the server and one terminal apparatus, and therefore the server retransmits erased packets. Also, like FIG. 22B, in a case where there are only two terminal apparatuses, the network function is occupied by a server and two terminal apparatuses, and therefore the server retransmits erased packets. Thus, in a case where there is no problem of degradation in throughput of the communication system, it is possible to reduce calculation processing required for erasure correction by retransmitting erased packets instead of performing an erasure correction.

Figure 22C:
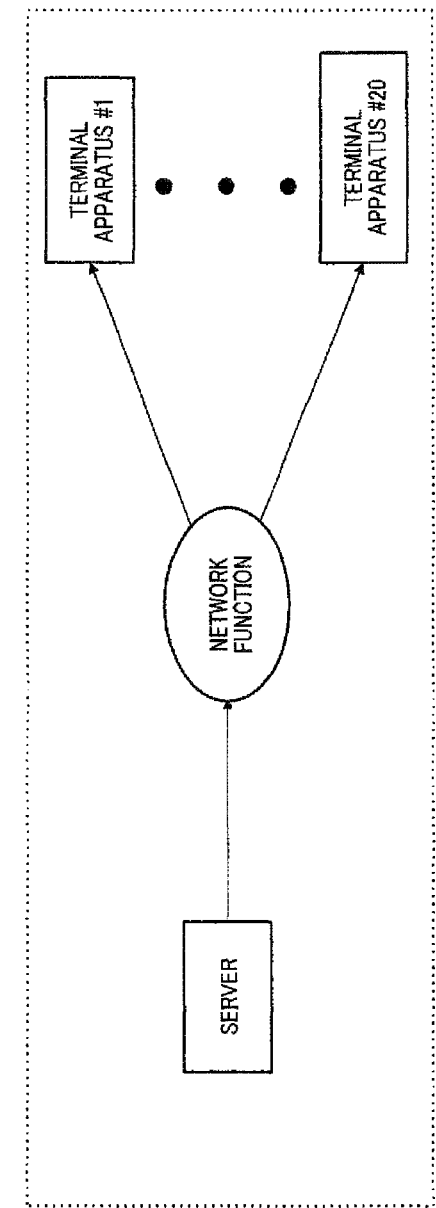

In contrast, as shown in FIG. 22C, if erased packets are retransmitted in a case where there are terminal apparatuses equal to or greater than a predetermined number in the communication system, it is necessary to respond to the retransmission requests from all terminals, which degrades throughput. Therefore, in such a case, if it is possible to decode erased packets by performing erasure correction coding in a server and performing erasure correction decoding in terminal apparatuses, it is not necessary to retransmit the erased packets, so that it is possible to prevent degradation in throughput.

Figure 24:
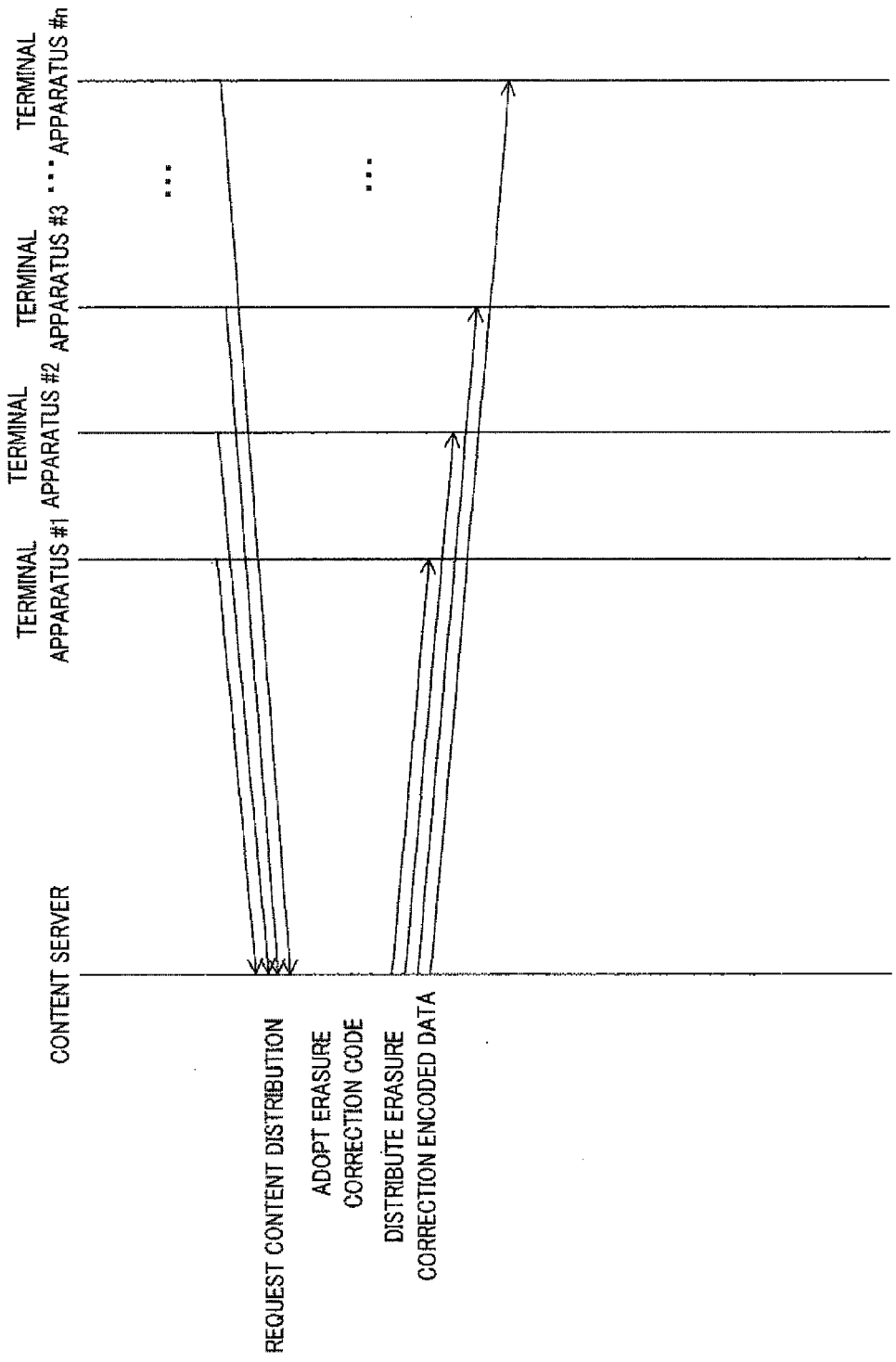
FIG. 24 is a diagram showing sequences between a content server and terminal apparatuses #1 to #n.

FIG. 23 and FIG. 24 show sequences between a content server and terminal apparatuses #1 to #n.

Upon receiving a content distribution request, each terminal apparatus reports a content distribution request message to the server, and the server decides the number of terminal apparatuses that request content distribution. Then, the server determines whether or not to adopt erasure correction coding, based on the number of terminal apparatuses that request content distribution.

FIG. 23 is a sequence diagram in a case where the number of requesting terminals is relatively small. In this case, the server does not adopt erasure correction coding, and transmits contents without erasure correction coding to the requesting terminals. At this time, retransmission is performed in response to the retransmission request from each terminal apparatus. By this means, in a case where the number of requesting terminals is relatively small and therefore there is no problem of degradation in throughput if retransmission is performed, erasure correction coding is not performed, so that it is possible to reduce power consumption.

FIG. 24 is a sequence diagram in a case where the number of requesting terminals is greater than a predetermined number. In this case, the server adopts erasure correction coding and transmits content subjected to erasure correction coding to the requesting terminals. By this means, there is a case where the requesting terminals can decode erased packets by erasure correction decoding without retransmission, so that it is possible to prevent degradation in throughput due to retransmission.

As described above, the present embodiment switches between performing erasure correction coding and not performing erasure correction coding, according to the number of terminal apparatuses that request content distribution. By this means, in a case where there is no problem of degradation in throughput of the communication system, it is possible to reduce calculation processing required for erasure correction by retransmitting erased packets instead of performing an erasure correction. Also, in a case where the number of terminal apparatuses is large, erased packets are decoded by erasure correction, so that it is possible to prevent degradation in throughput.

Although the relationship between a server and the number of communication terminals has been described as an example in the above explanation, switching between adopting an erased correction code (erasure correction mode) and supporting retransmission (retransmission mode) is not limited to the above explanation. For example, it is possible to switch between these based on the type of information. Also, naturally, it is possible to support the erasure correction mode and the retransmission mode at the same time. Especially, in a case of file data sharing or moving image data, it is important to adopt an erasure correction code, and, consequently, by supporting the erasure correction mode and the retransmission mode at the same time, terminal apparatuses can demodulate packets reliably.

Also, a server may have a switch setting function and, using this setting function, switch between adopting an erasure correction code and supporting retransmission.

(LDPC-CC Code)

The encoding apparatus and erasure code encoding method of the present invention have been described above. An LDPC-CC of a time varying period of g with good characteristics will be explained below.

First, an LDPC-CC of a time varying period of 4 with good characteristics will be described. A case in which the coding rate is ½ is described below as an example.

Consider equations 5-1 to 5-4 as parity check polynomials of an LDPC-CC for which the time varying period is 4. At this time, X(D) is a polynomial representation of data (information) and P(D) is a parity polynomial representation. Here, in equations 5-1 to 5-4, parity check polynomials have been assumed in which there are four terms in X(D) and P(D) respectively, the reason being that four terms are desirable from the standpoint of obtaining good received quality.

[5]

$$(D^{a1}+D^{a2}+D^{a3}+D^{a4})X(D)+(D^{b1}+D^{b2}+D^{b3}+D^{b4})P(D)=0 \quad \text{(Equation 5-1)}$$

$$(D^{A1}+D^{A2}+D^{A3}+D^{A4})X(D)+(+D^{B1}+D^{B2}+D^{B3}+D^{B4})P(D)=0 \quad \text{(Equation 5-2)}$$

$$(D^{\alpha1}+D^{\alpha2}+D^{\alpha3}+D^{\alpha4})X(D)+(+D^{\beta1}+D^{\beta2}+D^{\beta3}+D^{\beta4})P(D)=0 \quad \text{(Equation 5-3)}$$

$$(D^{E1}+D^{E2}+D^{E3}+D^{E4})X(D)+(+D^{F1}+D^{F2}+D^{F3}+D^{F4})P(D)=0 \quad \text{(Equation 5-4)}$$

In equation 5-1, it is assumed that a1, a2, a3 and a4 are integers (where a1≠a2≠a3≠a4, and a1 to a4 are all mutually different). Use of the notation "X≠Y≠ ... ≠Z" is assumed to express the fact that X, Y, ... , Z are all mutually different.

Also, it is assumed that b1, b2, b3 and b4 are integers (where b1≠b2≠b3≠b4). A parity check polynomial of equation 5-1 is called "check equation #1," and a sub-matrix based on the parity check polynomial of equation 5-1 is designated first sub-matrix H1.

In equation 5-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of equation 5-2 is called "check equation #2," and a sub-matrix based on the parity check polynomial of equation 5-2 is designated second sub-matrix $H_2$.

In equation 5-3, it is assumed that α1, α2, α3, and α4 are integers (where α1≠α2≠α3≠α4). Also, it is assumed that β1, β2, β3, and β4 are integers (where β1≠β2≠β3≠β4). A parity check polynomial of equation 5-3 is called "check equation #3," and a sub-matrix based on the parity check polynomial of equation 5-3 is designated third sub-matrix $H_3$.

In equation 5-4, it is assumed that E1, E2, E3, and E4 are integers (where E1≠E2≠E3≠E4). Also, it is assumed that F1, F2, F3, and F4 are integers (where F1≠F2≠F3≠F4). A parity check polynomial of equation 5-4 is called "check equation #4," and a sub-matrix based on the parity check polynomial of equation 5-4 is designated fourth sub-matrix $H_4$.

Next, an LDPC-CC of a time varying period of 4 is considered that generates a parity check matrix such as shown in FIG. 25 from first sub-matrix $H_1$, second sub-matrix $H_2$, third sub-matrix $H_3$, and fourth sub-matrix $H_4$.

At this time, if k is designated as a remainder after dividing the values of combinations of orders of X(D) and P(D), (a1, a2, a3, a4), (b1, b2, b3, b4), (A1, A2, A3, A4), (B1, B2, B3, B4), (α1, α2, α3, α4), (β1, β2, β3, β4), (E1, E2, E3, E4), (F1, F2, F3, F4), in equations 5-1 to 5-4 by 4, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2 and 3 are included in the four-coefficient set as remainders k. Similarly, if orders (b1, b2, b3, b4) of P(D) of "check equation #1" are set as (b1, b2, b3, b4)=(4, 3, 2, 1), remainders k after dividing orders (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of the other parity check equations ("check equation #2," "check equation #3" and "check equation #4").

By this means, the column weight of parity check matrix H configured from equations 5-1 to 5-4 becomes 4 for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 4, an LDPC-CC offering good reception performance can be obtained by generating an LDPC-CC as described above.

Table 1 shows examples of LDPC-CCs (LDPC-CCs #1 to #3) of a time varying period of 4 and a coding rate of ½ for which the above condition about "remainder" holds true. In table 1, LDPC-CCs of a time varying period of 4 are defined by four parity check polynomials: "check polynomial #1," "check polynomial #2," "check polynomial #3," and "check polynomial #4."

TABLE 1

| Code | Parity check polynomial |
|---|---|
| LDPC-CC #1 of a time varying period of 4 and a coding rate of ½ | Check polynomial #1: $(D^{458} + D^{435} + D^{341} + 1) \times (D) + (D^{598} + D^{373} + D^{67} + 1)P(D) = 0$<br>Check polynomial #2: $(D^{287} + D^{213} + D^{330} + 1) \times (D) + (D^{545} + D^{542} + D^{103} + 1)P(D) = 0$<br>Check polynomial #3: $(D^{557} + D^{495} + D^{326} + 1) \times (D) + (D^{561} + D^{502} + D^{351} + 1)P(D) = 0$<br>Check polynomial #4: $(D^{426} + D^{329} + D^{99} + 1) \times (D) + (D^{321} + D^{55} + D^{42} + 1)P(D) = 0$ |
| LDPC-CC #2 of a time varying period of 4 and a coding rate of ½ | Check polynomial #1: $(D^{503} + D^{454} + D^{49} + 1) \times (D) + (D^{569} + D^{467} + D^{407} + 1)P(D) = 0$<br>Check polynomial #2: $(D^{518} + D^{473} + D^{203} + 1) \times (D) + (D^{598} + D^{499} + D^{145} + 1)P(D) = 0$<br>Check polynomial #3: $(D^{403} + D^{397} + D^{62} + 1) \times (D) + (D^{294} + D^{267} + D^{69} + 1)P(D) = 0$<br>Check polynomial #4: $(D^{483} + D^{385} + D^{94} + 1) \times (D) + (D^{426} + D^{415} + D^{413} + 1)P(D) = 0$ |
| LDPC-CC #3 of a time varying period of 4 and a coding rate of ½ | Check polynomial #1: $(D^{454} + D^{447} + D^{17} + 1) \times (D) + (D^{494} + D^{237} + D^{7} + 1)P(D) = 0$<br>Check polynomial #2: $(D^{583} + D^{545} + D^{506} + 1) \times (D) + (D^{325} + D^{71} + D^{66} + 1)P(D) = 0$<br>Check polynomial #3: $(D^{430} + D^{425} + D^{407} + 1) \times (D) + (D^{582} + D^{47} + D^{45} + 1)P(D) = 0$<br>Check polynomial #4: $(D^{434} + D^{353} + D^{127} + 1) \times (D) + (D^{345} + D^{207} + D^{38} + 1)P(D) = 0$ |

In the above description, a case in which the coding rate is ½ has been described as an example, but a regular LDPC code is also formed and good received quality can be obtained when the coding rate is (n−1)/n if the above condition about "remainder" holds true for four-coefficient sets in information X1(D), X2(D), . . . , Xn−1(D).

In the case of a time varying period of 2, also, it has been confirmed that a code with good characteristics can be found if the above condition about "remainder" is applied. An LDPC-CC of a time varying period of 2 with good characteristics is described below. A case in which the coding rate is ½ is described below as an example.

Consider equations 6-1 and 6-2 as parity check polynomials of an LDPC-CC for which the time varying period is 2. At this time, X(D) is a polynomial representation of data (information) and P(D) is a parity polynomial representation. Here, in equations 6-1 and 6-2, parity check polynomials have been assumed in which there are four terms in X(D) and P(D) respectively, the reason being that four terms are desirable from the standpoint of obtaining good received quality.

[6]

$$(D^{a1}+D^{a2}+D^{a3}+D^{a4})X(D)+(D^{b1}+D^{b2}+D^{b3}+D^{b4})P(D)=0 \quad \text{(Equation 6-1)}$$

$$(D^{A1}+D^{A2}+D^{A3}+D^{A4})X(D)+(D^{B1}+D^{B2}+D^{B3}+D^{B4})P(D)=0 \quad \text{(Equation 6-2)}$$

In equation 6-1, it is assumed that a1, a2, a3, and a4 are integers (where a1≠a2≠a3≠a4). Also, it is assumed that b1, b2, b3, and b4 are integers (where b1≠b2≠b3≠b4). A parity check polynomial of equation 6-1 is called "check equation #1," and a sub-matrix based on the parity check polynomial of equation 6-1 is designated first sub-matrix $H_1$.

In equation 6-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of equation 6-2 is called "check equation #2," and a sub-matrix based on the parity check polynomial of equation 6-2 is designated second sub-matrix $H_2$.

Next, an LDPC-CC of a time varying period of 2 generated from first sub-matrix $H_1$ and second sub-matrix $H_2$ is considered.

At this time, if k is designated as a remainder after dividing the values of combinations of orders of X(D) and P(D), (a1, a2, a3, a4), (b1, b2, b3, b4), (A1, A2, A3, A4), (B1, B2, B3, B4), in equations 6-1 and 6-2 by 4, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2 and 3 are included in the four-coefficient set as remainders k. Similarly, if orders (b1, b2, b3, b4) of P(D) of "check equation #1" are set as (b1, b2, b3, b4)=(4, 3, 2, 1), remainders k after dividing orders (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of "check equation #2."

By this means, the column weight of parity check matrix H configured from equations 6-1 and 6-2 becomes 4 for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 8, an LDPC-CC enabling reception performance to be further improved can be obtained by generating an LDPC-CC as described above.

Table 2 shows examples of LDPC-CCs (LDPC-CCs #1 and #2) of a time varying period of 2 and a coding rate of ½ for which the above condition about "remainder" holds true. In table 2, LDPC-CCs of a time varying period of 2 are defined by two parity check polynomials: "check polynomial #1" and "cheek polynomial #2."

TABLE 2

| Code | Parity check polynomial |
|---|---|
| LDPC-CC #1 of a time varying period of 2 and a coding rate of 1/2 | Check polynomial #1<br>$(D^{551} + D^{465} + D^{98} + 1)X(D) + (D^{407} + D^{386} + D^{373} + 1)P(D) = 0$<br><br>Check polynomial #2<br>$(D^{443} + D^{433} + D^{54} + 1)X(D) + (D^{559} + D^{557} + D^{546} + 1)P(D) = 0$ |
| LDPC-CC #2 of a time varying period of 2 and a coding rate of 1/2 | Check polynomial #1<br>$(D^{265} + D^{190} + D^{99} + 1)X(D) + (D^{295} + D^{246} + D^{69} + 1)P(D) = 0$<br><br>Check polynomial #2<br>$(D^{275} + D^{226} + D^{213} + 1)X(D) + (D^{298} + D^{147} + D^{45} + 1)P(D) = 0$ |

In the above description (LDPC-CCs of a time varying period of 2), a case in which the coding rate is ½ has been described as an example, but a regular LDPC code is also formed and good received quality can be obtained when the coding rate is (n−1)/n if the above condition about "remainder" holds true for four-coefficient sets in information X1(D), X2(D), . . . , Xn−1(D).

In the case of a time varying period of 3, also, it has been confirmed that a code with good characteristics can be found if the following condition about "remainder" is applied. An LDPC-CC of a time varying period of 3 with good characteristics is described below. A case in which the coding rate is ½ is described below as an example.

Consider equations 7-1 to 7-3 as parity cheek polynomials of an LDPC-CC for which the time varying period is 3. At this time, X(D) is a polynomial representation of data (information) and P(D) is a parity polynomial representation. Here, in equations 7-1 to 7-3, parity check polynomials are assumed such that there are three terms in X(D) and P(D) respectively.

[7]

$$(D^{a1}+D^{a2}+D^{a3})X(D)+(D^{b1}+D^{b2}+D^{b3})P(D)=0 \quad \text{(Equation 7-1)}$$

$$(D^{A1}+D^{A2}+D^{A3})X(D)+(D^{B1}+D^{B2}+D^{B3})P(D)=0 \quad \text{(Equation 7-2)}$$

$$(D^{\alpha1}+D^{\alpha2}+D^{\alpha3})X(D)+(D^{\beta1}+D^{\beta2}+D^{\beta3})P(D)=0 \quad \text{(Equation 7-3)}$$

In equation 7-1, it is assumed that a1, a2, and a3 are integers (where a1≠a2≠a3). Also, it is assumed that b1, b2 and b3 are integers (where b1≠b2≠b3). A parity check polynomial of equation 7-1 is called "check equation #1," and a sub-matrix based on the parity check polynomial of equation 7-1 is designated first sub-matrix $H_1$.

In equation 7-2, it is assumed that A1, A2 and A3 are integers (where A1≠A2≠A3). Also, it is assumed that B1, B2 and B3 are integers (where B1≠B2≠B3). A parity check polynomial of equation 7-2 is called "check equation #2," and a sub-matrix based on the parity check polynomial of equation 7-2 is designated second sub-matrix $H_2$.

In equation 7-3, it is assumed that α1, α2 and α3 are integers (where α1≠α2≠α3). Also, it is assumed that β1, β2 and β3 are integers (where β1≠β2≠β3). A parity check polynomial of equation 7-3 is called "check equation #3," and a sub-matrix based on the parity check polynomial of equation 7-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of orders of X(D) and P(D), (a1, a2, a3), (b1, b2, b3), (A1, A2, A3), (B1, B2, B3), (α1, α2, α3), (β1, β2, β3), in equations 7-1 to 7-3 by 3, provision is made for one each of remainders 0, 1, and 2 to be included in three-coefficient sets represented as shown above (for example, (a1, a2, a3)), and to hold true for all the above three-coefficient sets.

For example, if orders (a1, a2, a3) of X(D) of "check equation #1" are set as (a1, a2, a3)=(6, 5, 4), remainders k after dividing orders (a1, a2, a3) by 3 are (0, 2, 1), and one each of 0, 1, 2 are included in the three-coefficient set as remainders k. Similarly, if orders (b1, b2, b3) of P(D) of "check equation #1" are set as (b1, b2, b3)=(3, 2, 1), remainders k after dividing orders (b1, b2, b3) by 3 are (0, 2, 1), and one each of 0, 1, 2 are included in the three-coefficient set as remainders k. It is assumed that the above condition about "remainder" also holds true for the three-coefficient sets of X(D) and P(D) of "check equation #2" and "check equation #3."

By generating an LDPC-CC as above, it is possible to generate a regular LDPC-CC code in which the row weight is equal in all rows and the column weight is equal in all columns, without some exceptions. Here, "exceptions" refer to part in the beginning of a parity check matrix and part in the end of the parity check matrix, where the row weights and columns weights are not the same as row weights and column weights of the other part. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained. This is because, when considered in column units, positions at which "1" is present are arranged so as to propagate belief accurately, as described above.

Figure 26A:
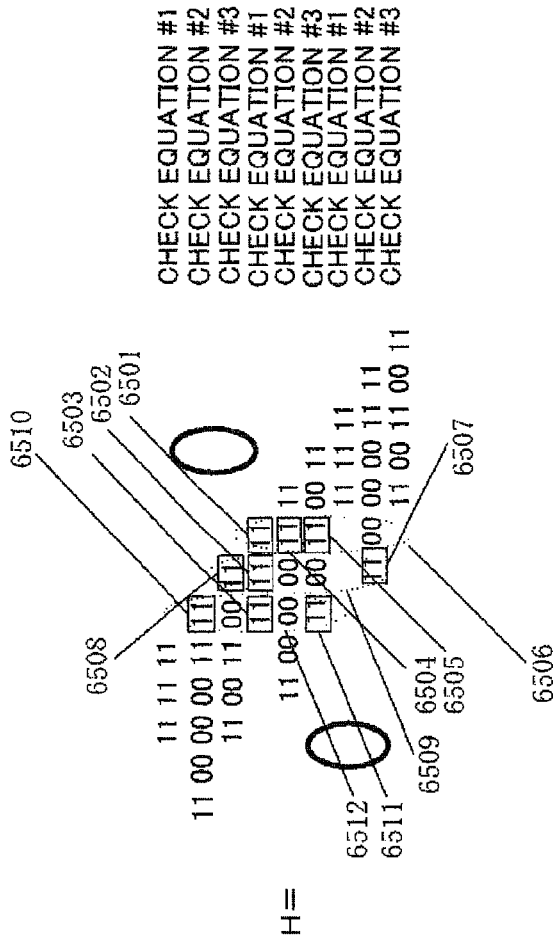
FIG. 26A shows parity check polynomials of an LDPC-CC of a time varying period of 3 and the configuration of parity check matrix H of this LDPC-CC.

The above belief propagation will be described below using accompanying drawings. FIG. 26A shows parity check polynomials of an LDPC-CC of a time varying period of 3 and the configuration of parity check matrix H of this LDPC-CC.

"Check equation #1" illustrates a case in which (a1, a2, a3)=(2, 1, 0) and (b1, b2, b3)=(2, 1, 0) in a parity check polynomial of equation 7-1, and remainders after dividing the coefficients by 3 are as follows: (a1%3, a2%3, a3%3)=(2, 1, 0), (b1%3, b2%3, b3%3)=(2, 1, 0), where "Z %3" represents a remainder after dividing Z by 3.

"Check equation #2" illustrates a case in which (A1, A2, A3)=(5, 1, 0) and (B1, B2, B3)=(5, 1, 0) in a parity check polynomial of equation 7-2, and remainders after dividing the coefficients by 3 are as follows: (A1%3, A2%3, A3%3)=(2, 1, 0), (B1%3, B2%3, B3%3)=(2, 1, 0).

"Check equation #3" illustrates a case in which (α1, α2, α3)=(4, 2, 0) and (β1, β2, β3)=(4, 2, 0) in a parity check polynomial of equation 7-3, and remainders after dividing the coefficients by 3 are as follows: (α1%3, α2%3, α3%3)=(1, 2, 0), (β1%3, β2%3, β3%3)=(1, 2, 0).

Therefore, the example of LDPC-CC of a time varying period of 3 shown in FIG. 26A satisfies the above condition about "remainder", that is, a condition that (a1%3, a2%3, a3%3), (b1%3, b2%3, b3%3), (A1%3, A2%3, A3%3), (B1%3, B2%3, B3%3), (α1%3, α2%3, α3%3) and (β1%3, β2%3, β3%3) are any of the following: (0, 1, 2), (0, 2, 1), (1, 0, 2), (1, 2, 0), (2, 0, 1), (2, 1, 0).

Returning to FIG. 26A again, belief propagation will now be explained. By column computation of column 6506 in BP decoding, for "1" of area 6501 of "check equation #1," belief is propagated from "1" of area 6504 of "check equation #2" and from "1" of area 6505 of "check equation #3." As described above, "1" of area 6501 of "check equation #1" is a coefficient for which a remainder after division by 3 is 0 (a3%3=0 (a3=0) or b3%3=0 (b3=0)). Also, "1" of area 6504 of "check equation #2" is a coefficient for which a remainder after division by 3 is 1 (A2%3=1 (A2=1) or B2%3=1 (B2=1)). Furthermore, "1" of area 6505 of "check equation #3" is a coefficient for which a remainder after division by 3 is 2 (α2%3=2 (α2=2) or β2%3=2 (β2=2)).

Thus, for "1" of area 6501 for which a remainder is 0 in the coefficients of "check equation #1," in column computation of column 6506 in BP decoding, belief is propagated from "1" of area 6504 for which a remainder is 1 in the coefficients of "check equation #2" and from "1" of area 6505 for which a remainder is 2 in the coefficients of "check equation #3."

Similarly, for "1" of area 6502 for which a remainder is 1 in the coefficients of "check equation #1," in column computation of column 6509 in BP decoding, belief is propagated from "1" of area 6507 for which a remainder is 2 in the coefficients of "check equation #2" and from "1" of area 6508 for which a remainder is 0 in the coefficients of "check equation #3."

Similarly, for "1" of area 6503 for which a remainder is 2 in the coefficients of "check equation #1," in column computation of column 6512 in BP decoding, belief is propagated from "1" of area 6510 for which a remainder is 0 in the coefficients of "check equation #2" and from "1" of area 6511 for which a remainder is 1 in the coefficients of "check equation #3."

Figure 26B:
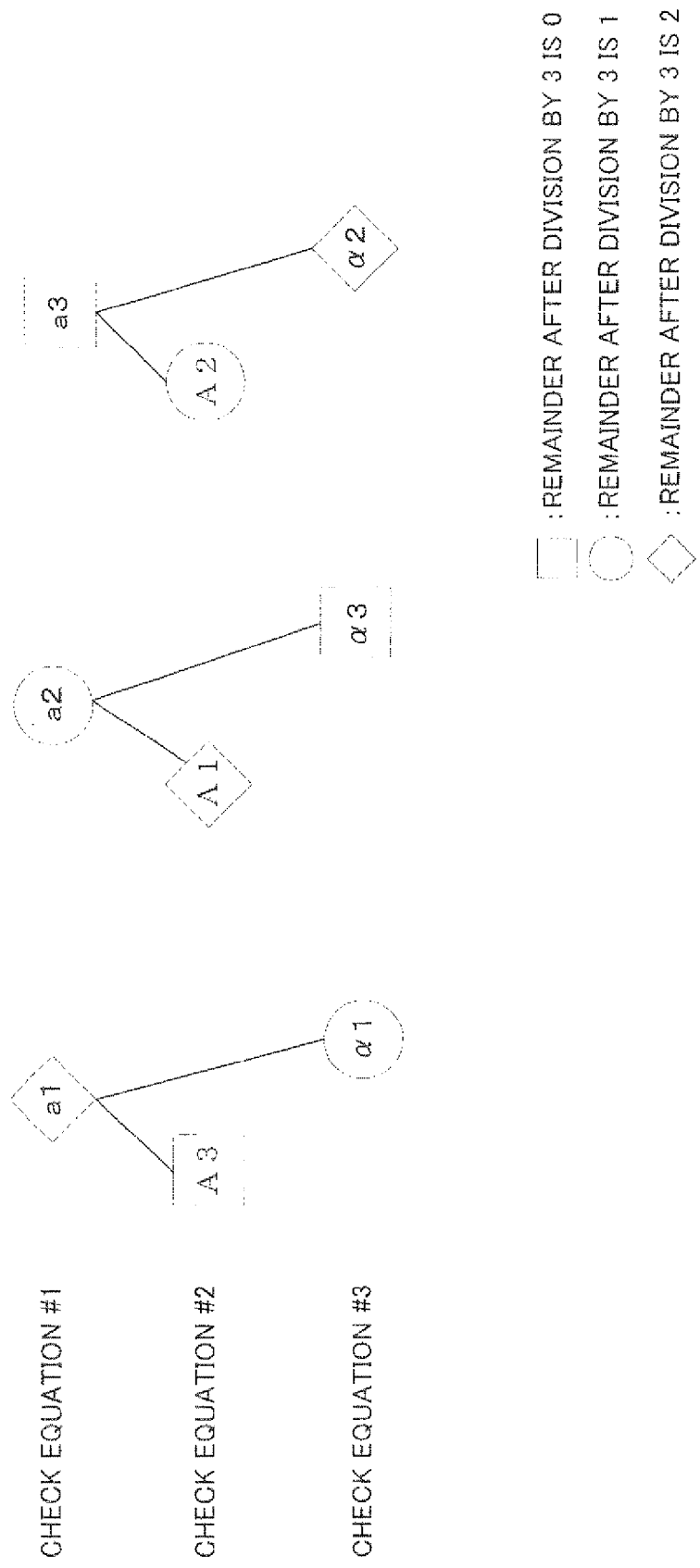
FIG. 26B shows the belief propagation relationship of terms relating to X(D) of "check equation #1" to "check equation #3" in FIG. 26A.

A supplementary explanation of belief propagation will now be given using FIG. 26B. FIG. 26B shows the belief propagation relationship of terms relating to X(D) of "check equation #1" to "check equation #3" in FIG. 26A. "Check equation #1" to "check equation #3" in FIG. 26A illustrate eases in which (a1, a2, a3)=(2, 1, 0), (A1, A2, A3)=(5, 1, 0), and (a1, a2, a3)=(4, 2, 0), in terms relating to X(D) of equations 7-1 to 7-3.

In FIG. 26B, terms (a3, A3, a3) inside squares indicate coefficients for which a remainder after division by 3 is 0. Also, terms (a2, A2, α1) inside circles indicate coefficients for which a remainder after division by 3 is 1. Also, terms (a1, A1, α2) inside diamond-shaped boxes indicate coefficients for which a remainder after division by 3 is 2.

As can be seen from FIG. 26B, for a1 of "check equation #1," belief is propagated from A3 of "check equation #2" and from α1 of "check equation #3" for which remainders after division by 3 differ; for a2 of "check equation #1," belief is propagated from A1 of "check equation #2" and from α3 of "check equation #3" for which remainders after division by 3 differ; and, for a3 of "check equation #1," belief is propagated from A2 of "check equation #2" and from α2 of "check equation #3" for which remainders after division by 3 differ. While FIG. 26B shows the belief propagation relationship of terms relating to X(D) of "check equation 41" to "check equation #3," the same applies to terms relating to P(D).

Thus, for "cheek equation #1," belief is propagated from coefficients for which remainders after division by 3 are 0, 1, and 2 among coefficients of "check equation #2." That is to say, for "check equation #1," belief is propagated from coefficients for which remainders after division by 3 are all different among coefficients of "check equation #2." Therefore, beliefs with low correlation are all propagated to "check equation #1."

Similarly, for "check equation #2," belief is propagated from coefficients for which remainders after division by 3 are 0, 1, and 2 among coefficients of "check equation #1." That is to say, for "check equation #2," belief is propagated from coefficients for which remainders after division by 3 are all different among coefficients of "check equation #1." Also, for "check equation #2," belief is propagated from coefficients for which remainders after division by 3 are 0, 1, and 2 among coefficients of "check equation #3." That is to say, for "check equation #2," belief is propagated from coefficients for which remainders after division by 3 are all different among coefficients of "check equation #3."

Similarly, for "cheek equation #3," belief is propagated from coefficients for which remainders after division by 3 are 0, 1, and 2 among coefficients of "check equation #1." That is to say, for "check equation #3," belief is propagated from coefficients for which remainders after division by 3 are all different among coefficients of "check equation #1." Also, for "check equation #3," belief is propagated from coefficients for which remainders after division by 3 are 0, 1, and 2 among coefficients of "check equation #2." That is to say, for "check equation #3," belief is propagated from coefficients for which remainders after division by 3 are all different among coefficients of "check equation #2."

By providing for the orders of parity check polynomials of equations 7-1 to 7-3 to satisfy the above condition about "remainder" in this way, belief is reliably propagated in all column computations, so that it is possible to perform belief propagation efficiently in all check equations and further increase error correction capability.

A case in which the coding rate is ½ has been described above for an LDPC-CC of a time varying period of 3, but the coding rate is not limited to ½. A regular LDPC code is also formed and good received quality can be obtained when the coding rate is (n−1)/n (where n is an integer equal to or greater than 2) if the above condition about "remainder" holds true for three-coefficient sets in information X1(D), X2(D), . . . , Xn−1(D).

A case in which the coding rate is (n−1)/n (where n is an integer equal to or greater than 2) is described below.

Consider equations 8-1 to 8-3 as parity check polynomials of an LDPC-CC for which the time varying period is 3. At this time, X1(D), X2(D), . . . , Xn−1(D) are polynomial representations of data (information) X1, X2, . . . , Xn−1, and P(D) is a polynomial representation of parity. Here, in equations 8-1 to 8-3, parity check polynomials are assumed such that there are three terms in X1(D), X2(D), . . . , Xn−1(D), and P(D) respectively.

[8]

$$(D^{a1,1}+D^{a1,2}+D^{a1,3})X_1(D)(D^{a2,1}+D^{a2,2}+D^{a2,3})X_2(D)+\ldots$$

$$+(D^{an-1,1}+D^{an-1,2}+D^{an-1,3})X_{n-1}(D)(D^{b1}+D^{b2}+D^{b3})P(D)=0 \quad \text{(Equation 8-1)}$$

$$(D^{A1,1}+D^{A1,2}+D^{A1,3})X_1(D)(D^{A2,1}+D^{A2,2}+D^{A2,3})X_2(D)+\ldots$$

$$+(D^{An-1,1}+D^{An-1,2}+D^{An-1,3})X_{n-1}(D)+(D^{B1}+D^{B2}+D^{B3})P(D)=0 \quad \text{(Equation 8-2)}$$

$$(D^{\alpha 1,1}+D^{\alpha 1,2}+D^{\alpha 1,3})X_1(D)+(D^{\alpha 2,1}+D^{\alpha 2,2}+D^{\alpha 2,3})X_2(D)+\ldots$$

$$+(D^{\alpha n-1,1}+D^{\alpha n-1,2}+D^{\alpha n-1,3})X_{n-1}(D)+(D^{\beta 1}+D^{\beta 2}+D^{\beta 3})P(D)=0 \quad \text{(Equation 8-3)}$$

In equation 8-1, it is assumed that $a_{i,1}$, $a_{i,2}$, and $a_{i,3}$ (where i=1, 2, . . . , n−1) are integers (where $a_{i,1} \neq a_{i,2} \neq a_{i,3}$). Also, it is assumed that b1, b2 and b3 are integers (where b1≠b2≠b3). A parity check polynomial of equation 8-1 is called "check equation #1," and a sub-matrix based on the parity check polynomial of equation 8-1 is designated first sub-matrix $H_1$.

In equation 8-2, it is assumed that $A_{i,1}$, $A_{i,2}$, and $A_{i,3}$ (where i=1, 2, . . . , n−1) are integers (where $A_{i,1} \neq A_{i,2} \neq A_{i,3}$). Also, it is assumed that B1, B2 and B3 are integers (where B1≠B2≠B3). A parity check polynomial of equation 8-2 is called "check equation #2," and a sub-matrix based on the parity check polynomial of equation 8-2 is designated second sub-matrix $H_2$.

In equation 8-3, it is assumed that $\alpha_{i,1}$, $\alpha_{i,2}$, and $\alpha_{i,3}$ (where i=1, 2, . . . , n−1) are integers (where $\alpha_{i,1} \neq \alpha_{i,2} \neq \alpha_{i,3}$). Also, it is assumed that β1, β2 and β3 are integers (where β1≠β2≠β3). A parity check polynomial of equation 8-3 is called "check equation #3," and a sub-matrix based on the parity check polynomial of equation 8-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of orders of X1(D), X2(D), . . . , Xn−1(D), and P(D), $(a_{1,1}, a_{1,2}, a_{1,3})$, $(a_{2,1}, a_{2,2}, a_{2,3})$, . . . , $(a_{n-1,1}, a_{n-1,2}, a_{n-1,3})$, (b1, b2, b3), $(A_{1,1}, A_{1,2}, A_{1,3})$, $(A_{2,1}, A_{2,2}, A_{2,3})$, . . . , $(A_{n-1,1}, A_{n-1,2}, A_{n-1,3})$, (B1, B2, B3), $(\alpha_{1,1}, \alpha_{1,2}, \alpha_{1,3})$, $(\alpha_{2,1}, \alpha_{2,2}, \alpha_{2,3})$, . . . , $(\alpha_{n-1,1}, \alpha_{n-1,2}, \alpha_{n-1,3})$, (β1, β3, β3), in equations 8-1 to 8-3 by 3, provision is made for one each of remainders 0, 1, and 2 to be included in three-coefficient sets represented as shown above (for example, $(a_{1,1}, a_{1,2}, a_{1,3})$), and to hold true for all the above three-coefficient sets.

That is to say, provision is made for $(a_{1,1}\%3, a_{1,2}\%3, a_{1,3}\%3)$, $(a_{2,1}\%3, a_{2,2}\%3, a_{2,3}\%3)$, . . . , $(a_{n-1,1}\%3, a_{n-1,2}\%3, a_{n-1,3}\%3)$, (b1%3, b2%3, b3%3), $(A_{1,1}\%3, A_{1,2}\%3, A_{1,3}\%3)$, $(A_{2,1}\%3, A_{2,2}\%3, A_{2,3}\%3)$, . . . , $(A_{n-1,1}\%3, A_{n-1,2}\%3, A_{n-1,3}\%3)$, (B1%3, B2%3, B3%3), $(\alpha_{1,1}\%3, \alpha_{1,2}\%3, \alpha_{1,3}\%3)$, $(\alpha_{2,1}\%3, \alpha_{2,2}\%3, \alpha_{2,3}\%3)$, . . . , $(\alpha_{n-1,1}\%3, \alpha_{n-1,2}\%3, \alpha_{n-1,3}\%3)$ and (β1%3, β2%3, β3%3) to be any of the following: (0, 1, 2), (0, 2, 1), (1, 0, 2), (1, 2, 0), (2, 0, 1), (2, 1, 0).

Generating an LDPC-CC in this way enables a regular LDPC-CC code to be generated. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained in the same way as in the case of a coding rate of ½.

Table 3 shows examples of LDPC-CCs (LDPC-CCs #1, #2, #3, #4, and #5) of a time varying period of 3 and a coding rate of ½ for which the above "remainder" related condition holds true. In table 3, LDPC-CCs of a time varying period of 3 are defined by three parity check polynomials: "check (polynomial) equation #1," "check (polynomial) equation #2" and "check (polynomial) equation #3."

TABLE 3

| Code | Parity check polynomial |
|---|---|
| LDPC-CC #1 of a time varying period of 3 and a coding rate of ½ | Check polynomial #1: $(D^{428} + D^{325} + 1) \times (D) + (D^{538} + D^{332} + 1)P(D) = 0$<br>Check polynomial #2: $(D^{538} + D^{380} + 1) \times (D) + (D^{449} + D^{1} + 1)P(D) = 0$<br>Check polynomial #3: $(D^{583} + D^{170} + 1) \times (D) + (D^{364} + D^{242} + 1)P(D) = 0$ |
| LDPC-CC #2 of a time varying period of 3 and a coding rate of ½ | Check polynomial #1: $(D^{562} + D^{71} + 1) \times (D) + (D^{325} + D^{155} + 1)P(D) = 0$<br>Check polynomial #2: $(D^{215} + D^{106} + 1) \times (D) + (D^{566} + D^{142} + 1)P(D) = 0$<br>Check polynomial #3: $(D^{590} + D^{559} + 1) \times (D) + (D^{127} + D^{110} + 1)P(D) = 0$ |
| LPC-CC #3 of a time varying period of 3 and a coding rate of ½ | Check polynomial #1: $(D^{112} + D^{53} + 1) \times (D) + (D^{110} + D^{88} + 1)P(D) = 0$<br>Check polynomial #2: $(D^{103} + D^{47} + 1) \times (D) + (D^{85} + D^{83} + 1)P(D) = 0$<br>Check polynomial #3: $(D^{148} + D^{89} + 1) \times (D) + (D^{146} + D^{49} + 1)P(D) = 0$ |
| LDPC-CC #4 of a time varying period of 3 and a coding rate of ½ | Check polynomial #1: $(D^{350} + D^{322} + 1) \times (D) + (D^{448} + D^{338} + 1)P(D) = 0$<br>Check polynomial #2: $(D^{529} + D^{32} + 1) \times (D) + (D^{238} + D^{188} + 1)P(D) = 0$<br>Check polynomial #3: $(D^{592} + D^{572} + 1) \times (D) + (D^{578} + D^{568} + 1)P(D) = 0$ |
| LDPC-CC #5 of a time varying period of 3 and a coding rate of ½ | Check polynomial #1: $(D^{410} + D^{82} + 1) \times (D) + (D^{835} + D^{47} + 1)P(D) = 0$<br>Check polynomial #2: $(D^{875} + D^{796} + 1) \times (D) + (D^{962} + D^{871} + 1)P(D) = 0$<br>Check polynomial #3: $(D^{605} + D^{547} + 1) \times (D) + (D^{950} + D^{439} + 1)P(D) = 0$ |
| LDPC-CC #6 of a time varying period of 3 and a coding rate of ½ | Check polynomial #1: $(D^{373} + D^{56} + 1) \times (D) + (D^{406} + D^{218} + 1)P(D) = 0$<br>Check polynomial #2: $(D^{457} + D^{197} + 1) \times (D) + (D^{491} + D^{22} + 1)P(D) = 0$<br>Check polynomial #3: $(D^{485} + D^{70} + 1) \times (D) + (D^{236} + D^{181} + 1)P(D) = 0$ |

It has been confirmed that, as in the case of a time varying period of 3, a code with good characteristics can be found if the condition about "remainder" below is applied to an LDPC-CC for which the time varying period is a multiple of 3 (for example, 6, 9, 12, . . . ). An LDPC-CC of a multiple of a time varying period of 3 with good characteristics is described below. The case of an LDPC-CC of a coding rate of ½ and a time varying period of 6 is described below as an example.

Consider equations 9-1 to 9-6 as parity check polynomials of an LDPC-CC for which the time varying period is 6. [9]

$$(D^{a1,1}+D^{a1,2}+D^{a1,3})X(D)+(D^{b1,1}+D^{b1,2}+D^{b1,3})P(D)=0 \quad \text{(Equation 9-1)}$$

$$(D^{a2,1}+D^{a2,2}+D^{a2,3})X(D)+(D^{b2,1}+D^{b2,2}+D^{b2,3})P(D)=0 \quad \text{(Equation 9-2)}$$

$$(D^{a3,1}+D^{a3,2}+D^{a3,3})X(D)+(D^{b3,1}+D^{b3,2}+D^{b3,3})P(D)=0 \quad \text{(Equation 9-3)}$$

$$(D^{a4,1}+D^{a4,2}+D^{a4,3})X(D)+(D^{b4,1}+D^{b4,2}+D^{b4,3})P(D)=0 \quad \text{(Equation 9-4)}$$

$$(D^{a5,1}+D^{a5,2}+D^{a5,3})X(D)+(D^{b5,1}+D^{b5,2}+D^{b5,3})P(D)=0 \quad \text{(Equation 9-5)}$$

$$(D^{a6,1}+D^{a6,2}+D^{a6,3})X(D)+(D^{b6,1}+D^{b6,2}+D^{b6,3})P(D)=0 \quad \text{(Equation 9-6)}$$

At this time, X(D) is a polynomial representation of data (information) and P(D) is a parity polynomial representation. With an LDPC-CC of a time varying period of 6, if i %6=k (where k=0, 1, 2, 3, 4, 5) is assumed for parity Pi and information Xi at time i, a parity check polynomial of equation 9-(k+1) holds true. For example, if i=1, i %6=1 (k=1), and therefore equation 10 holds true.

(Equation 10)

$$(D^{a2,1}+D^{a2,2}+D^{a2,3})X_1+(D^{b2,1}+D^{b2,2}+D^{b2,3})P_1=0 \quad [10]$$

Here, in equations 9-1 to 9-6, parity check polynomials are assumed such that there are three terms in X(D) and P(D) respectively.

In equation 9-1, it is assumed that a1,1, a1,2, a1,3 are integers (where a1,1≠a1,2≠a1,3). Also, it is assumed that b1,1, b1,2, and b1,3 are integers (where b1,1≠b1,2≠b1,3). A parity check polynomial of equation 9-1 is called "check equation #1," and a sub-matrix based on the parity check polynomial of equation 9-1 is designated first sub-matrix $H_1$.

In equation 9-2, it is assumed that a2,1, a2,2, and a2,3 are integers (where a2,1≠a2,2≠a2,3). Also, it is assumed that b2,1, b2,2, b2,3 are integers (where b2,1≠b2,2≠b2,3). A parity check polynomial of equation 9-2 is called "check equation #2," and a sub-matrix based on the parity check polynomial of equation 9-2 is designated second sub-matrix $H_2$.

In equation 9-3, it is assumed that a3,1, a3,2, and a3,3 are integers (where a3,1≠a3,2≠a3,3). Also, it is assumed that b3,1, b3,2, and b3,3 are integers (where b3,1≠b3,2≠b3,3). A parity check polynomial of equation 9-3 is called "check equation #3," and a sub-matrix based on the parity check polynomial of equation 9-3 is designated third sub-matrix $H_3$.

In equation 9-4, it is assumed that a4,1, a4,2, and a4,3 are integers (where a4,1≠a4,2≠a4,3). Also, it is assumed that b4,1, b4,2, and b4,3 are integers (where b4,1≠b4,2≠b4,3). A parity check polynomial of equation 9-4 is called "check equation #4," and a sub-matrix based on the parity cheek polynomial of equation 9-4 is designated fourth sub-matrix $H_4$.

In equation 9-5, it is assumed that a5,1, a5,2, and a5,3 are integers (where a5,1≠a5,2≠a5,3). Also, it is assumed that b5,1, b5,2, and b5,3 are integers (where b5,1≠b5,2≠b5,3). A parity check polynomial of equation 9-5 is called "check equation #5," and a sub-matrix based on the parity check polynomial of equation 9-5 is designated fifth sub-matrix $H_5$.

In equation 9-6, it is assumed that a6,1, a6,2, and a6,3 are integers (where a6,1≠a6,2≠a6,3). Also, it is assumed that b6,1, b6,2, and b6,3 are integers (where b6,1≠b6,2≠b6,3). A parity check polynomial of equation 9-6 is called "check equation #6," and a sub-matrix based on the parity check polynomial of equation 9-6 is designated sixth sub-matrix $H_6$.

Next, an LDPC-CC of a time varying period of 6 is considered that is generated from first sub-matrix $H_1$, second sub-matrix $H_2$, third sub-matrix $H_3$, fourth sub-matrix $H_4$, fifth sub-matrix $H_5$ and sixth sub-matrix $H_6$.

At this time, if k is designated as a remainder after dividing the values of combinations of orders of X(D) and P(D), (a1,1, a1,2, a1,3), (b1,1, b1,2, b1,3), (a2,1, a2,2, a2,3), (b2,1, b2,2, b2,3), (a3,1, a3,2, a3,3), (b3,1, b3,2, b3,3), (a4,1, a4,2, a4,3), (b4,1, b4,2, b4,3), (a5,1, a5,2, a5,3), (b5,1, b5,2, b5,3), (a6,1, a6,2, a6,3), (b6,1, b6,2, b6,3), in equations 9-1 to 9-6 by 3, provision is made for one each of remainders 0, 1, and 2 to be included in three-coefficient sets represented as shown above (for example, (a1,1, a1,2, a1,3)), and to hold true for all the above three-coefficient sets. That is to say, provision is made for (a1,1%3, a1,2%3, a1,3%3), (b1,1%3, b1,2%3, b1,3%3), (a2,1%3, a2,2%3, a2,3%3), (b2,1%3, b2,2%3, b2,3%3), (a3,1%3, a3,2%3, a3,3%3), (b3,1%3, b3,2%3, b3,3%3), (a4,1%3, a4,2%3, a4,3%3), (b4,1%3, b4,2%3, b4,3%3), (a5,1%3, a5,2%3, a5,3%3), (b5,1%3, b5,2%3, b5,3%3), (a6,1%3, a6,2%3, a6,3%3) and (b6,1%3, b6,2%3, b6,3%3) to be any of the following: (0, 1, 2), (0, 2, 1), (1, 0, 2), (1, 2, 0), (2, 0, 1), (2, 1, 0).

By generating an LDPC-CC in this way, if an edge is present when a Tanner graph is drawn for "check equation #1," belief in "check equation #2 or check equation #5" and belief in "cheek equation #3 or check equation #6" are propagated accurately.

Also, if an edge is present when a Tanner graph is drawn for "check equation #2," belief in "check equation #1 or check equation #4" and belief in "check equation #3 or check equation #6" are propagated accurately.

If an edge is present when a Tanner graph is drawn for "check equation #3," belief in "check equation #1 or check equation #4" and belief in "check equation #2 or check equation #5" are propagated accurately. If an edge is present when a Tanner graph is drawn for "check equation #4," belief in "check equation #2 or check equation #5" and belief in "check equation #3 or check equation #6" are propagated accurately.

If an edge is present when a Tanner graph is drawn for "check equation #5," belief in "check equation #1 or check equation #4" and belief in "check equation #3 or check equation #6" are propagated accurately. If an edge is present when a Tanner graph is drawn for "check equation #6," belief in "cheek equation #1 or check equation #4" and belief in "check equation #2 or check equation #5" are propagated accurately.

Consequently, an LDPC-CC of a time varying period of 6 can maintain better error correction capability in the same way as when the time varying period is 3.

Figure 26C:
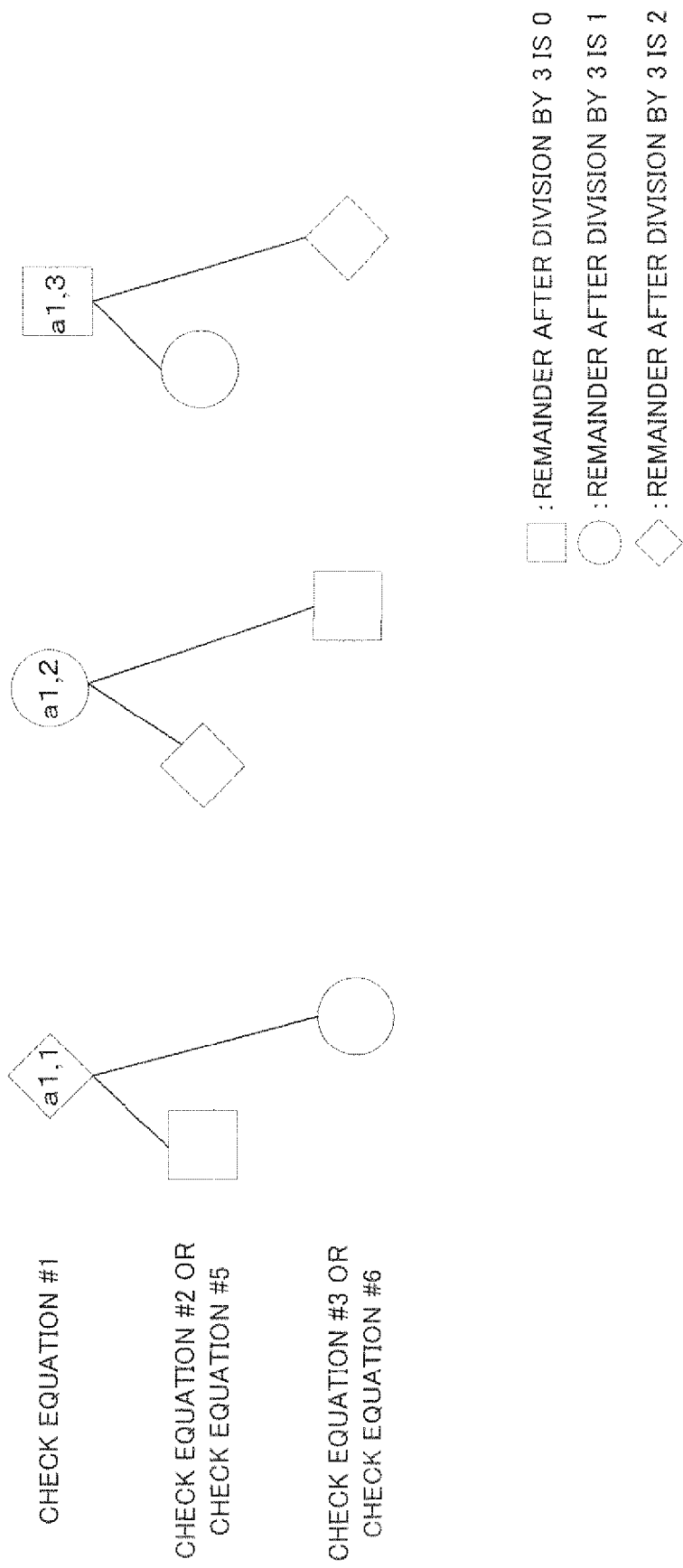
FIG. 26C shows the belief propagation relationship of terms relating to X(D) of "check equation #1" to "check equation #6"

In this regard, belief propagation will be described using FIG. 26C. FIG. 26C shows the belief propagation relationship of terms relating to X(D) of "check equation #1" to "check equation #6." In FIG. 26C, a square indicates a coefficient for which a remainder after division by 3 in ax,y (where x=2, 3, 4, 5, 6, and y=1, 2, 3) is 0.

A circle indicates a coefficient for which a remainder after division by 3 in ax,y (where x=1, 2, 3, 4, 5, 6, and y=1, 2, 3) is 1. A diamond-shaped box indicates a coefficient for which a remainder after division by 3 in ax,y (where x=1, 2, 3, 4, 5, 6, and y=1, 2, 3) is 2.

As can be seen from FIG. 26C, if an edge is present when a Tanner graph is drawn, for a1,1 of "check equation #1," belief is propagated from "check equation #2 or #5" and "check equation #3 or #6" for which remainders after division by 3 differ. Similarly, if an edge is present when a Tanner graph is drawn, for a1,2 of "check equation #1," belief is propagated from "check equation #2 or #5" and "check equation #3 or #6" for which remainders after division by 3 differ.

Similarly, if an edge is present when a Tanner graph is drawn, for a1,3 of "check equation #1," belief is propagated from "check equation #2 or #5" and "check equation #3 or #6" for which remainders after division by 3 differ. While FIG. 26C shows the belief propagation relationship of terms relating to X(D) of "check equation #1" to "check equation #6," the same applies to terms relating to P(D).

Thus, belief is propagated to each node in a Tanner graph of "check equation #1" from coefficient nodes of other than "check equation #1." Therefore, beliefs with low correlation are all propagated to "check equation 41," enabling an improvement in error correction capability to be expected.

In FIG. 26C, "check equation #1" has been focused upon, but a Tanner graph can be drawn in a similar way for "check equation #2" to "check equation #6," and belief is propagated to each node in a Tanner graph of "check equation #K" from coefficient nodes of other than "check equation #K."

Therefore, beliefs with low correlation are all propagated to "check equation #K" (where K=2, 3, 4, 5, 6), enabling an improvement in error correction capability to be expected.

By providing for the orders of parity cheek polynomials of equations 9-1 to 9-6 to satisfy the above condition about "remainder" in this way, belief can be propagated efficiently in all check equations, and the possibility of being able to further improve error correction capability is increased.

A case in which the coding rate is ½ has been described above for an LDPC-CC of a time varying period of 6, but the coding rate is not limited to ½. The possibility of obtaining good received quality can be increased when the coding rate is (n−1)/n (where n is an integer equal to or greater than 2) if the above condition about "remainder" holds true for three-coefficient sets in information X1(D), X2(D), . . . , Xn−1(D).

A case in which the coding rate is (n−1)/n (where n is an integer equal to or greater than 2) is described below.

Consider equations 11-1 to 11-6 as parity check polynomials of an LDPC-CC for which the time varying period is 6.

[11]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\ldots$$

$$+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 11-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\ldots$$

$$+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 11-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\ldots$$

$$+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 11-3)}$$

$$(D^{a\#4,1,1}+D^{a\#4,1,2}+D^{a\#4,1,3})X_1(D)+(D^{a\#4,2,1}+D^{a\#4,2,2}+D^{a\#4,2,3})X_2(D)+\ldots$$

$$+(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \quad \text{(Equation 11-4)}$$

$$(D^{a\#5,1,1}+D^{a\#5,1,2}+D^{a\#5,1,3})X_1(D)+(D^{a\#5,2,1}+D^{a\#5,2,2}+D^{a\#5,2,3})X_2(D)+\ldots$$

$$+(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \quad \text{(Equation 11-5)}$$

$$(D^{a\#6,1,1}+D^{a\#6,1,2}+D^{a\#6,1,3})X_1(D)+(D^{a\#6,2,1}+D^{a\#6,2,2}+D^{a\#6,2,3})X_2(D)+\ldots$$

$$+(D^{a\#6,n-1,1}+D^{a\#6,n-1,2}+D^{a\#6,n-1,3})X_{n-1}(D)+(D^{b\#6,1}+D^{b\#6,2}+D^{b\#6,3})P(D)=0 \quad \text{(Equation 11-6)}$$

At this time, X1(D), X2(D), . . . , Xn−1(D) are polynomial representations of data (information) X1, X2, . . . , Xn−1, and P(D) is a polynomial representation of parity. Here, in equations 11-1 to 11-6, parity check polynomials are assumed such that there are three terms in X1 (D), X2(D), . . . , Xn−1 (D), and P(D) respectively. As in the case of the above coding rate of ½, and in the case of a time varying period of 3, the possibility of being able to obtain higher error correction capability is increased if the condition below (<Condition #1>) is satisfied in an LDPC-CC of a time varying period of 6 and a coding rate of (n−1)/n (where n is an integer equal to or greater than 2) represented by parity check polynomials of equations 11-1 to 11-6.

In an LDPC-CC of a time varying period of 6 and a coding rate of (n−1)/n (where n is an integer equal to or greater than 2), parity and information at time i are represented by Pi and $X_{i,1}, X_{i,2}, \ldots, X_{i,n-1}$ respectively. If i %6=k (where k=0, 1, 2, 3, 4, 5) is assumed at this time, a parity check polynomial of equation 11-(k+1) holds true. For example, if i=8, i %6=2 (k=2), and therefore equation 12 holds true.

[12]

$$(D^{a\#3,1,1}+D^{a\#3,1,2}+D^{a\#3,1,3})X_{8,1}+(D^{a\#3,2,1}+D^{a\#3,2,2}+D^{a\#3,2,3})X_{8,2}+\ldots$$

$$+(D^{a\#3,n-1,1}+D^{a\#3,n-1,2}+D^{a\#3,n-1,3})X_{8,n-1}+(D^{b\#3,1}+D^{b\#3,2}+D^{b\#3,3})P_8=0 \quad \text{(Equation 12)}$$

<Condition #1>

In equations 11-1 to 11-6, combinations of orders of X1(D), X2(D), . . . , Xn−1(D), and P(D) satisfy the following condition:

$(a_{\#1,1,1}\%3, a_{\#1,1,2}\%3, a_{\#1,1,3}\%3), (a_{\#1,2,1}\%3, a_{\#1,2,2}\%3, a_{\#1,2,3}\%3), \ldots, (a_{\#1,k,1}\%3, a_{\#1,k,2}\%3, a_{\#1,k,3}\%3), \ldots, (a_{\#1,n-1,1}\%3, a_{\#1,n-1,2}\%3, a_{\#1,n-1,3}\%3)$ and $(b_{\#1,1}\%3, b_{\#1,2}\%3, b_{\#1,3}\%3)$ are any of (0, 1, 2), (0, 2, 1), (1, 0, 2), (1, 2, 0), (2, 0, 1), or (2, 1, 0) (where k=1, 2, 3, . . . , n−1);

$(a_{\#2,1,1}\%3, a_{\#2,1,2}\%3, a_{\#2,1,3}\%3), (a_{\#2,2,1}\%3, a_{\#2,2,2}\%3, a_{\#2,2,3}\%3), \ldots, (a_{\#2,k,1}\%3, a_{\#2,k,2}\%3, a_{\#2,k,3}\%3), \ldots, (a_{\#2,n-1,1}\%3, a_{\#2,n-1,2}\%3, a_{\#2,n-1,3}\%3)$ and $(b_{\#2,1}\%3, b_{\#2,2}\%3, b_{\#2,3}\%3)$ are any of (0, 1, 2), (0, 2, 1), (1, 0, 2), (1, 2, 0), (2, 0, 1), or (2, 1, 0) (where k=1, 2, 3, n−1);

$(a_{\#3,1,1}\%3, a_{\#3,1,2}\%3, a_{\#3,1,3}\%3), (a_{\#3,2,1}\%3, a_{\#3,2,2}\%3, a_{\#3,2,3}\%3), \ldots, (a_{\#3,k,1}\%3, a_{\#3,k,2}\%3, a_{\#3,k,3}\%3), \ldots, (a_{\#3,n-1,1}\%3, a_{\#3,n-1,3}\%3)$ and $(b_{\#3,1}\%3, b_{\#3,2}\%3, b_{\#3,3}\%3)$ are any of (0, 1, 2), (0, 2, 1), (1, 0, 2), (1, 2, 0), (2, 0, 1), or (2, 1, 0) (where k=1, 2, 3, n−1);

$(a_{\#4,1,1}\%3, a_{\#4,1,2}\%3, a_{\#4,1,3}\%3), (a_{\#4,2,1}\%3, a_{\#4,2,2}\%3, a_{\#4,2,3}\%3), \ldots, (a_{\#4,k,1}\%3, a_{\#4,k,2}\%3, a_{\#4,k,3}\%3), \ldots, (a_{\#4,n-1,1}\%3, a_{\#4,n-1,2}\%3, a_{\#4,n-1,3}\%3)$ and $(b_{\#4,1}\%3, b_{\#4,2}\%3, b_{\#4,3}\%3)$ are any of (0, 1, 2), (0, 2, 1), (1, 0, 2), (1, 2, 0), (2, 0, 1), or (2, 1, 0) (where k=1, 2, 3, n−1);

$(a_{\#5,1,1}\%3, a_{\#5,1,2}\%3, a_{\#5,1,3}\%3), (a_{\#5,2,1}\%3, a_{\#5,2,2}\%3, a_{\#5,2,3}\%3), \ldots, (a_{\#5,k,1}\%3, a_{\#5,k,2}\%3, a_{\#5,k,3}\%3), \ldots, (a_{\#5,n-1,1}\%3, a_{\#5,n-1,2}\%3, a_{\#5,n-1,3}\%3)$ and $(b_{\#5,1}\%3, b_{\#5,2}\%3, b_{\#5,3}\%3)$ are any of (0, 1, 2), (0, 2, 1), (1, 0, 2), (1, 2, 0), (2, 0, 1), or (2, 1, 0) (where k=1, 2, 3, n−1); and $(a_{\#6,1,1}\%3, a_{\#6,1,2}\%3, a_{\#6,1,3}\%3), (a_{\#6,2,1}\%3, a_{\#6,2,2}\%3, a_{\#6,2,3}\%3), \ldots, (a_{\#6,k,1}\%3, a_{\#6,k,2}\%3, a_{\#6,k,3}\%3), \ldots, (a_{\#6,n-1,1}\%3; a_{\#6,n-1,2}\%3, a_{\#6,n-1,3}\%3)$ and $(b_{\#6,1}\%3, b_{\#6,2}\%3, b_{\#6,3}\%3)$ are any of (0, 1, 2), (0, 2, 1), (1, 0, 2), (1, 2, 0), (2, 0, 1), or (2, 1, 0) (where k=1, 2, 3, n−1).

In the above description, a code having high error correction capability has been described for an LDPC-CC of a time varying period of 6, but a code having high error correction capability can also be generated when an LDPC-CC of a time varying period of 3g (where g=1, 2, 3, 4, . . . ) (that is, an LDPC-CC for which the time varying period is a multiple of 3) is created in the same way as with the design method for an LDPC-CC of a time varying period of 3 or 6. A configuration method for this code is described in detail below.

Consider equations 13-1 to 13-3g as parity check polynomials of an LDPC-CC for which the time varying period is 3g (where g=1, 2, 3, 4, . . . ) and the coding rate is (n−1)/n (where n is an integer equal to or greater than 2).

[13]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\ldots$$

$$+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 13-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\ldots$$

$$+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 13-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\ldots$$

$$+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 13-3)}$$

•

•

•

$$(D^{a\#k,1,1}+D^{a\#k,1,2}+D^{a\#k,1,3})X_1(D)+(D^{a\#k,2,1}+D^{a\#k,2,2}+D^{a\#k,2,3})X_2(D)+\ldots$$

$$+(D^{a\#k,n-1,1}+D^{a\#k,n-1,2}+D^{a\#k,n-1,3})X_{n-1}(D)+(D^{b\#k,1}+D^{b\#k,2}+D^{b\#k,3})P(D)=0 \quad \text{(Equation 13-k)}$$

•

•

•

$$(D^{a\#3g-2,1,1}+D^{a\#3g-2,1,2}+D^{a\#3g-2,1,3})X_1(D)+(D^{a\#3g-2,2,1}+D^{a\#3g-2,2,2}+D^{a\#3g-2,2,3})X_2(D)+\ldots$$

$$+(D^{a\#3g-2,n-1,1}+D^{a\#3g-2,n-1,2}+D^{a\#3g-2,n-1,3})X_{n-1}(D)+(D^{b\#3g-2,1}+D^{b\#3g-2,2}+D^{b\#3g-2,3})P(D)=0 \quad \text{(Equation 13-(3g-2))}$$

$$(D^{a\#3g-1,1,1}+D^{a\#3g-1,1,2}+D^{a\#3g-1,1,3})X_1(D)+(D^{a\#3g-1,2,1}+D^{a\#3g-1,2,2}+D^{a\#3g-1,2,3})X_2(D)+\ldots$$

$$+(D^{a\#3g-1,n-1,1}+D^{a\#3g-1,n-1,2}+D^{a\#3g-1,n-1,3})X_{n-1}(D)+$$
$$(D^{b\#3g-1,1}+D^{b\#3g-1,2}+D^{b\#3g-1,3})P(D)=0 \quad \text{(Equation 13-(3g-1))}$$

$$(D^{a\#3g,1,1}+D^{a\#3g,1,2}+D^{a\#3g,1,3})X_1(D)+(D^{a\#3g,2,1}+D^{a\#3g,2,2}+D^{a\#3g,2,3})X_2(D)+\ldots$$

$$+(D^{a\#3g,n-1,1}+D^{a\#3g,n-1,2}+D^{a\#3g,n-1,3})X_{n-1}(D)+$$
$$(D^{b\#3g,1}+D^{b\#3g,2}+D^{b\#3g,3})P(D)=0 \quad \text{(Equation 13-3g)}$$

At this time, X1(D), X2(D), ..., Xn−1(D) are polynomial representations of data (information) X1, X2, ..., Xn−1, and P(D) is a polynomial representation of parity. Here, in equations 13-1 to 13-3g, parity check polynomials are assumed such that there are three terms in X1 (D), X2(D), ..., Xn−1(D), and P(D) respectively.

As in the case of an LDPC-CC of a time varying period of 3 and an LDPC-CC of a time varying period of 6, the possibility of being able to obtain higher error correction capability is increased if the condition below (<Condition #2>) is satisfied in an LDPC-CC of a time varying period of 3g and a coding rate of (n−1)/n (where n is an integer equal to or greater than 2) represented by parity check polynomials of equations 13-1 to 13-3g.

In an LDPC-CC of a time varying period of 3g and a coding rate of (n−1)/n (where n is an integer equal to or greater than 2), parity and information at time i are represented by $P_i$ and $X_{i,1}, X_{i,2}, \ldots, X_{i,n-1}$ respectively. If i %3g=k (where k=0, 1, 2, ..., 3g−1) is assumed at this time, a parity check polynomial of equation 13-(k+1) holds true. For example, if i=2, i %3=2 (k=2), and therefore equation 14 holds true.

[14]

$$(D^{a\#3,1,1}+D^{a\#3,1,2}+D^{a\#3,1,3})X_{2,1}+(D^{a\#3,2,1}+D^{a\#3,2,2}+D^{a\#3,2,3})X_{2,2}+\ldots$$

$$+(D^{a\#3,n-1,1}+D^{a\#3,n-1,2}+D^{a\#3,n-1,3})X_{2,n-1}+(D^{b\#3,1}+D^{b\#3,2}+D^{b\#3,3})P_2=0 \quad \text{(Equation 14)}$$

In equations 13-1 to 13-3g, it is assumed that $a_{\#k,p,1}, a_{\#k,p,2}$ and $a_{\#k,p,3}$ are integers (where $a_{\#k,p,1} \neq a_{\#k,p,2} \neq a_{\#k,p,3}$) (where k=1, 2, 3, ..., 3g, and p=1, 2, 3, ..., n−1). Also, it is assumed that $b_{\#k,1}$, $b_{\#k,2}$ and $b_{\#k,3}$ are integers (where $b_{\#k,1} \neq b_{\#k,2} \neq b_{\#k,3}$). A parity check polynomial of equation 13-k (where k=1, 2, 3, ..., 3g) is called "check equation #k," and a sub-matrix based on the parity check polynomial of equation 13-k is designated k-th sub-matrix $H_k$. Next, an LDPC-CC of a time varying period of 3g is considered that is generated from first sub-matrix $H_1$, second sub-matrix $H_2$, third sub-matrix $H_3$, ..., and 3g-th sub-matrix $H_{3g}$.

<Condition #2>

In equations 13-1 to 13-3g, combinations of orders of X1(D), X2(D), ..., Xn−1(D), and P(D) satisfy the following condition:

($a_{\#1,1,1}$%3, $a_{\#1,1,2}$%3, $a_{\#1,1,3}$%3), ($a_{\#1,2,1}$%3, $a_{\#1,2,2}$%3, $a_{\#1,2,3}$%3), ..., ($a_{\#1,p,1}$%3, $a_{\#1,p,2}$%3, $a_{\#1,p,3}$%3), ..., ($a_{\#1,n-1,1}$%3, $a_{\#1,n-1,2}$%3, $a_{\#1,n-1,3}$%3) and ($b_{\#1,1}$%3, $b_{\#1,2}$%3, $b_{\#1,3}$%3) are any of (0, 1, 2), (0, 2, 1), (1, 0, 2), (1, 2, 0), (2, 0, 1), or (2, 1, 0) (where p=1, 2, 3, ..., n−1);

($a_{\#2,1,1}$%3, $a_{\#2,1,2}$%3, $a_{\#2,1,3}$%3), ($a_{\#2,2,1}$%3, $a_{\#2,2,2}$%3, $a_{\#2,2,3}$%3), ..., ($a_{\#2,p,1}$%3, $a_{\#2,p,2}$%3, $a_{\#2,p,3}$%3), ..., ($a_{\#2,n-1,1}$%3, $a_{\#2,n-1,2}$%3, $a_{\#2,n-1,3}$%3) and ($b_{\#2,1}$%3, $b_{\#2,2}$%3, $b_{\#2,3}$%3) are any of (0, 1, 2), (0, 2, 1), (1, 0, 2), (1, 2, 0), (2, 0, 1), or (2, 1, 0) (where p=1, 2, 3, ..., n−1);

($a_{\#3,1,1}$%3, $a_{\#3,1,2}$%3, $a_{\#3,1,3}$%3), ($a_{\#3,2,1}$%3, $a_{\#3,2,2}$%3, $a_{\#3,2,3}$%3), ..., ($a_{\#3,p,1}$%3, $a_{\#3,p,2}$%3, $a_{\#3,p,3}$%3), ..., ($a_{\#3,n-1,1}$%3, $a_{\#3,n-1,2}$%3, $a_{\#3,n-1,3}$%3) and ($b_{\#3,1}$%3, $b_{\#3,2}$%3, $b_{\#3,3}$%3) are any of (0, 1, 2), (0, 2, 1), (1, 0, 2), (1, 2, 0), (2, 0, 1), or (2, 1, 0) (where p=1, 2, 3, ..., n−1);

...;

($a_{\#k,1,1}$%3, $a_{\#k,1,2}$%3, $a_{\#k,1,3}$%3), ($a_{\#k,2,1}$%3, $a_{\#k,2,2}$%3, $a_{\#k,2,3}$%3), ..., ($a_{\#k,p,1}$%3, $a_{\#k,p,2}$%3, $a_{\#k,p,3}$%3), ..., ($a_{\#k,n-1,1}$%3, $a_{\#k,n-1,2}$%3, $a_{\#k,n-1,3}$%3) and ($b_{\#k,1}$%3, $b_{\#k,2}$%3, $b_{\#k,3}$%3) are any of (0, 1, 2), (0, 2, 1), (1, 0, 2), (1, 2, 0), (2, 0, 1), or (2, 1, 0) (where p=1, 2, 3, ..., n−1) (where, k=1, 2, 3, ..., 3g);

...;

($a_{\#3g-2,1,1}$%3, $a_{\#3g-2,1,2}$%3, $a_{\#3g-2,1,3}$%3), ($a_{\#3g-2,2,1}$%3, $a_{\#3g-2,2,2}$%3, $a_{\#3g-2,2,3}$%3), ..., ($a_{\#3g-2,p,1}$%3, $a_{\#3g-2,p,2}$%3, $a_{\#3g-2,p,3}$%3), ..., ($a_{\#3g-2,n-1,1}$%3, $a_{\#3g-2,n-1,2}$%3, $a_{\#3g-2,n-1,3}$%3), and ($b_{3g-2,1}$%3, $b_{\#3g-2,2}$%3, $b_{\#3g-2,3}$%3) are any of (0, 1, 2), (0, 2, 1), (1, 0, 2), (1, 2, 0), (2, 0, 1), or (2, 1, 0) (where p=1, 2, 3, ..., n−1);

($a_{\#3g-1,1,1}$%3, $a_{\#3g-1,1,2}$%3, $a_{\#3g-1,1,3}$%3), ($a_{\#3g-1,2,1}$%3, $a_{\#3g-1,2,2}$%3, $a_{\#3g-1,2,3}$%3), ..., ($a_{\#3g-1,p,1}$%3, $a_{\#3g-1,p,2}$%3, $a_{\#3g-1,p,3}$%3), ..., ($a_{\#3g-1,n-1,1}$%3, $a_{\#3g-1,n-1,2}$%3, $a_{\#3g-1,n-1,3}$%3) and ($b_{\#3g-1,1}$%3, $b_{\#3g-1,2}$%3, $b_{\#3g-1,3}$%3) are any of (0, 1, 2), (0, 2, 1), (1, 0, 2), (1, 2, 0), (2, 0, 1), or (2, 1, 0) (where p=1, 2, 3, ..., n−1); and ($a_{\#3g,1,1}$%3, $a_{\#3g,1,2}$%3, $a_{\#3g,1,3}$%3), ($a_{\#3g,2,1}$%3, $a_{\#3g,2,2}$%3, $a_{\#3g,2,3}$%3), ..., ($a_{\#3g,p,1}$%3, $a_{\#3g,p,2}$%3, $a_{\#3g,p,3}$%3), ..., ($a_{\#3g,n-1,1}$%3, $a_{\#3g,n-1,2}$%3, $a_{\#3g,n-1,3}$%3) and ($b_{\#3g,1}$%3, $b_{\#3g,2}$%3, $b_{\#3g,3}$%3) are any of (0, 1, 2), (0, 2, 1), (1, 0, 2), (1, 2, 0), (2, 0, 1), or (2, 1, 0) (where p=1, 2, 3, ..., n−1).

Here, as described with other parts than the present embodiment, taking ease of performing encoding into consideration, it is desirable for one "0" to be present among the three items ($b_{\#k,1}$%3, $b_{\#k,2}$%3, $b_{\#k,3}$%3) (where k=1, 2, 3g) in equations 13-1 to 13-3g.

Also, in order to provide relevancy between parity bits and data bits of the same point in time, and to facilitate a search for a code having high correction capability, it is desirable for:

one "0" to be present among the three items ($a_{\#k,1,1}$%3, $a_{\#k,1,2}$%3, $a_{\#k,1,3}$%3);

one "0" to be present among the three items ($a_{\#k,2,1}$%3, $a_{\#k,2,2}$%3, $a_{\#k,2,3}$%3);

...;

one "0" to be present among the three items ($a_{\#k,p,1}$%3, $a_{\#k,p,2}$%3, $a_{\#k,p,3}$%3);

...; and one "0" to be present among the three items ($a_{\#k,n-1,1}$%3, $a\#_{k,n-1,2}$%3, $a_{\#k,n-1,3}$%3), (where k=1, 2, ..., 3g).

Next, an LDPC-CC of a time varying period of 3g (where g=2, 3, 4, 5, ... ) that takes ease of encoding into account is considered. At this time, if the coding rate is (n−1)/n (where n is an integer equal to or greater than 2), LDPC-CC parity check polynomials can be represented as shown below.

[15]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\ldots$$

$$+(D^{a\#1,n-1,1}+D^{a\#1,n-1,2}+D^{a\#1,n-1,3})X_{n-1}(D)+(D^{b\#1,1}+D^{b\#1,2}+1)P(D)=0 \quad \text{(Equation 15-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\ldots$$

$$+(D^{a\#2,n-1,1}+D^{a\#2,n-1,2}+D^{a\#2,n-1,3})X_{n-1}(D)+(D^{b\#2,1}+D^{b\#2,2}+1)P(D)=0 \quad \text{(Equation 15-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\ldots$$

$$+(D^{a\#3,n-1,1}+D^{a\#3,n-1,2}+D^{a\#3,n-1,3})X_{n-1}(D)+(D^{b\#3,1}+D^{b\#3,2}+1)P(D)=0 \quad \text{(Equation 15-3)}$$

●

●

●

$$(D^{a\#k,1,1}+D^{a\#k,1,2}+D^{a\#k,1,3})X_1(D)+(D^{a\#k,2,1}+D^{a\#k,2,2}+D^{a\#k,2,3})X_2(D)+\ldots$$

$$+(D^{a\#k,n-1,1}+D^{a\#k,n-1,2}+D^{a\#k,n-1,3})X_{n-1}(D)+(D^{b\#k,1}+D^{b\#k,2}+1)P(D)=0 \quad \text{(Equation 15-k)}$$

•

•

•

$$(D^{a\#3g-2,1,1}+D^{a\#3g-2,1,2}+D^{a\#3g-2,1,3})X_1(D)+$$
$$(D^{a\#3g-2,2,1}+D^{a\#3g-2,2,2}+D^{a\#3g-2,2,3})X_2(D)+\ldots$$

$$+(D^{a\#3g-2,n-1,1}+D^{a\#3g-2,n-1,2}+D^{a\#3g-2,n-1,3})X_{n-1}(D)+$$
$$(D^{b\#3g-2,1}+D^{b\#3g-2,2}+1)P(D)=0 \quad \text{(Equation 15-(3g-2))}$$

$$(D^{a\#3g-1,1,1}+D^{a\#3g-1,1,2}+D^{a\#3g-1,1,3})X_1(D)+$$
$$(D^{a\#3g-1,2,1}+D^{a\#3g-1,2,2}+D^{a\#3g-1,2,3})X_2(D)+\ldots$$

$$+(D^{a\#3g-1,n-1,1}+D^{a\#3g-1,n-1,2}+D^{a\#3g-1,n-1,3})X_{n-1}(D)+(D^{b\#3g-1,1}+D^{b\#3g-1,2}+1)P(D)=0 \quad \text{(Equation 15-(3g-1))}$$

$$(D^{a\#3g,1,1}+D^{a\#3g,1,2}+D^{a\#3g,1,3})X_1(D)+(D^{a\#3g,2,1}+D^{a\#3g,2,2}+D^{a\#3g,2,3})X_2(D)+\ldots$$

$$+(D^{a\#3g,n-1,1}+D^{a\#3g,n-1,2}+D^{a\#3g,n-1,3})X_{n-1}(D)+(D^{b\#3g,1}+D^{b\#3g,2}+1)P(D)=0 \quad \text{(Equation 15-3g)}$$

At this time, $X_1(D)$, $X_2(D)$, ..., $X_{n-1}(D)$ are polynomial representations of data (information) $X_1, X_2, \ldots, X_{n-1}$, and $P(D)$ is a polynomial representation of parity. Here, in equations 15-1 to 15-3g, parity check polynomials are assumed such that there are three terms in $X_1(D), X_2(D), \ldots, X_{n-1}(D)$, and $P(D)$ respectively. In an LDPC-CC of a time varying period of 3g and a coding rate of (n−1)/n (where n is an integer equal to or greater than 2), parity and information at time i are represented by $P_i$ and $X_{i,1}, X_{i,2}, \ldots, X_{i,n-1}$ respectively. If i %3=k (where k=0, 1, 2, ..., 3g−1) is assumed at this time, a parity check polynomial of equation 15-(k+1) holds true. For example, if i=2, i %3=2 (k=2), and therefore equation 16 holds true.

[16]

$$(D^{a\#3,1,1}+D^{a\#3,1,2}+D^{a\#3,1,3})X_{2,1}+(D^{a\#3,2,1}+D^{a\#3,2,2}+D^{a\#3,2,3})X_{2,2}+\ldots$$

$$+(D^{a\#3,n-1,1}+D^{a\#3,n-1,2}+D^{a\#3,n-1,3})X_{2,n-1}+(D^{b\#3,1}+D^{b\#3,2}+1)P_2=0 \quad \text{(Equation 16)}$$

If <Condition #3> and <Condition #4> are satisfied at this time, the possibility of being able to create a code having higher error correction capability is increased.

<Condition #3>

In equations 15-1 to 15-3g, combinations of orders of $X_1(D), X_2(D), \ldots, X_{n-1}(D)$, and $P(D)$ satisfy the following condition:

$(a_{\#1,1,1}\%3, a_{\#1,1,2}\%3, a_{\#1,1,3}\%3)$, $(a_{\#1,2,1}\%3, a_{\#1,2,2}\%3, a_{\#1,2,3}\%3)$, ..., $(a_{\#1,p,1}\%3, a_{\#1,p,2}\%3, a_{\#1,p,3}\%3)$, ..., and $(a_{\#1,n-1,1}\%3, a_{\#1,n-1,2}\%3, a_{\#1,n-1,3}\%3)$ are any of (0, 1, 2), (0, 2, 1), (1, 0, 2), (1, 2, 0), (2, 0, 1), or (2, 1, 0) (where p=1, 2, 3, ..., n−1);

$(a_{\#2,1,1}\%3, a_{\#2,1,2}\%3, a_{\#2,1,3}\%3)$, $(a_{\#2,2,1}\%3, a_{\#2,2,2}\%3, a_{\#2,2,3}\%3)$, ..., $(a_{\#2,p,1}\%3, a_{\#2,p,2}\%3, a_{\#2,p,3}\%3)$, ..., and $(a_{\#2,n-1,1}\%3, a_{\#2,n-1,2}\%3, a_{\#2,n-1,3}\%3)$ are any of (0, 1, 2), (0, 2, 1), (1, 0, 2), (1, 2, 0), (2, 0, 1), or (2, 1, 0) (where p=1, 2, 3, ..., n−1);

$(a_{\#3,1,1}\%3, a_{\#3,1,2}\%3, a_{\#3,1,3}\%3)$, $(a_{\#3,2,1}\%3, a_{\#3,2,2}\%3, a_{\#3,2,3}\%3)$, ..., $(a_{\#3,p,1}\%3, a_{\#3,p,2}\%3, a_{\#3,p,3}\%3)$, ..., and $(a_{\#3,n-1,1}\%3, a_{\#3,n-1,2}\%3, a_{\#3,n-1,3}\%3)$ are any of (0, 1, 2), (0, 2, 1), (1, 0, 2), (1, 2, 0), (2, 0, 1), or (2, 1, 0) (where p=1, 2, 3, ..., n−1);

...;

$(a_{\#k,1,1}\%3, a_{\#k,1,2}\%3, a_{\#k,1,3}\%3)$, $(a_{\#k,2,1}\%3, a_{\#k,2,2}\%3, a_{\#k,2,3}\%3)$, ..., $(a_{\#k,p,1}\%3, a_{\#k,p,2}\%3, a_{\#k,p,3}\%3)$, ..., and $(a_{\#k,n-1,1}\%3, a_{\#k,n-1,2}\%3, a_{\#k,n-1,3}\%3)$ are any of (0, 1, 2), (0, 2, 1), (1, 0, 2), (1, 2, 0), (2, 0, 1), or (2, 1, 0) (where p=1, 2, 3, ..., n−1, and k=1, 2, 3, ..., 3g);

...;

$(a_{\#3g-2,1,1}\%3, a_{\#3g-2,1,2}\%3, a_{\#3g-2,1,3}\%3)$, $(a_{\#3g-2,2,1}\%3, a_{\#3g-2,2,2}\%3, a_{\#3g-2,2,3}\%3)$, ..., $(a_{\#3g-2,p,1}\%3, a_{\#3g-2,p,2}\%3, a_{\#3g-2,p,3}\%3)$, ..., and $(a_{\#3g-2,n-1,1}\%3, a_{3g-2,n-1,2}\%3, a_{\#3g-2,n-1,3}\%3)$ are any of (0, 1, 2), (0, 2, 1), (1, 0, 2), (1, 2, 0), (2, 0, 1), or (2, 1, 0) (where p=1, 2, 3, ..., n−1);

$(a_{\#3g-1,1,1}\%3, a_{\#3g-1,1,2}\%3, a_{\#3g-1,1,3}\%3)$, $(a_{\#3g-1,2,1}\%3, a_{\#3g-1,2,2}\%3, a_{\#3g-1,2,3}\%3)$, ..., $(a_{\#3g-1,p,1}\%3, a_{\#3g-1,p,2}\%3, a_{\#3g-1,p,3}\%3)$, ..., and $(a_{\#3g-1,n-1,1}\%3, a_{\#3g-1,n-1,2}\%3, a_{\#3g-1,n-1,3}\%3)$ are any of (0, 1, 2), (0, 2, 1), (1, 0, 2), (1, 2, 0), (2, 0, 1), or (2, 1, 0) (where p=1, 2, 3, ..., n−1); and $(a_{\#3g,1,1}\%3, a_{\#3g,1,2}\%3, a_{\#3g,1,3}\%3)$, $(a_{\#3g,2,1}\%3, a_{\#3g,2,2}\%3, a_{\#3g,2,3}\%3)$, ..., $(a_{\#3g,p,1}\%3, a_{\#3g,p,2}\%3, a_{\#3g,p,3}\%3)$, ..., and $(a_{\#3g,n-1,1}\%3, a_{\#3g,n-1,2}\%3, a_{\#3g,n-1,3}\%3)$ are any of (0, 1, 2), (0, 2, 1), (1, 0, 2), (1, 2, 0), (2, 0, 1), or (2, 1, 0) (where p=1, 2, 3, ..., n−1).

In addition, in equations 15-1 to 15-3g, combinations of orders of P(D) satisfy the following condition:

$(b_{\#1,1}\%3, b_{\#1,2}\%3)$, $(b_{\#2,1}\%3, b_{\#2,2}\%3)$, $(b_{\#3,1}\%3, b_{\#3,2}\%3)$, ..., $(b_{\#k,1}\%3, b_{\#k,2}\%3)$, ..., $(b_{\#3g-2,1}\%3, b_{\#3g-2,2}\%3)$, $(b_{\#3g-1,1}\%3, b_{\#3g-1,2}\%3)$, and $(b_{\#3g,1}\%3, b_{\#3g,2}\%3)$ are any of (1, 2), or (2, 1) (where k=1, 2, 3, ..., 3g).

<Condition #3> has a similar relationship with respect to equations 15-1 to 15-3g as <Condition #2> has with respect to equations 13-1 to 13-3g. If the condition below (<Condition #4>) is added for equations 15-1 to 15-3g in addition to <Condition #3>, the possibility of being able to create an LDPC-CC having higher error correction capability is increased.

<Condition #4>

Orders of P(D) of equations 15-1 to 15-3g satisfy the following condition:

all values other than multiples of 3 (that is, 0, 3, 6, ..., 3g−3) from among integers from 0 to 3g−1 (0, 1, 2, 3, 4, ..., 3g−2, 3g−1) are present in the values of 6g orders of $(b_{\#1,1}\%3, b_{\#1,2}\%3)$, $(b_{\#2,1}\%3, b_{\#2,2}\%3)$, $(b_{\#3,1}\%3, b_{\#3,2}\%3)$, ..., $(b_{\#k,1}\%3, b_{\#k,2}\%3)$, ..., $(b_{\#3g-2,1}\%3, b_{\#3g-2,2}\%3)$, $(b_{\#3g-1,1}\%3, b_{\#3g-1,2}\%3)$ and $(b_{\#3g,1}\%3, b_{\#3g,2}\%3)$ (in this case, two orders form a pair, and therefore the number of orders forming 3g pairs is 6g).

The possibility of obtaining good error correction capability is high if there is also randomness while regularity is maintained for positions at which "1"s are present in a parity check matrix. With an LDPC-CC for which the time varying period is 3g (where g=2, 3, 4, 5, ...) and the coding rate is (n−1)/n (where n is an integer equal to or greater than 2) that has parity check polynomials of equations 15-1 to 15-3g, if a code is created in which <Condition #4> is applied in addition to <Condition #3>, it is possible to provide randomness while maintaining regularity for positions at which "1"s are present in a parity check matrix, and therefore the possibility of obtaining good error correction capability is increased.

Next, an LDPC-CC of a time varying period of 3g (where g=2, 3, 4, 5, ...) is considered that enables encoding to be performed easily and provides relevancy to parity bits and data bits of the same point in time. At this time, if the coding rate is (n−1)/n (where n is an integer equal to or greater than 2), LDPC-CC parity check polynomials can be represented as shown below.

[17]

$$(D^{a\#1,1,1}+D^{a\#1,1,2}+1)X_1(D)+(D^{a\#1,2,1}+D^{a\#1,2,2}+1)X_2(D)+\ldots$$

$$+(D^{a\#1,n-1,1}+D^{a\#1,n-1,2}+1)X_{n-1}(D)+(D^{b\#1,1}+D^{b\#1,2}+1)P(D)=0 \quad \text{(Equation 17-1)}$$

$$(D^{a\#2,1,1}+D^{a\#2,1,2}+1)X_1(D)+(D^{a\#2,2,1}+D^{a\#2,2,2}+1)X_2(D)+\ldots$$

$$+(D^{a\#2,n-1,1}+D^{a\#2,n-1,2}+1)X_{n-1}(D)+(D^{b\#2,1}+D^{b\#2,2}+1)P(D)=0 \quad \text{(Equation 17-2)}$$

$$(D^{a\#3,1,1}+D^{a\#3,1,2}+1)X_1(D)+(D^{a\#3,2,1}+D^{a\#3,2,2}+1)X_2(D)+\ldots$$

$$+(D^{a\#3,n-1,1}+D^{a\#3,n-1,2}+1)X_{n-1}(D)+(D^{b\#3,1}+D^{b\#3,2}+1)P(D)=0 \quad \text{(Equation 17-3)}$$

•

•

•

$$(D^{a\#k,1,1}+D^{a\#k,1,2}+1)X_1(D)+(D^{a\#k,2,1}+D^{a\#k,2,2}+1)X_2(D)+\ldots$$

$$+(D^{a\#k,n-1,1}+D^{a\#k,n-1,2}+1)X_{n-1}(D)+(D^{b\#k,1}+D^{b\#k,2}+1)P(D)=0 \quad \text{(Equation 17-k)}$$

•

•

•

$$(D^{a\#3g-2,1,1}+D^{a\#3g-2,1,2}+1)X_1(D)+(D^{a\#3g-2,2,1}+D^{a\#3g-2,2,2}+1)X_2(D)+\ldots$$

$$+(D^{a\#3g-2,n-1,1}+D^{a\#3g-2,n-1,2}+1)X_{n-1}(D)+(D^{b\#3g-2,1}+D^{b\#3g-2,2}+1)P(D)=0 \quad \text{(Equation 17-(3g-2))}$$

$$(D^{a\#3g-1,1,1}+D^{a\#3g-1,1,2}+1)X_1(D)+(D^{a\#3g-1,2,1}+D^{a\#3g-1,2,2}+1)X_2(D)+\ldots$$

$$+(D^{a\#3g-1,n-1,1}+D^{a\#3g-1,n-1,2}+1)X_{n-1}(D)+(D^{b\#3g-1,1}+D^{b\#3g-1,2}+1)P(D)=0 \quad \text{(Equation 17-(3g-1))}$$

$$(D^{a\#3g,1,1}+D^{a\#3g,1,2}+1)X_1(D)+(D^{a\#3g,2,1}+D^{a\#3g,2,2}+1)X_2(D)+\ldots$$

$$+(D^{a\#3g,n-1,1}+D^{a\#3g,n-1,2}+1)X_{n-1}(D)+(D^{b\#3g,1}+D^{b\#3g,2}+1)P(D)=0 \quad \text{(Equation 17-3g)}$$

At this time, $X_1(D), X_2(D), \ldots, X_{n-1}(D)$ are polynomial representations of data (information) $X_1, X_2, \ldots, X_{n-1}$, and $P(D)$ is a polynomial representation of parity. In equations 17-1 to 17-3g, parity check polynomials are assumed such that there are three terms in $X_1(D), X_2(D), \ldots, X_{n-1}(D)$, and $P(D)$ respectively, and term $D^0$ is present in $X_1(D), X_2(D), \ldots, X_{n-1}(D)$, and $P(D)$ (where k=1, 2, 3, …, 3g).

In an LDPC-CC of a time varying period of 3g and a coding rate of (n−1)/n (where n is an integer equal to or greater than 2), parity and information at time i are represented by $P_i$ and $X_{i,1}, X_{i,2}, \ldots, X_{i,n-1}$ respectively. If $i \%3=k$ (where k=0, 1, 2, …3g−1) is assumed at this time, a parity check polynomial of equation 17-(k+1) holds true. For example, if i=2, (k=2), and therefore equation 18 holds true.

(Equation 18)

$$(D^{a\#3,1,1}+D^{a\#3,1,2}+1)X_{2,1}+(D^{a\#3,2,1}+D^{a\#3,2,2}+1)X_{2,2}+\ldots$$

$$+(D^{a\#3,n-1,1}+D^{a\#3,n-1,2}+1)X_{2,n-1}+(D^{b\#3,1}+D^{b\#3,2}+1)P_2=0 \quad [18]$$

If following <Condition #5> and <Condition #6> are satisfied at this time, the possibility of being able to create a code having higher error correction capability is increased.

<Condition #5>

In equations 17-1 to 17-3g, combinations of orders of $X_1(D), X_2(D), \ldots, X_{n-1}(D)$, and $P(D)$ satisfy the following condition:

$(a_{\#1,1,1}\%3, a_{\#1,1,2}\%3)$, $(a_{\#1,2,1}\%3, a_{\#1,2,2}\%3)$, …, $(a_{\#1,p,1}\%3, a_{\#1,p,2}\%3)$, …, and $(a_{\#1,n-1,1}\%3, a_{\#1,n-1,2}\%3)$ are any of (1, 2), (2, 1) (p=1, 2, 3, …, n−1);

$(a_{\#2,1,1}\%3, a_{\#2,1,2}\%3)$, $(a_{\#2,2,1}\%3, a_{\#2,2,2}\%3)$, …, $(a_{\#2,p,1}\%3, a_{\#2,p,2}\%3)$, …, and $(a_{\#2,n-1,1}\%3, a_{\#2,n-1,2}\%3)$ are any of (1, 2), or (2, 1) (where p=1, 2, 3, …, n−1);

$(a_{\#3,1,1}\%3, a_{\#3,1,2}\%3)$, $(a_{\#3,2,1}\%3, a_{\#3,2,2}\%3)$, …, $(a_{\#3,p,1}\%3, a_{\#3,p,2}\%3)$, …, and $(a_{\#3,n-1,1}\%3, a_{\#3,n-1,2}\%3)$ are any of (1, 2), or (2, 1) (where p=1, 2, 3, …, n−1);

…;

$(a_{\#k,1,1}\%3, a_{\#k,1,2}\%3)$, $(a_{\#k,2,1}\%3, a_{\#k,2,2}\%3)$, …, $(a_{\#k,p,1}\%3, a_{\#k,p,2}\%3)$, …, and $(a_{\#k,n-1,1}\%3, a_{\#k,n-1,2}\%3)$ are any of (1, 2), or (2, 1) (where p=1, 2, 3, n−1) (where, k=1, 2, 3, …, 3g)

…;

$(a_{\#3g-2,1,1}\%3, a_{\#3g-2,1,2}\%3)$, $(a_{\#3g-2,2,1}\%3, a_{\#3g-2,2,2}\%3)$, …, $(a_{\#3g-2,p,1}\%3, a_{\#3g-2,p,2}\%3)$, …, and $(a_{\#3g-2,n-1,1}\%3, a_{\#3g-2,n-1,2}\%3)$ are any of (1, 2), or (2, 1) (where p=1, 2, 3, …, n−1);

$(a_{\#3g-1,1,1}\%3, a_{\#3g-1,1,2}\%3)$, $(a_{\#3g-1,2,1}\%3, a_{\#3g-1,2,2}\%3)$, …, $(a_{\#3g-1,p,1}\%3, a_{\#3g-1,p,2}\%3)$, …, and $(a_{\#3g-1,n-1,1}\%3, a_{\#3g-1,n-1,2}\%3)$ are any of (1, 2), or (2, 1) (where p=1, 2, 3, …, n−1); and $(a_{\#3g,1,1}\%3, a_{\#3g,1,2}\%3)$, $(a_{\#3g,2,1}\%3, a_{\#3g,2,2}\%3)$, …, $(a_{\#3g,p,1}\%3, a_{\#3g,p,2}\%3)$, …, and $(a_{\#3g,n-1,1}\%3, a_{\#3g,n-1,2}\%3)$ are any of (1, 2), or (2, 1) (where p=1, 2, 3, …, n−1).

In addition, in equations 17-1 to 17-3g, combinations of orders of P(D) satisfy the following condition:

$(b_{\#1,1}\%3, b_{\#1,2}\%3)$, $(b_{\#2,1}\%3, b_{\#2,2}\%3)$, $(b_{\#3,1}\%3, b_{\#3,2}\%3)$, …, $(b_{\#k,1}\%3, b_{\#k,2}\%3)$, …, $(b_{\#3g-2,1}\%3, b_{\#3g-2,2}\%3)$, $(b_{\#3g-1,1}\%3, b_{\#3g-1,2}\%3)$, and $(b_{\#3g,1}\%3, b_{\#3g,2}\%3)$ are any of (1, 2), or (2, 1) (where k=1, 2, 3, …, 3g).

<Condition #5> has a similar relationship with respect to equations 17-1 to 17-3g as <Condition #2> has with respect to equations 13-1 to 13-3g. If the condition below (<Condition #6>) is added for equations 17-1 to 17-3g in addition to <Condition #5>, the possibility of being able to create a code having high error correction capability is increased.

<Condition #6>

Orders of X1(D) of equations 17-1 to 17-3g satisfy the following condition: all values other than multiples of 3 (that is, 0, 3, 6, …, 3g−3) from among integers from 0 to 3g−1 (0, 1, 2, 3, 4, …, 3g−2, 3g−1) are present in the following 6g values of $(a_{\#1,1,1}\%3, a_{\#1,1,2}\%3)$, $(a_{\#2,1,1}\%3, a_{\#2,1,2}\%3)$, …, $(a_{\#p,1,1}\%3, a_{\#p,1,2}\%3)$, …, and $(a_{\#3g,1,1}\%3, a_{\#3g,1,2}\%3)$ (where p=1, 2, 3, …, 3g);

orders of X2(D) of equations 17-1 to 17-3g satisfy the following condition: all values other than multiples of 3 (that is, 0, 3, 6, …, 3g−3) from among integers from 0 to 3g−1 (0, 1, 2, 3, 4, …, 3g−2, 3g−1) are present in the following 6g values of $(a_{\#1,2,1}\%3, a_{\#1,2,2}\%3)$, $(a_{\#2,2,1}\%3, a_{\#2,2,2}\%3)$, …, $(a_{\#p,2,1}\%3, a_{\#p,2,2}\%3)$, …, and $(a_{\#3g,2,1}\%3, a_{\#3g,2,2}\%3)$ (where p=1, 2, 3, …, 3g);

orders of X3(D) of equations 17-1 to 17-3g satisfy the following condition: all values other than multiples of 3 (that is, 0, 3, 6, …, 3g−3) from among integers from 0 to 3g−1 (0, 1, 2, 3, 4, …, 3g−2, 3g−1) are present in the following 6g values of $(a_{\#1,3,1}\%3, a_{\#1,3,2}\%3)$, $(a_{\#2,3,1}\%3, a_{\#2,3,2}\%3)$, …, $(a_{\#p,3,1}\%3, a_{\#p,3,2}\%3)$, …, and $(a_{\#3g,3,1}\%3, a_{\#3g,3,2}\%3)$ (where p=1, 2, 3, …, 3g);

…;

orders of Xk(D) of equations 17-1 to 17-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,k,1}\%3, a_{\#1,k,2}\%3g)$, $(a_{\#2,k,1}\%3, a_{\#2,k,2}\%3)$, . . . , $(a_{\#p,k,1}\%3, a_{\#p,k,2}\%3)$, . . . , and $(a_{\#3g,k,1}\%3, a_{\#3g,k,2}\%3)$ (where p=1, 2, 3, . . . , 3g, and k=1, 2, 3, . . . , n−1);

. . . ;

orders of Xn−1(D) of equations 17-1 to 17-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,n-1,1}\%3, a_{\#1,n-1,2}\%3)$, $(a_{\#2,n-1,1}\%3, a_{\#2,n-1,2}\%3)$, . . . , $(a_{\#p,n-1,1}\%3, a_{\#p,n-1,2}\%3)$, . . . , and $(a_{\#3g,n-1,1}\%3, a_{\#3g,n-1,2}\%3)$ (where p=1, 2, 3, . . . , 3g); and Orders of P(D) of equations 17-1 to 17-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(b_{\#1,1}\%3, b_{\#1,2}\%3)$, $(b_{\#2,1}\%3, b_{\#2,2}\%3)$, $(b_{\#3,1}\%3, b_{\#3,2}\%3)$, . . . , $(b_{\#k,1}\%3, b_{k,2}\%3)$, . . . , $(b_{\#3g-2,1}\%3, b_{\#3g-2,2}\%3)$, $(b_{\#3g-1,1}\%3, b_{\#3g-1,2}\%3)$ and $(b_{\#3g,1}\%3, b_{\#3g,2}\%3)$ (where k=1, 2, 3, . . . , n−1).

The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is (n−1)/n (where n is an integer equal to or greater than 2) that has parity check polynomials of equations 17-1 to 17-3g, if a code is created in which <Condition #6> is applied in addition to <Condition #5>, it is possible to provide randomness while maintaining regularity for positions at which "1"s are present in a parity check matrix, and therefore the possibility of obtaining good error correction capability is increased.

The possibility of being able to create an LDPC-CC having higher error correction capability is also increased if a code is created using <Condition #6'> instead of <Condition #6>, that is, using <Condition #6'> in addition to <Condition #5>.

<Condition #6'>

Orders of X1 (D) of equations 17-1 to 17-3g satisfy the following condition: all values other than multiples of 3 (that is, 0, 3, 6, 3g−3) from among integers from 0 to 3g−1 (0, 1, 2, 3, 4, . . . , 3g−2, 3g−1) are present in the following 6g values of $(a_{\#1,1,1}\%3, a_{\#1,1,2}\%3)$, $(a_{\#2,1,1}\%3, a_{2,1,2}\%3)$, . . . , $(a_{\#p,1,1}\%3, a_{\#p,1,2}\%3)$, . . . , and $(a_{\#3g,1,1}\%3, a_{3g,1,2}\%3)$ (where p=1, 2, 3, . . . , 3g);

orders of X2(D) of equations 17-1 to 17-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,2,1}\%3, a_{\#1,2,2}\%3)$, $(a_{\#2,2,1}\%3, a_{\#2,2,2}\%3)$, . . . , $(a_{\#p,2,1}\%3, a_{\#p,2,2}\%3)$, . . . , and $(a_{\#3g,2,1}\%3, a_{\#3g,2,2}\%3)$ (where p=1, 2, 3, . . . , 3g);

orders of X3(D) of equations 17-1 to 17-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,3,1}\%3, a_{\#1,3,2}\%3)$, $(a_{\#2,3,1}\%3, a_{\#2,3,2}\%3)$, . . . , $(a_{\#p,3,1}\%3, a_{\#p,3,2}\%3)$, . . . , and $(a_{\#3g,3,1}\%3, a_{3g,3,2}\%3)$ (where p=1, 2, 3, . . . , 3g)

. . . ;

orders of Xk(D) of equations 17-1 to 17-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,k,1}\%3, a_{\#1,k,2}\%3)$, $(a_{\#2,k,1}\%3, a_{\#2,k,2}\%3)$, . . . , $(a_{\#p,k,1}\%3, a_{\#p,k,2}\%3)$, . . . , and $(a_{\#3g,k,1}\%3, a_{\#3g,k,2}\%3)$ (where p=1, 2, 3, . . . , 3g, and k=1, 2, 3, . . . , n−1)

. . . ;

orders of Xn−1(D) of equations 17-1 to 17-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,n-1,1}\%3, a_{\#1,n-1,2}\%3)$, $(a_{\#2,n-1,1}\%3, a_{\#2,n-1,2}\%3)$, . . . , $(a_{\#p,n-1,1}\%3, a_{\#p,n-1,2}\%3)$, . . . , and $(a_{\#3g,n-1,1}\%3, a_{\#3g,n-1,2}\%3)$ (where p=1, 2, 3, . . . , 3g); or orders of P(D) of equations 17-1 to 17-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(b_{\#1,1}\%3, b_{\#1,2}\%3)$, $(b_{2,1}\%3, b_{2,2}\%3)$, $(b_{\#3,1}\%3, b_{\#3,2}\%3)$, . . . , $(b_{\#k,1}\%3, b_{\#k,2}\%3)$, . . . , $(b_{\#3g-2,1}\%3, b_{\#3g-2,2}\%3)$, $(b_{\#3g-1,1}\%3, b_{\#3g-1,2}\%3)$ and $(b_{\#3g,1}\%3, b_{\#3g,2}\%3)$ (where k=1, 2, 3, . . . , 3g).

The above description relates to an LDPC-CC of a time varying period of 3g and a coding rate of (n−1)/n (where n is an integer equal to or greater than 2). Below, conditions are described for orders of an LDPC-CC of a time varying period of 3g and a coding rate of ½ (n=2).

Consider equations 19-1 to 19-3g as parity check polynomials of an LDPC-CC for which the time varying period is 3g (where g=1, 2, 3, 4, . . . ) and the coding rate is ½ (n=2).

[19]

$$(D^{a\#1,1,1}+D^{a\#1,1,2}+D^{a\#1,1,3})X(D)+(D^{b\#1,1}+D^{b\#1,2}+D^{b\#1,3})P(D)=0 \quad \text{(Equation 19-1)}$$

$$(D^{a\#2,1,1}+D^{a\#2,1,2}+D^{a\#2,1,3})X(D)+(D^{b\#2,1}+D^{b\#2,2}+D^{b\#2,3})P(D)=0 \quad \text{(Equation 19-2)}$$

$$(D^{a\#3,1,1}+D^{a\#3,1,2}+D^{a\#3,1,3})X(D)+(D^{b\#3,1}+D^{b\#3,2}+D^{b\#3,3})P(D)=0 \quad \text{(Equation 19-3)}$$

•

•

•

$$(D^{a\#k,1,1}+D^{a\#k,1,2}+D^{a\#k,1,3})X(D)+(D^{b\#k,1}+D^{b\#k,2}+D^{b\#k,3})P(D)=0 \quad \text{(Equation 19-k)}$$

•

•

•

$$(D^{a\#3g-2,1,1}+D^{a\#3g-2,1,2}+D^{a\#3g-2,1,3})X(D)+(D^{b\#3g-2,1}+D^{b\#3g-2,2}+D^{b\#3g-2,3})P(D)=0 \quad \text{(Equation 19-(3g-2))}$$

$$(D^{a\#3g-1,1,1}+D^{a\#3g-1,1,2}+D^{a\#3g-1,1,3})X(D)+(D^{b\#3g-1,1}+D^{b\#3g-1,2}+D^{b\#3g-1,3})P(D)=0 \quad \text{(Equation 19-(3g-1))}$$

$$(D^{a\#3g,1,1}+D^{a\#3g,1,2}+D^{a\#3g,1,3})X(D)+(D^{b\#3g,1}+D^{b\#3g,2}+D^{b\#3g,3})P(D)=0 \quad \text{(Equation 19-3g)}$$

At this time, X(D) is a polynomial representation of data (information) X and P(D) is a polynomial representation of parity. Here, in equations 19-1 to 19-3g, parity check polynomials are assumed such that there are three terms in X(D) and P(D) respectively.

Thinking in the same way as in the case of an LDPC-CC of a time varying period of 3 and an LDPC-CC of a time varying period of 6, the possibility of being able to obtain higher error correction capability is increased if the condition below (<Condition #2-1>) is satisfied in an LDPC-CC of a time varying period of 3g and a coding rate of ½ (n=2) represented by parity check polynomials of equations 19-1 to 19-3g.

In an LDPC-CC of a time varying period of 3g and a coding rate of ½ (n=2), parity and information at time i are represented by Pi and $X_{i,1}$ respectively. If i %3=k (where k=0, 1, 2, . . . , 3g−1) is assumed at this time, a parity check polynomial of equation 19-(k+1) holds true. For example, if i=2, i %3=2 (k=2), and therefore equation 20 holds true.

[20]

$$(D^{a\#3,1,1}+D^{a\#3,1,2}+D^{a\#3,1,3})X_{2,1}+(D^{b\#3,1}+D^{b\#3,2}+D^{b\#3,3})P_2=0 \quad \text{(Equation 20)}$$

In equations 19-1 to 19-3g, it is assumed that $a_{\#k,1,1}$, $a_{\#k,1,2}$, and $a_{\#k,1,3}$ are integers (where $a_{\#k,1,1} \neq a_{\#k,1,2} \neq a_{\#k,1,3}$) (where k=1, 2, 3, . . . , 3g). Also, it is assumed that $b_{\#k,1}$, $b_{\#k,2}$, and $b_{\#k,3}$ are integers (where $b_{\#k,1} \neq b_{\#k,2} \neq b_{\#k,3}$), A parity check polynomial of equation 19-k (k=1, 2, 3, . . . , 3g) is called "check equation #k," and a sub-matrix based on the parity check polynomial of equation 19-k is designated k-th sub-matrix $H_k$. Next, an LDPC-CC of a time varying period of 3g is considered that is generated from first sub-matrix $H_1$, second sub-matrix $H_2$, third sub-matrix $H_3$, . . . , and 3g-th sub-matrix $H_{3g}$.

<Condition #2-1>

In equations 19-1 to 19-3g, combinations of orders of X(D) and P(D) satisfy the following condition:

($a_{\#1,1,1}$%3, $a_{\#1,1,2}$%3, $a_{\#1,1,3}$%3) and ($b_{\#1,1}$%3, $b_{\#1,2}$%3, $b_{\#1,3}$%3) are any of (0, 1, 2), (0, 2, 1), (1, 0, 2), (1, 2, 0), (2, 0, 1), or (2, 1, 0);

($a_{\#2,1,1}$%3, $a_{\#2,1,2}$%3, $a_{\#2,1,3}$%3) and ($b_{\#2,1}$%3, $b_{\#2,2}$%3, $b_{\#2,3}$%3) are any of (0, 1, 2), (0, 2, 1), (1, 0, 2), (1, 2, 0), (2, 0, 1), or (2, 1, 0);

($a_{\#3,1,1}$%3, $a_{\#3,1,2}$%3, $a_{\#3,1,3}$%3) and ($b_{3,1}$%3, $b_{\#3,2}$%3, $b_{3,3}$%3) are any of (0, 1, 2), (0, 2, 1), (1, 0, 2), (1, 2, 0), (2, 0, 1), or (2, 1, 0);

. . . , ($a_{\#k,1,1}$%3, $a_{\#k,1,2}$%3, $a_{\#k,1,3}$%3) and ($b_{\#k,1}$%3, $b_{\#k,2}$%3, $b_{\#k,3}$%3) are any of (0, 1, 2), (0, 2, 1), (1, 0, 2), (1, 2, 0), (2, 0, 1), or (2, 1, 0) (where k=1, 2, 3, . . . , 3g);

. . . , ($a_{\#3g-2,1,1}$%3, $a_{\#3g-2,1,2}$%3, $a_{\#3g-2,1,3}$%3) and ($b_{\#3g-2,1}$%3, $b_{\#3g-2,2}$%3, $b_{\#3g-2,3}$%3) are any of (0, 1, 2), (0, 2, 1), (1, 0, 2), (1, 2, 0), (2, 0, 1), or (2, 1, 0);

($a_{\#3g-1,1,1}$%3, $a_{\#3g-1,1,2}$%3, $a_{\#3g-1,1,3}$%3) and ($b_{\#3g-1,1}$%3, $b_{\#3g-1,2}$%3, $b_{3g-1,3}$%3) are any of (0, 1, 2), (0, 2, 1), (1, 0, 2), (1, 2, 0), (2, 0, 1), or (2, 1, 0); and ($a_{\#3g,1,1}$%3, $a_{\#3g,1,2}$%3, $a_{\#3g,1,3}$%3) and ($b_{\#3g,1}$%3, $b_{\#3g,2}$%3, $b_{\#3g,3}$%3) are any of (0, 1, 2), (0, 2, 1), (1, 0, 2), (1, 2, 0), (2, 0, 1), or (2, 1, 0).

Here, as described with other parts than the present embodiment, taking ease of performing encoding into consideration, it is desirable for one "0" to be present among the three items ($b_{\#k,1}$%3, $b_{\#k,2}$%3, $b_{\#k,3}$%3) (where k=1, 2, . . . , 3g) in equations 19-1 to 19-3g.

Also, in order to provide relevancy between parity bits and data bits of the same point in time, and to facilitate a search for a code having high correction capability, it is desirable for one "0" to be present among the three items ($a_{\#k,1,1}$%3, $a_{\#k,1,2}$%3, $a_{\#k,1,3}$%3) (where k=1, 2, . . . , 3g).

Next, an LDPC-CC of a time varying period of 3g (where g=2, 3, 4, 5, . . . ) that takes ease of encoding into account is considered. At this time, if the coding rate is ½ (n=2), LDPC-CC parity check polynomials can be represented as shown below.

[21]

$$(D^{a\#1,1,1}+D^{a\#1,1,2}+D^{a\#1,1,3})X(D)+(D^{b\#1,1}+D^{b\#1,2}+1)P(D)=0 \quad \text{(Equation 21-1)}$$

$$(D^{a\#2,1,1}+D^{a\#2,1,2}+D^{a\#2,1,3})X(D)+(D^{b\#2,1}+D^{b\#2,2}+1)P(D)=0 \quad \text{(Equation 21-2)}$$

$$(D^{a\#3,1,1}+D^{a\#3,1,2}+D^{a\#3,1,3})X(D)+(D^{b\#3,1}+D^{b\#3,2}+1)P(D)=0 \quad \text{(Equation 21-3)}$$

•

•

•

$$(D^{a\#k,1,1}+D^{a\#k,1,2}+D^{a\#k,1,3})X(D)+(D^{b\#k,1}+D^{b\#k,2}+1)P(D)=0 \quad \text{(Equation 21-k)}$$

•

•

•

$$(D^{a\#3g-2,1,1}+D^{a\#3g-2,1,2}+D^{a\#3g-2,1,3})X(D)+(D^{b\#3g-2,1}+D^{b\#3g-2,2}+1)P(D)=0 \quad \text{(Equation 21-(3g-2))}$$

$$(D^{a\#3g-1,1,1}+D^{a\#3g-1,1,2}+D^{a\#3g-1,1,3})X(D)+(D^{b\#3g-1,1}+D^{b\#3g-1,2}+1)P(D)=0 \quad \text{(Equation 21-(3g-1))}$$

$$(D^{a\#3g,1,1}+D^{a\#3g,1,2}+D^{a\#3g,1,3})X(D)+(D^{b\#3g,1}+D^{b\#3g,2}+1)P(D)=0 \quad \text{(Equation 21-3g)}$$

At this time, X(D) is a polynomial representation of data (information) X and P(D) is a polynomial representation of parity. Here, in equations 21-1 to 21-3g, parity check polynomials are assumed such that there are three terms in X(D) and P(D) respectively. In an LDPC-CC of a time varying period of 3g and a coding rate of ½ (n=2), parity and information at time i are represented by $P_i$ and $X_{i,1}$ respectively. If %3=k (where k=0, 1, 2, . . . , 3g−1) is assumed at this time, a parity check polynomial of equation 21-(k+1) holds true. For example, if i=2, i %3=2 (k=2), and therefore equation 22 holds true.

[22]

$$(D^{a\#3,1,1}+D^{a\#3,1,2}+D^{a\#3,1,3})X_{2,1}+(D^{b\#3,1}+D^{b\#3,2}+1)P_2=0 \quad \text{(Equation 22)}$$

If <Condition #3-1> and <Condition #4-1> are satisfied at this time, the possibility of being able to create a code having higher error correction capability is increased.

<Condition #3-1>

In equations 21-1 to 21-3g, combinations of orders of X(D) satisfy the following condition:

($a_{\#1,1,1}$%3, $a_{\#1,1,2}$%3, $a_{\#1,1,3}$%3) are any of (0, 1, 2), (0, 2, 1), (1, 0, 2), (1, 2, 0), (2, 0, 1), or (2, 1, 0);

($a_{\#2,1,1}$%3, $a_{\#2,1,2}$%3, $a_{\#2,1,3}$%3) are any of (0, 1, 2), (0, 2, 1), (1, 0, 2), (1, 2, 0), (2, 0, 1), or (2, 1, 0);

($a_{\#3,1,1}$%3, $a_{\#3,1,2}$%3, $a_{\#3,1,3}$%3) are any of (0, 1, 2), (0, 2, 1), (1, 0, 2), (1, 2, 0), (2, 0, 1), or (2, 1, 0);

. . . ;

$a_{\#k,1,1}$%3, $a_{\#k,1,2}$%3, $a_{\#k,1,3}$%3) are any of (0, 1, 2), (0, 2, 1), (1, 0, 2), (1, 2, 0), (2, 0, 1), or (2, 1, 0) (where k=1, 2, 3, . . . , 3g);

. . . ;

($a_{\#3g-2,1,1}$%3, $a_{\#3g-2,1,2}$%3, $a_{\#3g-2,1,3}$%3) are any of (0, 1, 2), (0, 2, 1), (1, 0, 2), (1, 2, 0), (2, 0, 1), or (2, 1, 0);

($a_{\#3g-1,1,1}$%3, $a_{\#3g-1,1,2}$%3, $a_{\#3g-1,1,3}$%3) are any of (0, 1, 2), (0, 2, 1), (1, 0, 2), (1, 2, 0), (2, 0, 1), or (2, 1, 0); and ($a_{3g,1,1}$%3, $a_{\#3g,1,2}$%3, $a_{\#3g,1,3}$%3) are any of (0, 1, 2), (0, 2, 1), (1, 0, 2), (1, 2, 0), (2, 0, 1), or (2, 1, 0).

In addition, in equations 21-1 to 21-3g, combinations of orders of P(D) satisfy the following condition:

($b_{1,1}$%3, $b_{\#1,2}$%3), ($b_{2,1}$%3, $b_{\#2,2}$%3), ($b_{\#3,1}$%3, $b_{\#3,2}$%3), . . . , ($b_{\#k,1}$%3, $b_{k,2}$%3), . . . , ($b_{\#3g-2,1}$%3, $b_{\#3g-2,2}$%3), ($b_{\#3g-1,1}$%3, $b_{\#3g-1,2}$%3), and ($b_{\#3g,1}$%3, $b_{\#3g,2}$%3) are any of (1, 2), or (2, 1) (k=1, 2, 3, . . . , 3g).

<Condition #3-1> has a similar relationship with respect to equations 21-1 to 21-3g as <Condition #2-1> has with respect to equations 19-1 to 19-3g. If the condition below (<Condition #4-1>) is added for equations 21-1 to 21-3g in addition to <Condition #3-1>, the possibility of being able to create an LDPC-CC having higher error correction capability is increased.

<Condition #4-1>

Orders of P(D) of equations 21-1 to 21-3g satisfy the following condition:

all values other than multiples of 3 (that is, 0, 3, . . . , 6, 3g−3) from among integers from 0 to 3g−1 (0, 1, 2, 3, 4, . . . , 3g−2, 3g−1) are present in the following 6g values of $(b_{\#1,1}\%3, b_{1,2}\%3), (b_{\#2,1}\%3, b_{\#2,2}\%3), (b_{\#3,1}\%3, b_{\#3,2}\%3), \ldots, (b_{\#k,1}\%3, b_{k,2}\%3), \ldots, (b_{\#3g-2,1}\%3, b_{\#3g-2,2}\%3), (b_{3g,1,1}\%3, b_{3g-1,2}\%3)$, and $(b_{\#3g,1}\%3, b_{\#3g,2}\%3)$.

The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is ½ (n=2) that has parity check polynomials of equations 21-1 to 21-3g, if a code is created in which <Condition #4-1> is applied in addition to <Condition #3-1>, it is possible to provide randomness while maintaining regularity for positions at which "1"s are present in a parity check matrix, and therefore the possibility of obtaining better error correction capability is increased.

Next, an LDPC-CC of a time varying period of 3g (where g=2, 3, 4, 5, . . . ) is considered that enables encoding to be performed easily and provides relevancy to parity bits and data bits of the same point in time. At this time, if the coding rate is ½ (n=2), LDPC-CC parity check polynomials can be represented as shown below.

[23]

$$(D^{a\#1,1,1}+D^{a\#1,1,2}+1)X(D)+(D^{b\#1,1}+D^{b\#1,2}+1)P(D)=0 \quad \text{(Equation 23-1)}$$

$$(D^{a\#2,1,1}+D^{a\#2,1,2}+1)X(D)+(D^{b\#2,1}+D^{b\#2,2}+1)P(D)=0 \quad \text{(Equation 23-2)}$$

$$(D^{a\#3,1,1}+D^{a\#3,1,2}+1)X(D)+(D^{b\#3,1}+D^{b\#3,2}+1)P(D)=0 \quad \text{(Equation 23-3)}$$

●

●

●

$$(D^{a\#k,1,1}+D^{a\#k,1,2}+1)X(D)+(D^{b\#k,1}+D^{b\#k,2}+1)P(D)=0 \quad \text{(Equation 23-k)}$$

●

●

●

$$(D^{a\#3g-2,1,1}+D^{a\#3g-2,1,2}+1)X(D)+(D^{b\#3g-2,1}+D^{b\#3g-2,2}+1)P(D)=0 \quad \text{(Equation 23-(3g-2))}$$

$$(D^{a\#3g-1,1,1}+D^{a\#3g-1,1,2}+1)X(D)+(D^{b\#3g-1,1}+D^{b\#3g-1,2}+1)P(D)=0 \quad \text{(Equation 23-(3g-1))}$$

$$(D^{a\#3g,1,1}+D^{a\#3g,1,2}+1)X(D)+(D^{b\#3g,1}+D^{b\#3g,2}+1)P(D)=0 \quad \text{(Equation 23-3g)}$$

At this time, X(D) is a polynomial representation of data (information) X and P(D) is a polynomial representation of parity. In equations 23-1 to 23-3g, parity check polynomials are assumed such that there are three terms in X(D) and P(D) respectively, and a $D^0$ term is present in X(D) and P(D) (where k=1, 2, 3, . . . , 3g).

In an LDPC-CC of a time varying period of 3g and a coding rate of ½ (n=2), parity and information at time i are represented by Pi and $X_{i,1}$ respectively. If i %3=k (where k=0, 1, 2, . . . , 3g−1) is assumed at this time, a parity check polynomial of equation 23-(k+1) holds true. For example, if i=2, i %3=2 (k=2), and therefore equation 24 holds true.

[24]

$$(D^{a\#3,1,1}+D^{a\#3,1,2}+1)X_{2,1}+(D^{b\#3,1}+D^{b\#3,2}+1)P_2=0 \quad \text{(Equation 24)}$$

If following <Condition #5-1> and <Condition #6-1> are satisfied at this time, the possibility of being able to create a code having higher error correction capability is increased.

<Condition #5-1>

In equations 23-1 to 23-3g, combinations of orders of X(D) satisfy the following condition:

$(a_{\#1,1,1}\%3, a_{\#1,1,2}\%3)$ is (1, 2) or (2, 1);
$(a_{\#2,1,1}\%3, a_{\#2,1,2}\%3)$ is (1, 2) or (2, 1);
$(a_{3,1,1}\%3, a_{\#3,1,2}\%3)$ is (1, 2) or (2, 1);
. . . ;
$(a_{\#k,1,1}\%3, a_{\#k,1,2}\%3)$ is (1, 2) or (2, 1) (where k=1, 2, 3, . . . , 3g);
. . . ;
$(a_{\#3g-2,1,1}\%3, a_{\#3g-2,1,2}\%3)$ is (1, 2) or (2, 1),
$(a_{\#3g-1,1,1}\%3, a_{\#3g-1,1,2}\%3)$ is (1, 2) or (2, 1); and
$(a_{\#3g,1,1}\%3, a_{\#3g,1,2}\%3)$ is (1, 2) or (2, 1).

In addition, in equations 23-1 to 23-3g, combinations of orders of P(D) satisfy the following condition:

$(b_{\#1,1}\%3, b_{\#1,2}\%3), (b_{\#2,1}\%3, b_{\#2,2}\%3), (b_{\#3,1}\%3, b_{\#3,2}\%3), \ldots, (b_{\#k,1}\%3, b_{k,2}\%3), \ldots, (b_{\#3g-2,1}\%3, b_{\#3g-2,2}\%3), (b_{\#3g-1,1}\%3, b_{\#3g-1,2}\%3)$, and $(b_{\#3g,1}\%3, b_{\#3g,2}\%3)$ are any of (1, 2), or (2, 1) (where k=1, 2, 3, . . . , 3g).

<Condition #5-1> has a similar relationship with respect to equations 23-1 to 23-3g as <Condition #2-1> has with respect to equations 19-1 to 19-3g. If the condition below (<Condition #6-1>) is added for equations 23-1 to 23-3g in addition to <Condition #5-1>, the possibility of being able to create an LDPC-CC having higher error correction capability is increased.

<Condition #6-1>

Orders of P(D) of equations 23-1 to 23-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,1,1}\%3, a_{\#1,1,2}\%3), (a_{2,1,1}\%3, a_{\#2,1,2}\%3), \ldots, (a_{\#p,1,1}\%3, a_{\#p,1,2}\%3), \ldots$, and $(a_{\#3g,1,1}\%3, a_{\#3g,1,2}\%3)$ (where p=1, 2, 3, . . . , 3g); and orders of P(D) of equations 23-1 to 23-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g(3g×2) values of $(b_{\#1,1}\%3, b_{\#1,2}\%3), (b_{\#2,1}\%3, b_{\#2,2}\%3), (b_{\#3,1}\%3, b_{\#3,2}\%3), \ldots, (b_{\#k,1}\%3, b_{\#k,2}\%3), \ldots, (b_{\#3g-2,1}\%3, b_{\#3g-2,2}\%3), (b_{\#3g-1,1}\%3, b_{\#3g-1,2}\%3)$, and $(b_{\#3g,1}\%3, b_{\#3g,2}\%3)$ (where k=1, 2, 3, . . . 3g).

The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is ½ that has parity check polynomials of equations 23-1 to 23-3g, if a code is created in which <Condition #6-1> is applied in addition to <Condition #5-1>, it is possible to provide randomness while maintaining regularity for positions at which "1"s are present in a parity check matrix, so that the possibility of obtaining better error correction capability is increased.

The possibility of being able to create a code having higher error correction capability is also increased if a code is created using <Condition #6'-1> instead of <Condition #6-1>, that is, using <Condition #6'-1> in addition to <Condition #5-1>.

<Condition #6'-1>

Orders of X(D) of equations 23-1 to 23-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(a_{\#1,1,1}\%3, a_{\#1,1,2}\%3)$, $(a_{\#2,1,1}\%3, a_{\#2,1,2}\%3)$, ..., $(a_{\#p,1,1}\%3, a_{\#p,1,2}\%3)$, ..., and $(a_{\#3g,1,1}\%3, a_{\#3g,1,2}\%3)$ (where p=1, 2, 3, ..., 3g); or orders of P(D) of equations 23-1 to 23-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(b_{\#1,1}\%3, b_{\#1,2}\%3)$, $(b_{\#2,1}\%3, b_{\#2,2}\%3)$, $(b_{\#3,1}\%3, b_{\#3,2}\%3)$, ..., $(b_{\#k,1}\%3, b_{\#k,2}\%3)$, ..., $(b_{3g-2,1}\%3, b_{\#3g-2,2}\%3)$, $(b_{\#3g-1,1}\%3, b_{\#3g-1,2}\%3)$ and $(b_{\#3g,1}\%3, b_{\#3g,2}\%3)$ (where k=1, 2, 3, ..., 3g).

Examples of LDPC-CCs of a coding rate of ½ and a time varying period of 6 having good error correction capability are shown in Table 4.

TABLE 4

| Code | Parity check polynomial |
|---|---|
| LDPC-CC #1 of a time varying period of 6 and a coding rate of ½ | Check polynomial #1: $(D^{328} + D^{317} + 1) \times (D) + (D^{589} + D^{434} + 1)P(D) = 0$ |
| | Check polynomial #2: $(D^{596} + D^{553} + 1) \times (D) + (D^{586} + D^{461} + 1)P(D) = 0$ |
| | Check polynomial #3: $(D^{550} + D^{143} + 1) \times (D) + (D^{470} + D^{448} + 1)P(D) = 0$ |
| | Check polynomial #4: $(D^{470} + D^{223} + 1) \times (D) + (D^{256} + D^{41} + 1)P(D) = 0$ |
| | Check polynomial #5: $(D^{89} + D^{40} + 1) \times (D) + (D^{316} + D^{71} + 1)P(D) = 0$ |
| | Check polynomial #6: $(D^{320} + D^{190} + 1) \times (D) + (D^{575} + D^{136} + 1)P(D) = 0$ |
| LDPC-CC #2 of a time varying period of 6 and a coding rate of ½ | Check polynomial #1: $(D^{524} + D^{511} + 1) \times (D) + (D^{215} + D^{103} + 1)P(D) = 0$ |
| | Check polynomial #2: $(D^{547} + D^{287} + 1) \times (D) + (D^{467} + D^{1} + 1)P(D) = 0$ |
| | Check polynomial #3: $(D^{289} + D^{62} + 1) \times (D) + (D^{503} + D^{502} + 1)P(D) = 0$ |
| | Check polynomial #4: $(D^{401} + D^{55} + 1) \times (D) + (D^{443} + D^{106} + 1)P(D) = 0$ |
| | Check polynomial #5: $(D^{433} + D^{395} + 1) \times (D) + (D^{404} + D^{100} + 1)P(D) = 0$ |
| | Check polynomial #6: $(D^{136} + D^{59} + 1) \times (D) + (D^{599} + D^{559} + 1)P(D) = 0$ |
| LDPC-CC #3 of a time varying period of 6 and a coding rate of ½ | Check polynomial #1: $(D^{253} + D^{44} + 1) \times (D) + (D^{473} + D^{256} + 1)P(D) = 0$ |
| | Check polynomial #2: $(D^{595} + D^{143} + 1) \times (D) + (D^{598} + D^{95} + 1)P(D) = 0$ |
| | Check polynomial #3: $(D^{97} + D^{11} + 1) \times (D) + (D^{592} + D^{491} + 1)P(D) = 0$ |
| | Check polynomial #4: $(D^{50} + D^{10} + 1) \times (D) + (D^{368} + D^{112} + 1)P(D) = 0$ |
| | Check polynomial #5: $(D^{286} + D^{221} + 1) \times (D) + (D^{517} + D^{359} + 1)P(D) = 0$ |
| | Check polynomial #6: $(D^{407} + D^{322} + 1) \times (D) + (D^{283} + D^{257} + 1)P(D) = 0$ |

An LDPC-CC of a time varying period of g with good characteristics has been described above. Also, in a case of using the above LDPC-CC in the erasure correction coding section in Embodiments 1 to 3, upon drawing a Tanner graph, it is confirmed that good characteristics are provided when there are no loop 4 (which is a round circuit starting from a certain node and ending at that node (i.e. a rounding path), and which has a length of 4) and loop 6 (which is a loop having a length of 6 (also referred to as "cycle of length 6")).

Also, for an LDPC-CC, it is possible to provide encoded data (codeword) by multiplying information vector n by generator matrix G. That is, encoded data (codeword) c can be represented by c=n×G. Here, generator matrix G is found based on parity check matrix H designed in advance. To be more specific, generator matrix G refers to a matrix satisfying G×H$^T$=0.

For example, a convolutional code of a coding rate of ½ and generator polynomial G=[1 G$_1$(D)/G$_0$(D)] will be considered as an example. At this time, G$_1$ represents a feedforward polynomial and G$_0$ represents a feedback polynomial. If a polynomial representation of an information sequence (data) is X(D), and a polynomial representation of a parity sequence is P(D), a parity check polynomial is represented as shown in equation 25 below.

[25]

$$G_1(D)X(D)+G_0(D)P(D)=0 \quad \text{(Equation 25)}$$

where D is a delay operator.

FIG. 27 shows information relating to a (7, 5) convolutional code. A (7, 5) convolutional code generator polynomial is represented as G=[1 (D$^2$+1)/(D$^2$+D+1)]. Therefore, a parity check polynomial is as shown in equation 26 below.

[26]

$$(D^2+1)X(D)+(D^2+D+1)P(D)=0 \quad \text{(Equation 26)}$$

Here, data at point in time i is represented by X$_i$, and parity by P$_i$, and transmission sequence Wi is represented as W$_i$ = (X$_i$, P$_i$). Then transmission vector w is represented as w=(X$_1$, P$_1$, X$_2$, P$_2$, ..., X$_i$, P$_i$ ... )$^T$. Thus, from equation 26, parity check matrix H can be represented as shown in FIG. 27. At this time, the relational equation in equation 27 below holds true.

[27]

$$Hw=0 \quad \text{(Equation 27)}$$

Therefore, with parity check matrix H, the decoding side can perform decoding using belief propagation (BP) decoding, min-sum decoding similar to BP decoding, offset BP decoding, normalized BP decoding, shuffled BP decoding, or suchlike belief propagation, as shown in Non-Patent Literature 4 to Non-Patent Literature 6.

(Time-Invariant/Time Varying LDPC-CCs (of a Coding Rate of (n−1)/n) Based on a Convolutional Code (where n is a Natural Number))

An overview of tune-invariant/time varying LDPC-CCs based on a convolutional code is given below.

A parity check polynomial represented as shown in equation 28 will be considered, with polynomial representations of coding rate of R=(n−1)/n as information X$_1$, X$_2$, ..., X$_{n-1}$ as X$_1$(D), X$_2$(D), ..., X$_{n-1}$(D), and a polynomial representation of parity P as P(D),

[28]

$$(D^{a1,1}+D^{a1,2}+\ldots+D^{a1,r1}+1)X_1(D)+(D^{a2,1}+D^{a2,2}+\ldots+D^{a2,r2}+1)X_2(D)$$

$$+\ldots+(D^{an-1,1}+D^{an-1,2}+\ldots+D^{an-1,rn-1}+1)X_{n-1}(D)$$

$$+(D^{b1}+D^{b2}+\ldots+D^{bs}+1)P(D)=0 \quad \text{(Equation 28)}$$

In equation 28, at this time, $a_{p,p}$ (where p=1, 2, ..., n−1 and q=1, 2, ..., rp) is, for example, a natural number, and satisfies the condition $a_{p,1} \neq a_{p,2} \neq \ldots \neq a_{p,rp}$. Also, $b_q$ (where q=1, 2, ..., s) is a natural number, and satisfies the condition $b_1 \neq b_2 \neq \ldots \neq b_s$. A code defined by a parity check matrix based on a parity check polynomial of equation 28 at this time is called a time-invariant LDPC-CC here.

Here, m different parity check polynomials based on equation 28 are provided (where m is an integer equal to or greater than 2). These parity check polynomials are represented as shown below.

[29]

$$A_{X1,i}(D)X_1(D)+A_{X2,i}(D)X_2(D)+\ldots$$
$$+A_{Xn-1,i}(D)X_{n-1}(D)+B_i(D)P(D)=0 \quad \text{(Equation 29)}$$

Here, i=0, 1, ..., m−1.

Then information $X_1, X_2, \ldots, X_{n-1}$ at point in time j is represented as $X_{1,j}, X_{2,j}, \ldots, X_{n-1,j}$, parity P at point in time j is represented as $P_j$, and $u_j=(X_{1,j}, X_{2,j}, \ldots, X_{n-1,j}, P_j)^T$. At this time, information $X_{1,j}, X_{2,j}, \ldots, X_{n-1,j}$, and parity $P_j$ at point in time j satisfy a parity check polynomial of equation 30.

[30]

$$A_{X1,k}(D)X_1(D)+A_{X2,k}(D)X_2(D)+\ldots$$
$$+A_{Xn-1,k}(D)X_{n-1}(D)+B_k(D)P(D)=0 \,(k=j \bmod m) \quad \text{(Equation 30)}$$

Here, "j mod m" is a remainder after dividing j by m.

A code defined by a parity check matrix based on a parity check polynomial of equation 30 is called a time varying LDPC-CC here. At this time, a time-invariant LDPC-CC defined by a parity check polynomial of equation 28 and a time varying LDPC-CC defined by a parity check polynomial of equation 30 have a characteristic of enabling parity easily to be found sequentially by means of a register and exclusive OR.

Figure 28:
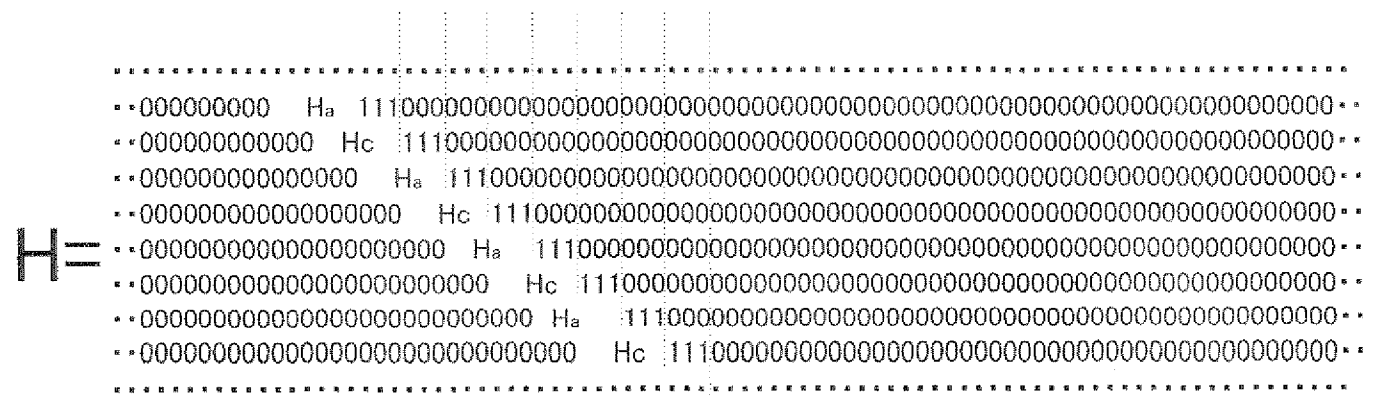

For example, FIG. 28 shows the configuration of parity check matrix H of an LDPC-CC of a time varying period of 2 and a coding rate of ⅔ based on equation 28 to equation 30. Two different check polynomials of a time varying period of 2 based on equation 30 are designed "check equation #1" and "check equation #2." In FIG. 28, (Ha,111) is a part corresponding to "check equation #1," and (Hc,111) is a part corresponding to "check equation #2." Below, (Ha,111) and (Hc,111) are defined as sub-matrices.

Thus, LDPC-CC parity check matrix H of a time varying period of 2 of this proposal can be defined by a first sub-matrix representing a parity check polynomial of "check equation #1", and by a second sub-matrix representing a parity check polynomial of "check equation #2". Specifically, in parity check matrix H, a first sub-matrix and second sub-matrix are arranged alternately in the row direction. When the coding rate is ⅔, a configuration is employed in which a sub-matrix is shifted three columns to the right between an i-th row and (i+1)-th row, as shown in FIG. 28.

In the case of a time varying LDPC-CC of a time varying period of 2, an i-th row sub-matrix and an (i+1)-th row sub-matrix are different sub-matrices. That is to say, either sub-matrix (Ha,111) or sub-matrix (Hc,111) is a first sub-matrix, and the other is a second sub-matrix. If transmission vector u is represented as $u=(X_{1,0}, X_{2,0}, P_0, X_{1,1}, X_{2,1}, P_1, \ldots, X_{1,k}, X_{2,k}, P_k, \ldots)^T$, the relationship Hu=0 holds true. This point is as explained in Embodiment 1 (see equation 27).

Next, an LDPC-CC for which the time varying period is m is considered in the case of a coding rate of ⅔. In the same way as when the time varying period is 2, m parity check polynomials represented by equation 28 are provided. Then "check equation #1" represented by equation 28 is provided. "Check equation #2" to "check equation #m" represented by equation 28 are provided in a similar way. Data X and parity P of point in time mi+1 are represented by $X_{mi+1}$ and $P_{mi+1}$ respectively, data X and parity P of point in time mi+2 are represented by $X_{mi+2}$ and $P_{mi+2}$ respectively, ..., and data X and parity P of point in time mi+m are represented by $X_{mi+m}$ and $P_{mi+m}$ respectively (where i is an integer).

Consider an LDPC-CC for which parity $P_{mi+1}$ of point in time mi+1 is found using "cheek equation #1," parity $P_{mi+2}$ of point in time mi+2 is found using "check equation #2," ..., and parity $P_{mi+m}$ of point in time mi+m is found using "check equation #m." An LDPC-CC code of this kind provides the following advantages:

An encoder can be configured easily, and parity can be found sequentially.

Termination bit reduction and received quality improvement in puncturing upon termination can be expected.

Figure 29:
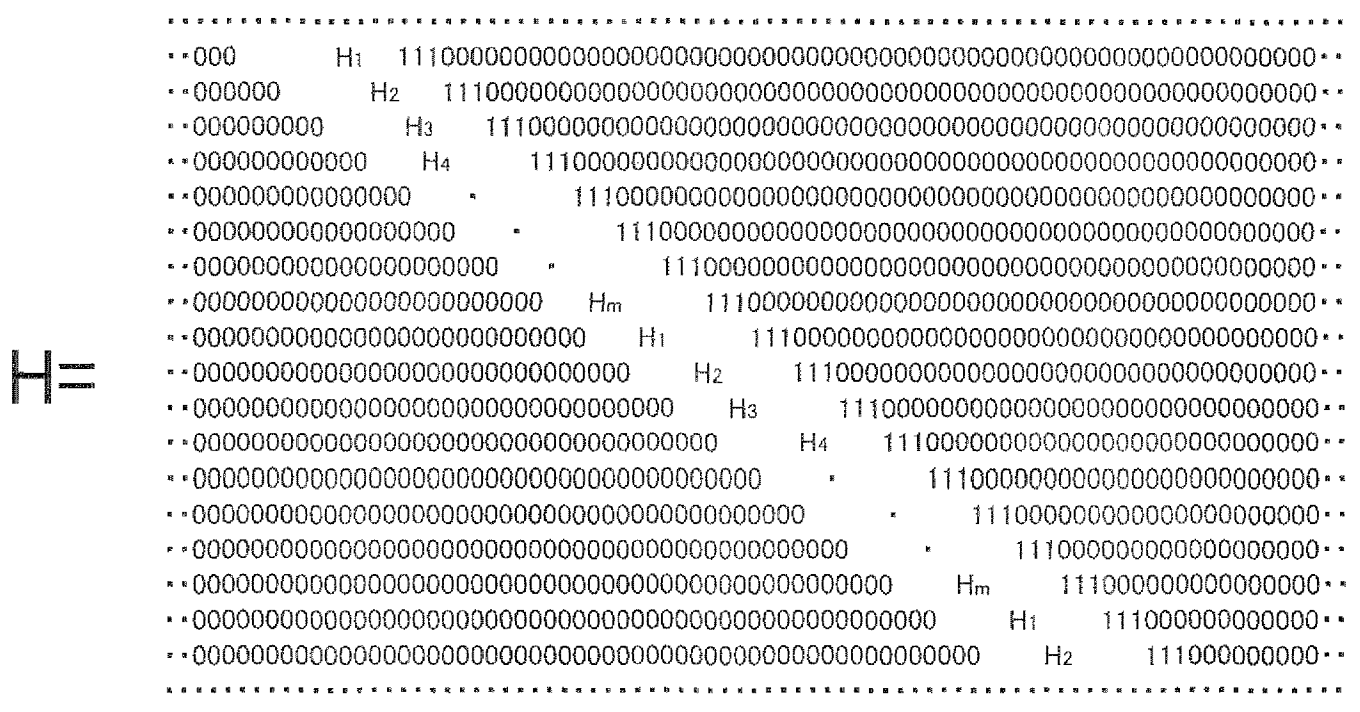

FIG. 29 shows the configuration of the above LDPC-CC parity check matrix of a coding rate of ⅔ and a time varying period of m. In FIG. 29, $(H_1,111)$ is a part corresponding to "check equation #1," $(H_2,111)$ is a part corresponding to "check equation #2," ..., and $(H_m,111)$ is a part corresponding to "check equation #m." Below, $(H_1,111)$ is defined as a first sub-matrix, $(H_2,111)$ is defined as a second sub-matrix, ..., and $(H_m, 111)$ is defined as an m-th sub-matrix.

Thus, LDPC-CC parity check matrix H of a time varying period of m of this proposal can be defined by a first sub-matrix representing a parity check polynomial of "check equation #1", a second sub-matrix representing a parity check polynomial of "check equation #2", ..., and an m-th sub-matrix representing a parity check polynomial of "check equation #m". Specifically, in parity check matrix H, a first sub-matrix to m-th sub-matrix are arranged periodically in the row direction (see FIG. 29). When the coding rate is ⅔, a configuration is employed in which a sub-matrix is shifted three columns to the right between an i-th row and (i+1)-th row (see FIG. 29).

If transmission vector u is represented as $u=(X_{1,0}, X_{2,0}, P_0, X_{1,1}, X_{2,1}, P_1, \ldots, X_{1,k}, X_{2,k}, P_k, \ldots)^T$, the relationship Hu=0 holds true. This point is as explained in Embodiment 1 (see equation 27).

In the above description, a ease of a coding rate of ⅔ has been described as an example of a time-invariant/time varying LDPC-CC based on a convolutional code of a coding rate of (n−1)/n, but a time-invariant/time varying LDPC-CC parity check matrix based on a convolutional code of a coding rate of (n−1)/n can be created by thinking in a similar way.

Figure 30:
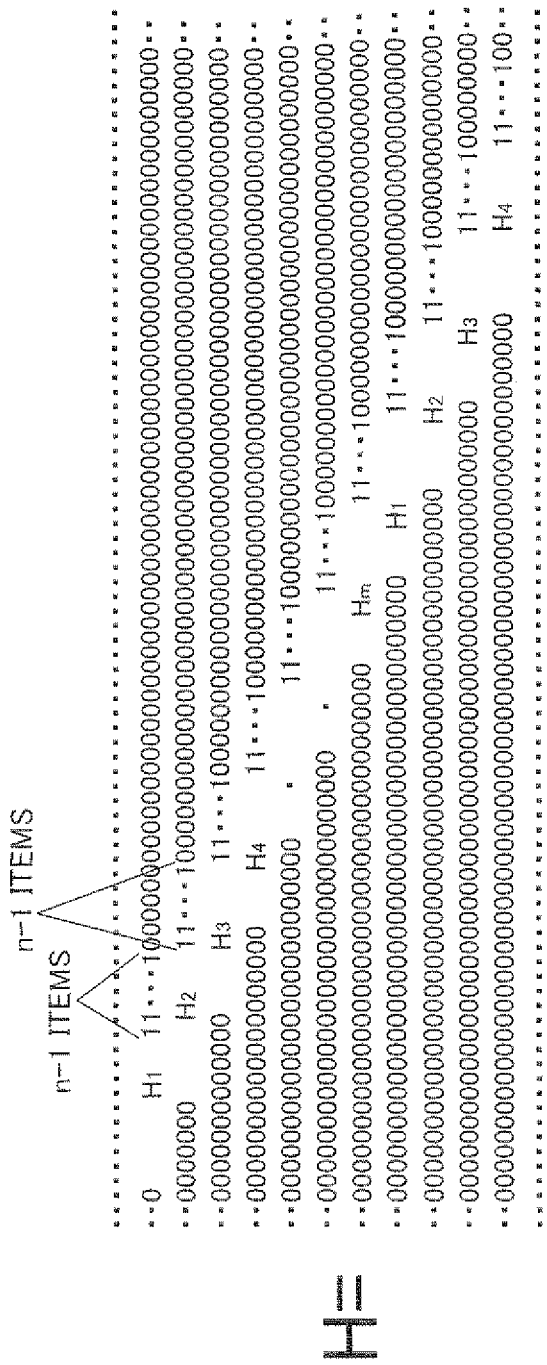
FIG. 30 shows an example of the configuration of an LDPC-CC parity check matrix of a coding rate of (n−1)/n and a time varying period of m.

That is to say, in the case of a coding rate of ⅔, in FIG. 29, $(H_1,111)$ is a part (first sub-matrix) corresponding to "check equation #1," $(H_2,111)$ is a part (second sub-matrix) corresponding to "check equation #2," ..., and $(H_m,111)$ is a part (m-th sub-matrix) corresponding to "check equation #m," while, in the case of a coding rate of (n−1)/n, the situation is as shown in FIG. 30. That is to say, a part (first sub-matrix) corresponding to "check equation #1" is represented by $(H_1, 11 \ldots 1)$, and a part (k-th sub-matrix) corresponding to "check equation #k" (where k=2, 3, ..., m) is represented by $(H_k, 11 \ldots 1)$. At this time, the number of "1"s of parts excluding $H_k$ in the k-th sub-matrix is n−1. Also, in parity check matrix H, a configuration is employed in which a sub-matrix is shifted n−1 columns to the right between an i-th row and (i+1)-th row (see FIG. 30).

If transmission vector u is represented as $u=(X_{1,0}, X_{2,0}, \ldots, X_{n-1,0}, P_0, X_{1,1}, X_{2,1}, \ldots, X_{n-1,1}, P_1, \ldots, X_{1,k},$ $X_{2,k}, \ldots, X_{n-1,k}, P_k, \ldots)^T$, the relationship Hu=0 holds true. This point is as explained in Embodiment 1 (see equation 27).

Figure 31:
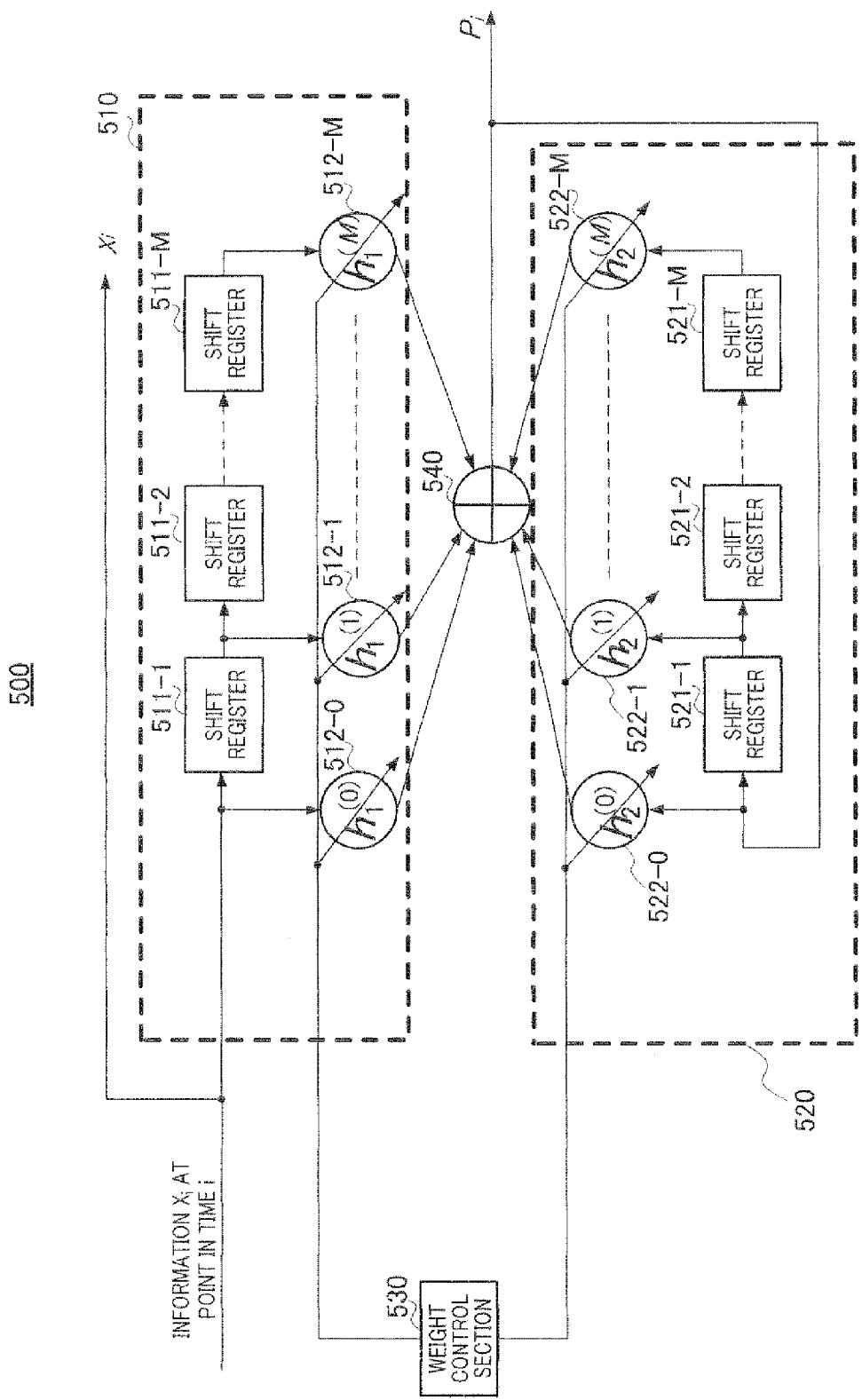
FIG. 31 shows an example of the configuration of an LDPC-CC encoding section.

FIG. 31 shows an example of the configuration of an LDPC-CC encoder when the coding rate is R=½. As shown in FIG. 31, LDPC-CC encoding section 500 is provided mainly with data computing section 510, parity computing section 520, weight control section 530, and modulo 2 adder (exclusive OR computer) 540.

Data computing section 510 is provided with shift registers 511-1 to 511-M and weight multipliers 512-0 to 512-M.

Parity computing section 520 is provided with shift registers 521-1 to 521-M and weight multipliers 522-0 to 522-M.

Shift registers 511-1 to 511-M and 521-1 to 521-M are registers storing and $v_{1,t-i}$ and $v_{2,t-i}$ (where i=0, ..., M) respectively, and, at a timing at which the next input comes in, send a stored value to the adjacent shift register to the right, and store a new value sent from the adjacent shift register to the left. The initial state of the shift registers is all-zeros.

Weight multipliers 512-0 to 512-M and 522-0 to 522-M switch values of $h_1^{(m)}$ and $h_2^{(m)}$ to 0 or 1 in accordance with a control signal outputted from weight control section 530.

Based on a parity check matrix stored internally, weight control section 530 outputs values of $h_1^{(m)}$ and $h_2^{(m)}$ at that timing, and supplies them to weight multipliers 512-0 to 512-M and 522-0 to 522-M.

Modulo 2 adder 540 adds all modulo 2 calculation results to the outputs of weight multipliers 512-0 to 512-M and 522-0 to 522-M, and calculates $v_{2,t}$.

By employing this kind of configuration, LDPC-CC encoding section (LDPC-CC encoder) 500 can perform LDPC-CC encoding in accordance with a parity check matrix.

If the arrangement of rows of a parity check matrix stored by weight control section 530 differs on a row-by-row basis, LDPC-CC encoding section 500 is a time varying convolutional encoder. Also, in the case of an LDPC-CC of a coding rate of (q−1)/q, a configuration needs to be employed in which (q−1) data computing sections 510 are provided and modulo 2 adder 540 performs modulo 2 addition of the outputs of weight multipliers.

Embodiment 4

The present embodiment will explain an erasure correction scheme in detail again, and explain in detail a method of changing the erasure correction code coding rate and a communication apparatus adopting this method.

Figure 32:
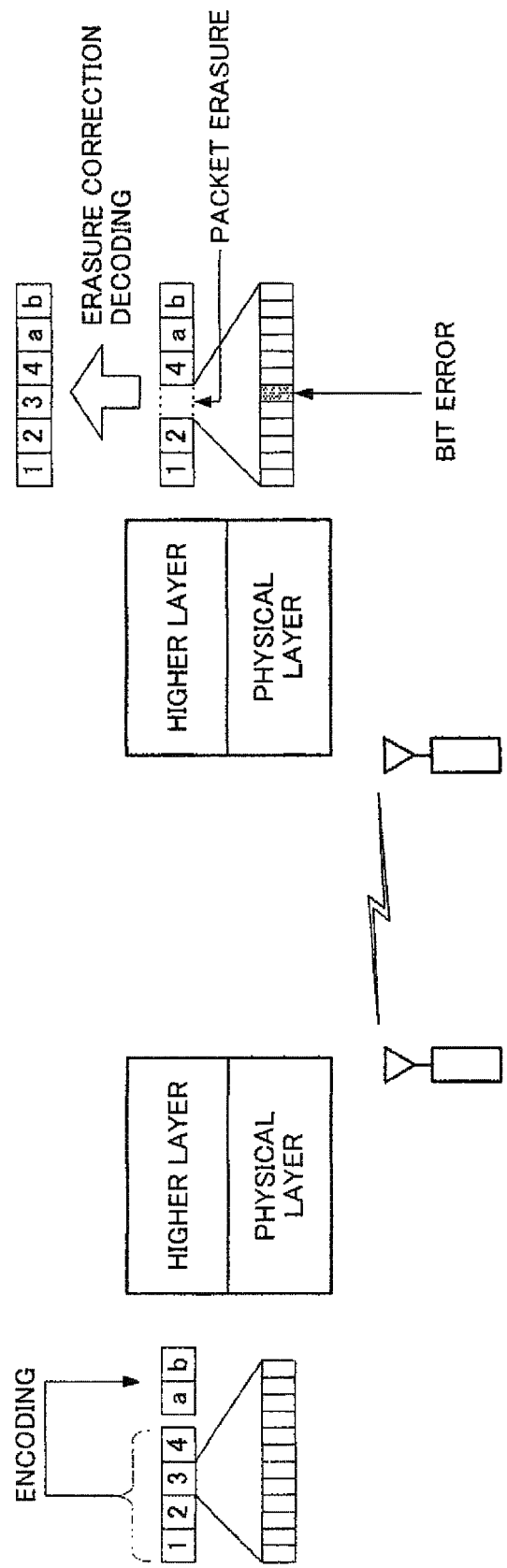
FIG. 32 is a conceptual diagram showing a communication system utilizing LDPC code erasure correction coding.

FIG. 32 is a conceptual diagram showing a communication system using an LDPC code erasure correction coding, as an example. In FIG. 32, a communication apparatus on the encoding side performs LDPC coding of information packets 1 to 4 to transmit, and generates parity packets a and b. A higher layer processing section outputs packets attaching the parity packets to information packets, to a lower layer (in the example of FIG. 32, a physical layer (PHY)), and a physical layer processing section in the lower layer converts the packets into a form that can be transmitted in a communication channel, and outputs the result to the communication channel. FIG. 32 shows a case where a communication channel is a radio communication channel.

A communication apparatus on the decoding side performs reception processing in a physical layer processing section of the lower layer. At this time, assume that bit error occurs in the lower layer. A case is possible where, due to this bit error, a packet including the corresponding bit is not decoded correctly in the higher layer and where a packet is erased. In the example of FIG. 32, a case is shown where information packet 3 is erased. A higher layer processing section decodes erased information packet 3 by applying LDPC decoding processing to the received packet sequence. As LDPC decoding, for example, sum-product decoding that performs decoding using belief propagation (BP) or a Gauss elimination method is used.

Figure 33:
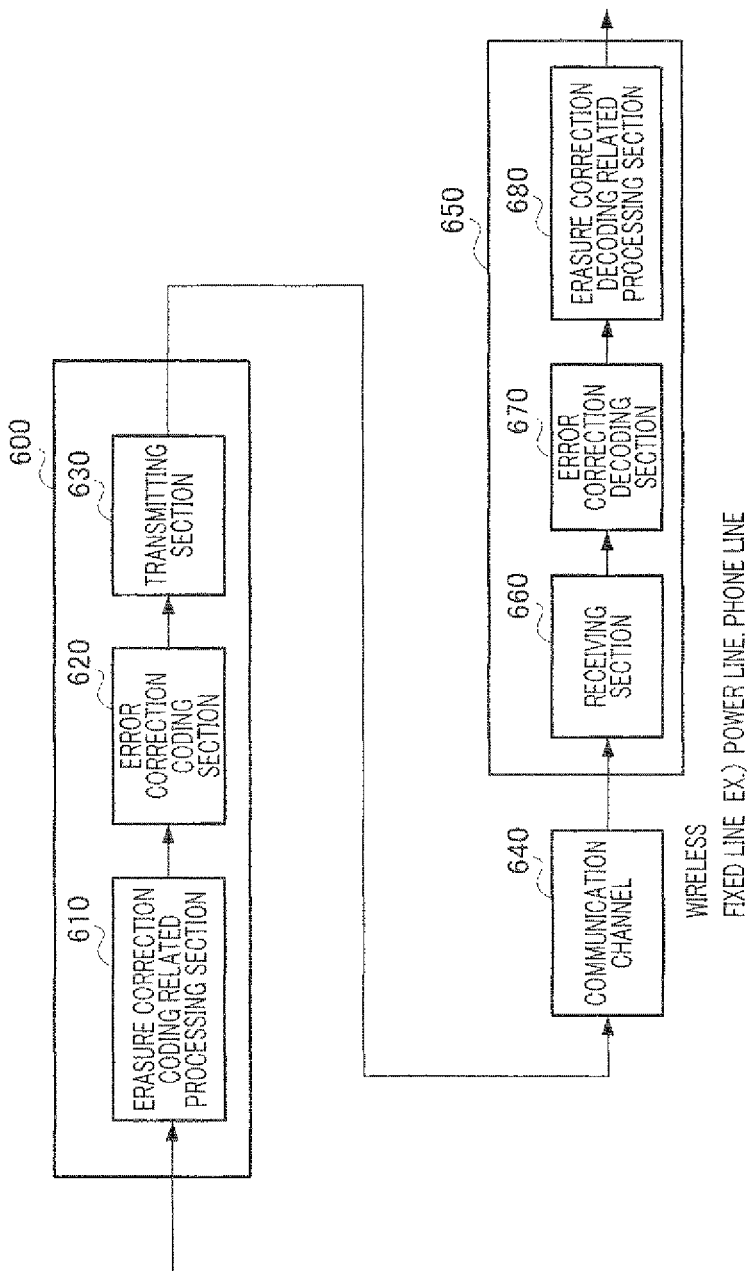
FIG. 33 shows the overall configuration of a communication system shown in FIG. 32.

FIG. 33 shows the overall configuration of the above communication system. In FIG. 33, the communication system includes communication apparatus 600 on the encoding side, communication channel 640 and communication apparatus 650 on the decoding side. Communicating apparatus 600 on the encoding side includes erasure correction coding related processing section 610, error correction coding section 620 and transmitting section 630, and communication apparatus 650 on the decoding side includes receiving section 660, error correction decoding section 670 and erasure correction decoding related processing section 680. Communication channel 640 represents the route through which a signal transmitted from transmitting section 630 of communication apparatus 600 on the encoding side passes before the signal is received in receiving section 660 of communication apparatus 650 on the decoding side. As communication channel 640, it is possible to use an Ethernet (registered trademark), power line, metal cable, optical fiber, radio, light (such as visible light and infrared) or combinations of these. Also, error correction coding section 620 adopts an error correction code in the physical layer in addition to an erasure correction code, in order to correct error that occurs in communication channel 640. Therefore, error correction decoding section 670 decodes an error correction code in the physical layer.

Figure 34A:
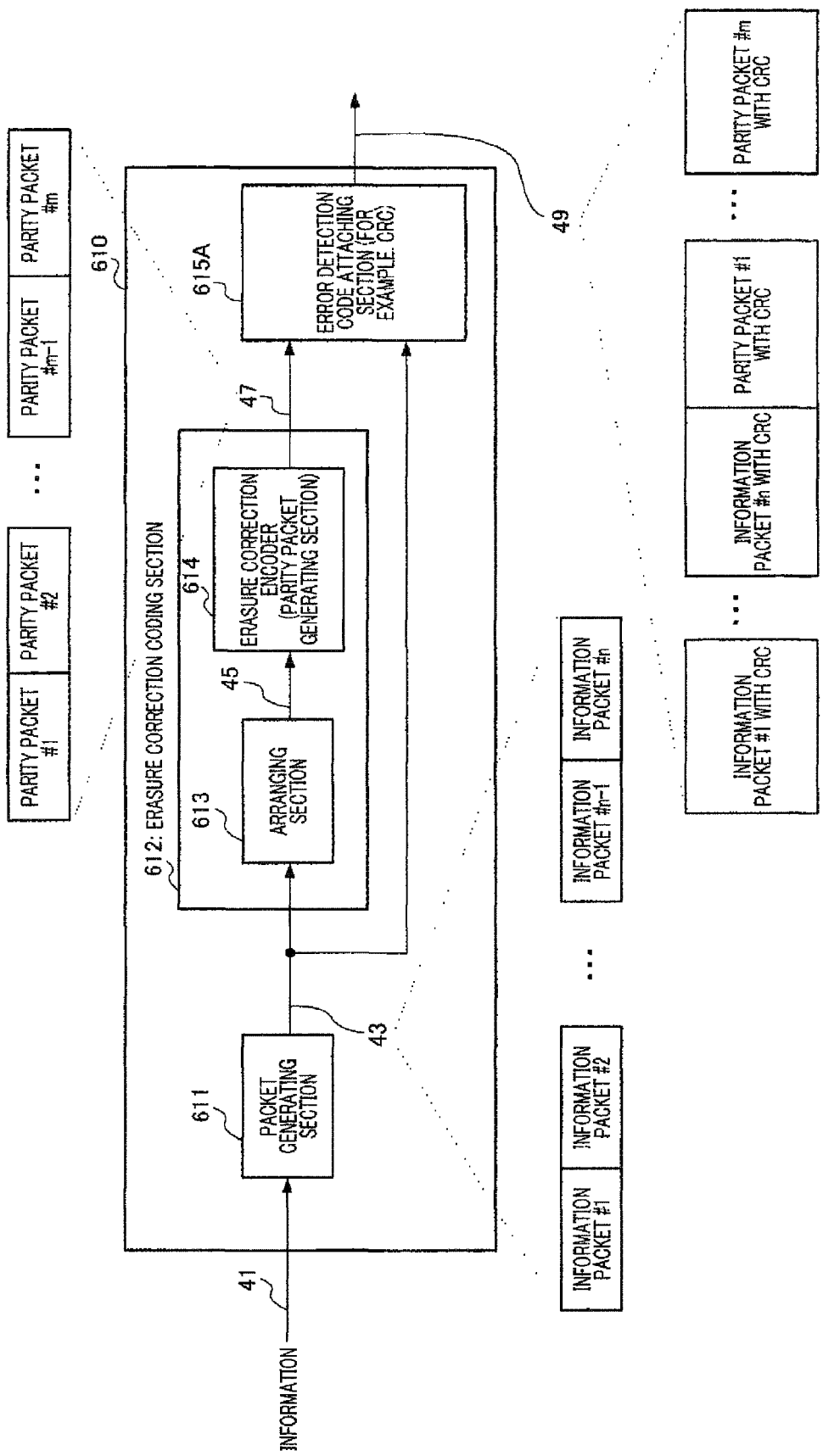
FIG. 34A shows a specific configuration of an erasure correction coding related processing section shown in FIG. 32.

FIG. 34A shows a specific configuration of erasure correction coding related processing section 610. The erasure correction coding method in erasure correction coding related processing section 610 will be explained using FIG. 34A.

Packet generating section 611 receives information 41 as input, and generates and outputs information packet 43 to erasure correction coding section 612 and error correction code attaching section 615A. In the following, a case will be explained as an example, where information packet 43 is formed with information packets #1 to #n.

Erasure correction coding section 612 includes arranging section 613 and erasure correction encoder (parity packet generating section) 614.

Arranging section 613 receives information packet 43 (in this case, information packets #1 to #n) as input, arranges the order of information and outputs arranged information 45.

Erasure correction encoder 614 receives arranged information 45 as input, and generates parity by applying, for example, LDPC-BC (Low-Density Parity-Check Block Code) or LDPC-CC (Low-Density Parity-Check Convolutional Code) coding to information 45. Erasure correction encoder 614 extracts only generated parity part, generates parity packet 47 from the extracted parity part and outputs parity packet 47. At this time, when parity packets #1 to #m are generated for information packets #1 to #n, parity packet 47 is represented by parity packets #1 to #m.

Error detection code attaching section 615A receives information packet 43 (information packets #1 to #n) and parity packet 47 (parity packets #1 to #m) as input, attaches a detection code (e.g. CRC (Cyclic Redundancy Check)) to information packet 43 (information packets #1 to #n) and parity packet 47 (parity packets #1 to #m), and outputs information packet 43 and parity packet 49 with CRC. Therefore, information packet 43 and parity packet 49 with CRC are formed with information packets #1 to #n with CRC and parity packets #1 to #m with CRC, respectively.

Figure 34B:
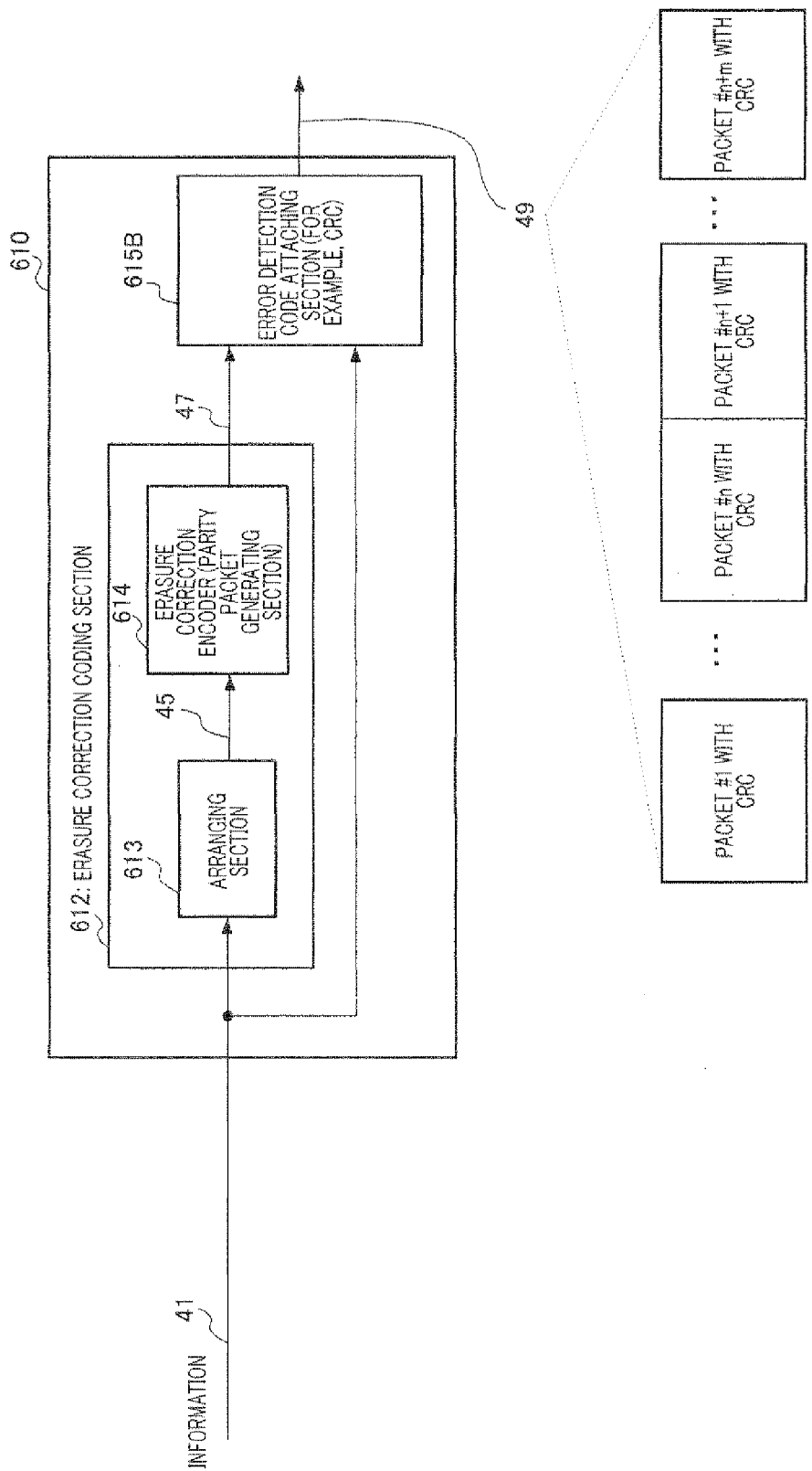
FIG. 34B shows another specific configuration of an erasure correction coding related processing section shown in FIG. 32.

FIG. 34B shows another specific configuration of erasure correction coding related processing section 610 that differs from in FIG. 34A.

Error detection code attaching section 615B receives information packet 43 (information packets #1 to #n) and parity packet 47 (parity packets #1 to #m) as input, forms packets #1 to #n+m using information and parity as data without distinguishing between information packet 43 (information packets #1 to #n) and parity 47, attaches an error detection code (e.g. CRC) to these packets and outputs packets #1 to #n+m with CRC.

Figure 35:
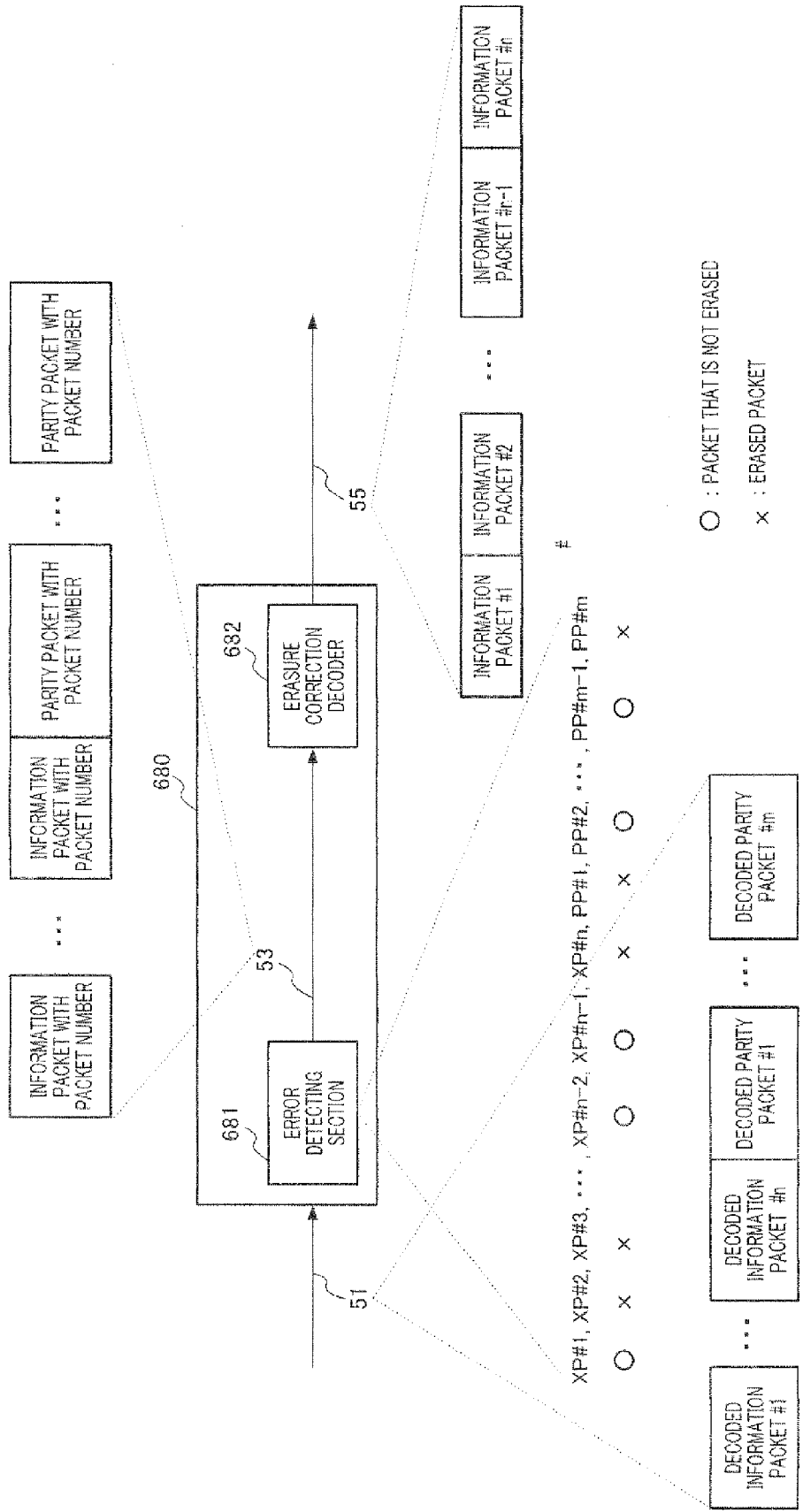
FIG. 35 shows a specific configuration of an erasure correction decoding related processing section shown in FIG. 32.

FIG. 35 shows the configuration inside erase correction decoding related processing section 680. Erase correction decoding related processing section 680 of FIG. 35 decodes packets encoded in erasure correction coding related processing section 610 of FIG. 34A. The erasure correction decoding method in erasure correction decoding related processing section 680 will be explained using FIG. 35.

Error detecting section 681 receives as input packet 51 in which an error correction code has been decoded in the physical layer, and detects error by, for example, CRC. At this time, packet 51 in which the error correction code has been decoded in the physical layer, is formed with decoded information packets #1 to #n and decoded parity packets #1 to #m. As a result of error detection, for example, if there are erased packets in the decoded information packets and the decoded parity packets as shown in FIG. 35, error detecting section 681 assigns packet numbers to information packets and parity packets in which a packet is not erased, and outputs the results as packet 53.

Erasure correction decoder 682 receives as input packet 53 (information packets (with packet numbers) and parity packets (with packet numbers) in which a packet is not erased), and decodes information packet 55 (information packets #1 to #n) by performing erasure correction decoding.

Also, as for packets encoded in erasure correction coding related processing section 610 of FIG. 34B, error detecting section 681 receives packets, without distinguishing between information packets and parity packets, as input decoded packet 51, and performs erasure correction decoding.

Figure 36:
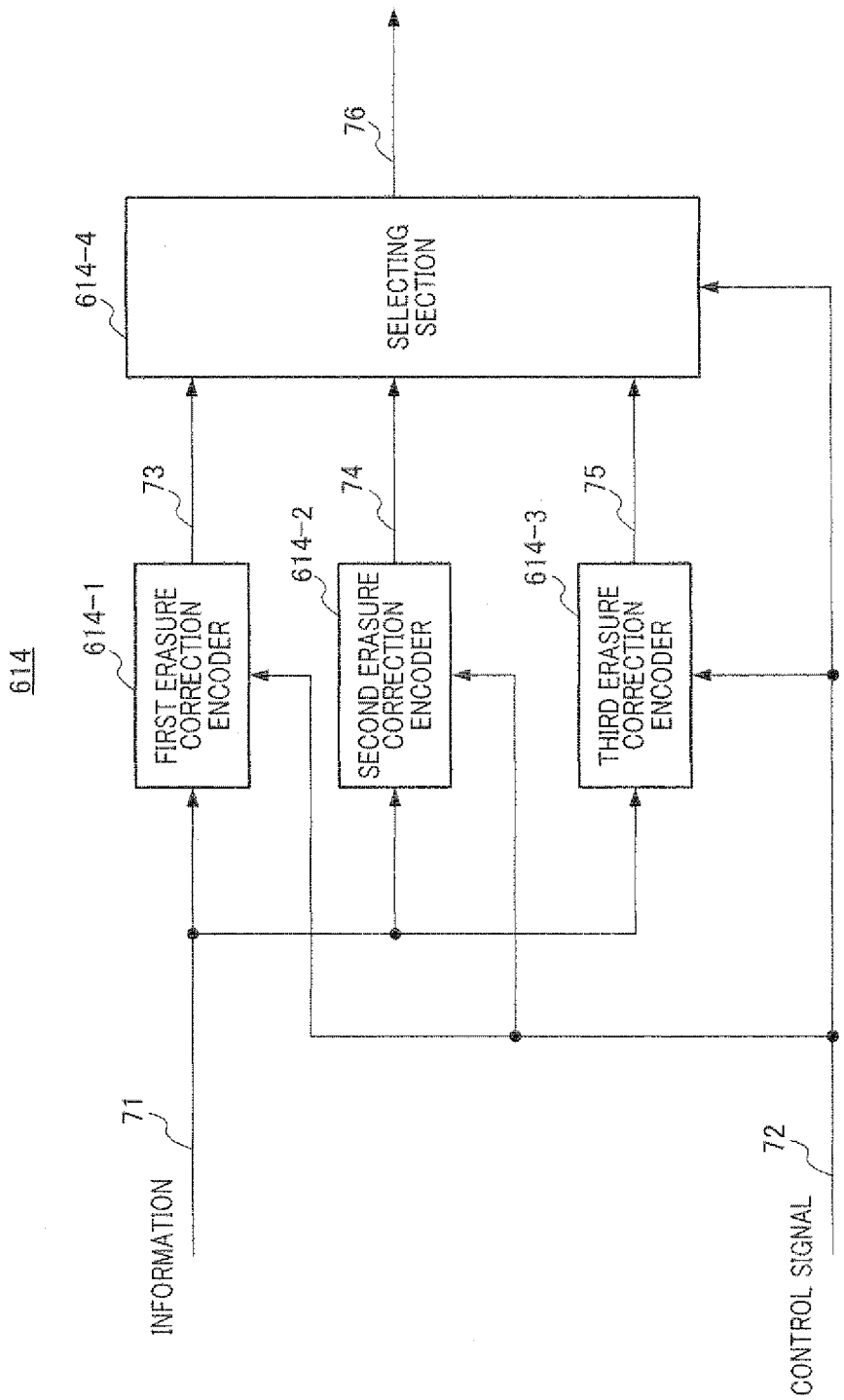
FIG. 36 shows a configuration example of an erasure correction encoder that can change the erasure correction code coding rate according to communication quality.

By the way, from the perspective of realizing both improved transmission efficiency and improved erasure correction capability, it is desirable to enable the coding rate in an erasure correction code to be changed based on communication quality. FIG. 36 shows a configuration example of erasure correction encoder 614 that can change the coding rate of an erasure correction code according to communication quality.

First erasure correction encoder 614-1 is an encoder for an erasure correction code of a coding rate of ½, second erasure correction encoder 614-2 is an encoder for an erasure correction code of a coding rate of ⅔, and third erasure correction encoder 614-3 is an encoder for an erasure correction code of a coding rate of ¾.

First erasure correction encoder 614-1 receives information 71 and control signal 72 as input, and, if control signal 72 designates a coding rate of ½, encodes information 71 and outputs data 73 subjected to erasure correction coding to selecting section 614-4. Similarly, second erasure correction encoder 614-2 receives information 71 and control signal 72 as input, and, if control signal 72 designates a coding rate of ⅔, encodes information 71 and outputs data 74 subjected to erasure correction coding to selecting section 614-4. Similarly, third erasure correction encoder 614-3 receives information 71 and control signal 72 as input, and, if control signal 72 designates a coding rate of ¾, encodes information 71 and outputs data 75 subjected to erasure correction coding to selecting section 614-4.

Selecting section 614-4 receives data 73, 74 and 75 subjected to erasure correction coding and control signal 72 as input, and outputs data 75 corresponding to the coding rate designated by control signal 72, as data 76 subjected to erasure correction coding.

Thus, erasure correction encoder 614 can change the coding rate of an erasure correction code according to control signal 72, so that it is possible to realize both improved received quality of the communicating party and improved transmission speed of data (information) by setting a suitable coding rate according to the communication condition.

By the way, in the case of an error correction code of a physical layer, it is known that it is preferable to use, as parameters, the SNR (Signal-to-Noise power Ratio) or reception field intensity of signals passing through a transmission channel, the block error rate (packet error rate) fed back from the communicating party or the number of retransmission requests based on ACK (ACKnowledgement)/NACK (Negative ACKnowledgement) information, and change the coding rate of the physical layer error correction code using these parameters. In contrast, even in the case of an erasure correction code, in the same way as in the case of the physical layer error correction code, parameters used upon changing the coding rate of the above physical layer error correction code are naturally parameters used upon changing the erasure correction code coding rate. However, an erasure correction code is encoded before a physical layer correction code on the transmitting side, so that there is a possibility of being able to further improve the received quality of the communicating party and the transmission speed of data (information). However, this problem has not been sufficiently investigated.

A case will be explained in detail with the present embodiment, where the received quality of the communicating party and the transmission speed of data (information) are further improved by changing the erasure correction code coding rate using, as one parameter, the size of a packet (hereinafter "packet size") in which an error detection code (e.g. CRC) is inserted.

Figure 37:
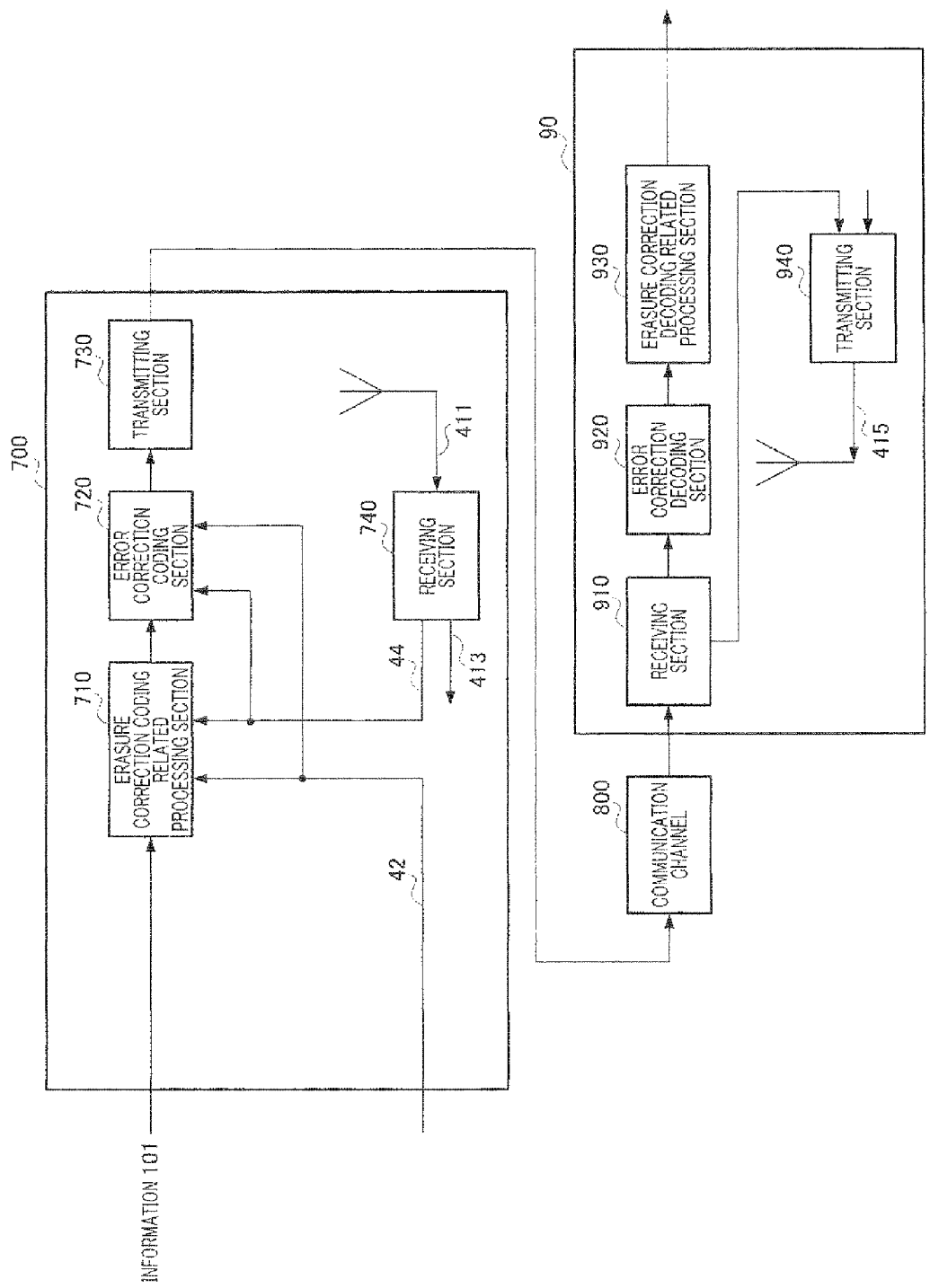
FIG. 37 showing the overall configuration of a communication system according to Embodiment 4 of the present invention.

FIG. 37 shows the overall configuration of a communication system according to the present embodiment. In FIG. 37, the communication system includes communication apparatus 700 on the encoding side, communication channel 800 and communication apparatus 900 on the decoding side. Communication channel 800 represents the route through which a signal transmitted from transmitting section 730 of communication apparatus 700 on the encoding side passes before the signal is received in receiving section 910 of communication apparatus 900 on the decoding side. The communication system of FIG. 37 differs from the communication system of FIG. 33 in that the communication system of FIG. 37 can change the erasure correction code coding rate.

Receiving section 910 of communication apparatus 900 receives signals transmitted from communication apparatus 700 and estimates the communication condition from control information signals of the received signals such as a pilot signal and a preamble. Then, receiving section 910 generates feedback information including information of the reception intensity, information about an occurrence of packet error and CSI (Channel State Information), according to the communication condition, and outputs this generated feedback information to transmitting section 940. Also, feedback information is not limited to these items of information, and any information is possible as long as this information indicates the communication condition. Feedback information is transmitted from transmitting section 940 to communication apparatus 700 via an antenna.

Receiving section 740 of communication apparatus 700 generates control signal 44 including information about the communication condition, from the feedback information transmitted from communication apparatus 900.

Erasure correction coding related processing section 710 receives as input control signal 44 including information about the communication condition and setting signal 401 including information about the size (packet size) of bits forming packets, sets the erasure correction code coding rate and/or the erasure correction code block size based on control signal 44 and setting signal 401, and performs erasure correction coding of information 101. The method of setting the erasure correction code coding rate and/or the erasure correction code block size in erasure correction coding related processing section 710, will be described later.

In order to correct error that occurs through communication channel 800, error correction coding section 720 adopts an error correction code in a physical layer apart from an erasure correction code in erasure correction coding related processing section 710, and generates an encoded sequence by performing error correction coding of an input sequence received as input from erasure correction coding related processing section 710.

Transmitting section 730 performs predetermined processing (such as modulation, band limitation, frequency conversion and amplification) on the encoded sequence generated by error correction coding in the physical layer in error correction coding section 720.

Receiving section 740 receives as input received signal 411 received at the antenna, and generates data 413 by performing predetermined processing (such as band limitation, frequency conversion, amplification and demodulation) on received signal 411.

Receiving section 910 of communication apparatus 900 outputs other signals than control information signals in received signals, to error correction decoding section 920.

Error correction decoding section 920 generates decoded packets by applying error correction decoding in the physical layer to the signals received as input from receiving section 910.

Erasure correction decoding related processing section 930 applies erasure correction decoding to the decoded packets. At this time, information about the coding rate in an erasure correction scheme and the block length (information length or processing length) in coding, is transmitted from communication apparatus 700, and, by finding this information, communication apparatus 900 controls the processing method related to erasure correction decoding. Here, this point is not essential in the present invention, and therefore specific explanation will be omitted.

Transmitting section 940 receives feedback information and transmission information as input, generates transmission signal 415 by performing predetermined processing (such as modulation, band limitation, frequency conversion and amplification) on the feedback information and the transmission information, and transmits transmission signal 415 from, for example, an antenna to communication apparatus 700.

Figure 38A:
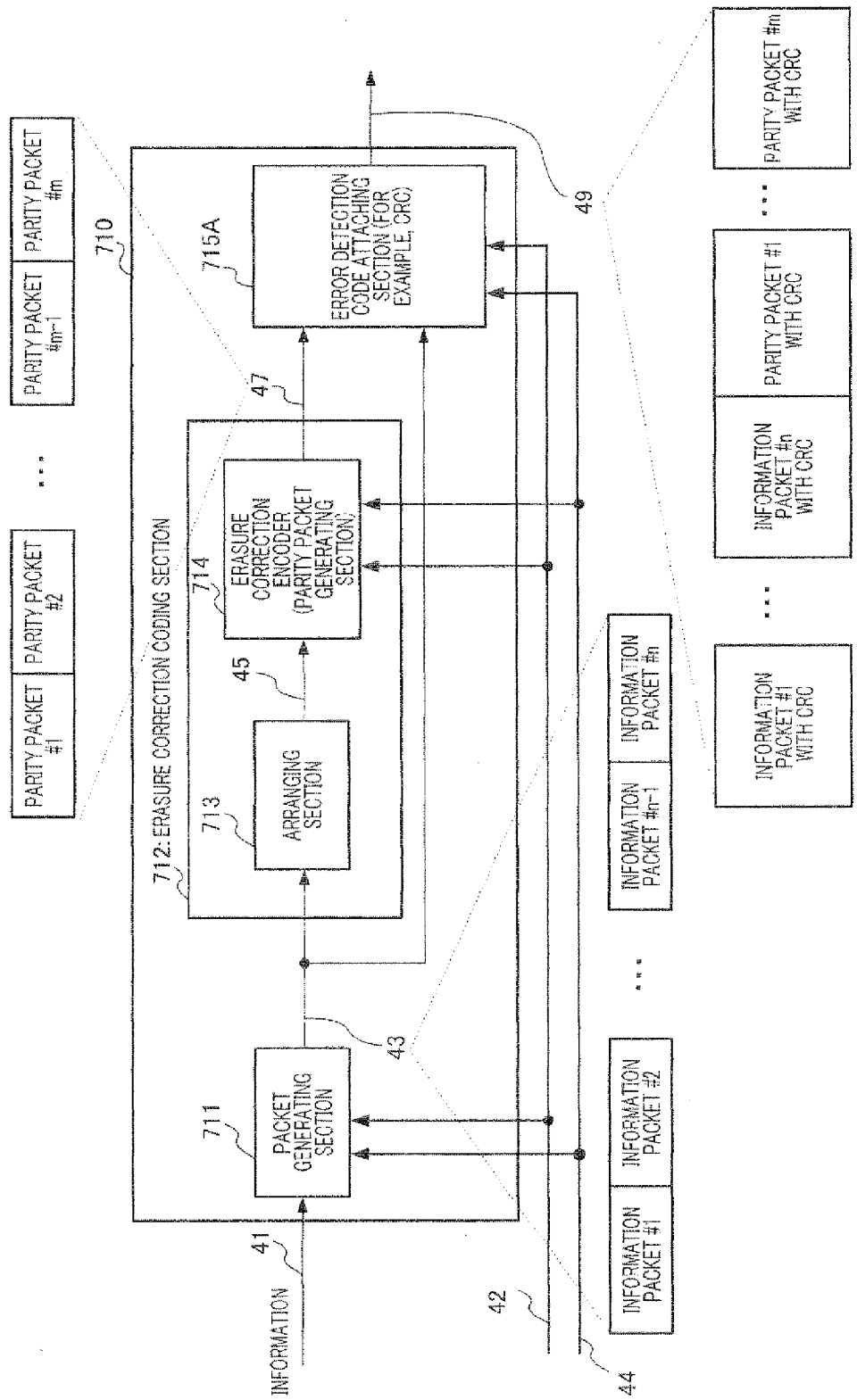
FIG. 38A shows a specific configuration of an erasure correction coding related processing section according to Embodiment 4.

FIG. 38A is a block diagram showing the specific configuration of erasure correction coding related processing section 710 according to the present embodiment. Also, in FIG. 38A, the same signals as in FIG. 34A are assigned the same reference numerals as in FIG. 34A. FIG. 38A differs from FIG. 34A mainly in adding setting signal 42 and control signal 44.

Also, setting signal 42 refers to a signal including information about the size of bits (packet size) forming packets, and control signal 44 refers to a signal including feedback information transmitted from communication apparatus 900.

Packet generating section 711, erasure correction encoder 714 and error detection code attaching section 715A receive setting section 42 and control signal 44 as input, and sets the erasure correction code coding rate and/or the erasure correction code block size based on the packet size included in setting signal 42 and the communication condition designated by control signal 44.

Packet generating section 711 receives information 41 as input, and generates and outputs information packet 43 to erasure correction coding section 712 and error detection attaching section 715A. In the following, a case will be explained as an example, where information packet 43 is formed with information packets #1 to #n.

Erasure correction coding section 712 includes arranging section 713 and erasure correction encoder (parity packet generating section) 714.

Arranging section 713 receives information packet 43 (in this case, information packets #1 to #n) as input, arranges the order of information and outputs arranged information 45.

Erasure correction encoder 714 receives arranged information 45 as input, and generates parity by applying, for example, LDPC-BC (Low-Density Parity-Check Block Code) or LDPC-CC (Low-Density Parity-Check Convolutional Code) coding to information 45. Erasure correction encoder 714 extracts only generated parity part, generates parity packet 47 from the extracted parity part and outputs parity packet 47. At this time, when parity packets #1 to #m are generated for information packets #1 to #n, parity packet 47 is represented by parity packets #1 to #m.

Error detection code attaching section 715A receives information packet 43 (information packets #1 to #n) and parity packet 47 (parity packets #1 to #m) as input, attaches a detection code (e.g. CRC (Cyclic Redundancy Check)) to information packet 43 (information packets #1 to fin) and parity packet 47 (parity packets #1 to #m), and outputs information packet 43 and parity packet 49 with CRC. Therefore, information packet 43 and parity packet 49 with CRC are formed with information packets #1 to #n with CRC and parity packets #1 to #m with CRC, respectively.

Figure 38B:
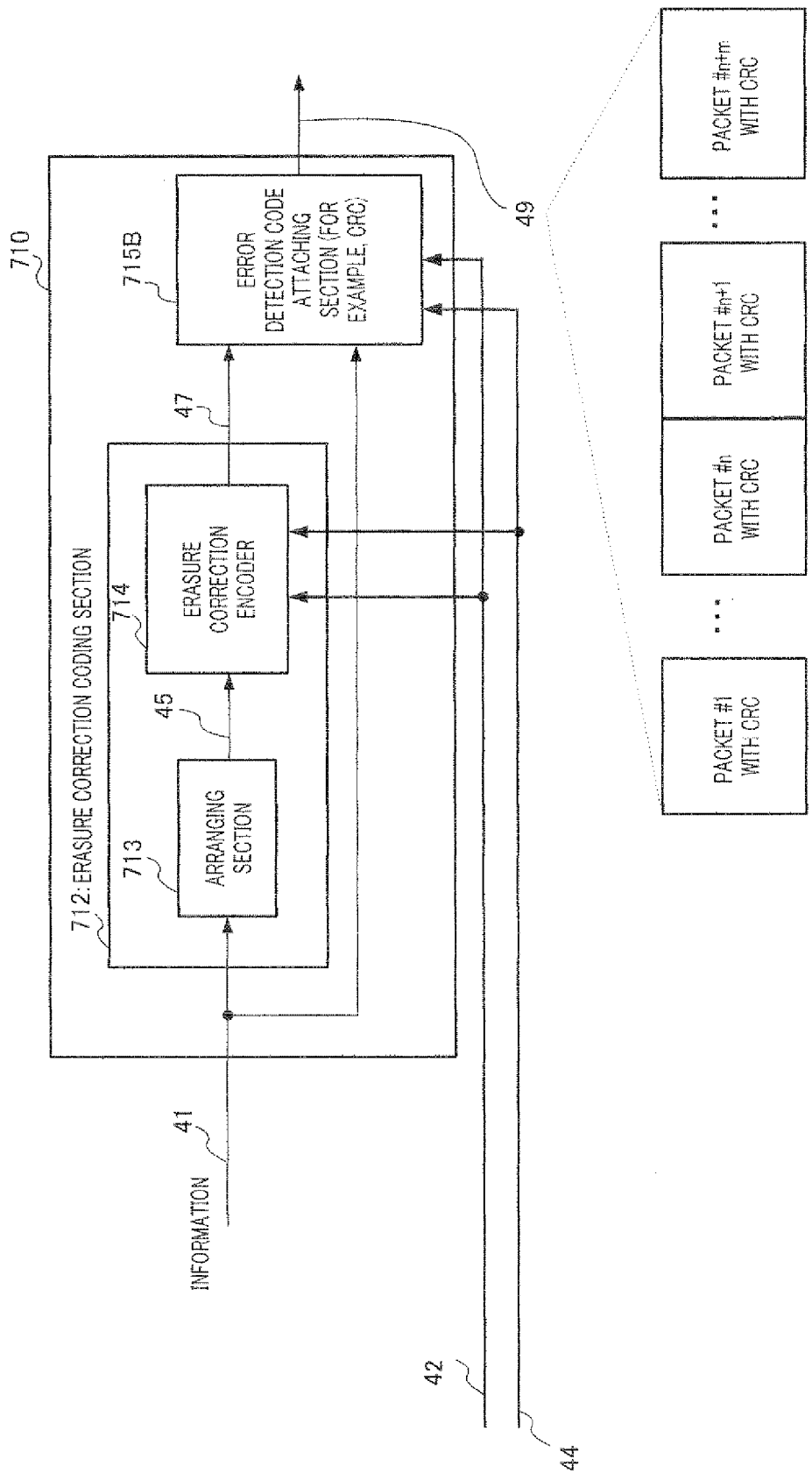
FIG. 38B shows another specific configuration of an erasure correction coding related processing section according to Embodiment 4.

FIG. 38B differs from FIG. 38A and is a block diagram showing the specific configuration of erasure correction coding related processing section 710 according to the present embodiment. Also, in FIG. 38B, the same components as in FIG. 34B and FIG. 38A will be assigned the same reference numerals. FIG. 38B differs from FIG. 34B mainly in adding setting signal 42 and control signal 44. Also, similar to FIG. 38A, setting signal 42 refers to a signal including information about the size of bits (packet size) forming packets, and control signal 44 refers to a signal including feedback information transmitted from communication apparatus 900.

Error detection code attaching section 715B receives information packet 43 (information packets #1 to #n) and parity packet 47 (parity packets #1 to #m) as input, forms packets #1 to #n+m using information and parity as data without distinguishing between information packet 43 (information packets #1 to #n) and parity 47 (parity packets #1 to #m), attaches an error detection code (e.g. CRC) to these packets and outputs packets #1 to #n+m with CRC.

Figure 39:
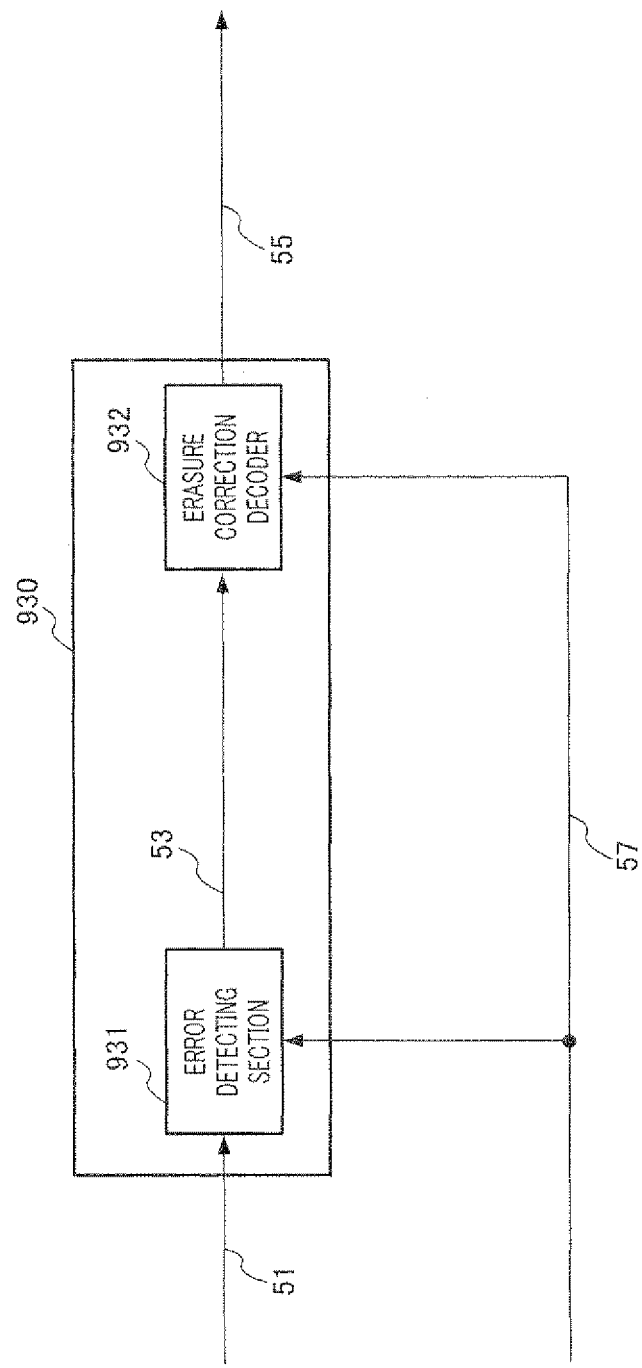
FIG. 39 shows a specific configuration of an erasure correction decoding related processing section according to Embodiment 4.

FIG. 39 shows an example of the configuration inside erasure correction decoding related processing section 930. In FIG. 39, the same signals as in FIG. 35 will be assigned the same reference numerals. Information 57 refers to information acquired by demodulating erasure correction coding method information in communication apparatus 700 of the communicating party and includes, for example, information of the erasure correction code coding rate and the packet size.

Error detecting section 931 receives as input data 51 and erasure correction coding method information 57, performs error detection based on, for example, information of the packet size and erasure correction coding rate information included in erasure correction coding method information 57, and outputs packet 53 subjected to error detection.

Erasure correction decoder 932 receives as input packet 53 subjected to error detection and erasure correction coding method information 57, performs erasure correction decoding based on erasure correction coding method information 57, and outputs decoded packet 55.

Next, a method will be explained in which erasure correction coding related processing section 710 changes the erasure correction code coding rate and/or the erasure correction code block size using, as one parameter, the size of packets (packet size) to insert an error detection code (e.g. CRC).

Figure 40:
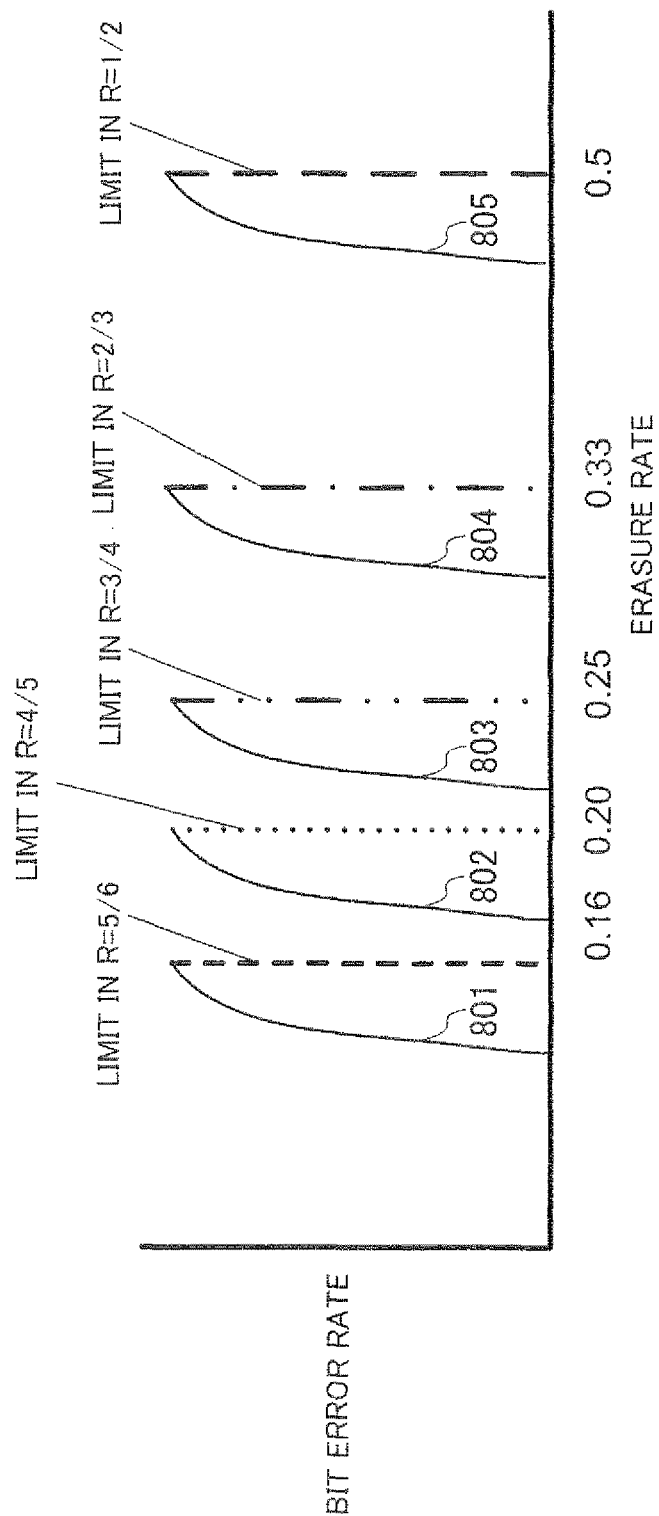
FIG. 40 shows relationships between the limit performance of bit error rates in coding rates of ½, ⅔, ¾, ⅘ and ⅚ and erasure rates.

FIG. 40 shows relationships between the limit performance of bit error rates in bit error rate R=½, ⅔, ¾, ⅘ and ⅚ and the erasure rate. Here, the limit performance refer to characteristics acquired presuming an ideal code to be created, and the erasure rate represents a value dividing the number of erased bits by the total number of transmission bits. Also, in FIG. 40, curve lines 801 to 805 show performance examples between the bit error rate and the erasure rate in each coding rate. In FIG. 40, curve lines 801, 802, 803, 804 and 805 each show an example of bit error rate performance in a code of a coding rate of ½, ⅔, ¾, ⅘ or ⅚. As seen from curve lines 801 to 805, the bit error rate in each coding rate becomes low when the erasure rate is lower.

Also, as seen from FIG. 40, there is a characteristic that, when the coding rate is lower, there is a high possibility of being able to restore erased bits even in a high erasure rate. The present inventors have focused on this characteristic. That is, it has been found that, by effectively utilizing this characteristic in a communication system and setting a suitable coding rate according to the erasure rate, it is possible to further improve the received quality of the communicating party and the transmission speed of data (information).

Therefore, the present embodiment proposes a method of determining the erasure correction code coding rate based on setting signal 42 including information of the size of packets (packet size) to insert an error detection code (e.g. CRC), in addition to control signal 44 corresponding to feedback information from the communicating party.

In the following, as an example, consider a communication system in which the number of bits (packet size) forming packets to insert an error detection code (e.g. CRC) is variable between 64 and 1517 bytes. At this time, depending on the number of bits (packet size) forming one packet, the erasure rate varies even in the same number of erased packets.

For example, consider a case where: a block code like an LDPC code is used as an erasure correction code; the block code information length is 16384 bits; the coding rate is ⅔; and the number of bits of one block code is 24576 bits. At this time, the erasure rate when one packet is erased is as follows:

(Case 1) when one packet is formed with 64 bytes and erased, the erasure rate is 0.02083;

(Case 2) when one packet is formed with 256 bytes and erased, the erasure rate is 0.08333; and (Case 3) when one packet is formed with 1024 bytes and erased, the erasure rate is 0.33333. Therefore, especially in case 3, when the coding rate R is equal to or higher than ⅔, it is difficult to restore an erased packet. That is, it follows that, when one packet is formed with 1024 bytes, the coding rate R needs to be set equal to or lower than ⅔.

In view of the above, by changing the erasure correction code coding rate using, as one parameter, information of the size of packets (packet size) to insert an error detection code (e.g. CRC), it is possible to improve the received quality of the communicating party, and, depending on this, provide an advantage of improving the transmission speed of data (information).

FIG. 41 shows an example of relationships between packet sizes and usable erasure correction code coding rates in a case where a communication system can use a plurality of coding rates as an erasure correction code. Also, FIG. 41A shows an example case where the communication system can use coding rates R of ½, ⅔, ¾, ⅘ and ⅚ as an erasure correction code and use block codes such as an LDPC code or trellis codes such as a turbo code and convolutional code (LDPC convolutional code), as an erasure correction code, and where the block code length (or the information length of a processing unit) is 16384 bits. Also, FIG. 41 shows an example case where the communication system can designate three kinds of 64 bytes, 256 bytes and 1024 bytes as the packet size.

In FIG. 41, as described above, examples 1 to 3 show association examples between packet sizes and coding rates prepared taking into account the erasure rate when one packet is erased.

Example 1

In example 1, when the packet size is 64 bytes, a usable coding rate is ⅚. Also, when the packet size is 256 bytes, usable coding rates are ⅔, ¾ and ⅘. Also, when the packet size is 1024 bytes, a usable coding rate is ½. Thus, example 1 is designed such that each coding rate supports only one packet size. By this means, if the packet size is designated by setting signal 42, the erasure correction code coding rate is uniquely determined, so that there is an advantage of simplifying control of the communication apparatus. However, in example 1, it is necessary to set associations between packet sizes and coding rates so as to obey the rule that the erasure correction coding rate is made lower when the packet size is larger.

Example 2

In example 2, when the packet size is 64 bytes, usable coding rates are ½, ⅔, ¾, ⅘ and ⅚. Also, when the packet size is 256 bytes, usable coding rates are ½, ⅔, ¾ and ⅘. Also, when the packet size is 1024 bytes, a usable coding rate is ½. In example 2, there is a characteristic that, when the packet size is larger, the maximum coding rate among supported coding rates becomes lower. By this means, the erasure rate when one packet is erased is taken into account, so that it is possible to realize further improvement in the received quality of the communication party and in the transmission speed of data (information).

Here, as described with FIG. 43 and FIG. 44 below, in a case where the maximum coding rate is Ra among usable coding rates when the packet size is A and the maximum coding rate is Rb among usable coding rates when the packet size is B (B≠A), "=" may be adopted so that Ra≧Rb when A<B. However, in a case where the communication system supports a plurality of sizes as the packet size, it is important to provide size A and size B that hold the relationship "in a case where the maximum coding rate is Ra among usable coding rates when the packet size is A and the maximum coding rate is Rb among usable coding rates when the packet size is B (B≠A), Ra>Rb ("=" is not adopted) when A<B." For example, in example 2 of FIG. 41, when (A, B)=(64, 256), (Ra, Rb)=(⅚, ⅘). By this means, the erasure rate when one packet is erased is taken into account, so that it is possible to realize further improvement in the received quality of the communicating party and in the transmission speed of data (information).

Example 3

In example 3, when the packet size is 64 bytes, usable coding rates are ¾, ⅘ and ⅚. Also, when the packet size is 256 bytes, usable coding rates are ½, ⅔, ¾ and ⅘. Also, when the packet size is 1024 bytes, a usable coding rate is ½. In example 3, similar to example 2, there is a characteristic that, when the packet size is larger, the maximum coding rate among supported coding rates becomes lower. Further, in example 3, unlike example 2, there is a characteristic that, when the packet size is larger, the minimum coding rate among supported coding rates becomes higher.

Here, in a case where the minimum coding rate is ra among usable coding rates when the packet size is A and the minimum coding rate is rb among usable coding rates when the packet size is B (B≠A), "=" may be adopted so that ra≧rb when A<B. However, in a case where the communication system supports a plurality of sizes as the packet size, it is important to provide size A and size B that hold the relationship "in a case where the minimum coding rate is ra among usable coding rates when the packet size is A and the minimum coding rate is rb among usable coding rates when the packet size is B (B≠A), ra>rb ("=" is not adopted) when A<B." By this means, the erasure rate when one packet is erased is taken into account, so that it is possible to realize further improvement in the received quality of the communicating party and in the transmission speed of data (information).

A case has been described with FIG. 41 where there are three kinds of packet sizes. In the following, using FIG. 42, FIG. 43 and FIG. 44 as an example, association relationships between packet sizes and usable coding rates will be explained in a case where there are three or more kinds of packet sizes.

Figure 42:
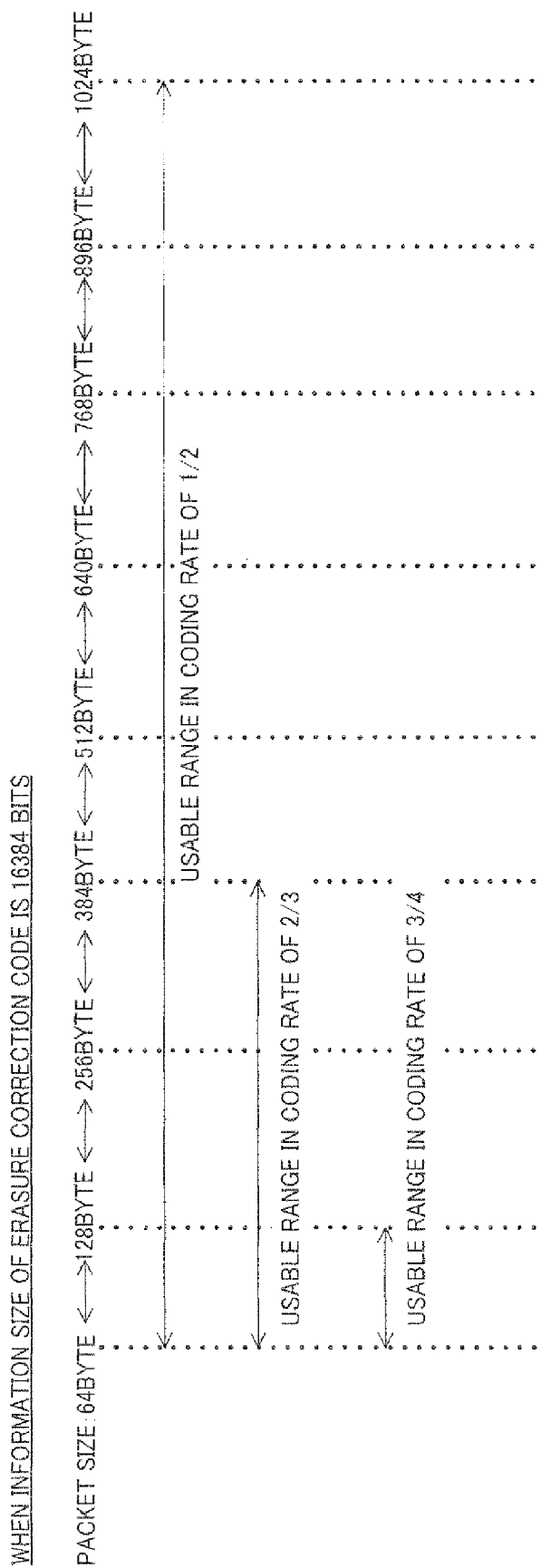
FIG. 42 shows another example of relationships between packet sizes and usable coding rates for an erasure correction code.

FIG. 42 shows an example case where the packet size between 64 bytes and 1024 bytes is supported. FIG. 42 shows an association example where: a coding rate of ½ is supported when the packet size is equal to or above 64 bytes and equal to or below 1024 bytes; a coding rate of ⅔ is supported when the packet size is equal to or above 64 bytes and equal to or below 384 bytes; and a coding rate of ¾ is supported when the packet size is equal to or above 64 bytes and equal to or below 128 bytes.

Thus, when coding rate Ra and coding rate Rb hold Ra<Rb, by setting a rule to hold A>B (including a case of A=B) in a case where the maximum value of the packet size supported by coding rate Ra is A and the maximum value of the packet size supported by coding rate Rb is B, the erasure rate when one packet is erased is taken into account, so that it is possible to realize further improvement in the received quality of the communicating party and in the transmission speed of data (information).

Figure 43:
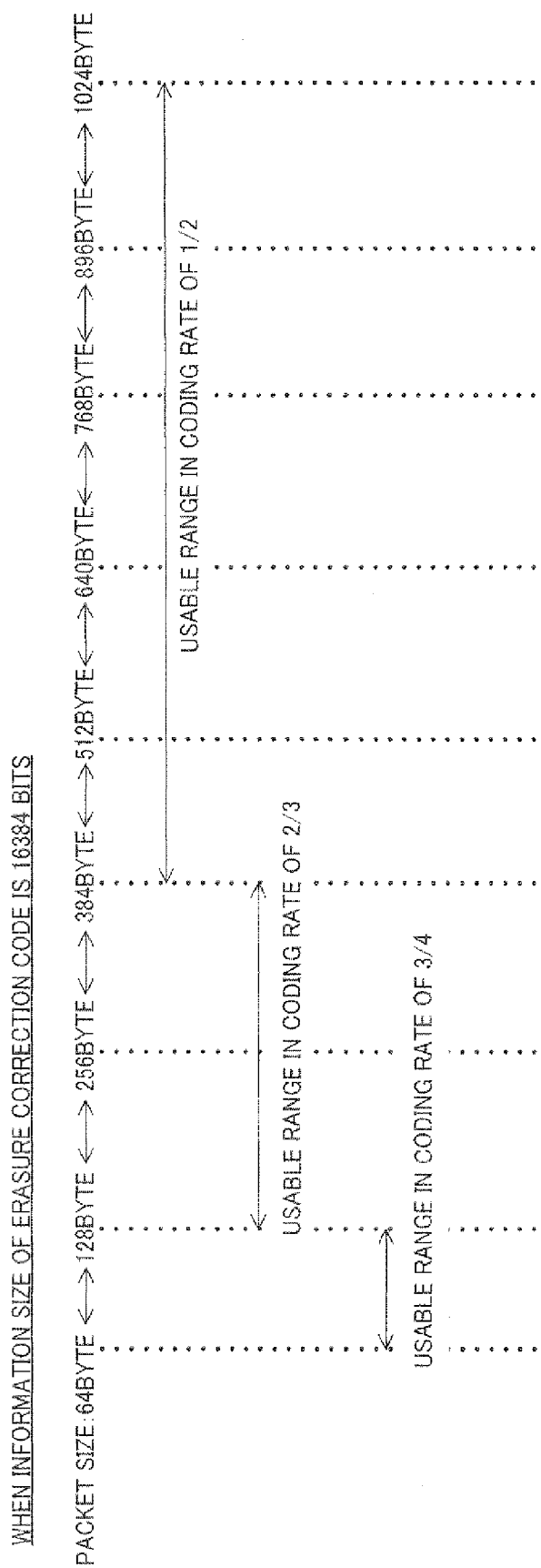
FIG. 43 shows an another example of relationships between packet sizes and usable coding rates for an erasure correction code.

Similar to FIG. 42, FIG. 43 shows an example case where the packet size between 64 bytes and 1024 bytes is supported. FIG. 43 shows an association example where: a coding rate of ½ is supported when the packet size is equal to or above 384 bytes and equal to or below 1024 bytes; a coding rate of ⅔ is supported when the packet size is equal to or above 128 bytes and equal to or below 384 bytes; and a coding rate of ¾ is supported when the packet size is equal to or above 64 bytes and equal to or below 128 bytes.

Thus, when coding rate Ra and coding rate Rb hold Ra<Rb, by setting a rule to hold A>B (including a case of A=B) in a case where the maximum value of the packet size supported by coding rate Ra is A and the maximum value of the packet size supported by coding rate Rb is B, the erasure rate when one packet is erased is taken into account, so that it is possible to realize further improvement in the received quality of the communicating party and in the transmission speed of data (information). Also, as clear from FIG. 43, there is a characteristic that, if the packet size is designated, the erasure correction code coding rate is uniquely determined, so that the communication apparatus can provide an advantage of simplifying determination of the erasure correction code coding rate.

Figure 44:
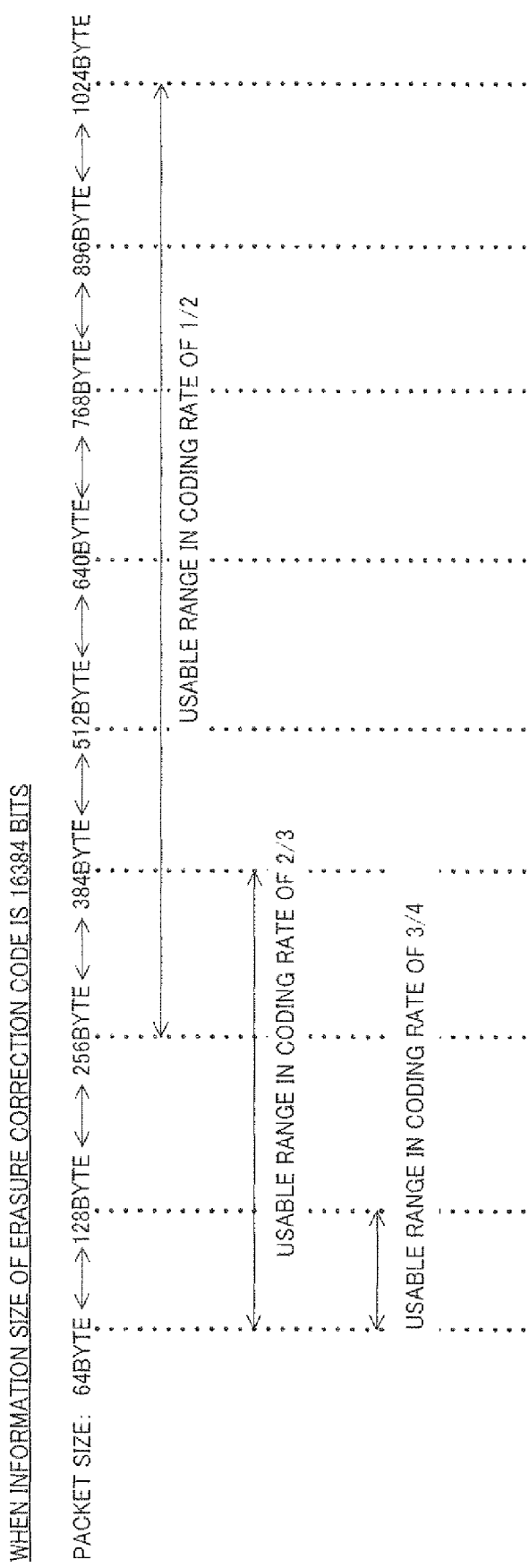
FIG. 44 shows another example of relationships between packet sizes and usable coding rates for an erasure correction code.

Similar to FIG. 42 and FIG. 43, FIG. 44 shows an example case where the packet size between 64 bytes and 1024 bytes is supported. FIG. 44 shows an association example where: a coding rate of ½ is supported when the packet size is equal to or above 256 bytes and equal to or below 1024 bytes; a coding rate of ⅔ is supported when the packet size is equal to or above 64 bytes and equal to or below 384 bytes; and a coding rate of ¾ is supported when the packet size is equal to or above 64 bytes and equal to or below 128 bytes.

Thus, when coding rate Ra and coding rate Rb hold Ra<Rb, by setting rules to: hold A>B (including a case of A=B) in a case where the maximum value of the packet size supported by coding rate Ra is A and the maximum value of the packet size supported by coding rate Rb is B; and further hold a≧b in a case where the minimum value of the packet size supported by coding rate Ra is "a" and the minimum value of the packet size supported by coding rate Rb is "b," the erasure rate when one packet is erased is taken into account, so that it is possible to realize further improvement in the received quality of the communicating party and in the transmission speed of data (information).

As described above, by changing the coding rate according to the packet size or making a supporting coding rate different according to the packet size, it is possible to improve the received quality of the communicating party and change the coding rate to a more suitable one. By this means, it is possible to provide an advantage of being able to improve the transmission speed of data (information). However, the relationships between packet sizes and coding rates are not limited to FIG. 41 to FIG. 44, and, by setting rules as described above, it is possible to provide the same advantage.

Also, although the erasure correction code information size is fixed and association examples between packet sizes and coding rates are created in FIG. 42 to FIG. 44, even in a case where the erasure correction code block size (or processing unit) is fixed, it is possible to set the coding rate according to the packet size in the same way as in FIG. 42 to FIG. 44.

The method has been described above in which the received quality of the communicating party and the transmission speed of data (information) are further improved by changing the erasure correction code coding rate using, as one parameter, the size of packets (packet size) to insert an error detection code (e.g. CRC).

Next, the method will be explained in detail, in which the received quality of the communicating party and the transmission speed of data (information) are further improved by changing the erasure correction code block size using the packet size as one parameter. Here, the block size refers to the number of bits of one block of a block code (also referred to as "processing unit"), and is determined by the information length and coding rate of the block code.

For example, consider a case where a block code like an LDPC code is used as an erasure correction code, the coding rate is 2/3 and the packet size is 1024 bytes. At this time, the erasure rate when one packet is erased is as follows:

(Case 1) when the block code information length is 8192 bits (block size: 6144 bits) and one packet is erased, the erasure rate is 0.66666;

(Case 2) when the block code information length is 16384 bits (block size: 24576 bits) and one packet is erased, the erasure rate is 0.33333; and (Case 3) when the block code information length is 32768 bits (block size: 49152 bits) and one packet is erased, the erasure rate is 0.16666. Therefore, especially in case 1 and case 2, if the coding rate R is 2/3, it is difficult to provide good erasure correction capability.

In view of the above, by changing the erasure correction code coding rate using, as one parameter, information of the size of packets (packet size) to insert an error detection code (e.g. CRC), it is possible to improve the received quality of the communicating party, and, depending on this, provide an advantage of improving transmission speed of data (information).

FIG. 45 shows an example of relationships between packet sizes and usable block sizes in a case where a communication system can use a plurality of sizes as the block size. Here, FIG. 45 shows an example case where the erasure correction code to use in the communication system is 2/3 and where block codes such as an LDPC code, trellis such as a turbo code and convolutional code (LDPC convolutional code) or Raptor codes (Fountain codes or LT (Luby-Transform) codes), are used as an erasure correction code. Also, FIG. 45 shows an example case where the communication system can designate three kinds of 64 bytes, 256 bytes and 1024 bytes as the packet size.

In FIG. 45, as described above, examples 1 to 3 show association examples between packet sizes and block sizes prepared taking into account the erasure rate when one packet is erased.

Example 1

In example 1, when the packet size is 64 bytes, a usable block size (or processing unit) is 6144 bits. Also, when the packet size is 256 bytes, a usable block size (or processing unit) is 24576 bits. Also, when the packet size is 1024 bytes, a usable block size (or processing unit) is 49152. Thus, example 1 is designed such that each block size (or processing unit) supports only one packet size. By this means, if the packet size is designated by setting signal 42, the erasure correction code block size (or processing unit) is uniquely determined, so that there is an advantage of simplifying control of the communication apparatus. However, in example 1, it is necessary to set associations between packet sizes and coding rates so as to obey the rule that the erasure correction block size (or processing unit) is made larger when the packet size is larger.

Example 2

In example 2, when the packet size is 64 bytes, usable block sizes (or processing units) are 6144, 24576 and 49152 bits. Also, when the packet size is 256 bytes, usable block sizes (or processing units) are 24576 and 49152 bits. Also, when the packet size is 1024 bytes, a usable block size (or processing unit) is 49152 bits. In example 2, there is a characteristic that, when the packet size is larger, the minimum block size (or processing unit) among supported block sizes (or processing units) becomes larger. By this means, the erasure rate when one packet is erased is taken into account, so that it is possible to realize further improvement in the received quality of the communication party and in the transmission speed of data (information).

Here, in a case where the minimum size is na among erasure correction code block sizes (or processing units) when the packet size is A and the minimum size is nb among erasure correction code block sizes (or processing units) when the packet size is B, "=" may be adopted so that na≦nb when A<B. However, in a case where the communication system supports a plurality of sizes as the packet size, it is important to provide size A and size B that hold the relationship "in a case where the minimum size is na among erasure correction code block sizes (or processing units) when the packet size is A and the minimum size is nb among erasure correction code block sizes (or processing units) when the packet size is B, na<nb ("=" is not adopted) when A<B." For example, in example 2 of FIG. 45, when (A, B)=(64, 256), (na, nb)=(6144, 24576). By this means, the erasure rate when one packet is erased is taken into account, so that it is possible to realize further improvement in the received quality of the communicating party and in the transmission speed of data (information).

Example 3

In example 3, when the packet size is 64 bytes, usable block sizes (or processing units) are 6144 and 24576 bits. Also, when the packet size is 256 bytes, usable block sizes (or processing units) are 24576 and 49152 bits. Also, when the packet size is 1024 bytes, a usable block size (or processing unit) is 49152 bits. In example 3, similar to example 2, there is a characteristic that, when the packet size is larger, the minimum block size (or processing unit) among supported block sizes (or processing units) becomes larger. Further, in example 3, unlike example 2, there is a characteristic that, when the packet size is larger, the maximum block size (or processing unit) among supported block sizes (or processing units) becomes larger.

Here, in a case where the maximum block size (or processing unit) is Na among block sizes (or processing units) when the packet size is A and the maximum block size (or processing unit) is Nb among block sizes (or processing units) when the packet size is B, "=" may be adopted so that Na≦Nb when A<B. However, in a case where the communication system supports a plurality of sizes as the packet size, it is important to provide size A and size B that hold the relationship "in a case where the maximum block size (or processing unit) is Na among block sizes (or processing units) when the packet size is A and the maximum block size (or processing unit) is Nb among block sizes (or processing units) when the packet size is B (B≠A), Na<Nb ("=" is not adopted) when A<B." For example, in example 3 of FIG. 45, when (A, B)=(64, 256), (Na, Nb=(24576, 49152). By this means, the erasure rate when one packet is erased is taken into account, so that it is possible to realize further improvement in the received quality of the communicating party and in the transmission speed of data (information).

A case has been described with FIG. 45 where there are three kinds of packet sizes. In the following, using FIG. 46, FIG. 47 and FIG. 48 as an example, association relationships between packet sizes and usable block sizes will be explained in a case where there are three or more kinds of packet sizes.

Figure 46:
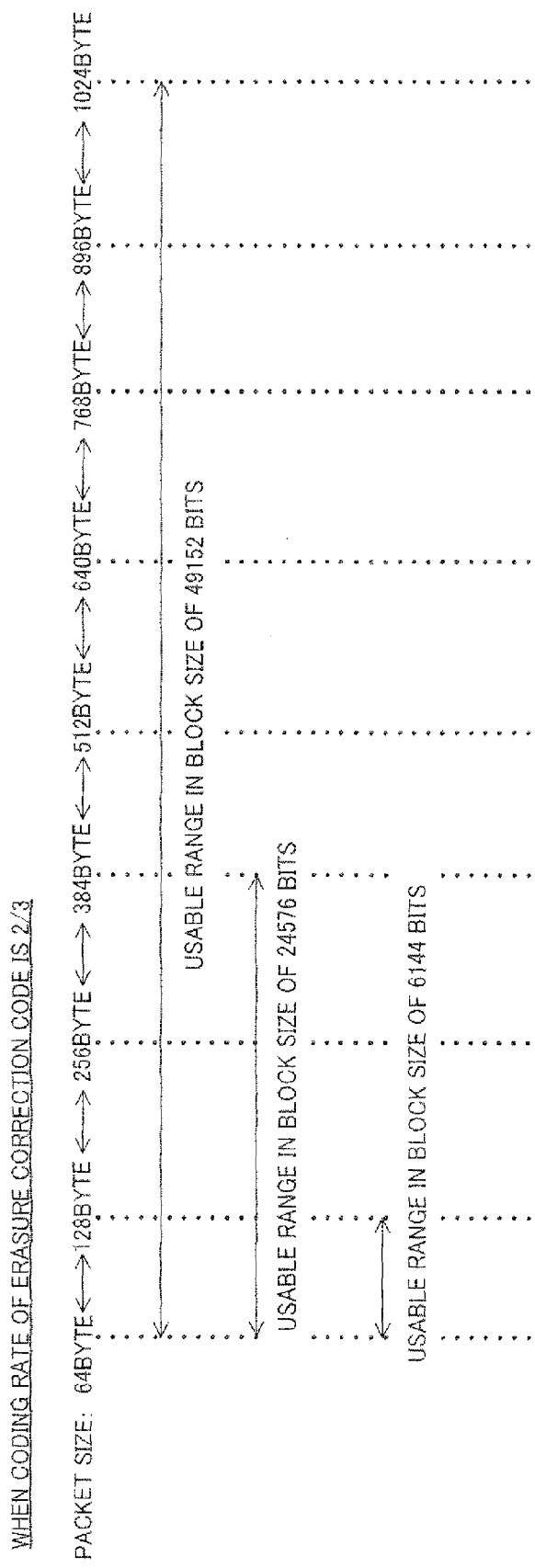
FIG. 46 shows another example of relationships between packet sizes and usable block sizes.

FIG. 46 shows an example case where the packet size between 64 bytes and 1024 bytes is supported. FIG. 46 shows an association example where: a block size (or processing unit) of 49152 bits is supported when the packet size is equal to or above 64 bytes and equal to or below 1024 bytes; a block size (or processing unit) of 24576 bits is supported when the packet size is equal to or above 64 bytes and equal to or below 384 bytes; and a block size (or processing unit) of 6144 bits is supported when the packet size is equal to or above 64 bytes and equal to or below 128 bytes.

Thus, when block sizes (or processing units) Na and Nb hold Na<Nb, by setting a rule to hold A<B (including a case of A=B) in a case where the maximum value of the packet size supported by block size (or processing unit) Na is A and the maximum value of the packet size supported by block size (or processing unit) Nb is B, the erasure rate when one packet is erased is taken into account, so that it is possible to realize further improvement in the received quality of the communicating party and in the transmission speed of data (information).

Figure 47:
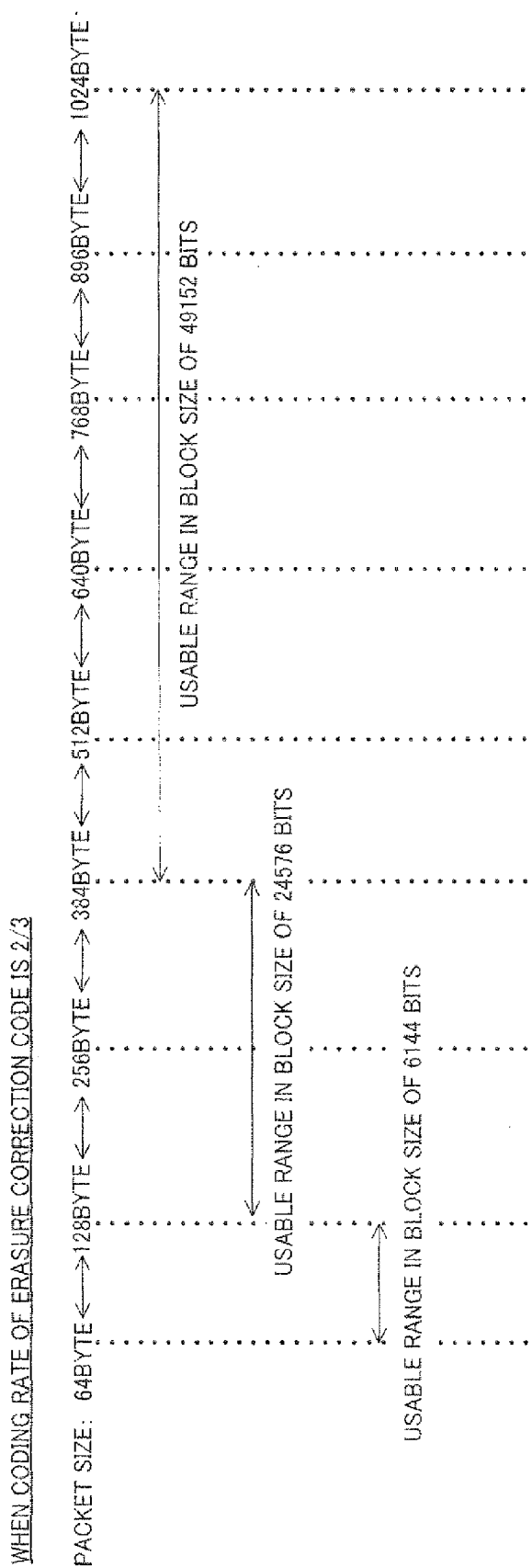
FIG. 47 shows another example of relationships between packet sizes and usable block sizes.

Similar to FIG. 46, FIG. 47 shows an example case where the packet size between 64 bytes and 1024 bytes is supported. FIG. 47 shows an association example where: a block size (or processing unit) of 49152 bits is supported when the packet size is equal to or above 384 bytes and equal to or below 1024 bytes; a block size (or processing unit) of 24576 bits is supported when the packet size is equal to or above 128 bytes and equal to or below 384 bytes; and a block size of 6144 bits is supported when the packet size is equal to or above 64 bytes and equal to or below 128 bytes.

Thus, when block sizes (or processing units) Na and Nb hold Na<Nb, by setting a rule to hold A<B (including a case of A=B) in a case where the maximum value of the packet size supported by block size (or processing unit) Na is A and the maximum value of the packet size supported by block size (or processing unit) Nb is B, the erasure rate when one packet is erased is taken into account, so that it is possible to realize further improvement in the received quality of the communicating party and in the transmission speed of data (information). Also, as clear from FIG. 47, there is a characteristic that, if the packet size is designated, the erasure correction code block size (or processing unit) is uniquely determined, so that the communication apparatus can provide an advantage of simplifying determination of the erasure correction code coding rate.

Figure 48:
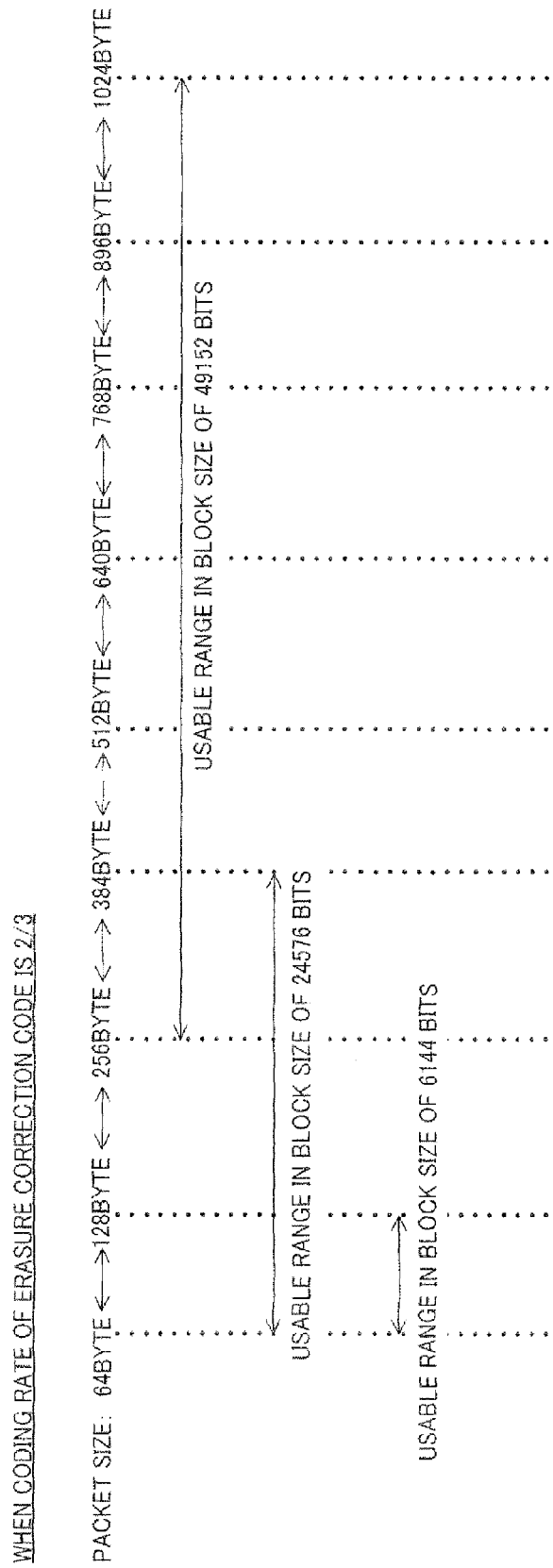
FIG. 48 shows another example of relationships between packet sizes and usable block sizes.

Similar to FIG. 46 and FIG. 47, FIG. 48 shows an example case where the packet size between 64 bytes and 1024 bytes is supported. FIG. 48 shows an association example where: a block size (or processing unit) of 49152 bits is supported when the packet size is equal to or above 256 bytes and equal to or below 1024 bytes; a block size (or processing unit) of 24576 bits is supported when the packet size is equal to or above 64 bytes and equal to or below 384 bytes; and a block size (or processing unit) of 6144 bits is supported when the packet size is equal to or above 64 bytes and equal to or below 128 bytes.

Thus, when block sizes (or processing units) Na and Nb hold Na<Nb, by setting rules to: hold A<B (including a case of A=B) in a case where the maximum value of the packet size supported by block size (or processing unit) Na is A and the maximum value of the packet size supported by block size (or processing unit) Nb is B; and further hold a≦b in a case where the minimum value of the packet size supported by block size (or processing unit) Na is "a" and the minimum value of the packet size supported by block size (or processing unit) Nb is "b," the erasure rate when one packet is erased is taken into account, so that it is possible to realize further improvement in the received quality of the communicating party and in the transmission speed of data (information).

As described above, by changing the block size (or processing unit) according to the packet size to insert an error correction code (e.g. CRC) or by making a supporting block size (or processing unit) different according to the packet size, it is possible to improve received quality of the communicating party and change the block size (or processing unit) to more suitable one. By this means, it is possible to provide an advantage of being able to improve the transmission speed of data (information). However, the relationships between packet sizes and block sizes are not limited to FIG. 45 to FIG. 48, and, by setting rules as described above, it is possible to provide the same advantage.

Cases have been described above where the erasure correction code coding rate is switched using, as one parameter, the size of packets (packet size) to insert an error detection code (e.g. CRC), and where the block size (or processing unit) is switched using the packet size as one parameter. It naturally follows that, even if the erasure correction code coding rate and the erasure correction code block size are changed at the same time using the packet size as one parameter, it is possible to provide the same advantage.

FIG. 41 to FIG. 44 show relationships between packet sizes and coding rates in a case where the erasure correction code information size is fixed or the erasure correction code block size (or processing unit) is fixed. By contrast with this, in a case where the erasure correction code coding rate and the erasure correction code block size are changed at the same time using the packet size as one parameter, it is preferable to provide relationships between packet sizes and coding rates every a plurality of erasure correction code information sizes or every erasure correction code block size (or processing unit), and then change the erasure correction code coding rate and the erasure correction code block size at the same time using the packet size as one parameter.

Also, FIG. 45 to FIG. 48 show relationships between packet sizes and block sizes in a case where the erasure correction code coding rate is fixed. By contrast with this, in a case where the erasure correction code coding rate and the erasure correction code block size are changed at the same time using the packet size as one parameter, it is preferable to provide relationships between packet sizes and coding rates every a plurality of erasure correction code information sizes and then change the erasure correction code coding rate and the erasure correction code block size at the same time using the packet size as one parameter.

By the way, although a case has been described above with Embodiment 3 where whether or not to use ARQ or an erasure correction code is decided based on the number of terminal apparatuses that request communication, it is equally possible to apply the present invention and change the erasure correction code coding rate based on the number of terminal apparatuses that request communication. For example, a lower coding rate among supported coding rates is used when there are a large number of terminal apparatuses, or a higher coding rate among supported coding rates is set when there are a small number of terminal apparatuses. By this means, if the erasure correction code coding rate is changed using the packet size and the number of terminal apparatuses as parameters, it is possible to set a more suitable coding rate, so that it is possible to realize further improvement in the received quality of the communicating party and in the transmission speed of data (information).

Also, as another example of applying the present embodiment, it is possible to apply the present invention to different kinds of data. For example, consider a case where speech data and video data are both used. Speech data and video data have a feature that the amount of speech data is smaller than the amount of video data. It follows that the packet size in a case of forming packets with speech data is smaller than the packet size in a case of forming packets with video data. Therefore, in a case where erasure correction coding is applied to packets of only speech data and erasure correction coding is applied to packets of only video data, if the erasure correction code coding rate for the packets of only speech data is made higher than the erasure correction code coding rate for the packets of only video data, the received quality of both packets improves. Alternatively, in a case of using the same coding rate, if the block size (processing unit) to apply erasure correction coding to packets of only speech data is made smaller than the block size (or processing unit) to apply erasure correction coding to packets of only video data, the received quality of both packets improves. Also, in a case of applying erasure correction coding to storage media such as DVD and CD (Compact Disc) for recording, it is preferable to make the erasure correction code coding rate for packets of only speech data higher than the erasure correction code coding rate for packets of only speech data and then store the results. Alternatively, in a case of using the same coding rate, it is preferable to make the block size (or processing unit) to apply erasure correction coding to packets of only speech data lower than the block size (or processing unit) to apply erasure correction coding to packets of only video data, and then store the results.

Also, although an example case has been described with the present embodiment where erasure correction is performed using systematic codes such as an LDPC block code and LDPC convolutional code, the present invention is equally applicable to a case where erasure correction is performed using non-systematic codes in Raptor codes (Fountain codes or LT (Luby-Transform) codes). In a case of systematic codes, the transmitting side generates information packets and parity packets from information packets, and the receiving side performs erasure correction decoding of received packets and estimates information packets. By contrast with this, in a case of non-systematic codes, the transmitting side generates only parity packets from information packets, and the receiving side performs erasure correction decoding of received packets and estimates information packets.

Embodiment 5

The present embodiment will explain an erasure correction scheme that is less influenced by the erasure rate, regardless of the size of packets (packet size) to insert an error detection code (e.g. CRC). In the following, an example case will be explained where the communication system supports two kinds of (A) 64 bits and (B) 512 bits as the packet size.

At this time, taking into account the circuit scales of an erasure correction code encoder and decoder, it is desirable to use the same erasure correction coding scheme in both cases of 64 bits and 512 bits. However, as described in Embodiment 4, the erasure rate differs between a packet size of 64 bits and a packet size of 512 bits in a case where one packet is erased, and, consequently, there is a problem that the same erasure correction coding scheme is difficult to adopt. Therefore, the present embodiment proposes an erasure correction coding scheme using packet division.

First, the packet generation method in a case of a packet size of 64 bits will be explained using FIG. 49. Data of information blocks #N64-1, #N64-2, #N64-512, each of which is formed with 64 bits, is encoded to generate parity. Further, data of information blocks #N64-1, #N64-2, #N64-512 and generated parity are divided in units of 64 bits to generate packets, and an error detection code (e.g. CRC) is inserted in each packet. Then, packets in which an error detection code has been inserted, are used as transmission packets.

Figure 50:
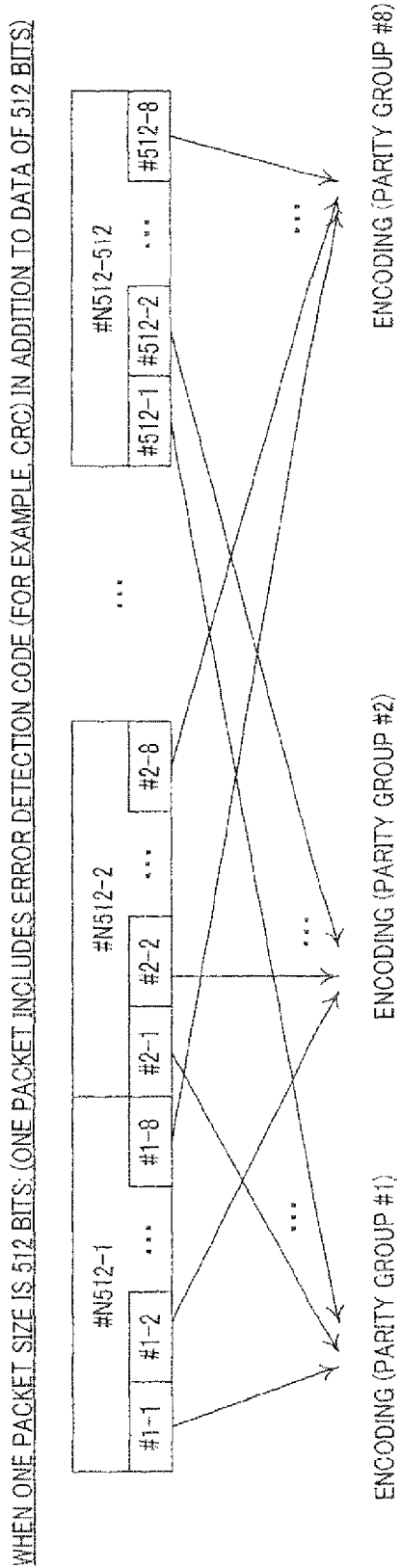
FIG. 50 is a drawing for explaining a packet generating method (for a packet size of 512 bits), according to Embodiment 5.

Next, the packet generation method in a case of a packet size of 512 bits will be explained using FIG. 50. FIG. 50 shows an example where there is data of information block #N512-1, #N512-2, . . . , #N512-512, which are formed with 512 bits. Then, information block #N512-1 formed with 512 bits is divided into 64-bit units of information blocks #1-1, #1-2, . . . , #1-8. Similarly, information block #N512-2 formed with 512 bits is divided into 64-bit units of information blocks #2-1, #2-2, . . . , #2-8. By this means, for all n's, information block #N512-n formed with 512 bits is divided in a 64-bit unit, which is the minimum packet size among packet sizes supported in the communication system, to generate 64-bit units of information blocks #n-1, #n-2, . . . , #n-8 (n=1, 2, . . . , 512).

Then, 64-bit units of blocks, that is, data of information blocks #1-1, #2-1, #3-1, . . . , #512-1, is encoded to generate parity group #1. Similarly, data of 64-bit units of information blocks #1-2, #2-2, #3-2, #512-2, is encoded to generate parity group #2. Similarly, data of 64-bit units of information blocks #1-m, #2-m, #3-m, . . . , #512-m, is encoded to generate parity group #m (m=1, 2, . . . , 8).

Here, an important point is to, when the communication system supports a plurality of packet sizes, use the minimum packet size (first packet size) among the plurality of packet sizes as a division unit to: divide information bits included in a different packet size (second packet size) into a plurality of information blocks; arrange the order of the divided information blocks; encode the arranged information blocks; and generate parity groups.

Then, an error detection code (e.g. CRC) is attached to information block #N512-1 formed with 512 bits, which represents a packet in which the error detection code has been inserted. Similarly, an error detection code (e.g. CRC) is attached to information block #N512-2 formed with 512 bits, which represents a packet in which the error detection code has been inserted. Similarly, an error detection code (e.g. CRC) is attached to information block #N512-n formed with 512 bits (n=1, 2, . . . , 512), which represents a packet in which the error detection code has been inserted.

Figure 51:
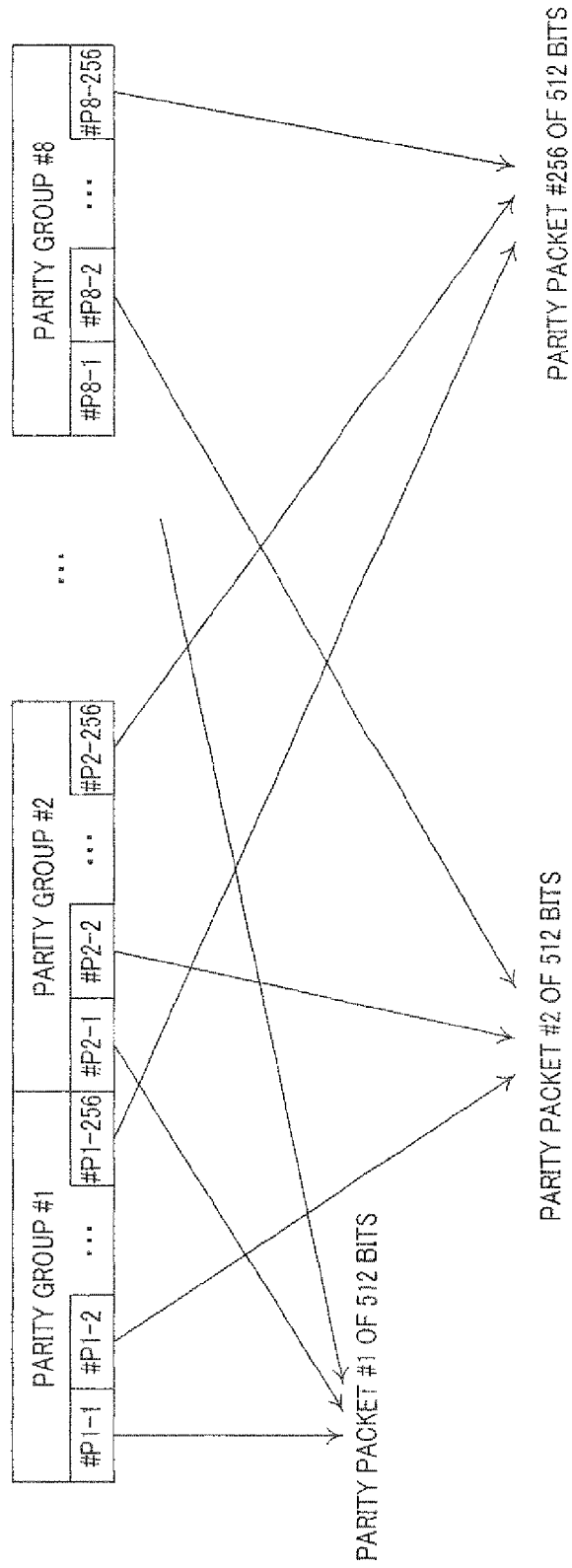
FIG. 51 is a drawing for explaining a packet generating method (for a packet size of 512 bits), according to Embodiment 5.

FIG. 51 shows an example of the parity packet structure of the parity groups in FIG. 50. As an example, a case will be explained where the erasure correction code coding rate is ⅔. An important point of the present embodiment is that, upon generating parity packets, each parity packet is generated so as to include parity bits of a plurality of parity groups.

To be more specific, with the present embodiment, as shown in FIG. 51, parity group #1 generated as shown in FIG. 50 is divided in 64-bit units to generate parity blocks #P1-1, #P1-2, . . . , #P1-256, each of which is formed with 64 bits. Similarly, parity group #2 is divided in 64-bit units to generate parity blocks #P2-1, #P2-2, . . . , #P2-256, each of which is formed with 64 bits. Similarly, parity group #K is divided in 64-bit units to generate parity blocks #PK-1, #PK-2, . . . , #PK-256 (K=1, 2, . . . , 8), each of which is formed with 64 bits. By this means, all parity groups #K (K=1, 2, . . . , 8) are divided in a 64-bit unit, which is the minimum packet size among packet size supported in the communication system, in order to generate 64-bit units of parity blocks #PK-1, #PK-2, . . . , #PK-256 (K=1, 2, . . . , 8).

Then, 512 bits of parity packet #1 is generated from parity blocks #P1-1, #P2-1, #P3-1, #P4-1, #P5-1, #P6-1, #P7-1 and #P8-1, and an error correction code (e.g. CRC) is attached to this parity packet #1 to generate a parity packet in which the error correction code has been inserted, as a transmission packet. Similarly, 512 bits of parity packet #2 is generated from parity blocks #P1-2, #P2-2, #P3-2, #P4-2, #P5-2, #P6-2, #P7-2 and #P8-2, and an error correction code (e.g. CRC) is attached to this parity packet #2 to generate a parity packet in which the error correction code has been inserted, as a transmission packet. Similarly, 512 bits of parity packet #L is generated from parity blocks #P1-L, #P2-L, #P3-L, #P4-L, #P5-L, #P6-L, #P7-L and #P8-L, and an error correction code (e.g. CRC) is attached to this parity packet #L to generate a parity packet in which the error correction code has been inserted, as a transmission packet (L=1, 2, . . . , 256).

In a case of generating information packets and parity packets as above, even if one information packet or one parity packet is erased, in view of erasure correction code blocks, there are eight erasure correction code blocks. Here, in view of 512 bits of the original processing unit, only 64 bits of 512 bits are erased. Therefore, the erasure rate by one-packet erasure is the same as in FIG. 49. Therefore, it is possible to use the same erasure correction code between a packet size of 64 bits (see FIG. 49) and a packet size of 512 bits (see FIG. 50), thereby providing high erasure correction capability, not depending on the size of packets (packet size) to insert an error detection code (e.g. CRC).

Figure 52:
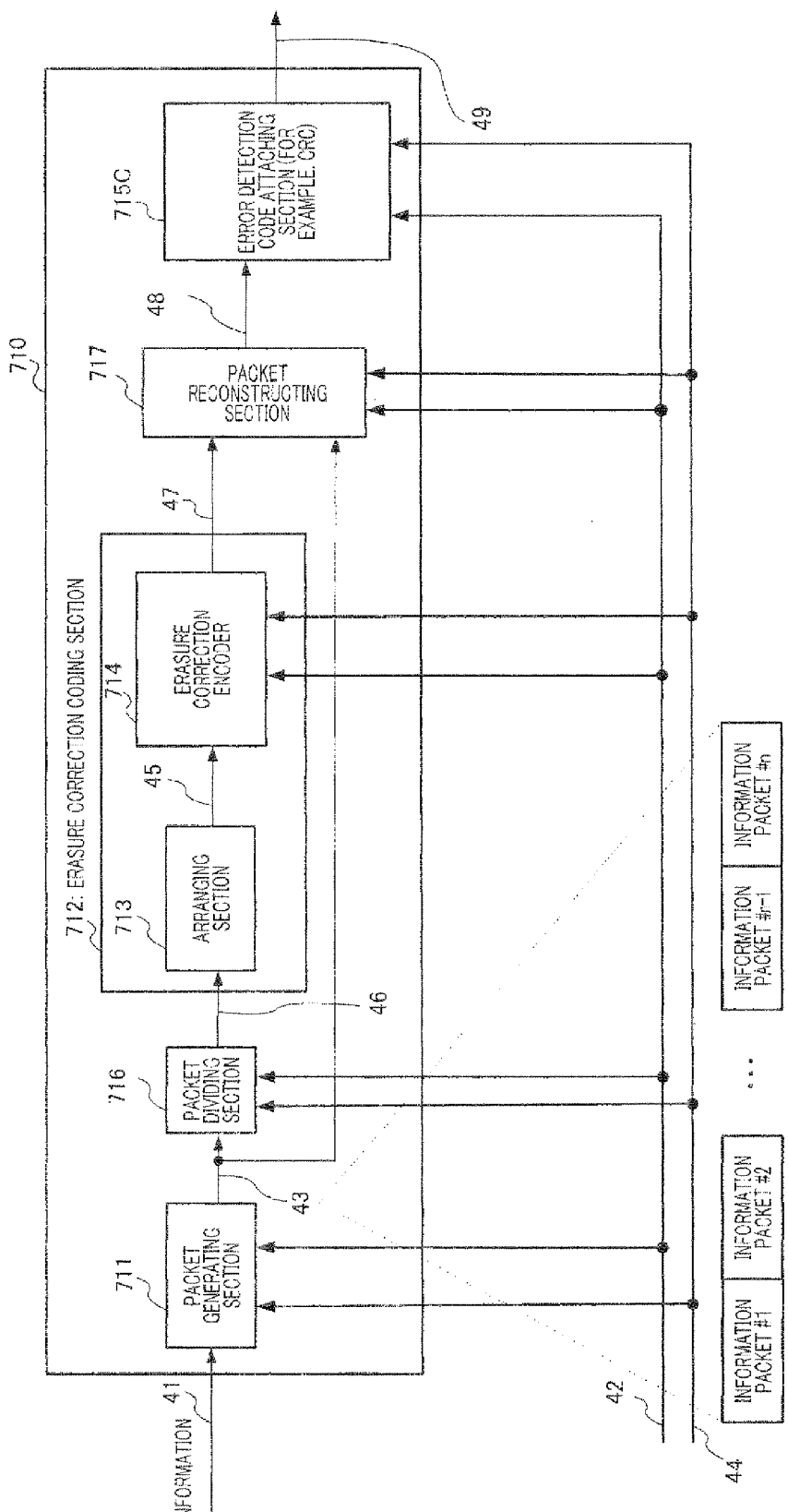
FIG. 52 shows a specific configuration of an erasure correction coding related processing section according to Embodiment 5.

FIG. 52 shows an example of the configuration of erasure correction coding related processing section 710 including communication apparatus 700 that performs packet division according to the present embodiment. In FIG. 52, components of the same operation as in FIG. 38A will be assigned the same reference numerals.

Packet dividing section 716 receives packet 43, setting signal 42 and control signal 44 as input, and decides whether or not to perform packet division based on the packet size. With the present embodiment, if the packet size designated by setting signal 42 is not the minimum packet size among packet sizes supported by the communication system, packet dividing section 716 decides to perform packet division. Then, in this case, packet dividing section 716 divides packet 43 and outputs divided packets as packet 46. By contrast, if the packet size designated by setting signal 42 is the minimum packet size among packet sizes supported by the communication system, packet dividing section 716 decides not to perform packet division. Then, in this case, packet dividing section 716 outputs packet 43 as is as packet 46. Therefore, if setting signal 42 designates a packet size of 512 bits, packet dividing section 716 performs packet division as shown in FIG. 50.

Arranging section 713 receives packet 46 as input and arranges data.

Erasure correction encoder 714 encodes arranged data and outputs parity 47.

Packet reconstructing section 717 receives parity 47, packet 43, setting signal 42 and control signal 44 as input, forms a packet with one of the packet structures shown in FIG. 49 to FIG. 51, based on the packet size, and outputs packet 48.

Error detection code attaching section 715C receives packet 48, setting signal 42 and control signal 44 as input, attaches an error detection bit according to each packet size, and outputs transmission packet 49.

Figure 53:
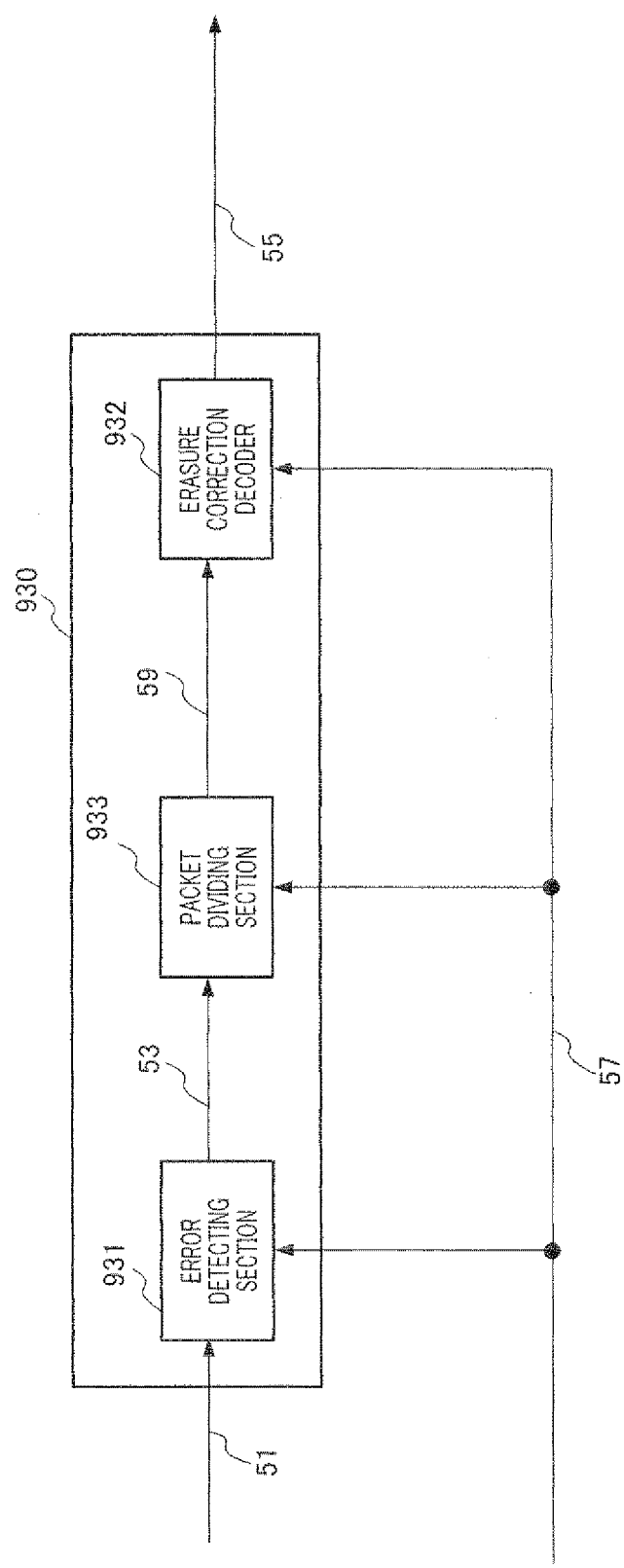
FIG. 53 shows a specific configuration of an erasure correction decoding related processing section according to Embodiment 5.

FIG. 53 shows an example of the configuration of erasure correction decoding related processing section 930 according to the present embodiment. Here, components of the same operations as in FIG. 39 will be assigned the same reference numerals. FIG. 53 differs from FIG. 39 mainly in adding packet dividing section 933 in FIG. 53 depending on the fact that packet dividing section 716 is added in erasure correction coding related processing section 710 of FIG. 52.

Error detecting section 931 receives data 51 and erasure correction coding method information 57 as input, performs error detection based on, for example, packet size information and erasure correction coding rate information included in erasure correction coding method information 57, and outputs error-detected packet 53.

Packet dividing section 933 receives error-detected packet 53 and erasure correction coding method information 57 as input, and decides whether or not to perform packet division, based on packet size information included in erasure correction coding method information 57. To be more specific, if the packet size included in erasure correction coding method information 57 is not the minimum packet size among packet sizes supported by the communication system, packet dividing section 933 decides to perform packet division. Then, in this case, packet dividing section 933 divides error-detected packet 53 and outputs the divided packets as packet 59. By contrast, if the packet size included in erasure correction coding method information 57 is not the minimum packet size among packet sizes supported by the communication system, packet dividing section 933 decides not to perform packet division. Then, in this case, packet dividing section 933 outputs error-detected packet 53 as is as packet 59.

Erasure correction decoder 932 receives packet 59 and erasure correction method information 57 as input, performs erasure correction decoding processing of packet 59 and outputs packet 55 subjected to erasure correction decoding.

In the above explanation, although an example case has been described with two kinds of packet sizes, the present invention is not limited to this. Even in a case of three kinds or more, by dividing packet 43 by a division unit of the minimum packet size among a plurality of packet sizes, it is possible to perform erasure correction coding. Therefore, even in the case of three kinds of packet sizes or more, in the same way as in the case of two kinds of packet sizes, it is possible to share erasure correction encoder and decoder circuits, so that it is possible to provide an advantage of reducing the circuit scale.

As described above, with the present embodiment, in a case of supporting a plurality of sizes of packets (packet sizes) to insert an error detection code (e.g. CRC), packet dividing section 716 divides packet 43 by a division unit of the minimum packet size among the plurality of packet sizes. Then, arranging section 713 arranges the order of divided packets, and erasure correction encoder 714 encodes the arranged data and generates parity. By this means, it is possible to use the same erasure correction code in any packet sizes and provide an advantage of reducing the circuit scale and providing high erasure correction capability, regardless of the packet size.

Also, although a case has been described above with the present embodiment where erasure correction is performed using systematic codes such as an LDPC block code and LDPC convolutional code, the present invention is equally applicable to a case where erasure correction is performed using non-systematic codes in Raptor codes (Fountain codes or LT (Luby-Transform) codes). In the case of systematic codes, the transmitting side generates information packets and parity packets from information packets, and the receiving side performs erasure correction decoding of received packets and estimates information packets. By contrast with this, in a case of non-systematic codes, the transmitting side generates only parity packets from information packets, and the receiving side performs erasure correction decoding of received packets and estimates information packets.

Embodiment 6

Two packet structures have been described with Embodiment 4 (see FIG. 34A and FIG. 34B). The present embodiment will describe an advantage of these two packet structures and propose the method of switching between these two packet structures.

Figure 54:
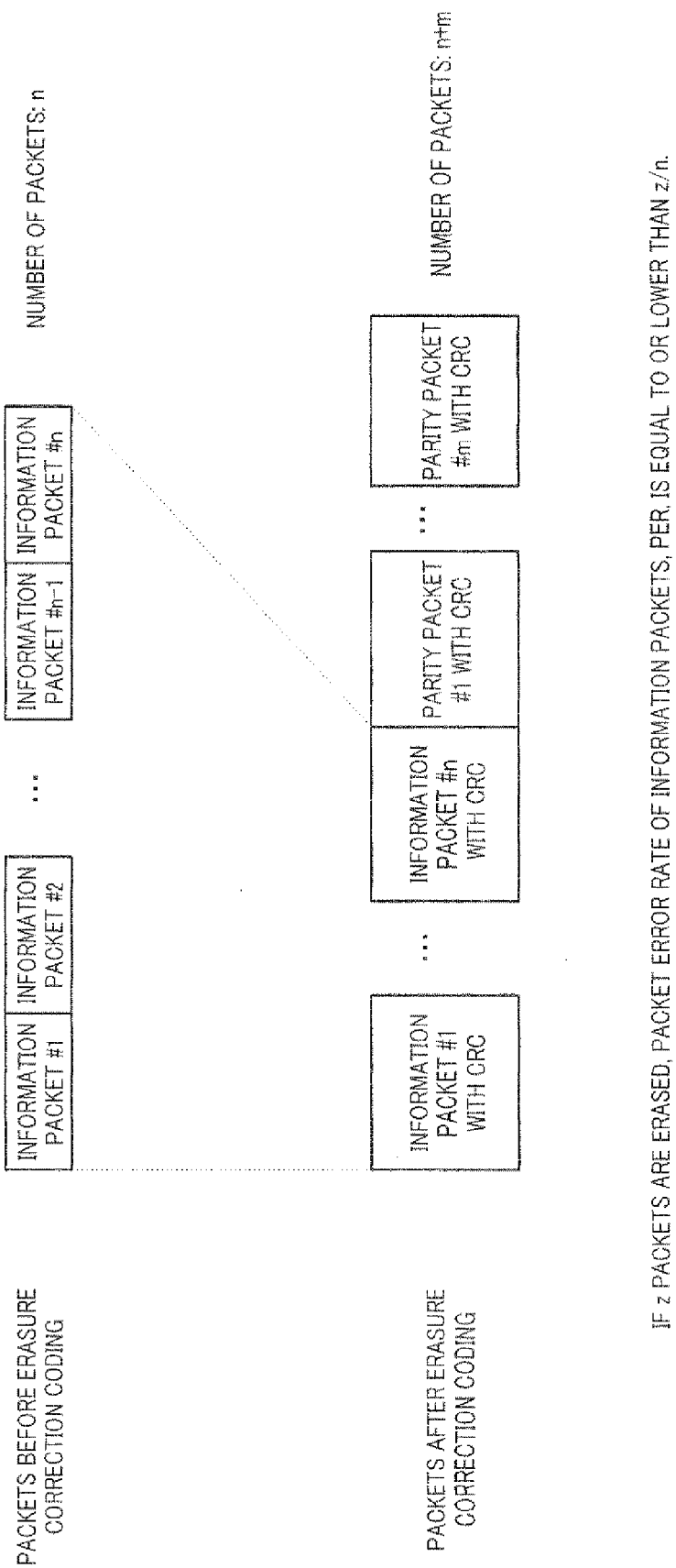
FIG. 54 shows packet structure #1 according to Embodiment 6 of the present invention.

FIG. 54 specifically illustrates packet structure #1 explained using FIG. 34A in Embodiment 4. Packet structure #1 is provided in which: erasure correction coding is applied to information packets #1 to #n to generate parity; information packets #1 to #n are used as is to form packets, which are attached an error detection code (e.g. CRC) to create information packets #1 to #n with CRC; and parity packets #1 to #m are created from the parity generated by erasure correction coding and are attached an error detection code (e.g. CRC) to provide parity packets #1 to #m with CRC. Then, m+n packets of information packets #1 to #n with CRC and parity packets #1 to #m with CRC are transmitted. At this time, for example, there is a characteristic of information packet error rate PER$\leq$z/n when z packets are erased.

Figure 55:
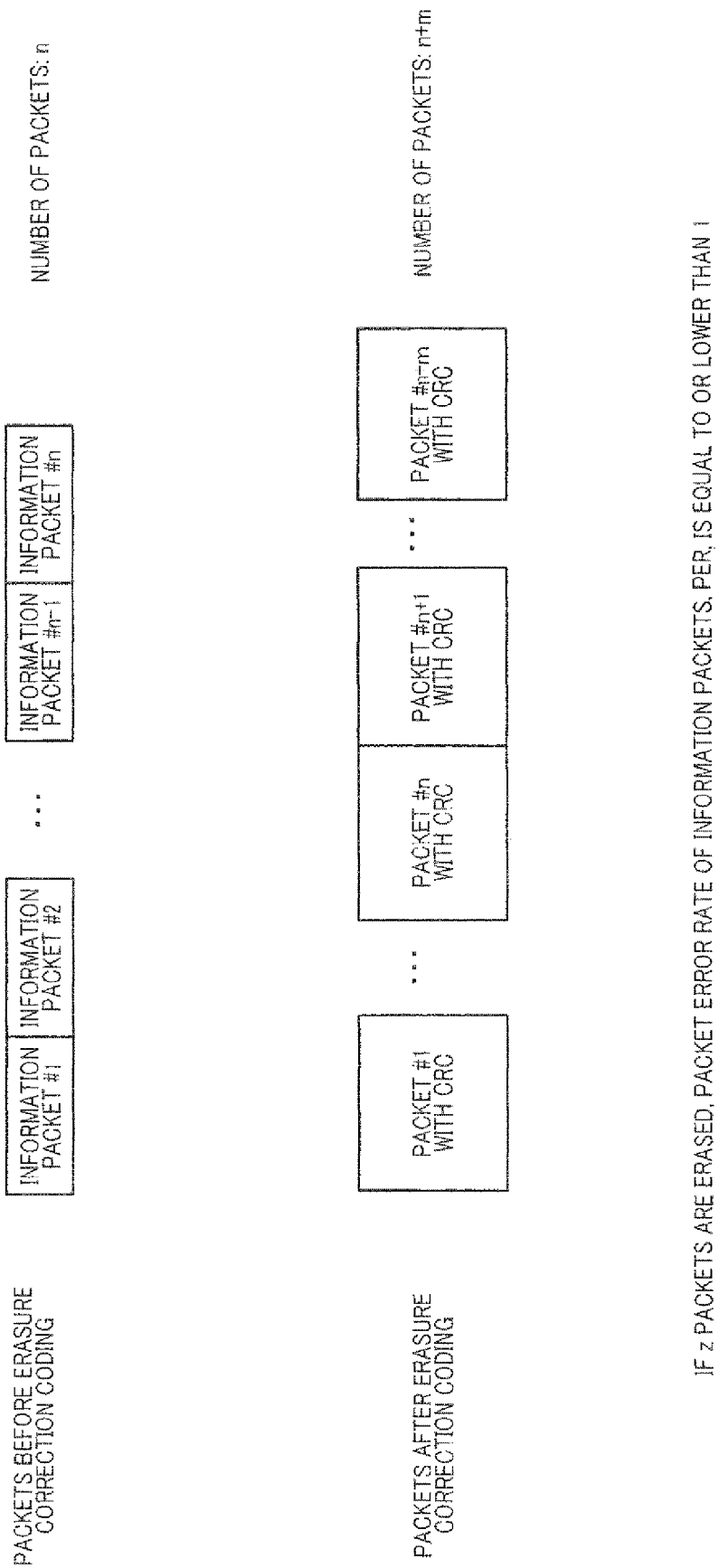
FIG. 55 shows packet structure #2 according to Embodiment 6.

FIG. 55 specifically illustrates packet structure #2 explained using FIG. 34B in Embodiment 4. In packet structure #2, information packets #1 to #n are subjected to erasure correction coding to generate parity, and packets #1 to #n+m are created without distinguishing between information packets and parity packets. Packets #1 to #n+m each are formed with information and parity. Here, exceptionally, a case is possible where there is a packet formed with only information or parity. Then, an error detection code (e.g. CRC) is attached to packets #1 to #n+m to provide packets #1 to #n+m with CRC. By this means, in packet structure #2, the original information packet structure is changed. Therefore, for example, if z packets are erased, information packet error rate PER$\leq$1.

Therefore, when there are a large number of erased packets, that is, when z is larger, packet structure #1 shown in FIG. 54 provides better packet error rate performance than packet structure #2 shown in FIG. 55. In contrast, when there are a small number of erased packets, that is, when z is smaller, packet structure #2 is not limited in the arrangement method unlike packet structure #1, and can provide higher erasure correction capability by distributing information included in information packet #i (i=1, 2, . . . , n) into packets #1 to #n with CRC and performing more suitable arrangement, thereby providing better packet error rate performance than packet structure #1.

Therefore, to provide better packet error rate performance, it is important to select a more suitable packet structure by switching between those two packet structures based on, for example:

found packet error rate performance
request from the communicating party
data type
communication condition with the communicating party (e.g. condition of received quality, received signal intensity or packet error)

Figure 56:
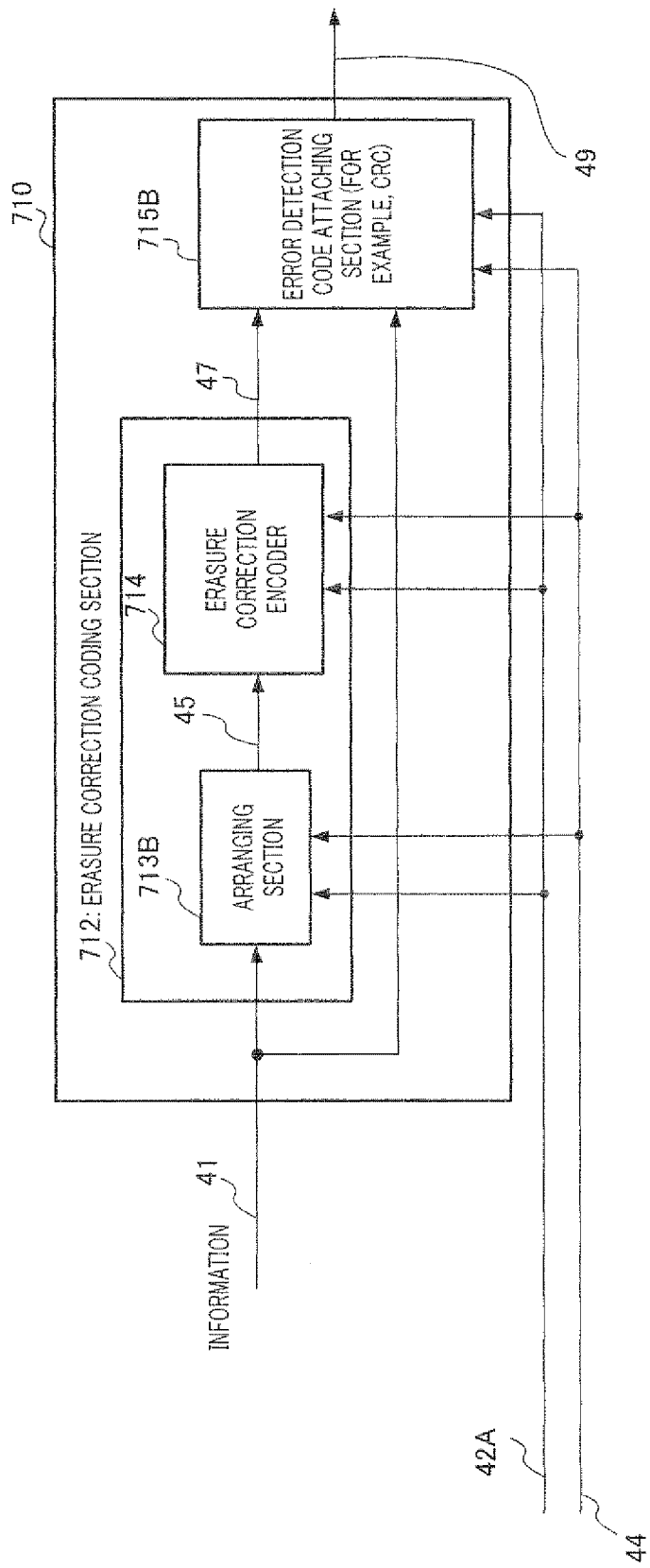
FIG. 56 shows a specific configuration of an erasure correction coding related processing section according to Embodiment 6.

FIG. 56 shows an example of the configuration of erasure correction coding related processing section 710 according to the present embodiment. Here, components of the same operations as in FIG. 38B will be assigned the same reference numerals. In FIG. 56, setting signal 42A includes information of an erasure correction scheme designated by communication apparatus 700 having erasure correction coding related processing section 710, in addition to information of the size of bits (packet size) forming a packet. Control signal 44 includes, for example, communication condition information fed back from the communicating party (e.g. reception intensity information, information about an occurrence of packet error, or, in the case of radio, CSI (Channel State Information), for example (however, that communication information is not limited to the above information)).

Arranging section 713B, erasure correction encoder 714 and error detection code attaching section 715B receive setting signal 42A and control signal 44 as input, and determine which of packet structure #1 and packet structure #2 to use as the packet structure, based on the communication condition indicated by control signal 44.

Then, according to the determined packet structure, arranging section 713B arranges the order of information based on information about the size of bits (packet size) forming packets included in setting signal 42A, and outputs arranged data 45.

Also, according to the determined packet structure, erasure correction encoder 714 performs erasure correction coding based on packet size information included in setting signal 42, and outputs parity 47.

Also, according to the determined packet structure, error detection code attaching section 715B forms packets with data 41 and parity 47 in one of the packet structures shown in FIG. 54 and FIG. 55, attaches an error detection code (e.g. CRC) to the formed packets and outputs packet 49 with the error detection code.

Figure 57:
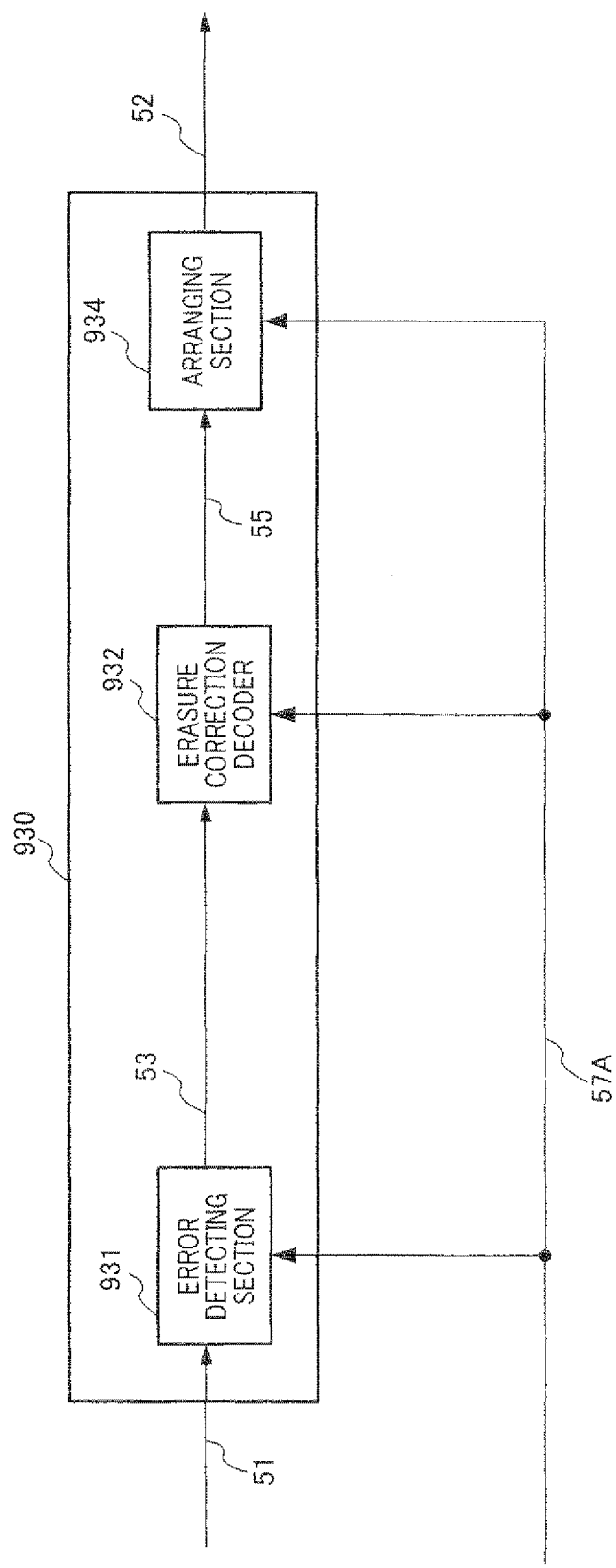
FIG. 57 shows a specific configuration of an erasure correction decoding related processing section according to Embodiment 6.

FIG. 57 shows an example of the configuration of erasure correction decoding related processing section 930 according to the present embodiment. In FIG. 57, components of the same operations as in FIG. 35 will be assigned the same reference numerals. Information 57A refers to erasure correction coding method information acquired by demodulating erasure correction coding method information in communication apparatus 700 of the communicating party, and includes, for example, the erasure correction code coding rate, packet size information and packet structure information. Therefore, error detecting section 781 receives data 51 and erasure correction coding method information 57A as input, performs error detection based on erasure correction coding method information 57A and outputs error-detected packet 53.

Erasure correction decoder 782 receives error-detected packet 53 and erasure correction coding method information 57A as input, performs erasure correction decoding based on erasure correction coding method information 57A and outputs decoded packet 55. Then, arranging section 934 generates information packet 52 from the decoded packet.

As described above, according to the communication condition, the present embodiment switches between a packet structure formed in which information packets and parity packets are not distinguished from each other (i.e. packet structure #1) and a packet structure formed in which information packets and parity packets are not distinguished from each other (i.e. packet structure #2). By this means, it is possible to employ a packet structure suitable to the communication condition, so that there is an advantage of being able to provide appropriate communication quality.

Embodiment 7

The present embodiment proposes different packet structures from in Embodiment 6.

Embodiment 6 has described a case where: comparing packet structure #1 of FIG. 54 and packet structure #2 of FIG.

55, packet structure 1 provides better packet error performance than packet structure #2 when there are a large number of erased packets, or packet structure 2 provides better packet error performance than packet structure #1 when there are a small number of erased packets; and, using this feature, a packet structure is switched according to the communication condition.

The present embodiment proposes a packet structure of better packet error performance, regardless of the number of erased packets.

Figure 58:
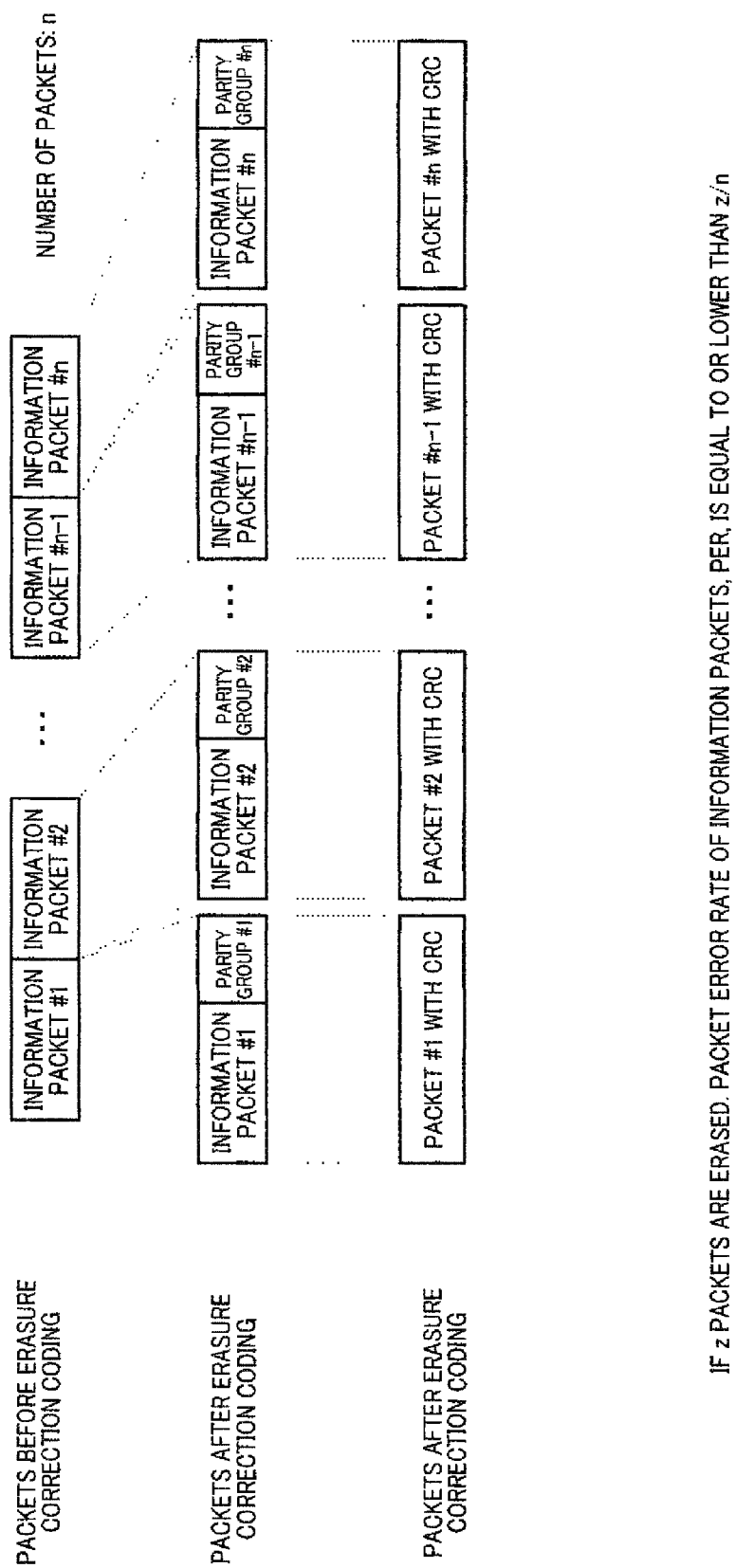
FIG. 58 shows packet structure #3 according to Embodiment 7 of the present invention.

FIG. 58 shows packet structure #3 according to the present embodiment. In packet structure #3, transmission packets are formed with information packets.

Figure 59:
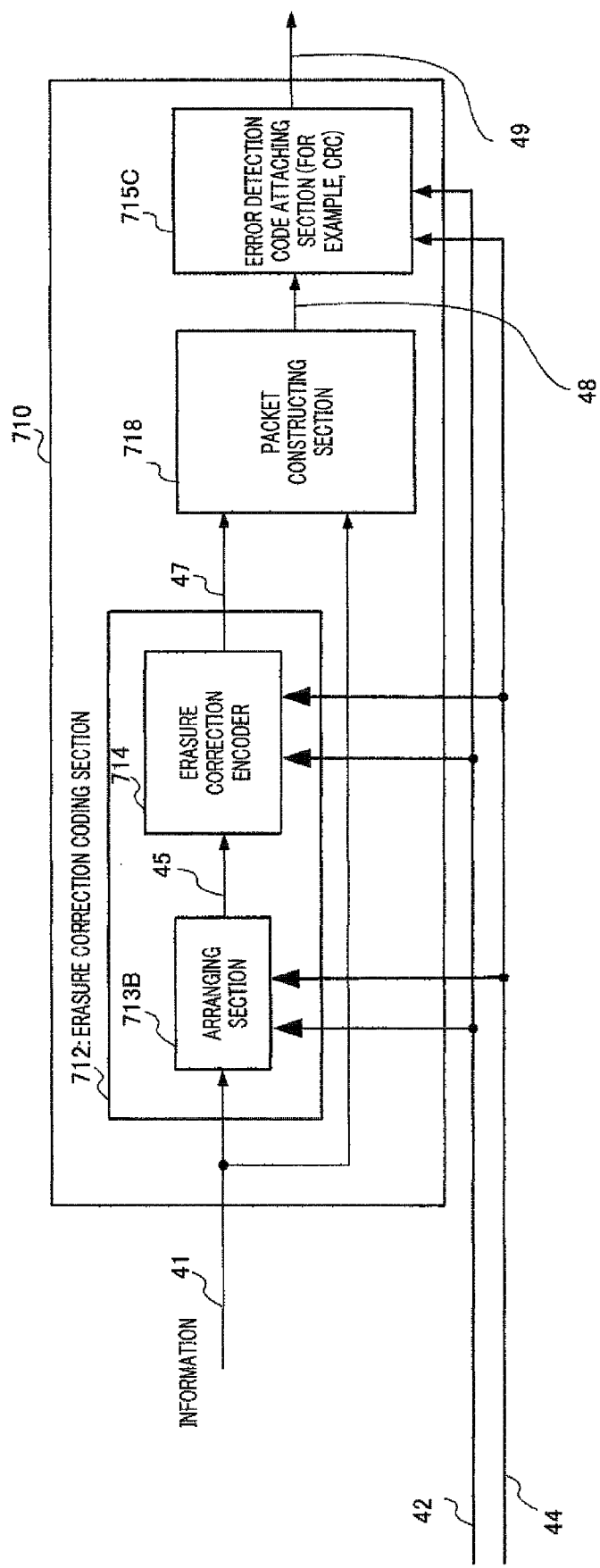
FIG. 59 shows a specific configuration of an erasure correction coding related processing section according to Embodiment 7.

Also, FIG. 59 shows an example of the configuration of erasure correction coding related processing section 710 according to the present embodiment. Here, components of the same operations will be assigned the same reference numerals.

As shown in FIG. 58, n information packets from information packet #1 to information packet #n are prepared. At this time, arranging section 713B receives as input and arranges these n information packets #1 to #n, and outputs arranged information 45. Then, erasure correction encoder 714 receives as input and encodes arranged information 45, and outputs parity 47.

Packet structure section 718 receives as input information packets #1 to #n and parity, and forms packets including information packets and parity as shown in FIG. 58. To be more specific, packet structure section 718 divides a plurality of parities found by erasure correction coding, into n parity groups #k (k=1, 2, . . . , n). However, when the number of parities is not a multiple of n, packet structure 718 inserts dummy bits such that the number of parities is a multiple of n and the sum of the number of parities and the number of dummy bits is a multiple of n. Then, as shown in FIG. 58, packet structure section 718 creates packet #1 formed with information packet #1 and parity group #1. Similarly, packet structure section 718 creates packet #k (k=1, 2, . . . , n) formed with information packet #k and parity group #k. Packet structure section 718 outputs created packet #k (k=1, 2, . . . , n) to error detection code attaching section 715C as packet 48.

After that, error detection code attaching section 715C attaches an error detection code (e.g. CRC) to each packet 48 and generates packets #1 to #n with CRC as transmission packets.

Here, in the packet structure of FIG. 58, if z packets are erased, information packet error rate PER is equal to or lower than z/n, that is, if there are a large number of erased packets, a better packet error rate is provided. In contrast, in a ease of the packet structure of FIG. 58, the regularity in data arrangement is less likely to be provided, so that a better packet error rate is provided even in a case of a small number of erased packets. Therefore, by using the packet structure according to the present embodiment, it is possible to provide better erasure correction capability regardless of the number of erased packets. However, the number of bits (packet size) forming packets is more than packet structure #1 (see FIG. 54) and packet structure #2 (see FIG. 55), and, consequently, there is a disadvantage that it is not suitable when there are a large number of bits forming information packets.

Therefore, it is important to select a more suitable packet structure by switching between packet structure #1 (see FIG. 54) and packet structure #2 (see FIG. 55) described in Embodiment 6 and packet structure #3 (see FIG. 58) described in the present embodiment, based on, for example:

found packet error rate performance
request from the communicating party
data type
communication condition with the communicating party (e.g. condition of received quality, received signal intensity or packet error)
the number of bits forming information packets Also, the configurations of an erasure correction coding related processing section and erasure correction decoding related processing section to realize packet structure #3, are the same as in FIG. 59 and FIG. 57, and therefore their explanation will be omitted. Also, it is not necessary to support all of packet structure #1 (see FIG. 54), packet structure #2 (see FIG. 55) and packet structure #3 (see FIG. 58), and, if a scheme is provided for switching between any two kinds of packet structures, it is possible to provide appropriate erasure correction capability.

Embodiment 8

Embodiment 6 has described the method of switching between two packet structures (see FIG. 54 and FIG. 55) according to the communication condition. Also, the present inventors have confirmed that, by switching between these two packet structures according to the coding rate in addition to the communication condition, better packet error rate performance is provided.

To be more specific, it is confirmed that: when the coding rate is $2/3$, there is little difference of packet error rate performance in a case of a small erasure rate between packet structure #1 (see FIG. 54) and packet structure #2 (see FIG. 55); and, when the erasure rate is high, packet structure #1 clearly provides better packet error performance than packet structure #2. Also, as a result, when the coding rate is $4/5$, packet error performance in a case of a small erasure rate are very poor in packet structure #1, but are good in packet structure #2.

In view of these, to provide better packet error rate performance, it is important to select a more suitable packet structure by switching between those two packet structures based on, for example;

found packet error rate performance
request from the communicating party
data type
communication condition with the communicating party (e.g. condition of received quality, received signal intensity or packet error)
coding rate Also, the configurations of erasure correction coding related processing section 710 and erasure correction decoding related processing section 930 according to the present embodiment, are the same as in Embodiment 6, and therefore their explanation will be omitted.

With the present embodiment, arranging section 713B, erasure correction encoder 714 and error detection code attaching section 715C receive setting signal 42 and control signal 44 as input, and, based on coding rate information indicated by setting signal 42 and the communication condition indicated by control signal 44, determines which of packet structure #1 and packet structure #2 to use as the packet structure.

For example, when setting signal 42 indicates a coding rate of $2/3$ and control signal 44 indicates a poor communication condition, arranging section 713B, erasure correction encoder 714 and error detection code attaching section 715C determine to use packet structure #2. Also, when setting signal 42 indicates a coding rate of $4/5$ and control signal 44 indicates a good communication condition, arranging section 713B, erasure correction encoder 714 and error detection code attaching section 715C determine to use packet structure #2.

Thus, by switching between two packet structures according to the coding rate and communication condition, arranging section 713B, erasure correction encoder 714 and error detection code attaching section 715C can provide good packet error performance.

Also, in a case of using packet structure #3 explained in Embodiment 7, as a simulation result, packet error performance does not fluctuate by the coding rate, and good packet error performance is provided in a high erasure rate and low erasure rate regardless of the communication condition.

(Parity Packets in a Case of Using an LDPC Convolutional Code)

Parity packets in a case of using an LDPC-CC (Low-Density Parity-Check Convolutional code) explained in Embodiment 1, will be explained supplementary.

With a convolutional code, if the communication apparatus on the encoding side transmits data up to a parity bit generated for an information bit finally transmitted by the encoder in the transmission information sequence, the communication apparatus on the decoding side cannot perform iterative decoding of a likelihood ratio in the row direction and column direction of a parity check matrix in decoding processing, which degrades the received quality of information significantly. Consequently, with a convolutional code, zero-termination is generally necessary.

Figure 60:
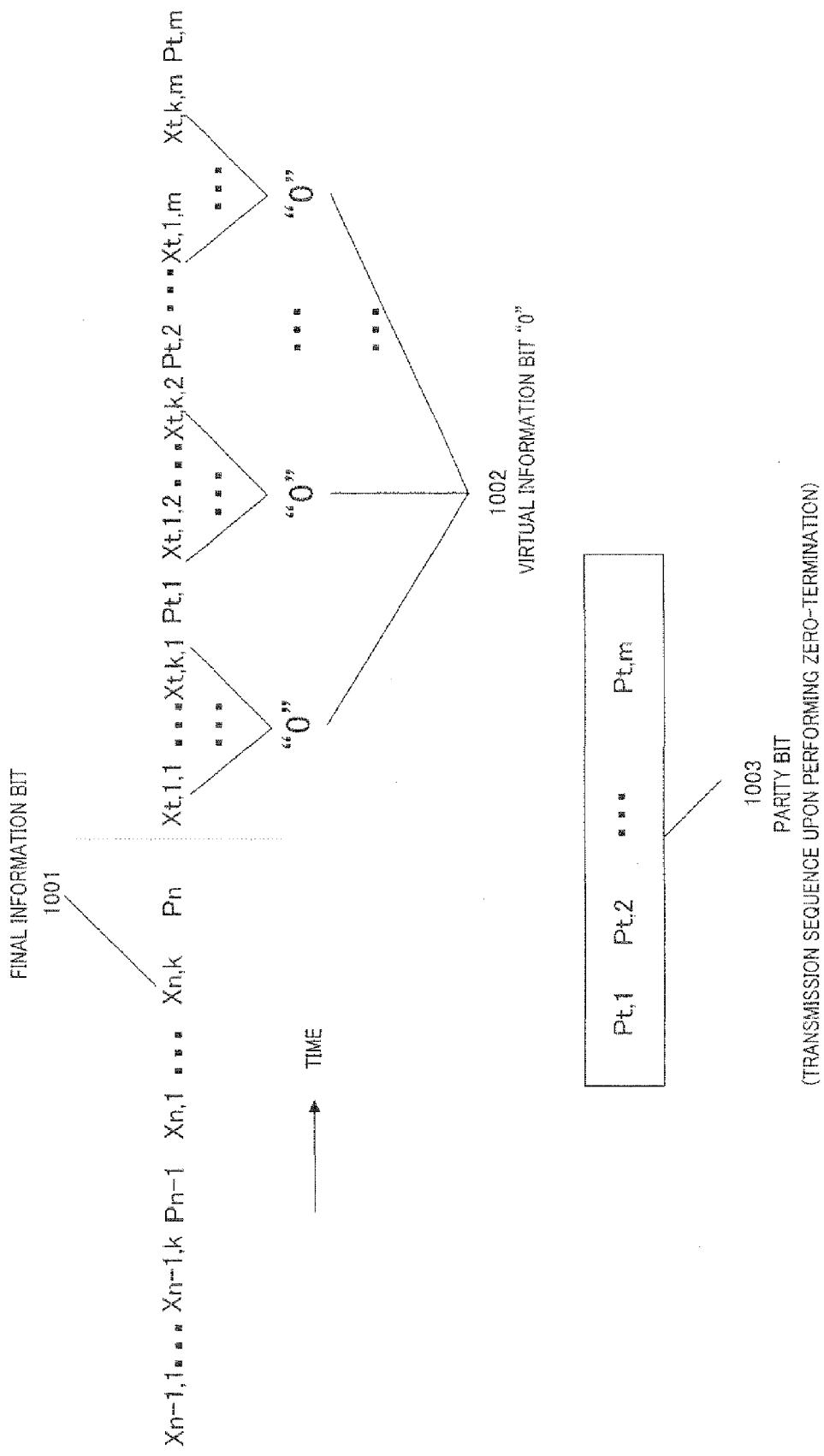
FIG. 60 is a drawing for explaining a method of information-zero-termination.

FIG. 60 is a drawing for explaining a method of information-zero-termination. Also, in FIG. 60, in a case of a coding rate of k/(k+1), information bits at point in time i are represented by Xi,1, Xi,2, ..., Xi,k, and a parity bit is represented by Pi.

As shown in FIG. 60, in information-zero-termination, coding is performed presuming information bit 1002 (referred to as "virtual information bit") finally transmitted in a transmission information sequence after at point in time n, to generate parity bit 1003.

At this time, the communication apparatus on the decoding side knows that virtual information bit 1002 is "0," so that the communication apparatus on the encoding side does not transmit virtual information bit 1002, but transmits only parity bit 1003 generated by virtual information bit 1002.

Although parity packets have been described with the present invention, when an LDPC-CC is used, parity bits forming a parity packet represent both parity bits generated up to point in time n and parity bit 1003 generated by information-zero-termination.

(Packet Generation Method in a Non-Systematic Code)

Figure 61:
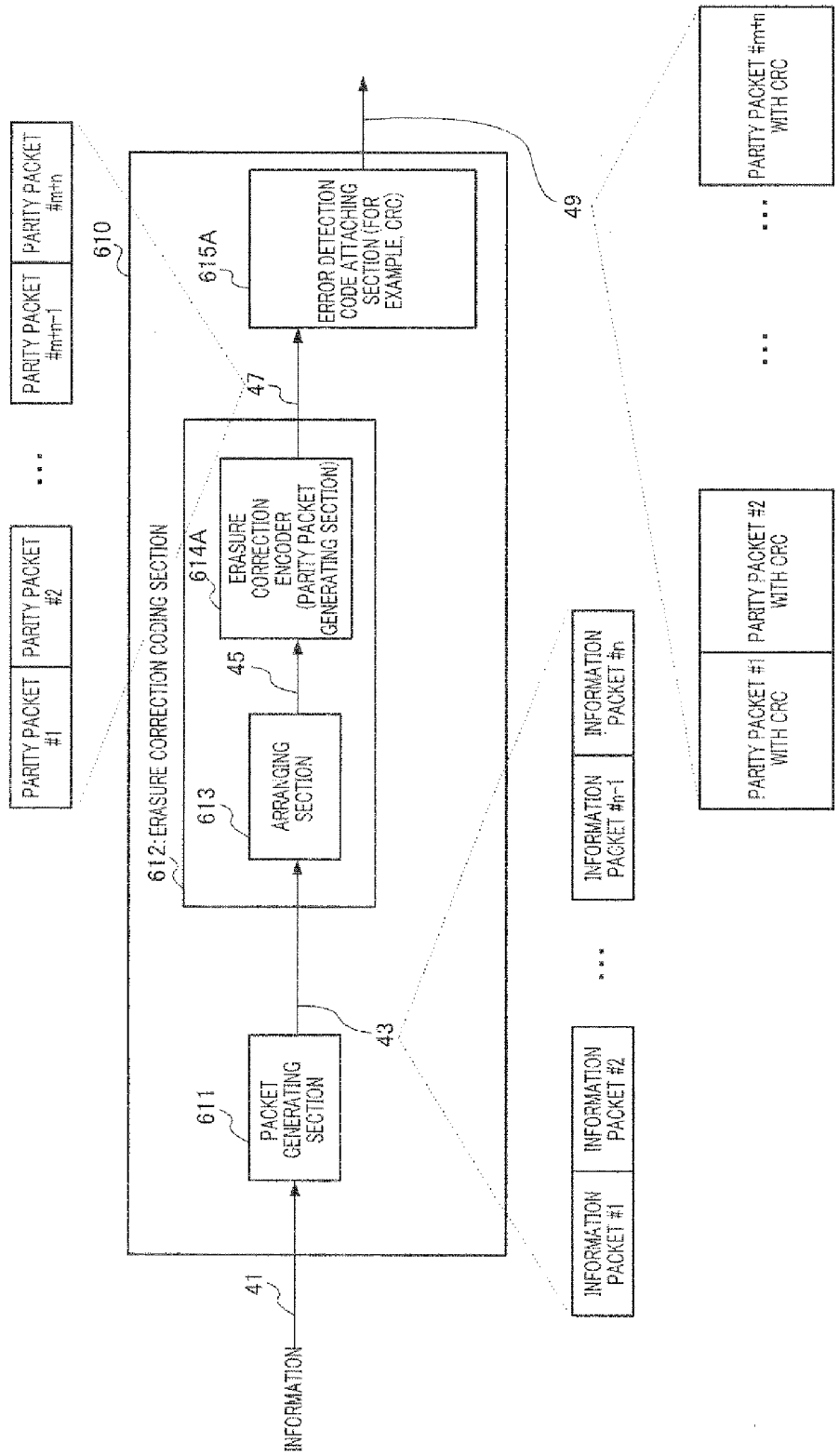
FIG. 61 shows an example of the configuration of an erasure correction coding section when using a non-systematic code.

In the following, the packet generation method in a non-systematic code will be explained. FIG. 61 shows an example of the configuration of an erasure correction coding section using a non-systematic code. In FIG. 61, components of the same operations as in FIG. 34A will be assigned the same reference numerals. FIG. 61 differs from FIG. 34A in that erasure correction coding section 614A refers to an encoder that performs non-systematic coding and generates parity packets #1 to #m+n from information packets #1 to #n. Therefore, erasure correction coding section 614 outputs parity packets #1 to #n+m. Then, error detection code attaching section 615A receives parity packets #1 to #n+m as input, attaches an error detection code (e.g. CRC) and outputs parity packets #1 to #n+m with CRC. Also, in erasure correction coding section 612A, arranging section 613 is not essential, and may not be provided.

Figure 62:
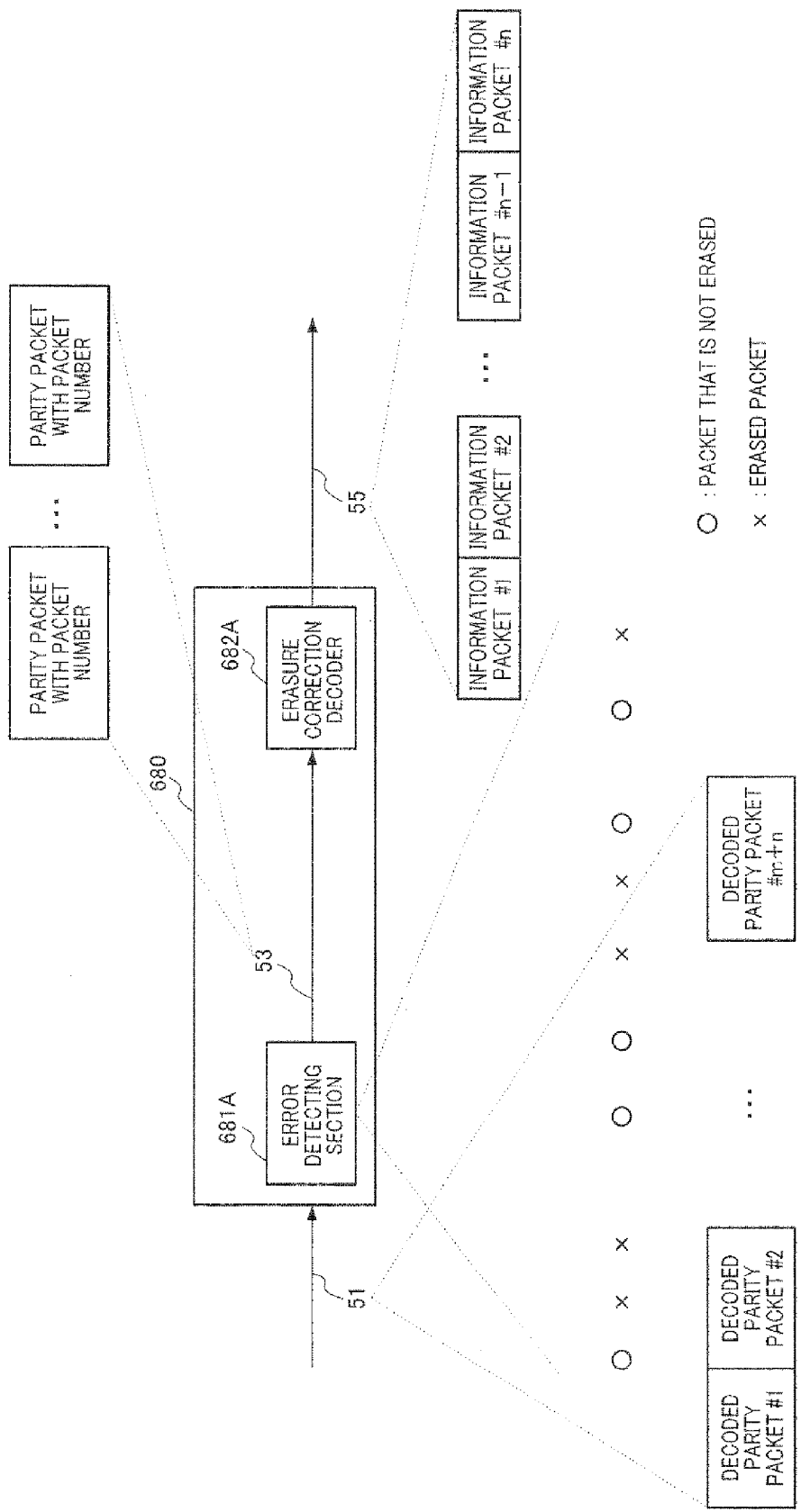
FIG. 62 shows an example of the configuration of an erasure correction decoding section when using a non-systematic code.

FIG. 62 shows an example of the configuration of an erasure correction decoding section. Here, components of the same operations as in FIG. 35 will be assigned the same reference numerals. FIG. 62 differs from FIG. 35 in that error detecting section 681A receives decoded parity packets #1 to #n+m, and that erasure correction decoder 682A restores parity packets #1 to #n+m and provides information packets #1 to #n from parity packets #1 to #n+m.

Embodiment 9

In the following, the specific packet structure method to provide high erasure correction capability in the packet structure method of FIG. 54 will be described.

Figure 63:
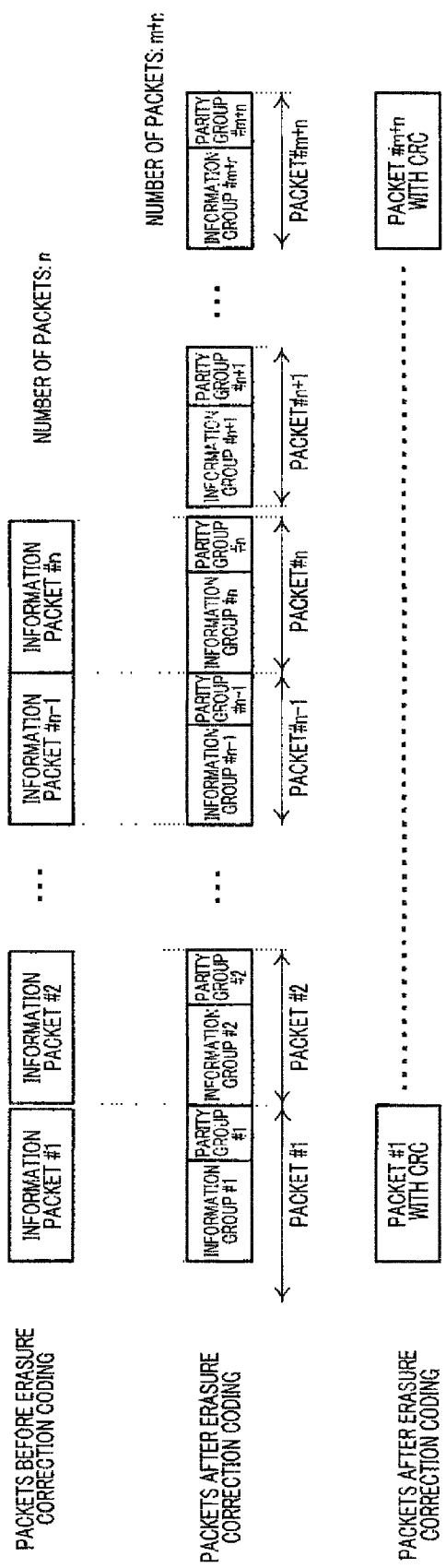
FIG. 63 shows a packet structure method of FIG. 54 by another expression method.

FIG. 63 shows the packet structure method of FIG. 54 in another way. Here, the number of bits forming an information packet equals the number of bits forming a packet subjected to erasure correction coding. In packets #1 to #m+n subjected to erasure correction coding, assume that packet #k m+n) is formed with information group #k (formed with information bits) and parity group #k (formed with parity bits). At this time, ideally, in packet #a and packet #b (here, a≠b; a, b=1, ..., m+n), if the number of bits of information group #a and the number of bits of information group #b are equal and the number of bits of parity group #a and the number of bits of parity group #b are equal (which holds true in arbitrary a and b), high error correction capability is provided.

However, depending on the coding rate, a case is possible where such a configuration cannot be employed. In this case, if the difference between the number of bits of information group #a and the number of bits of information group #b is no more than 1 and the difference between the number of bits of parity group #a and the number of bits of parity group #b is no more than 1 (which holds true in arbitrary a and b), high error correction capability is provided.

The present invention is not limited to the above-described embodiments, and can be implemented with various changes. For example, although cases have been mainly described above with embodiments where the present invention is implemented with an encoder and a transmitting apparatus, the present invention is not limited to this, and is applicable to cases of implementation by means of a power line communication apparatus.

It is also possible to implement the encoding method and the transmitting method as software. For example, provision may be made for a program that executes the above-described encoding method and communication method to be stored in ROM (Read Only Memory) beforehand, and for this program to be run by a CPU (Central Processing Unit).

Provision may also be made for a program that executes the above-described encoding method and transmitting method to be stored in a computer-readable storage medium, for the program stored in the storage medium to be recorded in RAM (Random Access Memory) of a computer, and for the computer to be operated in accordance with that program.

It goes without saying that the present invention is not limited to radio communication, and is also useful in power line communication (PLC), visible light communication, and optical communication.

The disclosure of Japanese Patent Application No. 2008-173735, filed on Jul. 2, 2008, including the specification, drawings and abstract, is incorporated herein by reference in its entirety.

INDUSTRIAL APPLICABILITY

The present invention can improve erasure correction capability in erasure correction using an LDPC-CC, and is effective to, for example, an encoding apparatus and erasure correction coding method for performing erasure correction using an LDPC-CC (Low-Density Parity-Check Convolutional Code).

REFERENCE SIGNS LIST

110, 611, 711 Packet generating section
120, 220 Erasure correction encoding apparatus 121 Dummy data inserting section
122 Arranging section
123, 310, 612, 712 Erasure correction coding section
124 Erasure correction coding parameter storage section
130 Transmitting apparatus
140, 640, 800 Communication channel
150 Receiving apparatus
160, 260 Erasure correction decoding apparatus
161 Dummy data inserting section
162, 613, 713, 713B Arranging section
163 Erasure correction decoding section
164 Erasure correction decoding parameter storage section
170 Packet decoding section
222 Block pattern arranging section
262 Block pattern arranging section
300 Server
320 Buffer
330 Switching section
340, 620, 720 Error correction coding section
350 Modulating/transmitting section
360 Receiving/demodulating section
370 Erasure correction on/off setting section
380 Mode setting section
400 Terminal apparatus
410, 660. 740, 910 Receiving section
420 Demodulating section
430 Header analyzing section
440 Erasure correction decoding section
450 Retransmission request deciding section
460, 630, 730, 940 Transmitting section
500 LDPC-CC encoding section
510 Data computing section
511-1 TO 511-M, 521-1 TO 521-M Shift register
512-0 TO 512-M, 522-0 TO 522-M Weight multiplier
520 Parity computing section
530 Weight control section
540 Mod 2 adder
600, 650, 700, 900 Communication apparatus
610, 710 Erasure correction coding related processing section
670, 920 Error correction decoding section
680, 930 Erasure correction decoding related processing section
615A, 615B, 715A, 715B, 715C Error detection code attaching section
614, 614A, 614-1 to 614-3, 714 Erasure correction encoder
681, 681A, 931 Error detecting section
682, 682A, 932 Erasure correction decoder
614-4 Selecting section
716, 933 Packet dividing section
717 Packet reconstructing section

The invention claimed is:

1. A coding apparatus that is applied to a communication apparatus that performs packet communication, comprising:
an arranging section that arranges information data included in a plurality of information packets according to constraint length Kmax and coding rate $(q-1)/q$ of a parity check polynomial of equation 1 of a low-density parity-check convolutional code;
an erasure correction encoding section that applies erasure correction coding to arranged information data using the parity check polynomial and generates first parity packets to output the first parity packets; and
an error correction coding section that applies error correction coding to the information data and the output first parity packets to generate second parity packets,
wherein the arranging section arranges the information data to make, a bit sequence which is decided based on the constraint length Kmax and the coding rate $(q-1)/q$ in the arranged information data, be formed with bits respectively included in the different information packets, $$(D^{a\#k,1,1}+D^{a\#k,1,2}+\ldots+D^{a\#k,1,L1k}+1)X_1(D)+(D^{a\#k,2,1}+D^{a\#k,2,2}+\ldots+D^{a\#k,2,L2k}+1)X_2(D)+\ldots$$
$$+(D^{a\#k,q-1,1}D^{a\#k,q-1,2}+\ldots+D^{a\#k,q-1,Lq-1k}+1)X_{q-1}(D)+(D^{b\#k,1}+D^{b\#k,2}+\ldots D^{b\#k,Lk}+1)P(D)=0 \quad \text{(Equation 1)}$$

where D is a delay operator, and, if a#k,x,y and b#k,y (k=1, 2, 3, ..., g) each are an order of the parity check polynomial of equation 1 and a maximum value (maximum order) of a#k,x,y and b#k,y is $a_{max}$, constraint length Kmax=$a_{max}$+1.

2. The coding apparatus according to claim 1, wherein Kmax×(q−1) pieces of information data that are the arranged bit sequence are formed with information data included in different information packets.

3. The coding apparatus according to claim 1, wherein the arranging section selects information data on a bit-by-bit basis from Kmax×(q−1) or more information packets and arranges the selected information data.

4. The coding apparatus according to claim 1, wherein the arranging section selects information data on a bit-by-bit basis from Kmax×(q−1) or more information packets, sorts the selected information data into a plurality of information blocks and arranges the information data such that an order of information packets included in the information data varies between the information blocks.

5. A coding method that is applied to packet communication, comprising the steps of:
arranging information data included in a plurality of information packets according to constraint length Kmax and coding rate $(q-1)/q$ of a parity check polynomial of equation 2 of a low-density parity-check convolutional code;
applying erasure correction coding to the arranged information data using the parity check polynomial and generating first parity packets to output the first parity packets; and
applying error correction coding to the information data and the output first parity packets to generate second parity packets,
wherein the information data is arranged to make, a bit sequence which is decided based on the constraint length Kmax and the coding rate $(q-1)/q$ in the arranged information data, be formed with bits respectively included in the different information packets, $$(D^{a\#k,1,1}+D^{a\#k,1,2}+\ldots+D^{a\#k,1,L1k}+1)X_1(D)+(D^{a\#k,2,1}+D^{a\#k,2,2}+\ldots+D^{a\#k,2,L2k}+1)X_2(D)+\ldots$$
$$+(D^{a\#k,q-1,1}D^{a\#k,q-1,2}+\ldots+D^{a\#k,q-1,Lq-1k}+1)X_{q-1}(D)+(D^{b\#k,1}+D^{b\#k,2}+\ldots D^{b\#k,Lk}+1)P(D)=0 \quad \text{(Equation 2)}$$

where D is a delay operator, and, if a#k,x,y and b#k,y (k=1, 2, 3, ..., g) each are an order of the parity check polynomial of equation 2 and a maximum value (maximum order) of a#k,x,y and b#k,y is $a_{max}$, constraint length Kmax=$a_{max}$+1.

* * * * *

UNITED STATES PATENT AND TRADEMARK OFFICE
CERTIFICATE OF CORRECTION

PATENT NO. : 8,522,109 B2
APPLICATION NO. : 12/994367
DATED : August 27, 2013
INVENTOR(S) : Yutaka Murakami et al.

It is certified that error appears in the above-identified patent and that said Letters Patent is hereby corrected as shown below:

In the claims

Claim 1, column 74, line 12 incorrectly reads:

"+(Da#k,q-1,1Da#k,q-1,2+...+Da#k,q-1,Lq-1k+1)Xq-1(D)+"

and should read

"+(Da#k,q-1,1+Da#k,q-1,2+...+Da#k,q-1,Lq-1k+1)Xq-1(D)+".

Claim 1, column 74, line 13 incorrectly reads:

"(Db#k,1+Db#k,2+...Db#k,Lk+1)P(D)=0     (Equation 1)"

and should read

"(Db#k,1+Db#k,2+...+Db#k,Lk+1)P(D)=0     (Equation 1)".

Claim 5, column 74, line 56 incorrectly reads:

"+(Da#k,q-1,1Da#k,q-1,2+...+Da#k,q-1,Lq-1k+1)Xq-1(D)+"

and should read

"+(Da#k,q-1,1+Da#k,q-1,2+...+Da#k,q-1,Lq-1k+1)Xq-1(D)+".

Signed and Sealed this
Sixth Day of May, 2014

Michelle K. Lee
*Deputy Director of the United States Patent and Trademark Office*

CERTIFICATE OF CORRECTION (continued)
U.S. Pat. No. 8,522,109 B2

Claim 5, column 74, line 57 incorrectly reads:

"(Db#k,1+Db#k,2+...Db#k,Lk+1)P(D)=0      (Equation 2)"

and should read

"(Db#k,1+Db#k,2+...+Db#k,Lk+1)P(D)=0      (Equation 2)".